(12) United States Patent
Jinde et al.

(10) Patent No.: US 12,446,463 B2
(45) Date of Patent: Oct. 14, 2025

(54) ORGANIC ELECTROLUMINESCENT ELEMENT AND ELECTRONIC DEVICE

(71) Applicant: IDEMITSU KOSAN CO., LTD., Tokyo (JP)

(72) Inventors: Yukitoshi Jinde, Tokyo (JP); Hisato Matsumoto, Tokyo (JP); Keiichi Yasukawa, Tokyo (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 382 days.

(21) Appl. No.: 18/204,474

(22) Filed: Jun. 1, 2023

(65) Prior Publication Data
US 2024/0114780 A1    Apr. 4, 2024

(30) Foreign Application Priority Data
Jun. 2, 2022    (JP) .................... 2022-090279

(51) Int. Cl.
*H10K 85/60* (2023.01)
*H10K 50/11* (2023.01)

(52) U.S. Cl.
CPC ......... *H10K 85/657* (2023.02); *H10K 85/654* (2023.02); *H10K 85/6572* (2023.02); *H10K 85/658* (2023.02); *H10K 50/11* (2023.02)

(58) Field of Classification Search
None
See application file for complete search history.

(56) References Cited

U.S. PATENT DOCUMENTS

2024/0114780 A1* 4/2024 Jinde ................. H10K 50/00

OTHER PUBLICATIONS

Adachi Chihaya, "Yuki Hando-tai no Debaisu Bussei (Device Physics of Organic Semiconductors)", Device Physics of Organic Semiconductors, Kodansha Ltd., 2012, p. 261-268 (with English translation).
Hiroki Uoyama, et al., "Highly efficient organic light-emitting diodes from delayed fluorescence", Nature, vol. 492, pp. 234-238, Dec. 13, 2012.
Minlang Yang, et al., Full Color, Narrowband, and High Efficiency Electroluminescence from Boron and Carbazole Embedded Polycyclic Heteroaromatics , Journal of the American Chemical Society, 2020, vol. 142, No. 46 n 19468-19472.

* cited by examiner

*Primary Examiner* — Jack S Chen
(74) *Attorney, Agent, or Firm* — Element IP, PLC

(57) ABSTRACT

An emitting layer of an organic EL device contains a fluorescent first compound, a delayed fluorescent second compound, and a third compound that satisfy numerical formulae (Numerical Formula 1) to (Numerical Formula 4). (Numerical Formula 1): $|Af(M1)-Af(M2)| \leq 0.40$ eV, (Numerical Formula 2): $Ip(M2) \geq 5.75$ eV, (Numerical Formula 3): $|Ip(M2)-Ip(M3)| \leq 0.25$ eV, (Numerical Formula 4): $S_1(M3) \geq S_1(M2)$. Af(M1) is an affinity of the first compound, Af(M2) is an affinity of the second compound, Ip(M2) is an ionization potential of the second compound, $S_1(M2)$ is a lowest singlet energy of the second compound, Ip(M3) is an ionization potential of the third compound, and $S_1(M3)$ is a lowest singlet energy of the third compound.

22 Claims, 4 Drawing Sheets

ORGANIC ELECTROLUMINESCENT ELEMENT AND ELECTRONIC DEVICE

The entire disclosure of Japanese Patent Application No. 2022-090279, filed Jun. 2, 2022, is expressly incorporated by reference herein.

TECHNICAL FIELD

The present invention relates to an organic electroluminescence device and an electronic device.

BACKGROUND ART

When a voltage is applied to an organic electroluminescence device (hereinafter, occasionally referred to as "organic EL device"), holes are injected from an anode and electrons are injected from a cathode into an emitting layer. The injected holes and electrons are recombined in the emitting layer to form excitons. Specifically, according to the electron spin statistics theory, singlet excitons and triplet excitons are generated at a ratio of 25%:75%.

A fluorescent organic EL device using light emission from singlet excitons has been applied to a full-color display such as a mobile phone and a television set, but an internal quantum efficiency is said to be at a limit of 25%. Studies have thus been made to improve performance of the organic EL device.

For instance, the organic EL device is expected to emit light more efficiently using triplet excitons in addition to singlet excitons. In view of the above, a highly-efficient fluorescent organic EL device using thermally activated delayed fluorescence (hereinafter simply referred to as "delayed fluorescence" in some cases) has been proposed and studied.

A thermally activated delayed fluorescence (TADF) mechanism uses such a phenomenon in which inverse intersystem crossing from triplet excitons to singlet excitons thermally occurs when a material having a small energy difference ($\Delta ST$) between singlet energy level and triplet energy level is used. Thermally activated delayed fluorescence is explained in "Yuki Hando-tai no Debaisu Bussei (Device Physics of Organic Semiconductors)" (edited by ADACHI Chihaya, published by Kodansha, issued on Apr. 1, 2012, on pages 261-268).

Examples of known compounds that exhibit thermally activated delayed fluorescence (TADF) (hereinafter, also referred to as TADF compounds) include compounds in which a donor moiety and an acceptor moiety are bonded in their molecules.

Literature 1 (Journal of the American Chemical Society, 2020, 142, 46, 19468-19472) discloses an organic light-emitting diode that utilizes, as a TADF emitter, a polycyclic compound containing a boron atom and a nitrogen atom.

A further improvement in performance of the organic EL device has been demanded for an improvement in performance of an electronic device such as a display. The performance of the organic EL device is evaluable in terms of, for instance, luminance, emission wavelength, chromaticity, luminous efficiency, drive voltage, and lifetime.

Hitherto, in an organic EL device including an emitting layer that radiates red light due to the TADF mechanism (hereinafter, sometimes abbreviated as an R-TADF device), an emitting region in the emitting layer is unevenly distributed at an interface close to the electron transporting layer. In organic EL display devices equipped with top-emission organic EL devices of respective colors serving as a red pixel, a green pixel, and a blue pixel (RGB pixels), when the R-TADF device is provided as the red pixel, it is difficult to perform optical adjustment (cavity adjustment). Specifically, in top-emission organic EL devices, the thickness of a layer disposed between the emitting layer and the cathode is fixed, therefore, when, in an R-TADF device, the emitting region is unevenly distributed at an interface on a side of the emitting layer close to the electron transporting layer, on the other hand, in an organic EL device serving as a blue pixel, the emitting region is unevenly distributed at an interface on a side of the emitting layer close to the electron transporting layer, and the emitting region is present over the entire emitting layer in an organic EL device serving as a green pixel, it is difficult to perform optical adjustment (cavity adjustment). Therefore, also for an R-TADF device, it is desirable that the emitting region is present at an interface on a side of the emitting layer close to the hole transporting layer or present over the entire emitting layer as in the organic EL device serving as a blue pixel and the organic EL device serving as a green pixel.

SUMMARY OF THE INVENTION

An object of the invention is to provide an organic electroluminescence device that can realize higher efficiency and that can be used as an R pixel (red pixel) which is easily subjected to cavity adjustment in an organic EL display device equipped with RGB pixels and to provide an electronic device equipped with the organic electroluminescence device.

According to an aspect of the invention, there is provided an organic electroluminescence device including an anode, a cathode, and an emitting layer, in which the emitting layer contains a first compound, a second compound, and a third compound, the first compound, the second compound, and the third compound are different from each other, the first compound is a fluorescent compound, the second compound is a delayed fluorescent compound, and the first compound, the second compound, and the third compound satisfy numerical formulae (Numerical Formula 1), (Numerical Formula 2), (Numerical Formula 3), and (Numerical Formula 4) below:

| $\|Af(M1)-Af(M2)\| \leq 0.40$ eV | (Numerical Formula 1): |
| $Ip(M2) \geq 5.75$ eV | (Numerical Formula 2): |
| $\|Ip(M2)-Ip(M3)\| \leq 0.25$ eV | (Numerical Formula 3): |
| $S_1(M3) \geq S_1(M2)$ | (Numerical Formula 4): | where Af(M1) is an affinity of the first compound,
Af(M2) is an affinity of the second compound,
Ip(M2) is an ionization potential of the second compound,
$S_1(M2)$ is a lowest singlet energy of the second compound,
Ip(M3) is an ionization potential of the third compound, and
$S_1(M3)$ is a lowest singlet energy of the third compound.

According to another aspect of the invention, there is provided an electronic device equipped with the organic electroluminescence device according to the above aspect of the invention.

According to the aspect of the invention, it is possible to provide an organic electroluminescence device that can realize higher efficiency and that can be used as an R pixel (red pixel) which is easily subjected to cavity adjustment in an organic EL display device equipped with RGB pixels.

According to the aspect of the invention, it is possible to provide an electronic device equipped with the organic electroluminescence device.

DETAILED DESCRIPTION

Definitions

Figure 1:
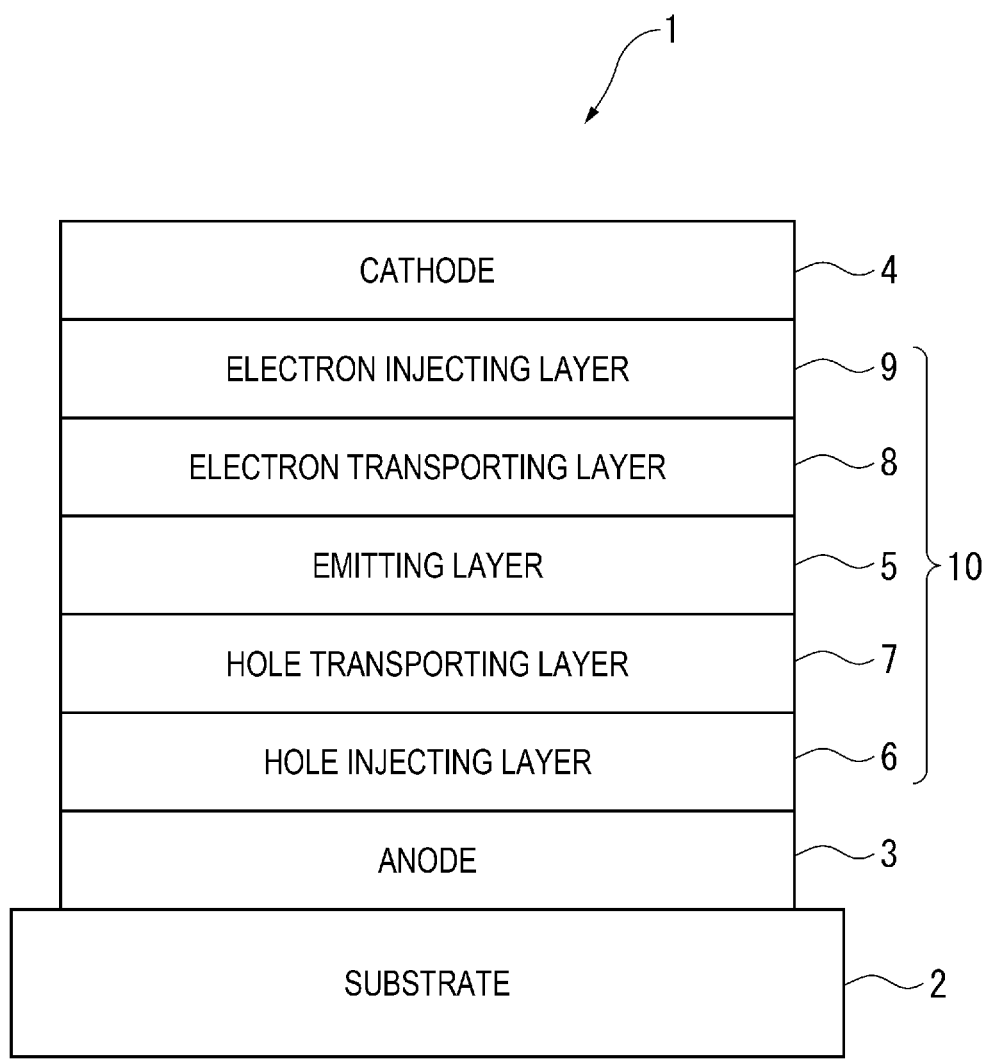
FIG. 1 is a view illustrating a schematic structure of an example of an organic electroluminescence device according to a first exemplary embodiment of the invention.

Herein, a hydrogen atom includes isotope having different numbers of neutrons, specifically, protium, deuterium and tritium.

In chemical formulae herein, it is assumed that a hydrogen atom (i.e. protium, deuterium and tritium) is bonded to each of bondable positions that are not annexed with signs "R" or the like or "D" representing a deuterium.

Herein, the ring carbon atoms refer to the number of carbon atoms among atoms forming a ring of a compound (e.g., a monocyclic compound, fused-ring compound, cross-linking compound, carbon ring compound, and heterocyclic compound) in which the atoms are bonded to each other to form the ring. When the ring is substituted by a substituent (s), carbon atom(s) contained in the substituent(s) is not counted in the ring carbon atoms. Unless otherwise specified, the same applies to the "ring carbon atoms" described later. For instance, a benzene ring has 6 ring carbon atoms, a naphthalene ring has 10 ring carbon atoms, a pyridine ring has 5 ring carbon atoms, and a furan ring has 4 ring carbon atoms. Further, for instance, 9,9-diphenylfluorenyl group has 13 ring carbon atoms and 9,9-spirobifluorenyl group has 25 ring carbon atoms.

When a benzene ring is substituted by a substituent in a form of, for instance, an alkyl group, the number of carbon atoms of the alkyl group is not counted in the number of the ring carbon atoms of the benzene ring. Accordingly, the benzene ring substituted by an alkyl group has 6 ring carbon atoms. When a naphthalene ring is substituted by a substituent in a form of, for instance, an alkyl group, the number of carbon atoms of the alkyl group is not counted in the number of the ring carbon atoms of the naphthalene ring. Accordingly, the naphthalene ring substituted by an alkyl group has 10 ring carbon atoms.

Herein, the ring atoms refer to the number of atoms forming a ring of a compound (e.g., a monocyclic compound, fused-ring compound, cross-linking compound, carbon ring compound, and heterocyclic compound) in which the atoms are bonded to each other to form the ring (e.g., monocyclic ring, fused ring, and ring assembly). Atom(s) not forming the ring (e.g., hydrogen atom(s) for saturating the valence of the atom which forms the ring) and atom(s) in a substituent by which the ring is substituted are not counted as the ring atoms. Unless otherwise specified, the same applies to the "ring atoms" described later. For instance, a pyridine ring has 6 ring atoms, a quinazoline ring has 10 ring atoms, and a furan ring has 5 ring atoms. For instance, the number of hydrogen atom(s) bonded to a pyridine ring or the number of atoms forming a substituent is not counted as the pyridine ring atoms. Accordingly, a pyridine ring bonded to a hydrogen atom(s) or a substituent (s) has 6 ring atoms. For instance, the hydrogen atom(s) bonded to carbon atom(s) of a quinazoline ring or the atoms forming a substituent are not counted as the quinazoline ring atoms. Accordingly, a quinazoline ring bonded to hydrogen atom(s) or a substituent(s) has 10 ring atoms.

Herein, "XX to YY carbon atoms" in the description of "substituted or unsubstituted ZZ group having XX to YY carbon atoms" represent carbon atoms of an unsubstituted ZZ group and do not include carbon atoms of a substituent(s) of the substituted ZZ group. Herein, "YY" is larger than "XX," "XX" representing an integer of 1 or more and "YY" representing an integer of 2 or more.

Herein, "XX to YY atoms" in the description of "substituted or unsubstituted ZZ group having XX to YY atoms" represent atoms of an unsubstituted ZZ group and does not include atoms of a substituent(s) of the substituted ZZ group. Herein, "YY" is larger than "XX," "XX" representing an integer of 1 or more and "YY" representing an integer of 2 or more. Herein, an unsubstituted ZZ group refers to an "unsubstituted ZZ group" in a "substituted or unsubstituted ZZ group," and a substituted ZZ group refers to a "substituted ZZ group" in a "substituted or unsubstituted ZZ group."

Herein, the term "unsubstituted" used in a "substituted or unsubstituted ZZ group" means that a hydrogen atom(s) in the ZZ group is not substituted with a substituent(s). The hydrogen atom(s) in the "unsubstituted ZZ group" is protium, deuterium, or tritium.

Herein, the term "substituted" used in a "substituted or unsubstituted ZZ group" means that at least one hydrogen atom in the ZZ group is substituted with a substituent. Similarly, the term "substituted" used in a "BB group substituted by AA group" means that at least one hydrogen atom in the BB group is substituted with the AA group.

Substituent Mentioned Herein

Substituent mentioned herein will be described below.

An "unsubstituted aryl group" mentioned herein has, unless otherwise specified herein, 6 to 50, preferably 6 to 30, more preferably 6 to 16 ring carbon atoms.

An "unsubstituted heterocyclic group" mentioned herein has, unless otherwise specified herein, 5 to 50, preferably 5 to 30, more preferably 5 to 18 ring atoms.

An "unsubstituted alkyl group" mentioned herein has, unless otherwise specified herein, 1 to 50, preferably 1 to 20, more preferably 1 to 6 carbon atoms.

An "unsubstituted alkenyl group" mentioned herein has, unless otherwise specified herein, 2 to 50, preferably 2 to 20, more preferably 2 to 6 carbon atoms.

An "unsubstituted alkynyl group" mentioned herein has, unless otherwise specified herein, 2 to 50, preferably 2 to 20, more preferably 2 to 6 carbon atoms.

An "unsubstituted cycloalkyl group" mentioned herein has, unless otherwise specified herein, 3 to 50, preferably 3 to 20, more preferably 3 to 6 ring carbon atoms.

An "unsubstituted arylene group" mentioned herein has, unless otherwise specified herein, 6 to 50, preferably 6 to 30, more preferably 6 to 18 ring carbon atoms.

An "unsubstituted divalent heterocyclic group" mentioned herein has, unless otherwise specified herein, 5 to 50, preferably 5 to 30, more preferably 5 to 18 ring atoms.

An "unsubstituted alkylene group" mentioned herein has, unless otherwise specified herein, 1 to 50, preferably 1 to 20, more preferably 1 to 6 carbon atoms.

Substituted or Unsubstituted Aryl Group

Specific examples (specific example group G1) of the "substituted or unsubstituted aryl group" mentioned herein include unsubstituted aryl groups (specific example group G1A) below and substituted aryl groups (specific example group G1B). (Herein, an unsubstituted aryl group refers to an "unsubstituted aryl group" in a "substituted or unsubstituted aryl group", and a substituted aryl group refers to a "substituted aryl group" in a "substituted or unsubstituted aryl group.") A simply termed "aryl group" herein includes both of an "unsubstituted aryl group" and a "substituted aryl group".

The "substituted aryl group" refers to a group derived by substituting at least one hydrogen atom in an "unsubstituted aryl group" with a substituent. Examples of the "substituted aryl group" include a group derived by substituting at least one hydrogen atom in the "unsubstituted aryl group" in the specific example group G1A below with a substituent, and examples of the substituted aryl group in the specific example group G1B below. It should be noted that the examples of the "unsubstituted aryl group" and the "substituted aryl group" mentioned herein are merely exemplary, and the "substituted aryl group" mentioned herein includes a group derived by further substituting a hydrogen atom bonded to a carbon atom of a skeleton of a "substituted aryl group" in the specific example group G1B below, and a group derived by further substituting a hydrogen atom of a substituent of the "substituted aryl group" in the specific example group G1B below.

Unsubstituted Aryl Group (Specific Example Group G1A):

a phenyl group, p-biphenyl group, m-biphenyl group, o-biphenyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-terphenyl-4-yl group, o-terphenyl-3-yl group, o-terphenyl-2-yl group, 1-naphthyl group, 2-naphthyl group, anthryl group, benzanthryl group, phenanthryl group, benzophenanthryl group, phenalenyl group, pyrenyl group, chrysenyl group, benzochrysenyl group, triphenylenyl group, benzotriphenylenyl group, tetracenyl group, pentacenyl group, fluorenyl group, 9,9'-spirobifluorenyl group, benzofluorenyl group, dibenzofluorenyl group, fluoranthenyl group, benzofluoranthenyl group, perylenyl group, and monovalent aryl group derived by removing one hydrogen atom from cyclic structures represented by formulae (TEMP-1) to (TEMP-15) below.

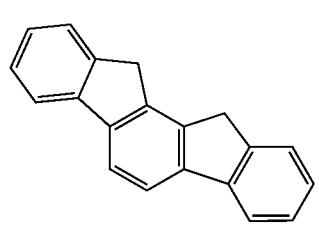

(TEMP-1)

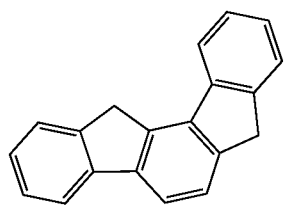

(TEMP-2)

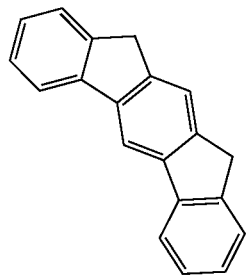

(TEMP-3)

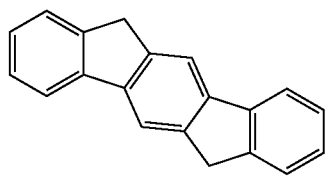

(TEMP-4)

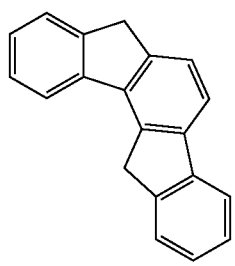

(TEMP-5)

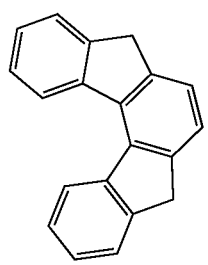

(TEMP-6)

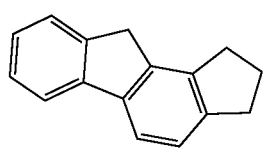

(TEMP-7)

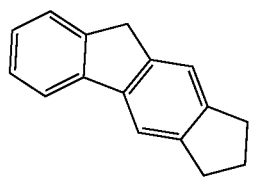

(TEMP-8)

-continued

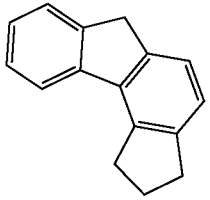
(TEMP-9)

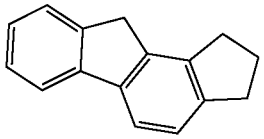
(TEMP-10)

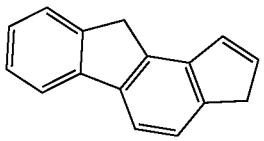
(TEMP-11)

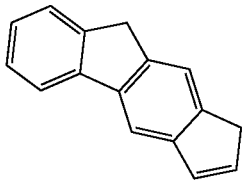
(TEMP-12)

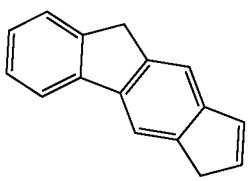
(TEMP-13)

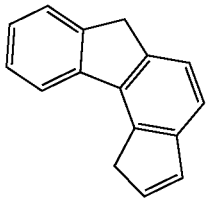
(TEMP-14)

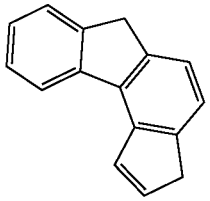
(TEMP-15)

Substituted Aryl Group (Specific Example Group G1B):
an o-tolyl group, m-tolyl group, p-tolyl group, para-xylyl group, meta-xylyl group, ortho-xylyl group, para-isopropylphenyl group, meta-isopropylphenyl group, ortho-isopropylphenyl group, para-t-butylphenyl group, meta-t-butylphenyl group, ortho-t-butylphenyl group, 3,4,5-trimethylphenyl group, 9,9-dimethylfluorenyl group, 9,9-diphenylfluorenyl group, 9,9-bis(4-methylphenyl)fluorenyl group, 9,9-bis(4-isopropylphenyl)fluorenyl group, 9,9-bis(4-t-butylphenyl)fluorenyl group, cyanophenyl group, triphenylsilylphenyl group, trimethylsilylphenyl group, phenylnaphthyl group, naphthylphenyl group, and group derived by substituting at least one hydrogen atom of a monovalent group derived from one of the cyclic structures represented by the formulae (TEMP-1) to (TEMP-15) with a substituent.

Substituted or Unsubstituted Heterocyclic Group

The "heterocyclic group" mentioned herein refers to a cyclic group having at least one hetero atom in the ring atoms.

Specific examples of the hetero atom include a nitrogen atom, oxygen atom, sulfur atom, silicon atom, phosphorus atom, and boron atom.

The "heterocyclic group" mentioned herein is a monocyclic group or a fused-ring group.

The "heterocyclic group" mentioned herein is an aromatic heterocyclic group or a non-aromatic heterocyclic group.

Specific examples (specific example group G2) of the "substituted or unsubstituted heterocyclic group" mentioned herein include unsubstituted heterocyclic groups (specific example group G2A) and substituted heterocyclic groups (specific example group G2B). (Herein, an unsubstituted heterocyclic group refers to an "unsubstituted heterocyclic group" in a "substituted or unsubstituted heterocyclic group," and a substituted heterocyclic group refers to a "substituted heterocyclic group" in a "substituted or unsubstituted heterocyclic group.") A simply termed "heterocyclic group" herein includes both of an "unsubstituted heterocyclic group" and a "substituted heterocyclic group."

The "substituted heterocyclic group" refers to a group derived by substituting at least one hydrogen atom in an "unsubstituted heterocyclic group" with a substituent. Specific examples of the "substituted heterocyclic group" include a group derived by substituting at least one hydrogen atom in the "unsubstituted heterocyclic group" in the specific example group G2A below with a substituent, and examples of the substituted heterocyclic group in the specific example group G2B below. It should be noted that the examples of the "unsubstituted heterocyclic group" and the "substituted heterocyclic group" mentioned herein are merely exemplary, and the "substituted heterocyclic group" mentioned herein includes a group derived by further substituting a hydrogen atom bonded to a ring atom of a skeleton of a "substituted heterocyclic group" in the specific example group G2B below, and a group derived by further substituting a hydrogen atom of a substituent of the "substituted heterocyclic group" in the specific example group G2B below.

The specific example group G2A includes, for instance, unsubstituted heterocyclic groups including a nitrogen atom (specific example group G2A1) below, unsubstituted heterocyclic groups including an oxygen atom (specific example group G2A2) below, unsubstituted heterocyclic groups including a sulfur atom (specific example group G2A3) below, and monovalent heterocyclic groups (specific example group G2A4) derived by removing a hydrogen atom from cyclic structures represented by formulae (TEMP-16) to (TEMP-33) below.

The specific example group G2B includes, for instance, substituted heterocyclic groups including a nitrogen atom (specific example group G2B1) below, substituted heterocyclic groups including an oxygen atom (specific example group G2B2) below, substituted heterocyclic groups including a sulfur atom (specific example group G2B3) below, and groups derived by substituting at least one hydrogen atom of the monovalent heterocyclic groups (specific example group G2B4) derived from the cyclic structures represented by formulae (TEMP-16) to (TEMP-33) below.

Unsubstituted Heterocyclic Groups Including Nitrogen Atom (Specific Example Group G2A1):
　a pyrrolyl group,
　imidazolyl group,
　pyrazolyl group,
　triazolyl group,
　tetrazolyl group,
　oxazolyl group,
　isoxazolyl group,
　oxadiazolyl group,
　thiazolyl group,
　isothiazolyl group,
　thiadiazolyl group,
　pyridyl group,
　pyridazynyl group,
　pyrimidinyl group,
　pyrazinyl group,
　triazinyl group,
　indolyl group,
　isoindolyl group,
　indolizinyl group,
　quinolizinyl group,
　quinolyl group,
　isoquinolyl group,
　cinnolyl group,
　phthalazinyl group,
　quinazolinyl group,
　quinoxalinyl group,
　benzimidazolyl group,
　indazolyl group,
　phenanthrolinyl group,
　phenanthridinyl group,
　acridinyl group,
　phenazinyl group,
　carbazolyl group,
　benzocarbazolyl group,
　morpholino group,
　phenoxazinyl group,
　phenothiazinyl group,
　azacarbazolyl group, and diazacarbazolyl group.
Unsubstituted Heterocyclic Groups Including Oxygen Atom (Specific Example Group G2A2):
　a furyl group,
　oxazolyl group,
　isoxazolyl group,
　oxadiazolyl group,
　xanthenyl group,
　benzofuranyl group,
　isobenzofuranyl group,
　dibenzofuranyl group,
　naphthobenzofuranyl group,
　benzoxazolyl group,
　benzisoxazolyl group,
　phenoxazinyl group,
　morpholino group,
　dinaphthofuranyl group,
　azadibenzofuranyl group,
　diazadibenzofuranyl group,
　azanaphthobenzofuranyl group, and
　diazanaphthobenzofuranyl group.
Unsubstituted Heterocyclic Groups Including Sulfur Atom (Specific Example Group G2A3):
　a thienyl group,
　thiazolyl group,
　isothiazolyl group,
　thiadiazolyl group,
　benzothiophenyl group (benzothienyl group),
　isobenzothiophenyl group (isobenzothienyl group),
　dibenzothiophenyl group (dibenzothienyl group),
　naphthobenzothiophenyl group (nahthobenzothienyl group),
　benzothiazolyl group,
　benzisothiazolyl group,
　phenothiazinyl group,
　dinaphthothiophenyl group (dinaphthothienyl group),
　azadibenzothiophenyl group (azadibenzothienyl group),
　diazadibenzothiophenyl group (diazadibenzothienyl group),
　azanaphthobenzothiophenyl group (azanaphthobenzothienyl group), and
　diazanaphthobenzothiophenyl group (diazanaphthobenzothienyl group).

Monovalent Heterocyclic Groups Derived by Removing One Hydrogen Atom from Cyclic Structures Represented by Formulae (TEMP-16) to (TEMP-33) (Specific Example Group G2A4):

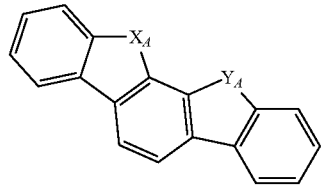

(TEMP-16)

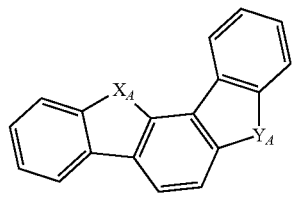

(TEMP-17)

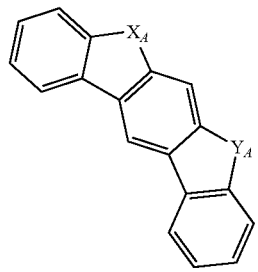

(TEMP-18)

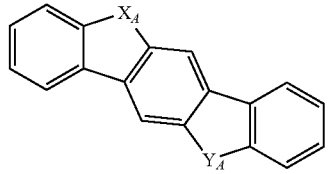

(TEMP-19)

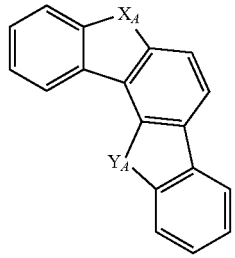

(TEMP-20)

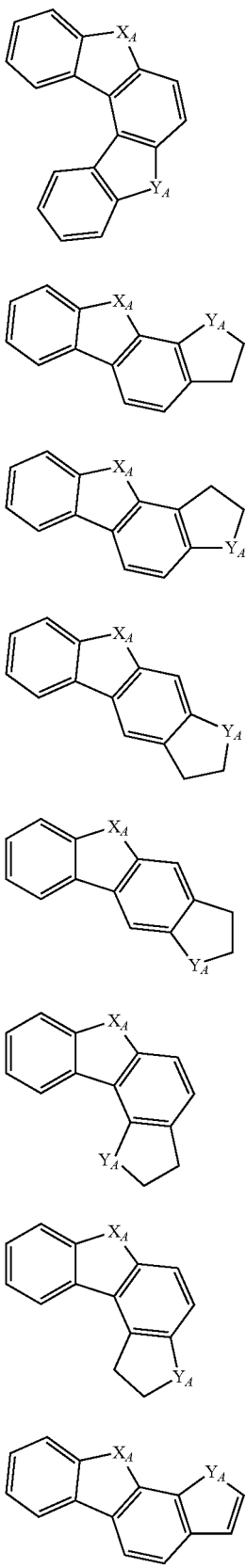

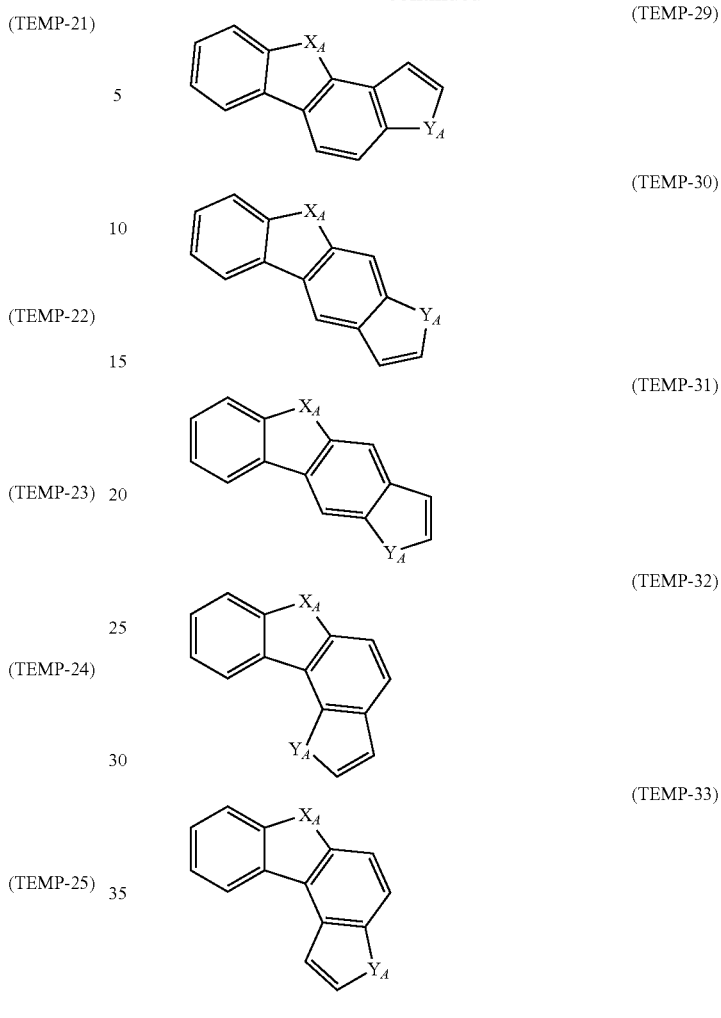

In the formulae (TEMP-16) to (TEMP-33), $X_A$ and $Y_A$ are each independently an oxygen atom, a sulfur atom, NH or $CH_2$, with a proviso that at least one of $X_A$ or $Y_A$ is an oxygen atom, a sulfur atom, or NH.

When at least one of $X_A$ or $Y_A$ in the formulae (TEMP-16) to (TEMP-33) is NH or $CH_2$, the monovalent heterocyclic groups derived from the cyclic structures represented by the formulae (TEMP-16) to (TEMP-33) include a monovalent group derived by removing one hydrogen atom from NH or $CH_2$.

Substituted Heterocyclic Groups Including Nitrogen Atom (Specific Example Group G2B31):
  (9-phenyl)carbazolyl group,
  (9-biphenylyl)carbazolyl group,
  (9-phenyl)phenylcarbazolyl group,
  (9-naphthyl)carbazolyl group,
  diphenylcarbazole-9-yl group,
  phenylcarbazole-9-yl group,
  methylbenzimidazolyl group,
  ethylbenzirnidazolyl group,
  phenyltriazinyl group,
  biphenylyltriazinyl group,
  diphenyltriazinyl group,
  phenylquinazolinyl group, and biphenylquinazolinyl group.

Substituted Heterocyclic Groups Including Oxygen Atom (Specific Example Group G2B2):

phenyldibenzofuranyl group,
methyldibenzofuranyl group,
t-butyldibenzofuranyl group, and
monovalent residue of spiro[9H-xanthene-9,9'-[9H]fluorene].

Substituted Heterocyclic Groups Including Sulfur Atom (Specific Example Group G2B3):
a phenyldibenzothiophenyl group,
methyldibenzothiophenyl group,
t-butyldibenzothiophenyl group, and
monovalent residue of spiro[9H-thioxanthene-9,9'-[9H]fluorene].

Groups Obtained by Substituting at Least One Hydrogen Atom of Monovalent Heterocyclic Group Derived from Cyclic Structures Represented by Formulae (TEMP-16) to (TEMP-33) with Substituent (Specific Example Group G2B4):

The "at least one hydrogen atom of a monovalent heterocyclic group" means at least one hydrogen atom selected from a hydrogen atom bonded to a ring carbon atom of the monovalent heterocyclic group, a hydrogen atom bonded to a nitrogen atom when at least one of $X_A$ or $Y_A$ is NH, and a hydrogen atom of a methylene group when at least one of $X_A$ or $Y_A$ is $CH_2$.

Substituted or Unsubstituted Alkyl Group

Specific examples (specific example group G3) of the "substituted or unsubstituted alkyl group" mentioned herein include unsubstituted alkyl groups (specific example group G3A) and substituted alkyl groups (specific example group G3B) below. (Herein, an unsubstituted alkyl group refers to an "unsubstituted alkyl group" in a "substituted or unsubstituted alkyl group," and a substituted alkyl group refers to a "substituted alkyl group" in a "substituted or unsubstituted alkyl group.") A simply termed "alkyl group" herein includes both of an "unsubstituted alkyl group" and a "substituted alkyl group".

The "substituted alkyl group" refers to a group derived by substituting at least one hydrogen atom in an "unsubstituted alkyl group" with a substituent. Specific examples of the "substituted alkyl group" include a group derived by substituting at least one hydrogen atom of an "unsubstituted alkyl group" (specific example group G3A) below with a substituent, and examples of the substituted alkyl group (specific example group G3B) below. Herein, the alkyl group for the "unsubstituted alkyl group" refers to a chain alkyl group. Accordingly, the "unsubstituted alkyl group" include linear "unsubstituted alkyl group" and branched "unsubstituted alkyl group." It should be noted that the examples of the "unsubstituted alkyl group" and the "substituted alkyl group" mentioned herein are merely exemplary, and the "substituted alkyl group" mentioned herein includes a group derived by further substituting a hydrogen atom of a skeleton of the "substituted alkyl group" in the specific example group 03B, and a group derived by further substituting a hydrogen atom of a substituent of the "substituted alkyl group" in the specific example group G38.

Unsubstituted Alkyl Group (Specific Example Group G3A):
a methyl group,
ethyl group,
n-propyl group,
isopropyl group,
n-butyl group,
isobutyl group,
s-butyl group, and
t-butyl group.

Substituted Alkyl Group (Specific Example Group G38):
a heptafluoropropyl group (including isomer thereof),
pentafluoroethyl group,
2,2,2-trifluoroethyl group, and
trifluoromethyl group.

Substituted or Unsubstituted Alkenyl Group

Specific examples (specific example group G4) of the "substituted or unsubstituted alkenyl group" mentioned herein include unsubstituted alkenyl groups (specific example group G4A) and substituted alkenyl groups (specific example group G4B). (Herein, an unsubstituted alkenyl group refers to an "unsubstituted alkenyl group" in a "substituted or unsubstituted alkenyl group," and a substituted alkenyl group refers to a "substituted alkenyl group" in a "substituted or unsubstituted alkenyl group.") A simply termed "alkenyl group" herein includes both of an "unsubstituted alkenyl group" and a "substituted alkenyl group".

The "substituted alkenyl group" refers to a group derived by substituting at least one hydrogen atom in an "unsubstituted alkenyl group" with a substituent. Specific examples of the "substituted alkenyl group" include an "unsubstituted alkenyl group" (specific example group G4A) substituted by a substituent, and examples of the substituted alkenyl group (specific example group G4B) below. It should be noted that the examples of the "unsubstituted alkenyl group" and the "substituted alkenyl group" mentioned herein are merely exemplary, and the "substituted alkenyl group" mentioned herein includes a group derived by further substituting a hydrogen atom of a skeleton of the "substituted alkenyl group" in the specific example group G4B with a substituent, and a group derived by further substituting a hydrogen atom of a substituent of the "substituted alkenyl group" in the specific example group G4B with a substituent.

Unsubstituted Alkenyl Group (Specific Example Group G4A):
a vinyl group,
allyl group,
1-butenyl group,
2-butenyl group, and
3-butenyl group.

Substituted Alkenyl Group (Specific Example Group G4B):
a 1,3-butanedienyl group,
1-methylvinyl group,
1-methylallyl group,
1,1-dimethylallyl group,
2-methylallyl group, and
1,2-dimethylallyl group.

Substituted or Unsubstituted Alkynyl Group

Specific examples (specific example group G5) of the "substituted or unsubstituted alkynyl group" mentioned herein include unsubstituted alkynyl groups (specific example group G5A) below. (Herein, an unsubstituted alkynyl group refers to an "unsubstituted alkynyl group" in a "substituted or unsubstituted alkynyl group.") A simply termed "alkynyl group" herein includes both of "unsubstituted alkynyl group" and "substituted alkynyl group".

The "substituted alkynyl group" refers to a group derived by substituting at least one hydrogen atom in an "unsubstituted alkynyl group" with a substituent. Specific examples of the "substituted alkynyl group" include a group derived by substituting at least one hydrogen atom of the "unsubstituted alkynyl group" (specific example group G5A) below with a substituent.

Unsubstituted Alkynyl Group (Specific Example Group G5A):
an ethynyl group.

Substituted or Unsubstituted Cycloalkyl Group

Specific examples (specific example group G6) of the "substituted or unsubstituted cycloalkyl group" mentioned herein include unsubstituted cycloalkyl groups (specific example group G6A) and substituted cycloalkyl groups (specific example group G6B). (Herein, an unsubstituted cycloalkyl group refers to an "unsubstituted cycloalkyl group" in a "substituted or unsubstituted cycloalkyl group," and a substituted cycloalkyl group refers to a "substituted cycloalkyl group" in a "substituted or unsubstituted cycloalkyl group.") A simply termed "cycloalkyl group" herein includes both of "unsubstituted cycloalkyl group" and "substituted cycloalkyl group".

The "substituted cycloalkyl group" refers to a group derived by substituting at least one hydrogen atom of an "unsubstituted cycloalkyl group" with a substituent. Specific examples of the "substituted cycloalkyl group" include a group derived by substituting at least one hydrogen atom of the "unsubstituted cycloalkyl group" (specific example group G6A) below with a substituent, and examples of the substituted cycloalkyl group (specific example group G6B) below. It should be noted that the examples of the "unsubstituted cycloalkyl group" and the "substituted cycloalkyl group" mentioned herein are merely exemplary, and the "substituted cycloalkyl group" mentioned herein includes a group derived by substituting at least one hydrogen atom bonded to a carbon atom of a skeleton of the "substituted cycloalkyl group" in the specific example group G6B with a substituent, and a group derived by further substituting a hydrogen atom of a substituent of the "substituted cycloalkyl group" in the specific example group G6B with a substituent.

Unsubstituted Cycloalkyl Group (Specific Example Group G6A):
  a cyclopropyl group,
  cyclobutyl group,
  cyclopentyl group,
  cyclohexyl group,
  1-adamantyl group,
  2-adamantyl group,
  1-norbornyl group, and
  2-norbornyl group.

Substituted Cycloalkyl Group (Specific Example Group G6B):
  a 4-methylcyclohexyl group.

Group Represented by —Si($R_{901}$)($R_{902}$)($R_{903}$)
  Specific examples (specific example group G7) of the group represented herein by —Si($R_{901}$)($R_{902}$)($R_{903}$) include:
    —Si(G1)(G1)(G1);
    —Si(G1)(G2)(G2);
    —Si(G1)(G1)(G2);
    —Si(G2)(G2)(G2);
    —Si(G3)(G3)(G3); and
    —Si(G6)(G6)(G6);
  where:
    G1 represents a "substituted or unsubstituted aryl group" in the specific example group G1;
    G2 represents a "substituted or unsubstituted heterocyclic group" in the specific example group G2;
    G3 represents a "substituted or unsubstituted alkyl group" in the specific example group G3;
    G6 represents a "substituted or unsubstituted cycloalkyl group" in the specific example group G6;
    a plurality of G1 in —Si(G1)(G1)(G1) are mutually the same or different;
    a plurality of G2 in —Si(G1)(G2)(G2) are mutually the same or different;
    a plurality of G1 in —Si(G1)(G1)(G2) are mutually the same or different;
    a plurality of G2 in —Si(G2)(G2)(G2) are mutually the same or different;
    A plurality of G3 in —Si(G3)(G3)(G3) are mutually the same or different; and
    a plurality of G6 in —Si(G6)(G6)(G6) are mutually the same or different.

Group Represented by —O—($R_{904}$)
  Specific examples (specific example group G8) of a group represented by —O—($R_{904}$) herein include: —O(G1); —O(G2); —O(G3); and —O(G6);
  where:
    G1 represents a "substituted or unsubstituted aryl group" in the specific example group G1;
    G2 represents a "substituted or unsubstituted heterocyclic group" in the specific example group G2;
    G3 represents a "substituted or unsubstituted alkyl group" in the specific example group G3; and
    G6 represents a "substituted or unsubstituted cycloalkyl group" in the specific example group G6.

Group Represented by —S—($R_{905}$)
  Specific examples (specific example group G9) of a group represented herein by —S—($R_{905}$) include: —S(G1); —S(G2); —S(G3); and —S(G6);
  where:
    G1 represents a "substituted or unsubstituted aryl group" in the specific example group G1;
    G2 represents a "substituted or unsubstituted heterocyclic group" in the specific example group G2;
    G3 represents a "substituted or unsubstituted alkyl group" in the specific example group G3; and
    G6 represents a "substituted or unsubstituted cycloalkyl group" in the specific example group G6.

Group Represented by —N($R_{906}$)($R_{907}$)
  Specific examples (specific example group G10) of a group represented herein by —N($R_{906}$)($R_{907}$) include: —N(G1)(G1); —N(G2)(G2); —N(G1)(G2); —N(G3)(G3); and —N(G6)(G6),
  where:
    G1 represents a "substituted or unsubstituted aryl group" in the specific example group G1;
    G2 represents a "substituted or unsubstituted heterocyclic group" in the specific example group G2;
    G3 represents a "substituted or unsubstituted alkyl group" in the specific example group G3;
    G6 represents a "substituted or unsubstituted cycloalkyl group" in the specific example group G6;
    a plurality of G1 in —N(G1)(G1) are mutually the same or different;
    a plurality of G2 in —N(G2)(G2) are mutually the same or different;
    a plurality of G3 in —N(G3)(G3) are mutually the same or different; and
    a plurality of G6 in —N(G6)(G6) are mutually the same or different.

Halogen Atom
  Specific examples (specific example group G11) of "halogen atom" mentioned herein include a fluorine atom, chlorine atom, bromine atom, and iodine atom.

Substituted or Unsubstituted Fluoroalkyl Group
  The "substituted or unsubstituted fluoroalkyl group" mentioned herein refers to a group derived by substituting at least one hydrogen atom bonded to at least one of carbon atoms forming an alkyl group in the "substituted or unsubstituted alkyl group" with a fluorine atom, and also includes a group (perfluoro group) derived by substituting all of hydrogen atoms bonded to carbon atoms forming the alkyl group in the "substituted or unsubstituted alkyl group" with fluorine atoms. An "unsubstituted fluoroalkyl group" has, unless otherwise specified herein, 1 to 50, preferably 1 to 30, more preferably 1 to 18 carbon atoms. The "substituted fluoroalkyl group" refers to a group derived by substituting at least one hydrogen atom in a "fluoroalkyl group" with a substituent. It should be noted that the examples of the "substituted fluoroalkyl group" mentioned herein include a group derived by further substituting at least one hydrogen atom bonded to a carbon atom of an alkyl chain of a "substituted fluoroalkyl group" with a substituent, and a group derived by further substituting at least one hydrogen atom of a substituent of the "substituted fluoroalkyl group" with a substituent. Specific examples of the "unsubstituted fluoroalkyl group" include a group derived by substituting at least one hydrogen atom of the "alkyl group" (specific example group G3) with a fluorine atom.

Substituted or Unsubstituted Haloalkyl Group

The "substituted or unsubstituted haloalkyl group" mentioned herein refers to a group derived by substituting at least one hydrogen atom bonded to carbon atoms forming the alkyl group in the "substituted or unsubstituted alkyl group" with a halogen atom, and also includes a group derived by substituting all hydrogen atoms bonded to carbon atoms forming the alkyl group in the "substituted or unsubstituted alkyl group" with halogen atoms. An "unsubstituted haloalkyl group" has, unless otherwise specified herein, 1 to 50, preferably 1 to 30, and more preferably 1 to 18 carbon atoms. The "substituted haloalkyl group" refers to a group derived by substituting at least one hydrogen atom in a "haloalkyl group" with a substituent. It should be noted that the examples of the "substituted haloalkyl group" mentioned herein include a group derived by further substituting at least one hydrogen atom bonded to a carbon atom of an alkyl chain of a "substituted haloalkyl group" with a substituent, and a group derived by further substituting at least one hydrogen atom of a substituent of the "substituted haloalkyl group" with a substituent. Specific examples of the "unsubstituted haloalkyl group" include a group derived by substituting at least one hydrogen atom of the "alkyl group" (specific example group G3) with a halogen atom. The haloalkyl group is sometimes referred to as a halogenated alkyl group.

Substituted or Unsubstituted Alkoxy Group

Specific examples of a "substituted or unsubstituted alkoxy group" mentioned herein include a group represented by —O(G3), G3 being the "substituted or unsubstituted alkyl group" in the specific example group G3. An "unsubstituted alkoxy group" has, unless otherwise specified herein, 1 to 50, preferably 1 to 30, more preferably 1 to 18 carbon atoms, Substituted or Unsubstituted Alkylthio Group Specific examples of a "substituted or unsubstituted alkylthio group" mentioned herein include a group represented by —S(G3), G3 being the "substituted or unsubstituted alkyl group" in the specific example group G3. An "unsubstituted alkylthio group" has, unless otherwise specified herein, 1 to 50, preferably 1 to 30, more preferably 1 to 18 carbon atoms.

Substituted or Unsubstituted Aryloxy Group

Specific examples of a "substituted or unsubstituted aryloxy group" mentioned herein include a group represented by —O(G1), G1 being the "substituted or unsubstituted aryl group" in the specific example group G1. An "unsubstituted aryloxy group" has, unless otherwise specified herein, 6 to 50, preferably 6 to 30, more preferably 6 to 18 ring carbon atoms.

Substituted or Unsubstituted Arylthio Group

Specific examples of a "substituted or unsubstituted arylthio group" mentioned herein include a group represented by —S(G1), G1 being the "substituted or unsubstituted aryl group" in the specific example group G1. An "unsubstituted arylthio group" has, unless otherwise specified herein, 6 to 50, preferably 6 to 30, more preferably 6 to 18 ring carbon atoms.

Substituted or Unsubstituted Trialkylsilyl Group

Specific examples of a "trialkylsilyl group" mentioned herein include a group represented by —Si(G3)(G3)(G3), G3 being the "substituted or unsubstituted alkyl group" in the specific example group G3. The plurality of G3 in —Si(G3)(G3)(G3) are mutually the same or different, Each of the alkyl groups in the "trialkylsilyl group" has, unless otherwise specified herein, 1 to 50, preferably 1 to 20, more preferably 1 to 6 carbon atoms, Substituted or Unsubstituted Aralkyl Group Specific examples of a "substituted or unsubstituted aralkyl group" mentioned herein include a group represented by -(G3)-(G1), G3 being the "substituted or unsubstituted alkyl group" in the specific example group G3, G1 being the "substituted or unsubstituted aryl group" in the specific example group G1. Accordingly, the "aralkyl group" is a group derived by substituting a hydrogen atom of the "alkyl group" with a substituent in a form of the "aryl group," which is an example of the "substituted alkyl group." An "unsubstituted aralkyl group," which is an "unsubstituted alkyl group" substituted by an "unsubstituted aryl group," has, unless otherwise specified herein, 7 to 50 carbon atoms, preferably 7 to 30 carbon atoms, more preferably 7 to 18 carbon atoms.

Specific examples of the "substituted or unsubstituted aralkyl group" include a benzyl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, and 2-β-naphthylisopropyl group.

Preferable examples of the substituted or unsubstituted aryl group mentioned herein include, unless otherwise specified herein, a phenyl group, p-biphenyl group, m-biphenyl group, o-biphenyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-terphenyl-4-yl group, o-terphenyl-3-yl group, o-taerphenyl-2-yl group, 1 naphthyl group, 2-naphthyl group, anthryl group, phenanthryl group, pyrenyl group, chrysenyl group, triphenylenyl group, fluorenyl group, 9,9'-spirobifluorenyl group, 9,9-dimethylfluorenyl group, and 9,9-diphenylfluorenyl group.

Preferable examples of the substituted or unsubstituted heterocyclic group mentioned herein include, unless otherwise specified herein, a pyridyl group, pyrimidinyl group, triazinyl group, quinolyl group, isoquinolyl group, quinazolinyl group, benzimidazolyl group, phenanthrolinyl group, carbazolyl group (1-carbazolyl group, 2-carbazolyl group, 3-carbazolyl group, 4-carbazolyl group, or 9-carbazolyl group), benzocarbazolyl group, azacarbazolyl group, diazacarbazolyl group, dibenzofuranyl group, naphthobenzofuranyl group, azadibenzofuranyl group, diazadibenzofuranyl group, dibenzothiophenyl group, naphthobenzothiophenyl group, azadibenzothiophenyl group, diazadibenzothiophenyl group, (9-phenyl)carbazolyl group, (9-phenyl)carbazole-1-yl group, (9-phenyl)carbazole-2-yl group, (9-phenyl)carbazole-3-yl group, or (9-phenyl)carbazole-4-yl group), (9-biphenylyl)carbazolyl group, (9-phenyl)phenylcarbazolyl group, diphenylcarbazole-9-yl group, phenylcarbazole-9-yl group, phenyltriazinyl group, biphenylyltriazinyl group, diphenyltriazinyl group, phenyldibenzofuranyl group, and phenyldibenzothiophenyl group.

The carbazolyl group mentioned herein is, unless otherwise specified herein, specifically a group represented by one of formulae below.

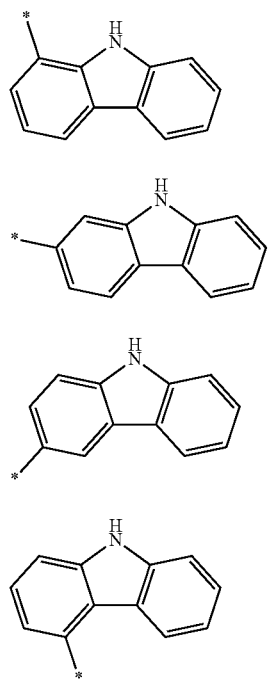

(TEMP-Cz1)

(TEMP-Cz2)

(TEMP-Cz3)

(TEMP-Cz4)

(TEMP-Cz5)

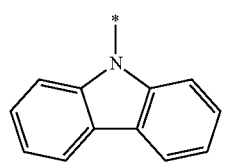

The (9-phenyl)carbazolyl group mentioned herein is, unless otherwise specified herein, specifically a group represented by one of formulae below.

(TEMP-Cz6)

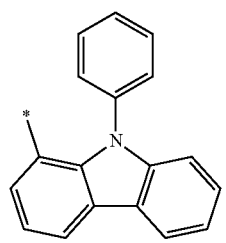

-continued (TEMP-Cz7)

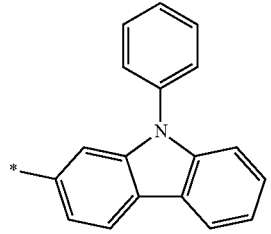

(TEMP-Cz8)

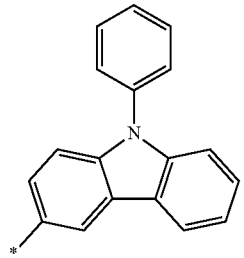

(TEMP-Cz9)

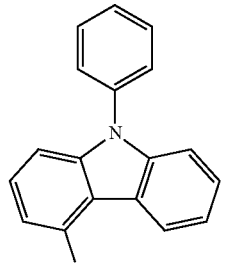

In the formulae (TEMP-Cz1) to (TEMP-Cz9), each * represents a bonding position.

The dibenzofuranyl group and dibenzothiophenyl group mentioned herein are, unless otherwise specified herein, each specifically represented by one of formulae below.

(TEMP-34)

(TEMP-35)

(TEMP-36)

(TEMP-37)

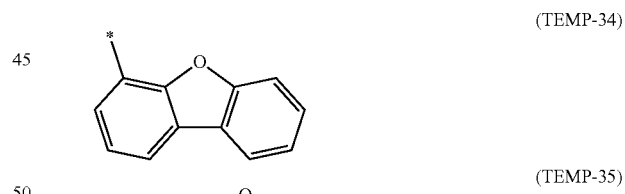
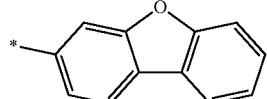
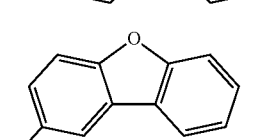
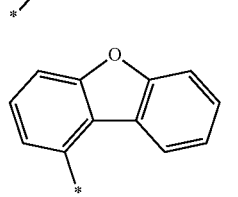

-continued

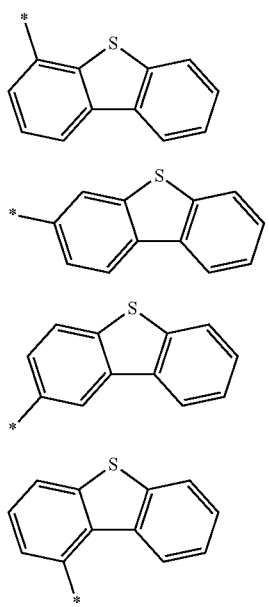

(TEMP-38)

(TEMP-39)

(TEMP-40)

(TEMP-41)

In the formulae (TEMP-34) to (TEMP-41), each * represents a bonding position.

Preferable examples of the substituted or unsubstituted alkyl group mentioned herein include, unless otherwise specified herein, a methyl group, ethyl group, propyl group, isopropyl group, n-butyl group, isobutyl group, and t-butyl group.

Substituted or Unsubstituted Arylene Group

The "substituted or unsubstituted arylene group" mentioned herein is, unless otherwise specified herein, a divalent group derived by removing one hydrogen atom on an aryl ring of the "substituted or unsubstituted aryl group." Specific examples of the "substituted or unsubstituted arylene group" (specific example group G12) include a divalent group derived by removing one hydrogen atom on an aryl ring of the "substituted or unsubstituted aryl group" in the specific example group G1.

Substituted or Unsubstituted Divalent Heterocyclic Group

The "substituted or unsubstituted divalent heterocyclic group" mentioned herein is, unless otherwise specified herein, a divalent group derived by removing one hydrogen atom on a heterocycle of the "substituted or unsubstituted heterocyclic group." Specific examples of the "substituted or unsubstituted divalent heterocyclic group" (specific example group G13) include a divalent group derived by removing one hydrogen atom on a heterocyclic ring of the "substituted or unsubstituted heterocyclic group" in the specific example group G2.

Substituted or Unsubstituted Alkylene Group

The "substituted or unsubstituted alkylene group" mentioned herein is, unless otherwise specified herein, a divalent group derived by removing one hydrogen atom on an alkyl chain of the "substituted or unsubstituted alkyl group." Specific examples of the "substituted or unsubstituted alkylene group" (specific example group G14) include a divalent group derived by removing one hydrogen atom on an alkyl chain of the "substituted or unsubstituted alkyl group" in the specific example group G3.

The substituted or unsubstituted arylene group mentioned herein is, unless otherwise specified herein, preferably any one of groups represented by formulae (TEMP-42) to (TEMP-68) below.

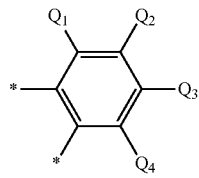

(TEMP-42)

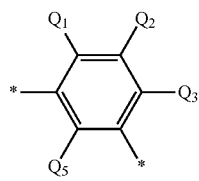

(TEMP-43)

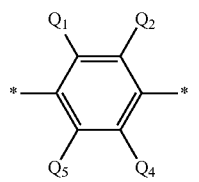

(TEMP-44)

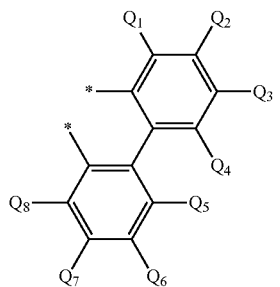

(TEMP-45)

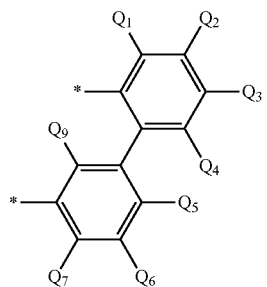

(TEMP-46)

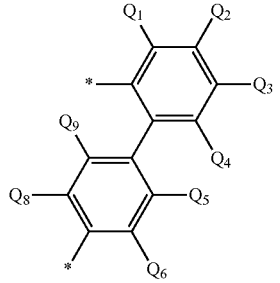

(TEMP-47)

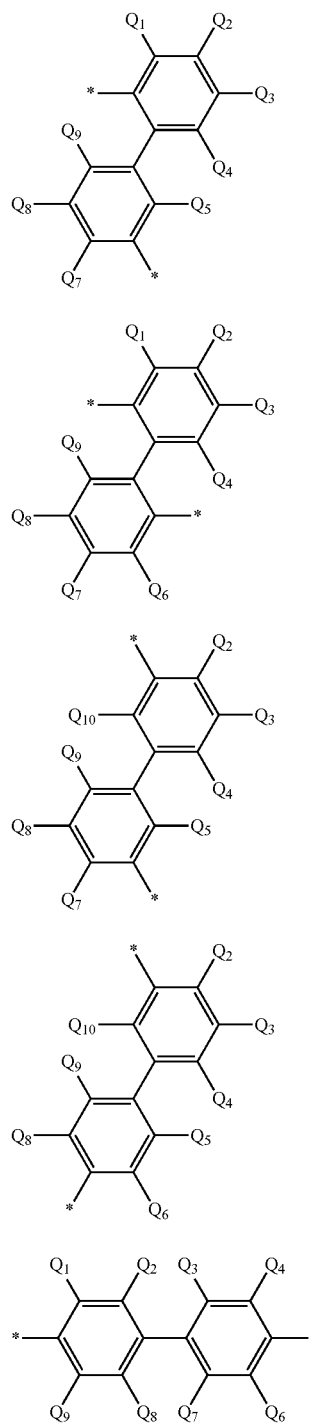
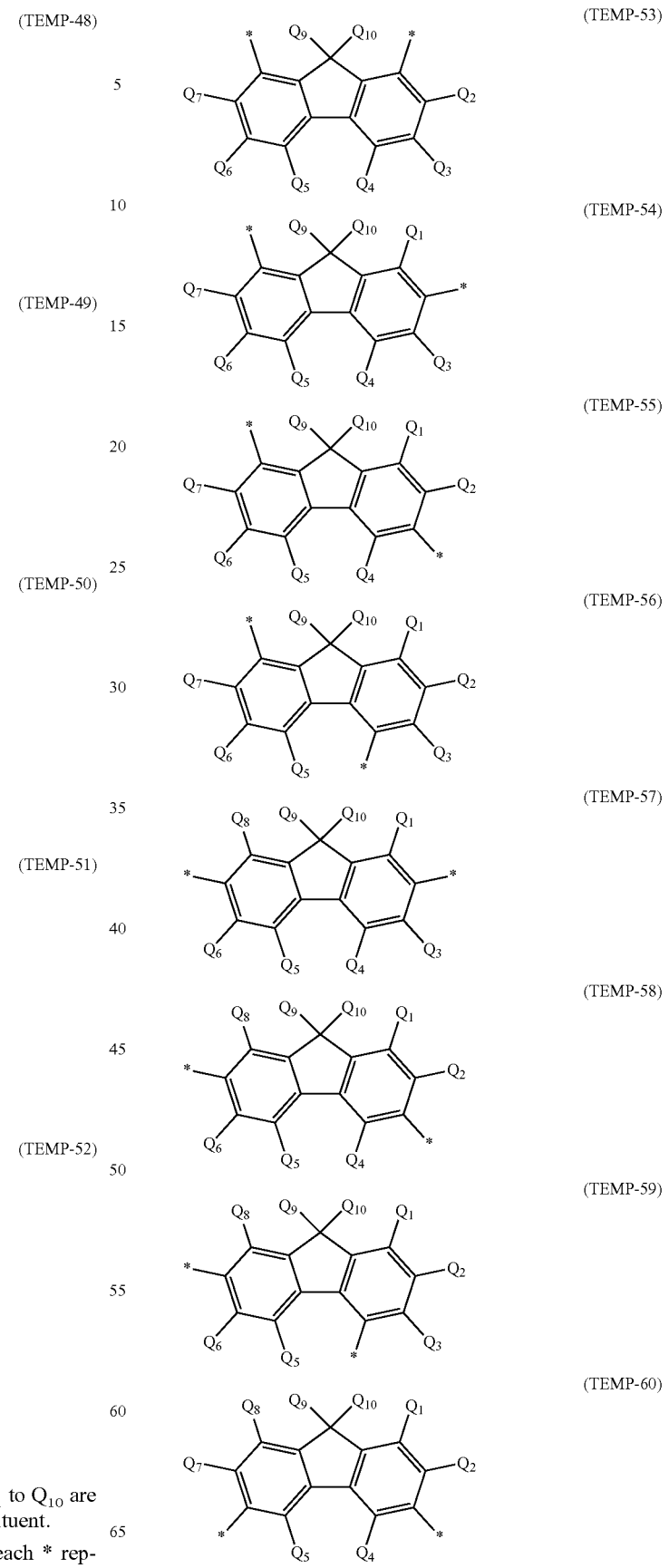
In the formulae (TEMP-42) to (TEMP-52), $Q_1$ to $Q_{10}$ are each independently a hydrogen atom or a substituent.
In the formulae (TEMP-42) to (TEMP-52), each * represents a bonding position.

(TEMP-61)

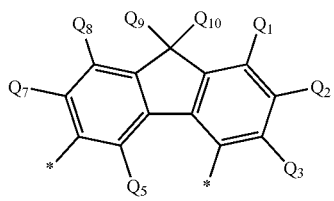

(TEMP-62)

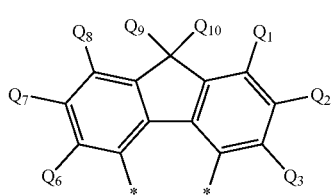

In the formulae (TEMP-53) to (TEMP-62), $Q_1$ to $Q_{10}$ are each independently a hydrogen atom or a substituent.

In the formulae, $Q_9$ and $Q_{10}$ may be mutually bonded through a single bond to form a ring.

In the formulae (TEMP-53) to (TEMP-62), each * represents a bonding position.

(TEMP-63)

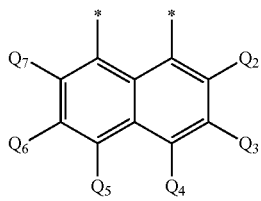

(TEMP-64)

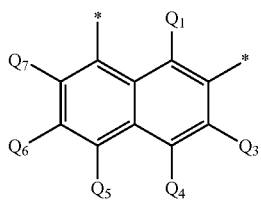

(TEMP-65)

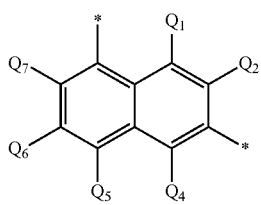

(TEMP-66)

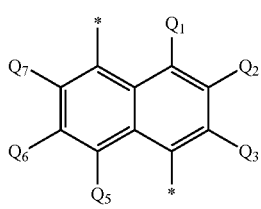

(TEMP-67)

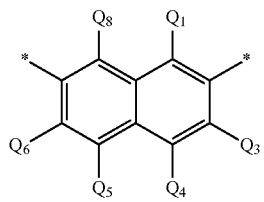

(TEMP-68)

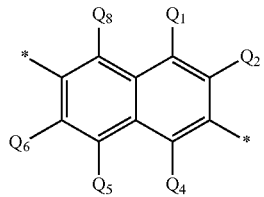

In the formulae (TEMP-63) to (TEMP-68), $Q_1$ to $Q_8$ are each independently a hydrogen atom or a substituent.

In the formulae (TEMP-63) to (TEMP-68), each * represents a bonding position.

The substituted or unsubstituted divalent heterocyclic group mentioned herein is, unless otherwise specified herein, preferably a group represented by any one of formulae (TEMP-69) to (TEMP-102) below.

(TEMP-69)

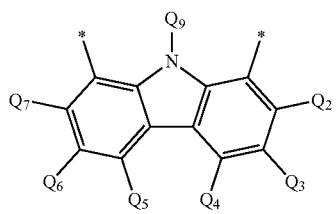

(TEMP-70)

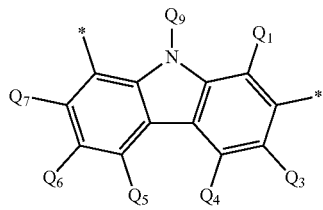

(TEMP-71)

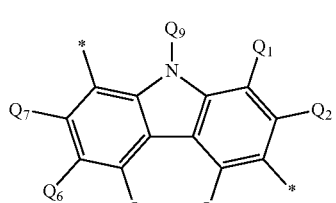

(TEMP-72)

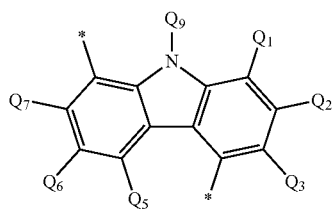

(TEMP-73)
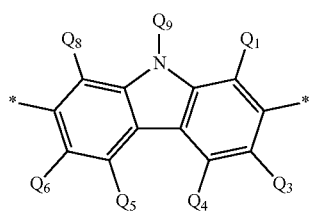
(TEMP-74)
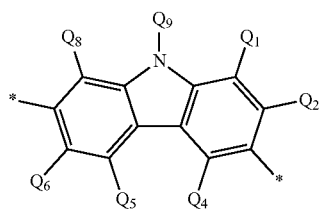
(TEMP-75)
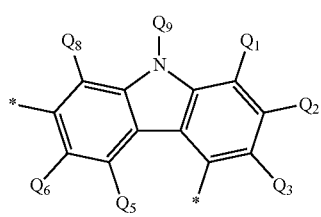
(TEMP-76)
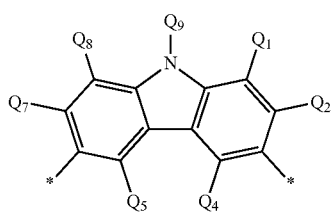
(TEMP-77)
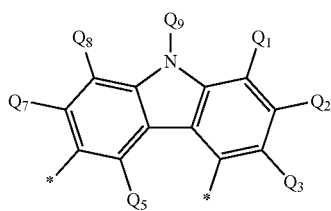
(TEMP-78)
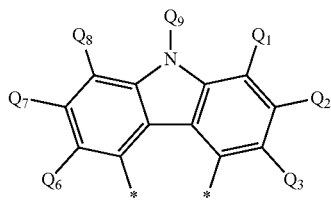
(TEMP-79)
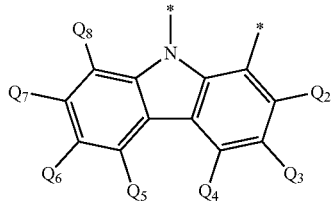
(TEMP-80)
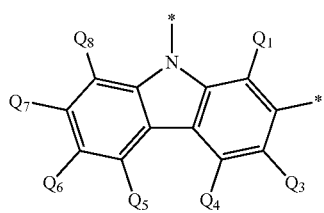
(TEMP-81)
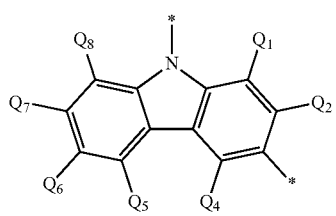
(TEMP-82)
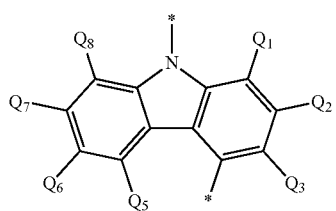
In the formulae (TEMP-69) to (TEMP-82), $Q_1$ to $Q_9$ are each independently a hydrogen atom or a substituent.
(TEMP-83)
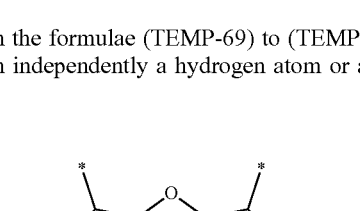
(TEMP-84)
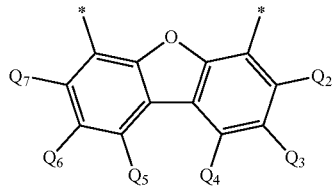
(TEMP-85)
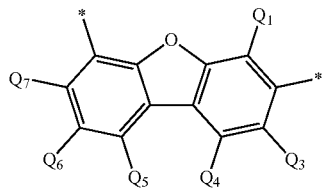
(TEMP-86)
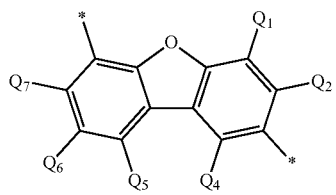
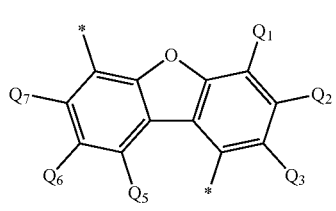

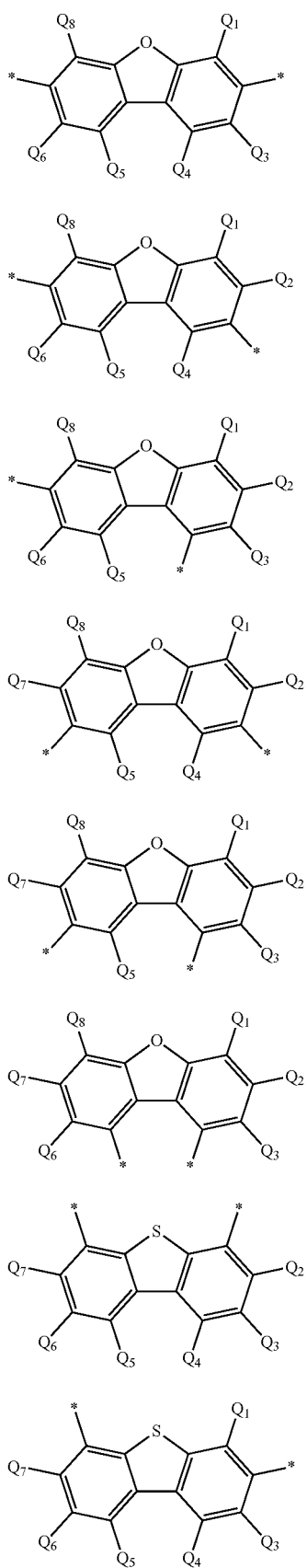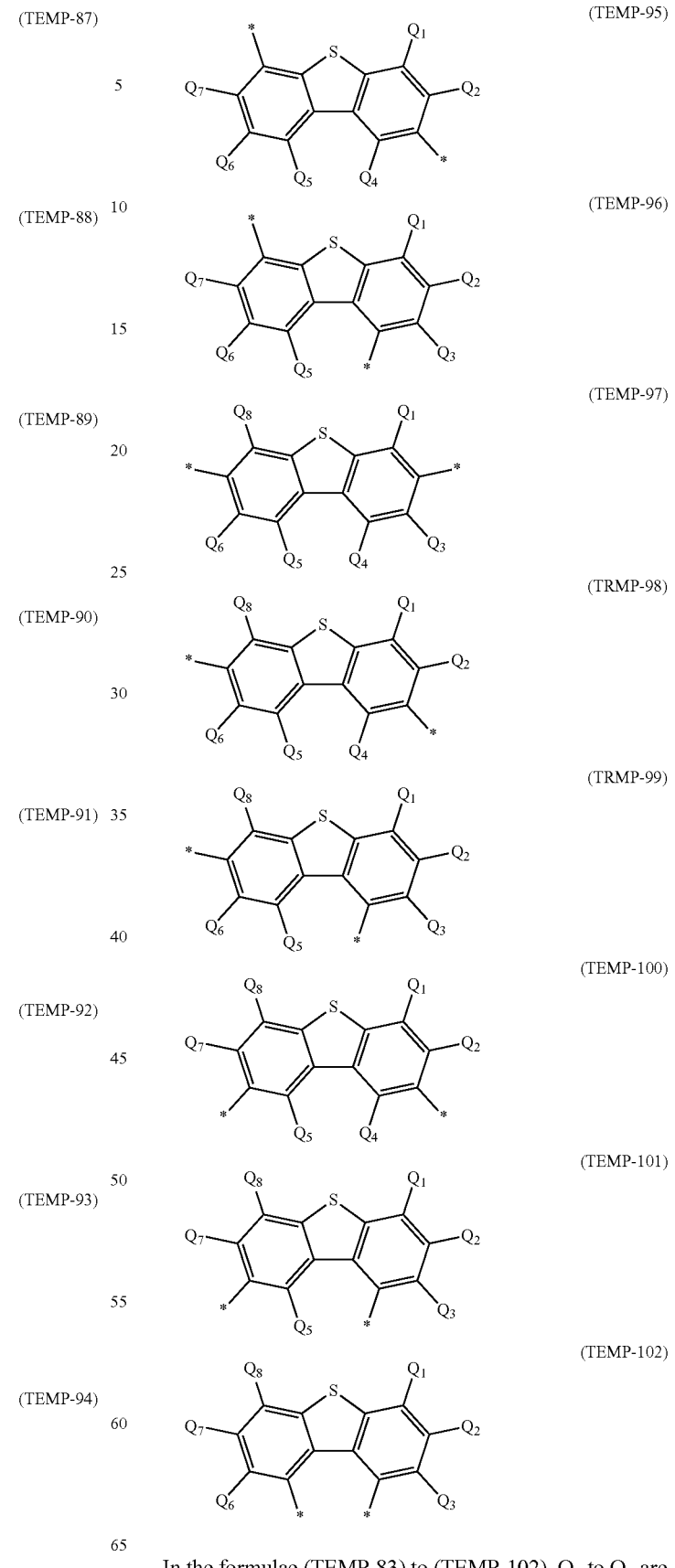
In the formulae (TEMP-83) to (TEMP-102), $Q_1$ to $Q_8$ are each independently a hydrogen atom or a substituent.

The substituent mentioned herein has been described above.

Instance of "Bonded to Form Ring"

Instances where "at least one combination of adjacent two or more (of . . . ) are mutually bonded to form a substituted or unsubstituted monocyclic ring, mutually bonded to form a substituted or unsubstituted fused ring, or not mutually bonded" mentioned herein refer to instances where "at least one combination of adjacent two or more (of . . . ) are mutually bonded to form a substituted or unsubstituted monocyclic ring, "at least one combination of adjacent two or more (of . . . ) are mutually bonded to form a substituted or unsubstituted fused ring," and "at least one combination of adjacent two or more (of . . . ) are not mutually bonded."

The instances where "at least one combination of adjacent two or more (of . . . ) are mutually bonded to form a substituted or unsubstituted monocyclic ring" and "at least one combination of adjacent two or more (of . . . ) are mutually bonded to form a substituted or unsubstituted fused ring" mentioned herein (hereinafter, these instances may be collectively referred to as an instance of "bonded to form a ring") will be described below.

An anthracene compound having a basic skeleton in a form of an anthracene ring and represented by a formula (TEMP-103) below will be used as an example for the description.

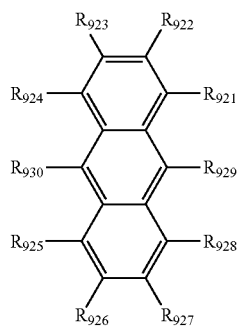

(TEMP-103)

For instance, when "at least one combination of adjacent two or more of $R_{921}$ to $R_{930}$ are mutually bonded to form a ring," the combination of adjacent ones of $R_{921}$ to $R_{930}$ (i.e. the combination at issue) is a combination of $R_{921}$ and $R_{922}$, a combination of $R_{922}$ and $R_{923}$, a combination of $R_{923}$ and $R_{924}$, a combination of $R_{924}$ and $R_{930}$, a combination of $R_{930}$ and $R_{925}$, a combination of $R_{925}$ and $R_{926}$, a combination of $R_{926}$ and $R_{927}$, a combination of $R_{927}$ and $R_{923}$, a combination of $R_{928}$ and $R_{929}$, or a combination of $R_{929}$ and $R_{921}$.

The term "at least one combination" means that two or more of the above combinations of adjacent two or more of $R_{921}$ to $R_{930}$ may simultaneously form rings.

For instance, when $R_{921}$ and $R_{922}$ are mutually bonded to form a ring $Q_A$ and $R_{925}$ and $R_{926}$ are simultaneously mutually bonded to form a ring $Q_B$, the anthracene compound represented by the formula (TEMP-103) is represented by a formula (TEMP-104) below

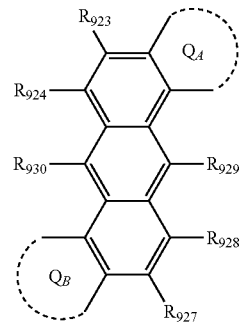

(TEMP-104)

The instance where the "combination of adjacent two or more" form a ring means not only an instance where the "two" adjacent components are bonded but also an instance where adjacent "three or more" are bonded. For instance, $R_{921}$ and $R_{922}$ are mutually bonded to form a ring $Q_A$ and $R_{922}$ and $R_{923}$ are mutually bonded to form a ring $Q_C$, and mutually adjacent three components ($R_{921}$, $R_{922}$ and $R_{923}$) are mutually bonded to form a ring fused to the anthracene basic skeleton. In this case, the anthracene compound represented by the formula (TEMP-103) is represented by a formula (TEMP-105) below. In the formula (TEMP-105) below, the ring $Q_A$ and the ring $Q_C$ share $R_{922}$.

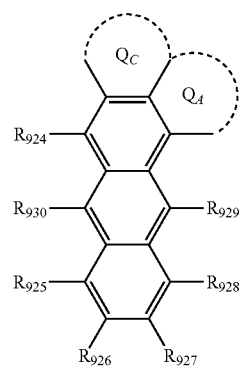

(TEMP-105)

The formed "monocyclic ring" or "fused ring" may be, in terms of the formed ring in itself, a saturated ring or an unsaturated ring. When the "combination of adjacent two" form a "monocyclic ring" or a "fused ring," the "monocyclic ring" or "fused ring" may be a saturated ring or an unsaturated ring. For instance, the ring $Q_A$ and the ring Qs formed in the formula (TEMP-104) are each independently a "monocyclic ring" or a "fused ring." Further, the ring $Q_A$ and the ring $Q_C$ formed in the formula (TEMP-105) are each a "fused ring," The ring $Q_A$ and the ring $Q_C$ in the formula (TEMP-105) are fused to form a fused ring. When the ring $Q_A$ in the formula (TEMP-104) is a benzene ring, the ring $Q_A$ is a monocyclic ring. When the ring $Q_A$ in the formula (TEMP-104) is a naphthalene ring, the ring $Q_A$ is a fused ring.

The "unsaturated ring" represents an aromatic hydrocarbon ring or an aromatic heterocycle. The "saturated ring" represents an aliphatic hydrocarbon ring or a non-aromatic heterocycle.

Specific examples of the aromatic hydrocarbon ring include a ring formed by terminating a bond of a group in the specific example of the specific example group G1 with a hydrogen atom.

Specific examples of the aromatic heterocycle include a ring formed by terminating a bond of an aromatic heterocyclic group in the specific example of the specific example group G2 with a hydrogen atom.

Specific examples of the aliphatic hydrocarbon ring include a ring formed by terminating a bond of a group in the specific example of the specific example group G6 with a hydrogen atom.

The phrase "to form a ring" herein means that a ring is formed only by a plurality of atoms of a basic skeleton, or by a combination of a plurality of atoms of the basic skeleton and one or more optional atoms. For instance, the ring $Q_A$ formed by mutually bonding $R_{921}$ and $R_{922}$ shown in the formula (TEMP-104) is a ring formed by a carbon atom of the anthracene skeleton bonded to $R_{921}$, a carbon atom of the anthracene skeleton bonded to $R_{922}$, and one or more optional atoms. Specifically, when the ring $Q_A$ is a monocyclic unsaturated ring formed by $R_{92}$ and $R_{922}$, the ring formed by a carbon atom of the anthracene skeleton bonded to $R_{921}$, a carbon atom of the anthracene skeleton bonded to $R_{922}$, and four carbon atoms is a benzene ring.

The "optional atom" is, unless otherwise specified herein, preferably at least one atom selected from the group consisting of a carbon atom, nitrogen atom, oxygen atom, and sulfur atom. A bond of the optional atom (e.g. a carbon atom and a nitrogen atom) not forming a ring may be terminated by a hydrogen atom or the like or may be substituted by an "optional substituent" described later. When the ring includes an optional element other than carbon atom, the resultant ring is a heterocycle.

The number of "one or more optional atoms" forming the monocyclic ring or fused ring is, unless otherwise specified herein, preferably in a range from 2 to 15, more preferably in a range from 3 to 12, further preferably in a range from 3 to 5.

Unless otherwise specified herein, the ring, which may be a "monocyclic ring" or "fused ring," is preferably a "monocyclic ring."

Unless otherwise specified herein, the ring, which may be a "saturated ring" or "unsaturated ring," is preferably an "unsaturated ring."

Unless otherwise specified herein, the "monocyclic ring" is preferably a benzene ring.

Unless otherwise specified herein, the "unsaturated ring" is preferably a benzene ring.

When "at least one combination of adjacent two or more" (of . . . ) are "mutually bonded to form a substituted or unsubstituted monocyclic ring" or "mutually bonded to form a substituted or unsubstituted fused ring," unless otherwise specified herein, at least one combination of adjacent two or more of components are preferably mutually bonded to form a substituted or unsubstituted "unsaturated ring" formed of a plurality of atoms of the basic skeleton, and 1 to 15 atoms of at least one element selected from the group consisting of carbon, nitrogen, oxygen and sulfur.

When the "monocyclic ring" or the "fused ring" has a substituent, the substituent is the substituent described in later-described "optional substituent."

When the "monocyclic ring" or the "fused ring" has a substituent, specific examples of the substituent are the substituents described in the above under the subtitle "Substituent Mentioned Herein."

When the "saturated ring" or the "unsaturated ring" has a substituent, the substituent is the substituent described in later-described "optional substituent."

When the "monocyclic ring" or the "fused ring" has a substituent, specific examples of the substituent are the substituents described in the above under the subtitle "Substituent Mentioned Herein."

The above is the description for the instances where "at least one combination of adjacent two or more (of . . . ) are mutually bonded to form a substituted or unsubstituted monocyclic ring" and "at least one combination of adjacent two or more (of . . . ) are mutually bonded to form a substituted or unsubstituted fused ring" mentioned herein (sometimes referred to as an instance of "bonded to form a ring").

Substituent for Substituted or Unsubstituted Group

In an exemplary embodiment herein, the substituent for the substituted or unsubstituted group (sometimes referred to as an "optional substituent" hereinafter) is, for instance, a group selected from the group consisting of an unsubstituted alkyl group having 1 to 50 carbon atoms, an unsubstituted alkenyl group having 2 to 50 carbon atoms, an unsubstituted alkynyl group having 2 to 50 carbon atoms, an unsubstituted cycloalkyl group having 3 to 50 ring carbon atoms, $Si(R_{901})(R_{902})(R_{903})$, —O—($R_{904}$), —S—($R_{905}$), —N($R_{906}$)($R_{907}$), a halogen atom, a cyano group, a nitro group, an unsubstituted aryl group having 6 to 50 ring carbon atoms, and an unsubstituted heterocyclic group having 5 to 50 ring atoms;

$R_{901}$ to $R_{907}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when two or more $R_{901}$ are present, the two or more $R_{901}$ are mutually the same or different;

when two or more $R_{902}$ are present, the two or more $R_{902}$ are mutually the same or different;

when two or more $R_{903}$ are present, the two or more $R_{903}$ are mutually the same or different;

when two or more $R_{904}$ are present, the two or more $R_{904}$ are mutually the same or different;

when two or more $R_{905}$ are present, the two or more $R_{905}$ are mutually the same or different;

when two or more $R_{906}$ are present, the two or more $R_{906}$ are mutually the same or different; and when two or more $R_{907}$ are present, the two or more $R_{907}$ are mutually the same or different.

In an exemplary embodiment, the substituent for the substituted or unsubstituted group is a group selected from the group consisting of an alkyl group having 1 to 50 carbon atoms, an aryl group having 6 to 50 ring carbon atoms, and a heterocyclic group having 5 to 50 ring atoms.

In an exemplary embodiment, the substituent for the substituted or unsubstituted group is a group selected from the group consisting of an alkyl group having 1 to 18 carbon atoms, an aryl group having 6 to 18 ring carbon atoms, and a heterocyclic group having 5 to 18 ring atoms.

Specific examples of the above optional substituent are the same as the specific examples of the substituent described in the above under the subtitle "Substituent Mentioned Herein."

Unless otherwise specified herein, adjacent ones of the optional substituents may form a "saturated ring" or an "unsaturated ring," preferably a substituted or unsubstituted saturated five-membered ring, a substituted or unsubstituted saturated six-membered ring, a substituted or unsubstituted unsaturated five-membered ring, or a substituted or unsubstituted unsaturated six-membered ring, more preferably a benzene ring.

Unless otherwise specified herein, the optional substituent may further include a substituent. Examples of the substituent for the optional substituent are the same as the examples of the optional substituent.

Herein, numerical ranges represented by "AA to BB" represent a range whose lower limit is the value (AA) recited before "to" and whose upper limit is the value (BB) recited after "to."

Herein, numerical formulae represented by "A≥B" represent that the value of A and the value of B are equal to each other, or the value of A is greater than the value of B.

Herein, numerical formulae represented by "A≤B" represent that the value of A and the value of B are equal to each other, or the value of A is smaller than the value of B.

First Exemplary Embodiment

Organic Electroluminescence Device

An organic EL device according to this exemplary embodiment will be described.

The organic EL device according to the exemplary embodiment includes an anode, a cathode, and an organic layer between the two electrodes. The organic layer includes at least one layer formed from an organic compound(s).

Alternatively, the organic layer includes a plurality of layers formed from an organic compound(s). The organic layer may further contain an inorganic compound(s).

The organic electroluminescence device according to this exemplary embodiment includes an anode, a cathode, and an emitting layer, in which the emitting layer contains a first compound, a second compound, and a third compound, the first compound, the second compound, and the third compound are different from each other, the first compound is a fluorescent compound, the second compound is a delayed fluorescent compound, and the first compound, the second compound, and the third compound satisfy numerical formulae (Numerical Formula 1), (Numerical Formula 2), (Numerical Formula 3), and (Numerical Formula 4) below.

| $\|Af(M1)-Af(M2)\| \leq 0.40$ eV | (Numerical Formula 1): |
|---|---|
| $Ip(M2) \geq 5.75$ eV | (Numerical Formula 2): |
| $\|Ip(M2)-Ip(M3)\| \leq 0.25$ eV | (Numerical Formula 3): |
| $S_1(M3) \geq S_1(M2)$ | (Numerical Formula 4): |

Af(M1) is an affinity of the first compound,
Af(M2) is an affinity of the second compound,
Ip(M2) is an ionization potential of the second compound,
$S_1$(M2) is a lowest singlet energy of the second compound,
Ip(M3) is an ionization potential of the third compound, and
$S_1$(M3) is a lowest singlet energy of the third compound.

Since the emitting layer of the organic EL device of the exemplary embodiment contains the compounds that satisfy the numerical formulae (Numerical Formula 1), (Numerical Formula 2), (Numerical Formula 3), and (Numerical Formula 4), electron trapping by the first compound in the emitting layer and hole injection into the emitting layer are suppressed, and consequently, an emitting region can be controlled to be present at an interface on a side of the emitting layer close to the hole transporting layer or present over the entire emitting layer. Accordingly, the organic EL device of the exemplary embodiment can realize higher efficiency and can be used as a red pixel which is easily subjected to cavity adjustment in an organic EL display device equipped with RGB pixels. Use of the organic EL device of the exemplary embodiment as a red pixel in an organic EL display device equipped with RGB pixels enables the efficiency of the red pixel to be increased while maintaining the luminous efficiency (blue index (BI)) of an organic EL device serving as a blue pixel. The blue index (BI) is a value calculated by dividing the value of current efficiency L/J by the CIEy value of CIE chromaticity and is one of indices representing the efficiency of blue light emission.

It is also preferable that an absolute value |Af(M1)−Af(M2)| of a difference between the affinity of the first compound Af(M1) and the affinity of the second compound Af(M2) satisfies a numerical formula (Numerical Formula 1A) or (Numerical Formula 1B) below.

| $\|Af(M1)-Af(M2)\| < 0.40$ eV | (Numerical Formula 1A): |
|---|---|
| $\|Af(M1)-Af(M2)\| < 0.39$ eV | (Numerical Formula 1B): |

It is also preferable that the absolute value |Af(M1)−Af(M2)| of the difference between the affinity of the first compound Af(M1) and the affinity of the second compound Af(M2) is 0 eV or more.

It is also preferable that the ionization potential of the second compound Ip(M2) is 5.80 eV or more, and 5.90 eV or more.

It is also preferable that the ionization potential of the second compound Ip(M2) is 6.30 eV or less.

It is also preferable that an absolute value |Ip(M2)−Ip(M3)| of a difference between the ionization potential of the second compound Ip(M2) and the ionization potential of the third compound Ip(M3) satisfies a numerical formula (Numerical Formula 3A) or (Numerical Formula 3B) below.

| $\|Ip(M2)-Ip(M3)\| \leq 0.24$ eV | (Numerical Formula 3A): |
|---|---|
| $\|Ip(M2)-Ip(M3)\| \leq 0.23$ eV | (Numerical Formula 3B): |

It is also preferable that the absolute value |Ip(M2)−Ip(M3)| of the difference between the ionization potential of the second compound Ip(M2) and the ionization potential of the third compound Ip(M3) is 0 eV or more.

Methods for Measuring Ionization Potential Ip and Affinity Af

The ionization potential Ip of a measurement target (compound or material) is calculated by the following numerical formula (Numerical Formula Y1), and the affinity Af thereof is calculated by the following numerical formula (Numerical Formula Y2).

The unit of the ionization potential Ip and the unit of the affinity Af are eV.

| $Ip=-1.40 \times (Eox-Efc)-4.60$ eV | (Numerical Formula Y1): |
|---|---|
| $Af=-1.19 \times (Ere-Efc)-4.78$ eV | (Numerical Formula Y2): |

In the numerical formulae (Numerical Formula Y1) and (Numerical Formula Y2), Eox, Ere, and Efc are as follows.
Eox: First oxidation potential of measurement target (DPV, Positive scan)
Ere: First reduction potential of measurement target (DPV, Negative scan)
Efc: First oxidation potential of ferrocene (DPV, Positive scan), (ca. +0.55 V vs Ag/AgCl)

The oxidation-reduction potential can be measured by, for example, differential pulse voltammetry (DPV) with an electrochemical analyzer (CHI852D, produced by ALS Co., Ltd.).

A sample solution used for the measurement is prepared by using N,N-dimethylformamide (DMF) as a solvent, dissolving a measurement target such that the concentration of the measurement target is 1.0 mmol/L, and dissolving tetrabutylammonium hexafluorophosphate (TBHP) serving as a supporting electrolyte such that the concentration of TBHP is 100 mmol/L. A glassy carbon electrode is used as a working electrode. A platinum (Pt) electrode is used as a counter electrode.

(Reference Documents) M. E. Thompson, et al., Organic Electronics, 6 (2005), pp. 11-20, Organic Electronics, 10 (2009), pp. 515-520

Organic Layer

In the organic EL device of this exemplary embodiment, the organic layer may, for example, be provided by a single emitting layer or include a layer that can be used in an organic EL device. Examples of the layer that can be used in an organic EL device include, but are not particularly limited to, at least one layer selected from the group consisting of a hole injecting layer, a hole transporting layer, an electron blocking layer, a hole blocking layer, an electron transporting layer, and an electron injecting layer.

It is also preferable that the organic EL device of the exemplary embodiment includes a hole transporting layer between the anode and the emitting layer.

It is also preferable that the organic EL device of the exemplary embodiment includes an electron transporting layer between the cathode and the emitting layer.

FIG. 1 illustrates a schematic structure of an example of an organic EL device according to this exemplary embodiment.

An organic EL device 1 includes a substrate 2, an anode 3, a cathode 4, and an organic layer 10 disposed between the anode 3 and the cathode 4.

The organic layer 10 includes a hole injecting layer 6, a hole transporting layer 7, an emitting layer 5, an electron transporting layer 8, and an electron injecting layer 9 that are stacked in this order on the anode 3. The invention is not limited to the structure of the organic EL device illustrated in FIG. 1.

Emitting Layer

In the organic EL device of this exemplary embodiment, the emitting layer contains a first compound, a second compound, and a third compound. The first compound, the second compound, and the third compound are compounds that are different from each other.

In the organic EL device of the exemplary embodiment, the first compound is preferably a dopant material (also referred to as a guest material, an emitter, or a luminescent material), and the second compound is preferably a host material (also referred to as a matrix material).

In the organic EL device of the exemplary embodiment, the first compound, the second compound, and the third compound are preferably contained in the same layer.

Specifically, the first compound, the second compound, and the third compound are preferably contained in the same emitting layer.

In one exemplary embodiment, the emitting layer may contain a metal complex.

In one exemplary embodiment, it is also preferable that the emitting layer contains no metal complex.

In one exemplary embodiment, the emitting layer preferably contains no phosphorescent material.

In one exemplary embodiment, the emitting layer preferably contains neither heavy metal complex nor phosphorescent rare-earth metal complex.

Examples of the heavy metal complex include iridium complexes, osmium complexes, and platinum complexes.

First Compound

In the organic EL device of the exemplary embodiment, the first compound is a fluorescent compound. In one exemplary embodiment, the first compound is a compound that does not exhibit thermally activated delayed fluorescence. In one exemplary embodiment, the first compound is a compound that exhibits thermally activated delayed fluorescence.

The first compound is a compound having a structure different from that of the second compound.

The first compound of this exemplary embodiment is not a phosphorescent metal complex. Preferably, the first compound is not a heavy metal complex. Preferably, the first compound is not a metal complex.

A fluorescent material can be used as the first compound of this exemplary embodiment.

Specific examples of the fluorescent material include a bisarylaminonaphthalene derivative, aryl-substituted naphthalene derivative, bisarylaminoanthracene derivative, aryl-substituted anthracene derivative, bisarylaminopyrene derivative, aryl-substituted pyrene derivative, bisarylamino chrysene derivative, aryl-substituted chrysene derivative, bisarylaminofluoranthene derivative, aryl-substituted fluoranthene derivative, indenoperylene derivative, acenaphthofluoranthene derivative, compound including a boron atom, pyromethene boron complex compound, compound having a pyromethene skeleton, metal complex of the compound having a pyrromethene skeleton, diketopyrrolopyrrole derivative, perylene derivative, and naphthacene derivative.

In the organic EL device of the exemplary embodiment, the first compound is preferably a compound represented by a formula (D1) or (D2) below.

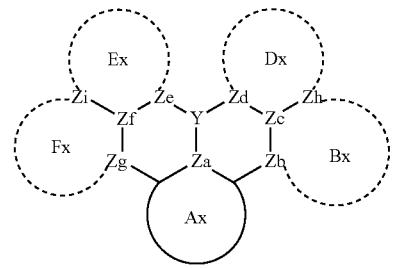

(D1)

In the formula (D1):
 a ring Ax, ring Bx, ring Dx, ring Ex, and ring Fx are each independently a cyclic structure selected from the group consisting of a substituted or unsubstituted aryl ring having 6 to 50 ring carbon atoms, and a substituted or unsubstituted heterocycle having 5 to 50 ring atoms,
 one of the ring Bx and the ring Dx is present or both the ring Bx and the ring Dx are present,
 when both the ring Bx and the ring Dx are present, the ring Bx and the ring Dx share a bond connecting Zc and Zh to each other,
 one of the ring Ex and the ring Fx is present or both the ring Ex and the ring Fx are present,
 when both the ring Ex and the ring Fx are present, the ring Ex and the ring Fx share a bond connecting Zf and Zi to each other;

Za is a nitrogen atom or a carbon atom;
Zb is a nitrogen atom or a carbon atom when the ring Bx is present, or an oxygen atom, a sulfur atom, N(Rb), C(Rb$_1$)(Rb$_2$), Si(Rb$_3$)(Rb$_4$), or B(Rb$_5$) when the ring Bx is not present;
Zc is a nitrogen atom or a carbon atom;
Zd is a nitrogen atom or a carbon atom when the ring Dx is present, or an oxygen atom, a sulfur atom, or N(Rd) when the ring Dx is not present;
Ze is a nitrogen atom or a carbon atom when the ring Ex is present, or an oxygen atom, a sulfur atom, or N(Re) when the ring Ex is not present;
Zf is a nitrogen atom or a carbon atom;
Zg is a nitrogen atom or a carbon atom when the ring Fx is present, or an oxygen atom, a sulfur atom, N(Rg), C(Rg$_1$)(Rg$_2$), Si(Rg$_3$)(Rg$_4$), or B(Rg$_5$) when the ring Fx is not present;
Zh is a nitrogen atom or a carbon atom;
Zi is a nitrogen atom or a carbon atom;
Y is a boron atom, a nitrogen atom, a phosphorus atom, Si(Rh), P=O, or P=S;
a combination of Rb$_1$ and Rb$_2$ are mutually bonded to form a substituted or unsubstituted monocyclic ring, mutually bonded to form a substituted or unsubstituted fused ring, or not mutually bonded;
a combination of Rg$_1$ and Rg$_2$ are mutually bonded to form a substituted or unsubstituted monocyclic ring, mutually bonded to form a substituted or unsubstituted fused ring, or not mutually bonded;
Rb, Rb$_1$, Rb$_2$, Rb$_3$, Rb$_4$, Rb$_5$, Rd, Re, Rg, Rg$_1$, Rg$_2$, Rg$_3$, Rg$_4$, Rg$_5$, and Rh are each independently a hydrogen atom or a substituent; and
Rb, Rb, Rb$_2$, Rb$_3$, Rb$_4$, Rb$_5$, Rd, Re, Rg, Rg$_1$, Rg$_2$, Rg$_3$, Rg$_4$, Rg$_5$, and Rh serving as substituents are each independently a substituted or unsubstituted aryl group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted cycloalkyl group having 3 to 30 ring carbon atoms, a group represented by —Si(R$_{911}$)(R$_{912}$)(R$_{913}$), a group represented by —O—(R$_{914}$), a group represented by —S—(R$_{915}$), or a group represented by —N(R$_{916}$)(R$_{917}$), provided that a bond between Y and Za, a bond between Y and Zd, and a bond between Y and Ze are each a single bond.

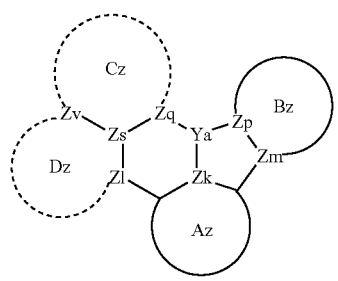

(D2)

In the formula (D2):
a ring Az, ring Bz, ring Cz, and ring Dz are each independently a cyclic structure selected from the group consisting of a substituted or unsubstituted aryl ring having 6 to 50 ring carbon atoms, and a substituted or unsubstituted heterocycle having 5 to 50 ring atoms, one of the ring Cz and the ring Dz is present or both the ring Cz and the ring Dz are present,
when both the ring Cz and the ring Dz are present, the ring Cz and the ring Dz share a bond connecting Zs and Zv to each other;
Zk is a nitrogen atom or a carbon atom;
Zm is a nitrogen atom or a carbon atom;
Zp is a nitrogen atom or a carbon atom;
Zq is a nitrogen atom or a carbon atom when the ring Cz is present, or an oxygen atom, a sulfur atom, or N(Rq) when the ring Cz is not present;
Zs is a nitrogen atom or a carbon atom;
Zt is a nitrogen atom or a carbon atom when the ring Dz is present, or an oxygen atom, a sulfur atom, N(Rt), C(Rt$_1$)(Rt$_2$), Si(Rt$_3$)(Rt$_4$), or B(Rt$_5$) when the ring Dz is not present;
Zv is a nitrogen atom or a carbon atom
Ya is a boron atom, a nitrogen atom, a phosphorus atom, Si(Rv), P=O, or P=S;
a combination of Rt$_1$ and Rt$_2$ are mutually bonded to form a substituted or unsubstituted monocyclic ring, mutually bonded to form a substituted or unsubstituted fused ring, or not mutually bonded;
Rq, Rt, Rt$_1$, Rt$_2$, Rt$_3$, Rt$_4$, Rt$_5$, and Rv are each independently a hydrogen atom or a substituent; and
Rq, Rt, Rt$_1$, Rt$_2$, Rt$_3$, Rt$_4$, Rt$_5$, and Rv serving as substituents are each independently a substituted or unsubstituted aryl group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted cycloalkyl group having 3 to 30 ring carbon atoms, a group represented by —Si(R$_{911}$)(R$_{912}$)(R$_{913}$), a group represented by —O—(R$_{914}$), a group represented by —S—(R$_{915}$), or a group represented by —N(R$_{916}$)(R$_{917}$), provided that a bond between Ya and Zk, a bond between Ya and Zp, and a bond between Ya and Zq are each a single bond.

In the first compound, R$_{911}$ to R$_{917}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms,
when a plurality of R$_{911}$ are present, the plurality of R$_{911}$ are mutually the same or different,
when a plurality of R$_{912}$ are present, the plurality of R$_{912}$ are mutually the same or different,
when a plurality of R$_{913}$ are present, the plurality of R$_{913}$ are mutually the same or different,
when a plurality of R$_{914}$ are present, the plurality of R$_{914}$ are mutually the same or different,
when a plurality of R$_{915}$ are present, the plurality of R$_{915}$ are mutually the same or different,
when a plurality of R$_{916}$ are present, the plurality of R$_{916}$ are mutually the same or different, and
when a plurality of R$_{917}$ are present, the plurality of R$_{917}$ are mutually the same or different.

Herein, examples of the heterocycle include cyclic structures (heterocycles) formed by removing a bond from the "heterocyclic group" mentioned as examples in the above under the subtitle "Substituent Mentioned Herein".

These heterocycles may have a substituent or may be unsubstituted.

Herein, examples of the aryl ring include cyclic structures (aryl rings) formed by removing a bond from the "aryl group" mentioned as examples in the above under the subtitle "Substituent Mentioned Herein".

These aryl rings may have a substituent or may be unsubstituted.

In the first compound of the exemplary embodiment, Rq, Rt, $Rt_1$, $Rt_2$, $Rt_3$, $Rt_4$, $Rt_5$, and Rv are preferably each independently a hydrogen atom, a substituted or unsubstituted aryl group having 6 to 30 ring carbon atoms, a substituted or unsubstituted heterocyclic group having 5 to 30 ring atoms, a substituted or unsubstituted alkyl group having 1 to 30 carbon atoms, or a substituted or unsubstituted cycloalkyl group having 3 to 30 ring carbon atoms.

In the organic EL device of the exemplary embodiment, the first compound is preferably a compound represented by a formula (D100) below.

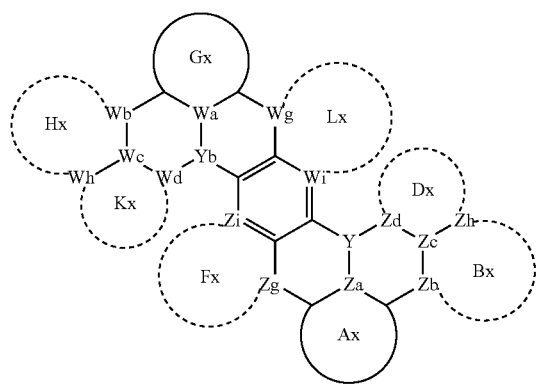

(D100)

In the formula (D100):
the ring Ax, ring Bx, ring Dx, and ring Fx represent the same as the ring Ax, ring Bx, ring Dx, and ring Fx, respectively, in the formula (D1);
Y, Za, Zb, Zc, Zd, Zg, Zh, and Zi represent the same as Y, Za, Zb, Zc, Zd, Zg, Zh, and Zi, respectively, in the formula (D1);
a ring Gx, ring Hx, ring Kx, and ring Lx are each independently a cyclic structure selected from the group consisting of a substituted or unsubstituted aryl ring having 6 to 30 ring carbon atoms, and a substituted or unsubstituted heterocycle having 5 to 30 ring atoms,
one of the ring Hx and the ring Kx is present or both the ring Hx and the ring Kx are present,
when both the ring Hx and the ring Kx are present, the ring Hx and the ring Kx share a bond connecting Wc and Wh to each other;
Wa is a nitrogen atom or a carbon atom;
Wb is a nitrogen atom or a carbon atom when the ring Hx is present, or an oxygen atom, a sulfur atom, N(Rk), $C(Rk_1)(Rk_2)$, $Si(Rk_3)(Rk_4)$, or $B(Rk_5)$ when the ring Hx is not present;
Wc is a nitrogen atom or a carbon atom;
Wd is a nitrogen atom or a carbon atom when the ring Kx is present, or an oxygen atom, a sulfur atom, or N(Rm) when ring Kx is not present;
Wg is a nitrogen atom or a carbon atom when ring Lx is present, or an oxygen atom, a sulfur atom, N(Rn), $C(Rn_1)(Rn_2)$, $Si(Rn_3)(Rn_4)$, or $B(Rn_5)$ when the ring Lx is not present;
Wh is a nitrogen atom or a carbon atom;
Wi is a nitrogen atom or a carbon atom;

Yb is a boron atom, a nitrogen atom, a phosphorus atom, Si(Rp), P=O, or P=S;
a combination of $Rk_1$ and $Rk_2$ are mutually bonded to form a substituted or unsubstituted monocyclic ring, mutually bonded to form a substituted or unsubstituted fused ring, or not mutually bonded:
a combination of $Rn_1$ and $Rn_2$ are mutually bonded to form a substituted or unsubstituted monocyclic ring, mutually bonded to form a substituted or unsubstituted fused ring, or not mutually bonded:
Rk, $Rk_1$, $Rk_2$, $Rk_3$, $Rk_4$, $Rk_5$, Rm, Rn, $Rn_1$, $Rn_2$, $Rn_3$, $Rn_4$, $Rn_5$, and Rp are each independently a hydrogen atom or a substituent; and
Rk, $Rk_1$, $Rk_2$, $Rk_3$, $Rk_4$, Rh, Rm, Rn, $Rn_1$, $Rn_2$, $Rn_3$, $Rn_4$, $Rn_5$, and Rp serving as substituents are each independently a substituted or unsubstituted aryl group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted cycloalkyl group having 3 to 30 ring carbon atoms, a group represented by $-Si(R_{911})(R_{912})(R_{913})$, a group represented by $-O-(R_{914})$, a group represented by $-S-(R_{916})$, or a group represented by $-N(R_{916})(R_{917})$, provided that a bond between Yb and Wa and a bond between Yb and Wd are each a single bond.

In the first compound of the exemplary embodiment, Rk, $Rk_1$, $Rk_2$, $Rk_3$, $Rk_4$, $Rk_5$, Rm, Rn, $Rn_1$, $Rn_2$, $Rn_3$, $Rn_4$, $Rn_5$, and Rp are preferably each independently a hydrogen atom, a substituted or unsubstituted aryl group having 6 to 30 ring carbon atoms, a substituted or unsubstituted heterocyclic group having 5 to 30 ring atoms, a substituted or unsubstituted alkyl group having 1 to 30 carbon atoms, or a substituted or unsubstituted cycloalkyl group having 3 to 30 ring carbon atoms.

In the organic EL device of the exemplary embodiment, the first compound is preferably a compound represented by a formula (D101) below.

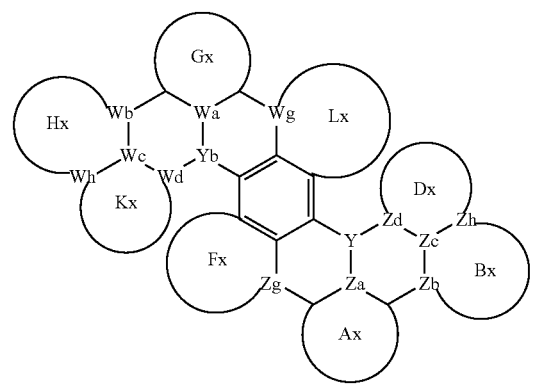

(D101)

In the formula (D101):
the ring Ax, ring Bx, ring Dx, ring Fx, ring Gx, ring Hx, ring Kx, and ring Lx represent the same as the ring Ax, ring Bx, ring Dx, ring Fx, ring Gx, ring Hx, ring Kx, and ring Lx, respectively, in the formula (D100);
Y, Za, Zb, Zc, Zd, Zg, and Zh represent the same as Y, Za, Zb, Zc, Zd, Zg, and Zh, respectively, in the formula (D100); and Yb, Wa, Wb, Wc, Wd, Wg, and Wh represent the same as Yb, Wa, Wb, Wc, Wd, Wg, and Wh, respectively, in the formula (D100).

In the organic EL device of the exemplary embodiment, the first compound is preferably a compound represented by a formula (D102) below.

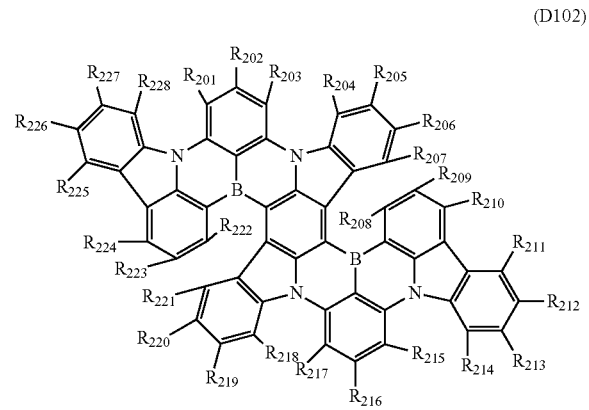

(D102)

In the formula (D102):

$R_{201}$ to $R_{228}$ are each independently a hydrogen atom, a substituted or unsubstituted aryl group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted cycloalkyl group having 3 to 30 ring carbon atoms, a halogen atom, a cyano group, a group represented by —Si($R_{911}$)($R_{912}$)($R_{913}$), a group represented by —O—($R_{914}$), a group represented by —S—($R_{915}$), or a group represented by —N($R_{916}$)($R_{917}$).

In the organic EL device of the exemplary embodiment, the first compound is preferably a compound represented by a formula (D103) below.

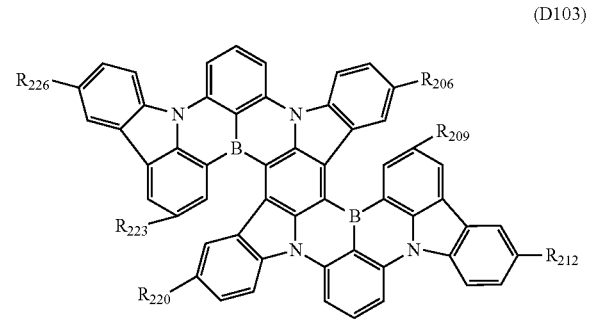

(D103)

In the formula (D103): $R_{206}$, $R_{209}$, $R_{212}$, $R_{220}$, $R_{223}$, and $R_{226}$ are each independently a hydrogen atom, a substituted or unsubstituted aryl group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted cycloalkyl group having 3 to 30 ring carbon atoms, a halogen atom, a cyano group, a group represented by —Si($R_{911}$)($R_{912}$)($R_{913}$), a group represented by —O—($R_{914}$), a group represented by —S—($R_{915}$), or a group represented by —N($R_{916}$)($R_{917}$).

In the organic EL device of the exemplary embodiment, the first compound is preferably a compound that emits fluorescence having a maximum peak wavelength in a range from 600 nm to 660 nm.

The maximum peak wavelength of the first compound is more preferably in a range from 600 nm to 640 nm, still more preferably in a range from 610 nm to 630 nm.

In the organic EL device of the exemplary embodiment, the first compound preferably emits red light.

Herein, the red light emission refers to light emission in which the maximum peak wavelength of a fluorescence spectrum is in a range from 600 nm to 660 nm.

Herein, the maximum peak wavelength refers to a peak wavelength of a fluorescence spectrum exhibiting a maximum luminous intensity in the fluorescence spectrum measured for a toluene solution in which a measurement target compound is dissolved at a concentration in a range from $10^{-6}$ mol/L to $10^{-5}$ mol/L. A spectrophotofluorometer (F-7000, produced by Hitachi High-Tech Science Corporation) is used as a measuring apparatus.

In the first compound according to the exemplary embodiment, the substituent for the substituted or unsubstituted group is preferably an unsubstituted alkyl group having 1 to 25 carbon atoms, an unsubstituted alkenyl group having 2 to 25 carbon atoms, an unsubstituted alkynyl group having 2 to 25 carbon atoms, an unsubstituted cycloalkyl group having 3 to 25 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), an unsubstituted aralkyl group having 7 to 50 carbon atoms, a group represented by —C(=O)$R_{908}$, a group represented by —COOR$_{909}$, a group represented by —S(=O)$_2R_{941}$, a group represented by —P(=O)($R_{942}$)($R_{943}$), a group represented by —Ge($R_{944}$)($R_{945}$)($R_{946}$), a halogen atom, a cyano group, a nitro group, an unsubstituted aryl group having 6 to 25 ring carbon atoms, or an unsubstituted heterocyclic group having 5 to 25 ring atoms;

where $R_{901}$ to $R_{906}$ and $R_{941}$ to $R_{946}$ are preferably each independently a hydrogen atom, an unsubstituted alkyl group having 1 to 25 carbon atoms, an unsubstituted aryl group having 6 to 25 ring carbon atoms, or an unsubstituted heterocyclic group having 5 to 25 ring atoms.

In the first compound according to the exemplary embodiment, the substituent for the substituted or unsubstituted group is preferably a halogen atom, an unsubstituted alkyl group having 1 to 25 carbon atoms, an unsubstituted aryl group having 6 to 25 ring carbon atoms, or an unsubstituted heterocyclic group having 5 to 25 ring atoms.

In the first compound according to the exemplary embodiment, the substituent for the substituted or unsubstituted group is preferably an unsubstituted alkyl group having 1 to 10 carbon atoms, an unsubstituted aryl group having 6 to 12 ring carbon atoms, or an unsubstituted heterocyclic group having 5 to 12 ring atoms.

In the first compound according to the exemplary embodiment, it is also preferable that each of the groups mentioned as a "substituted or unsubstituted" group is an "unsubstituted" group.

Method of Producing First Compound

The first compound can be produced by a known method.

The first compound can also be produced based on a known method through a known alternative reaction using a known material(s) tailored for the target compound.

Specific Examples of First Compound

Specific examples of the first compound include the following compounds. However, the invention is not limited to these specific examples.

Herein, a deuterium atom is denoted by D in chemical formulae, and a protium atom is denoted by H or its symbol is omitted.

Herein, a methyl group may be denoted by Me, and a phenyl group may be denoted by Ph.

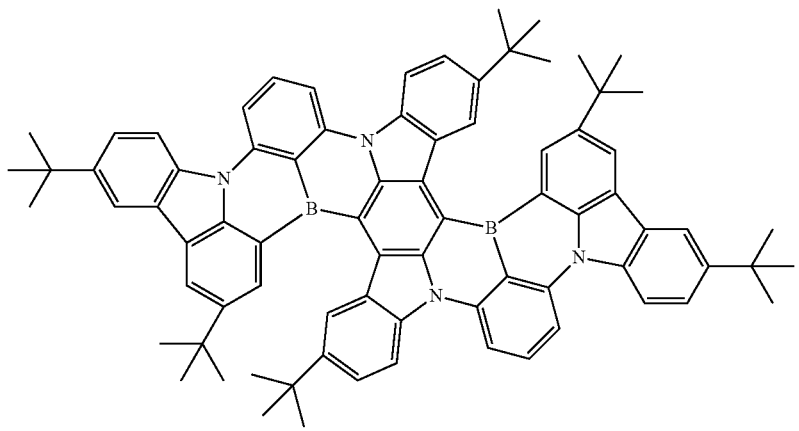

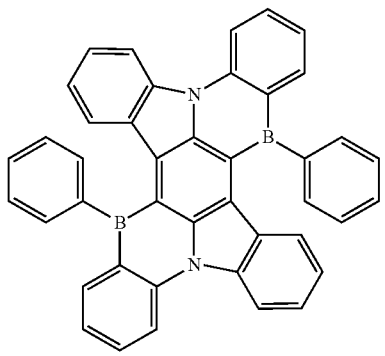

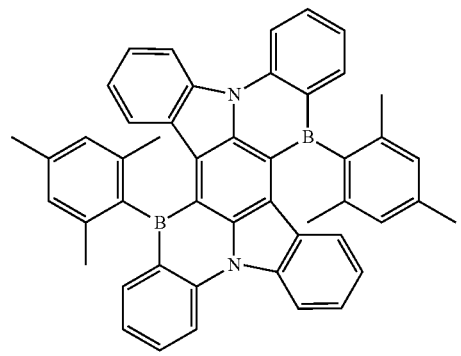

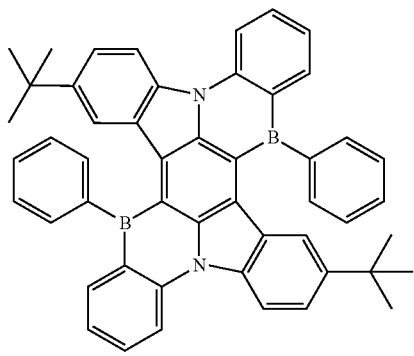

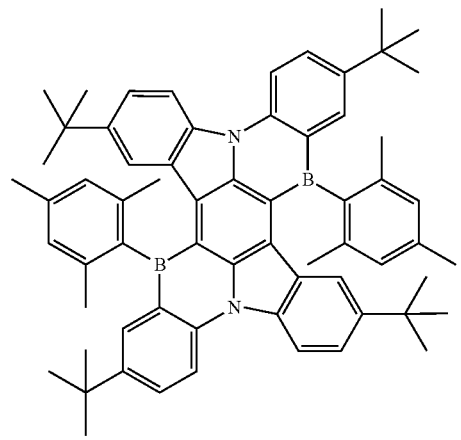

47 48
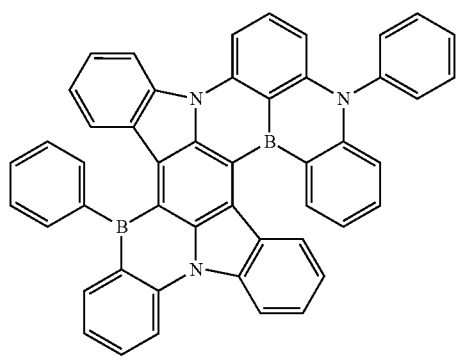 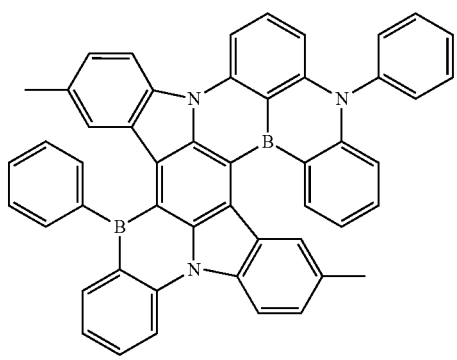
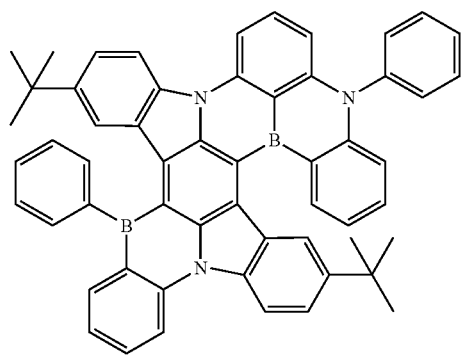 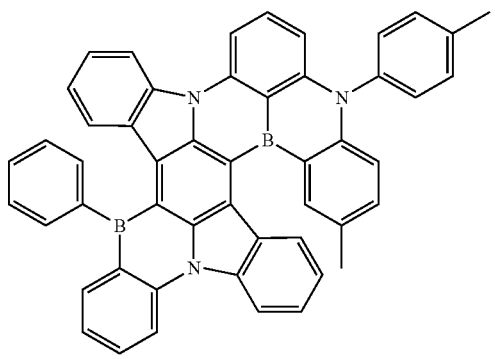
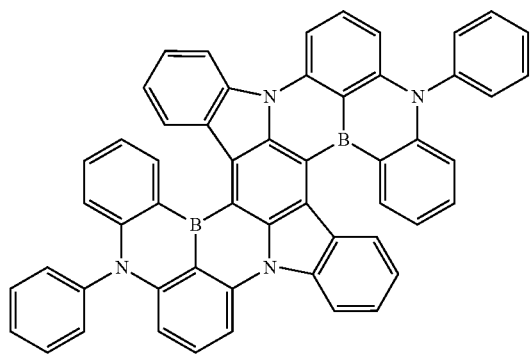 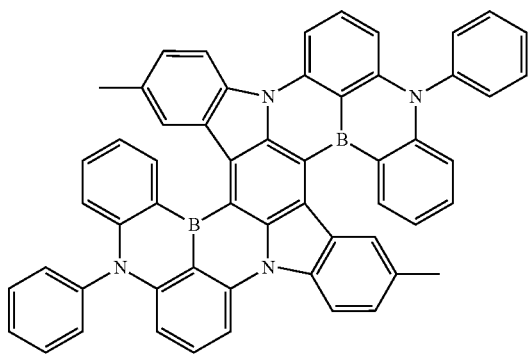
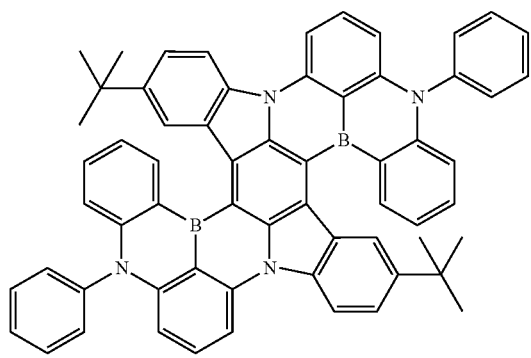 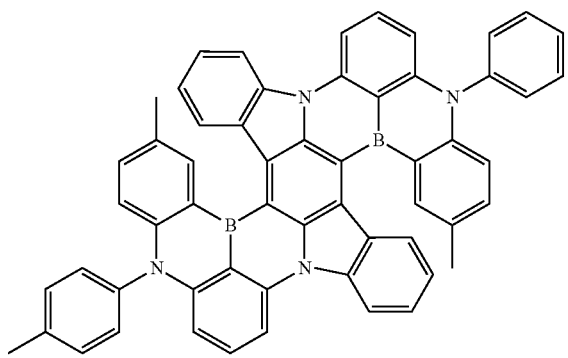

-continued
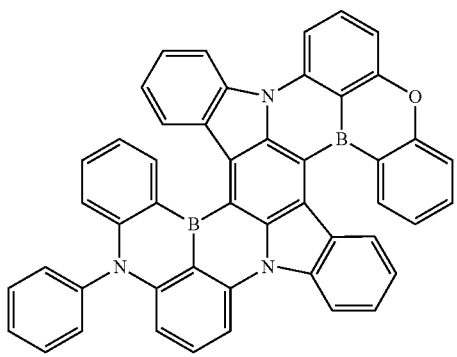
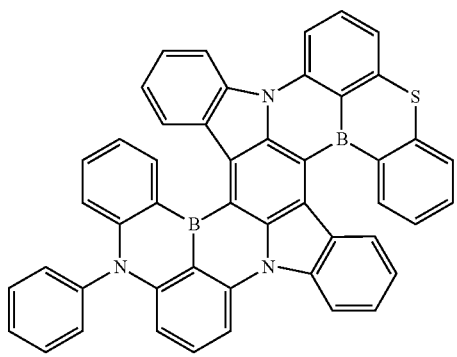
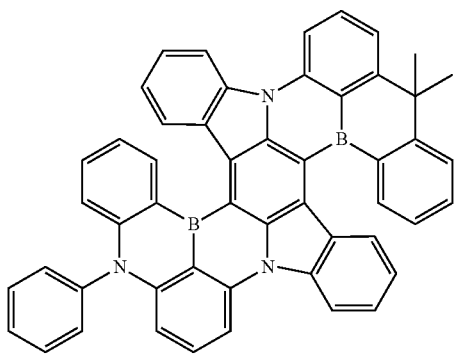
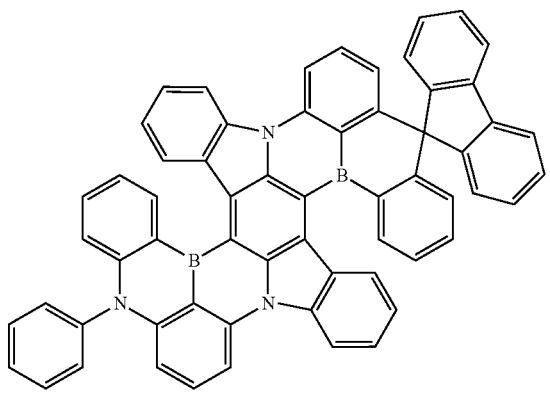
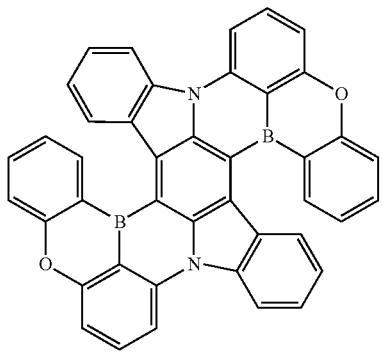
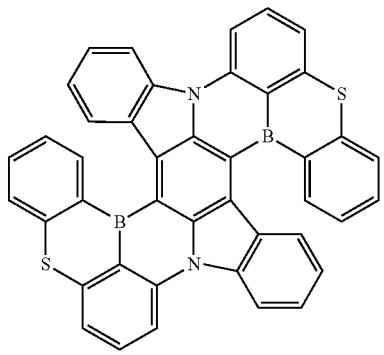
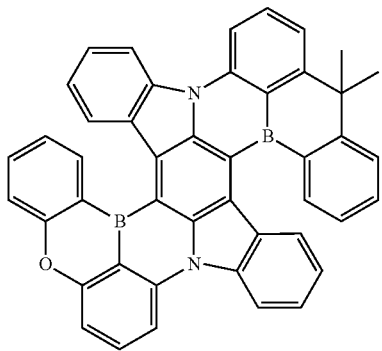
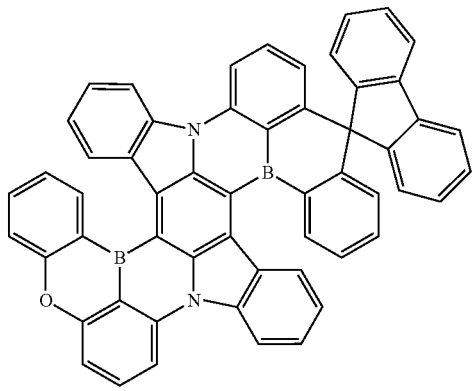

51 52
-continued
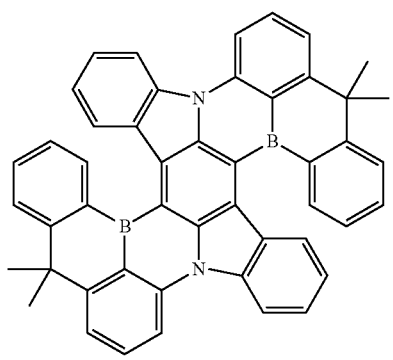
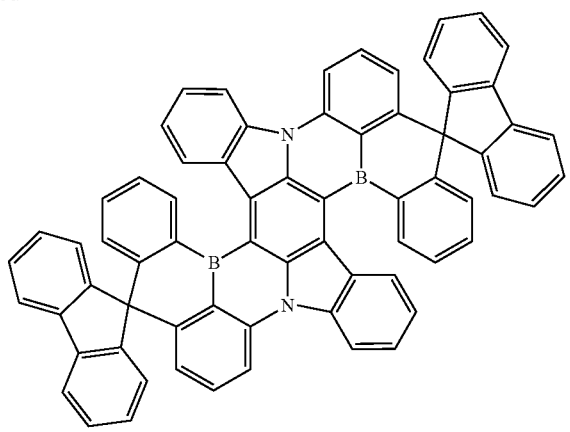
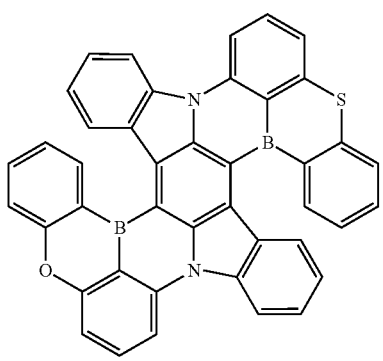
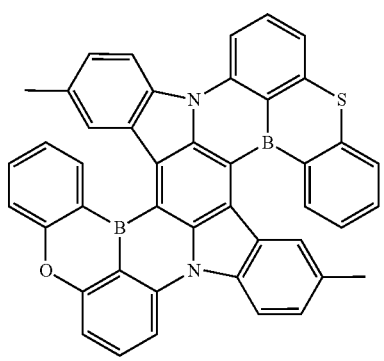
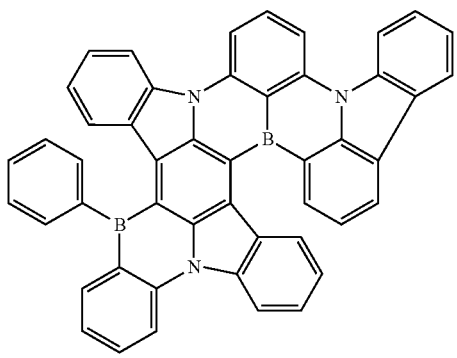
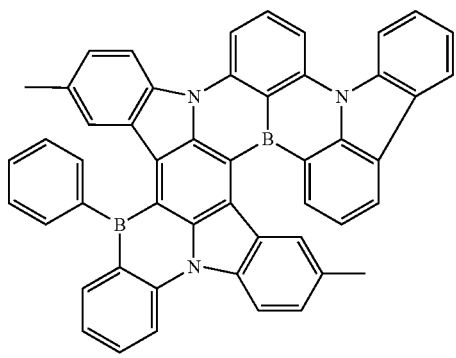
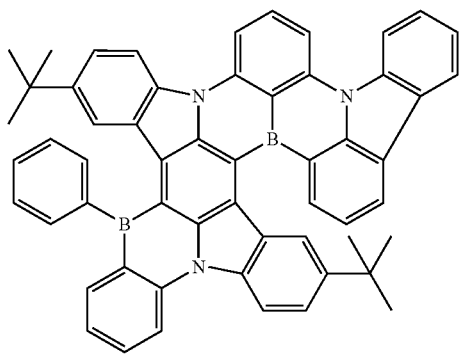
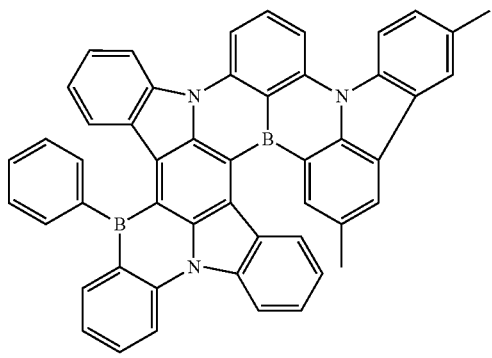

-continued
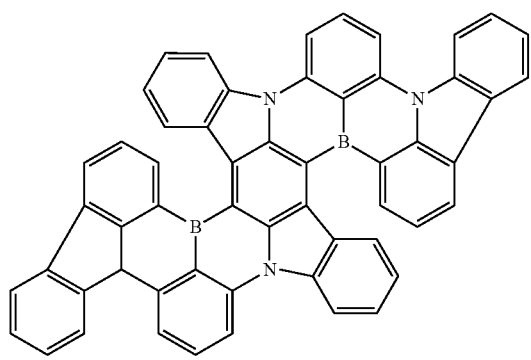
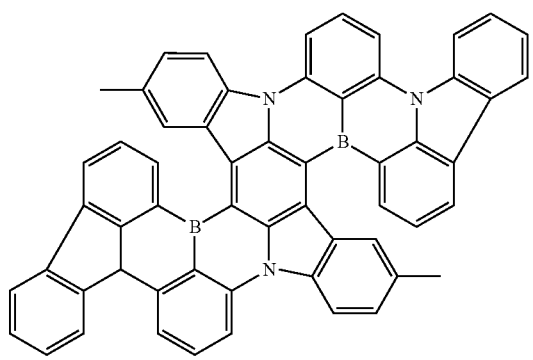
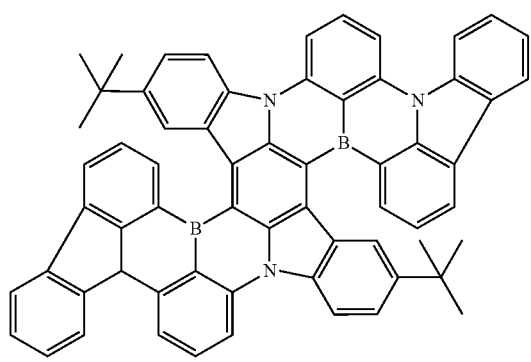
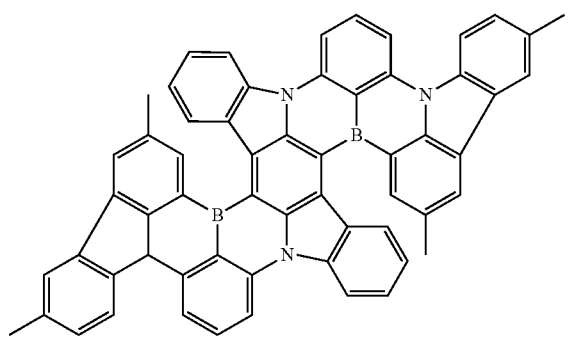
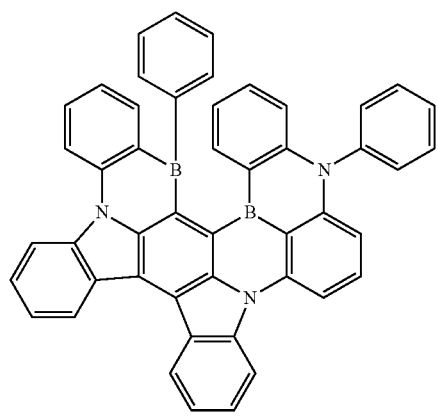
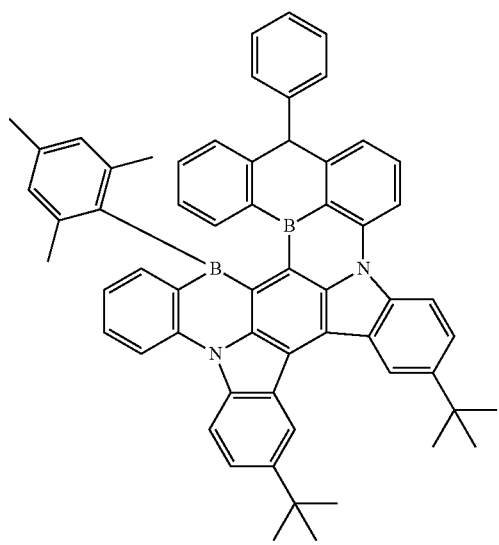

-continued
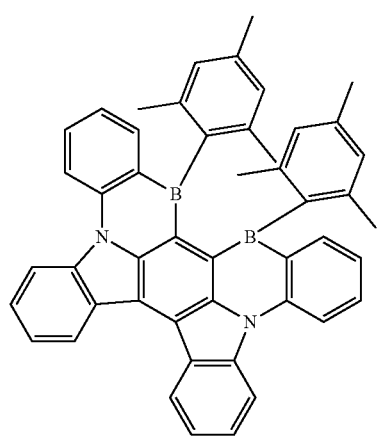
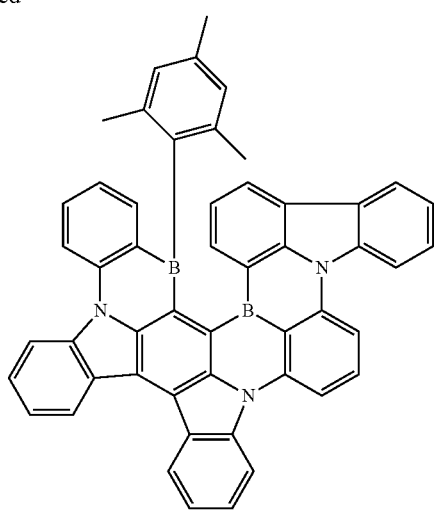
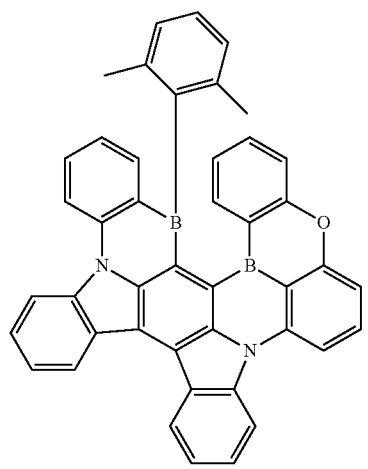
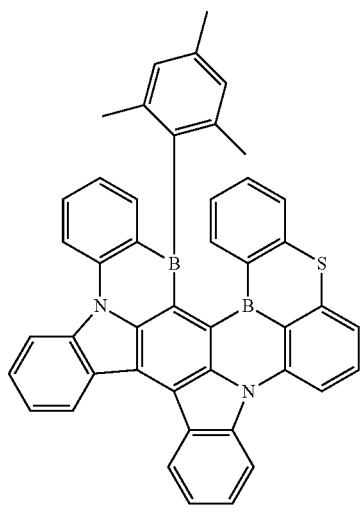
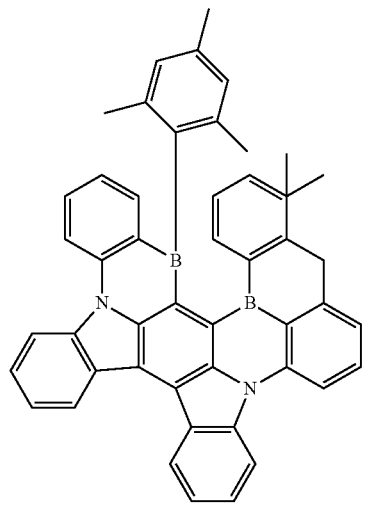
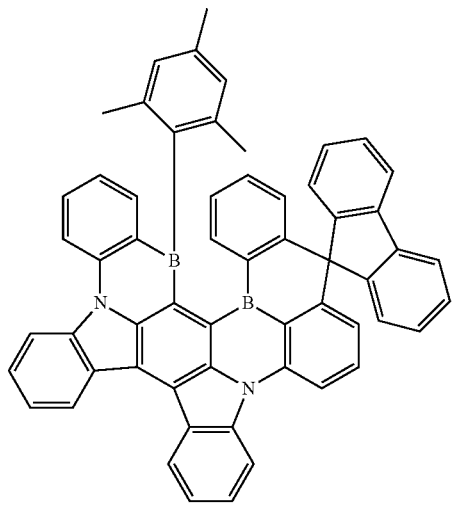

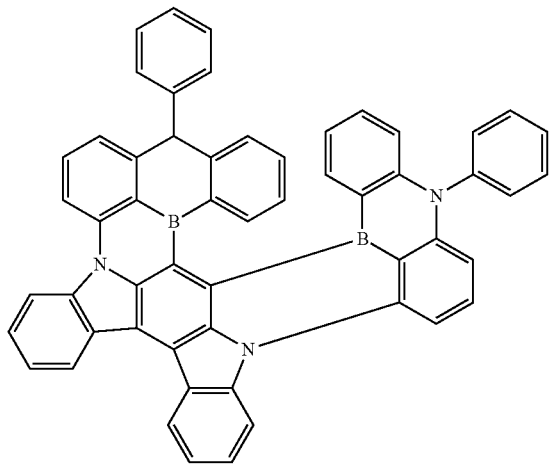
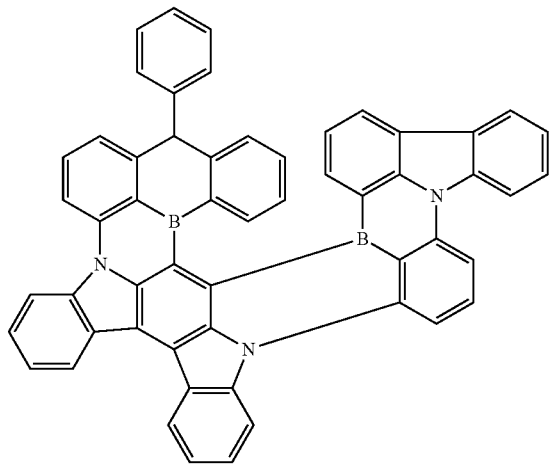
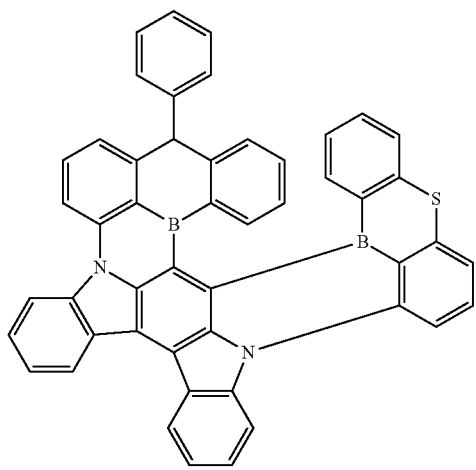
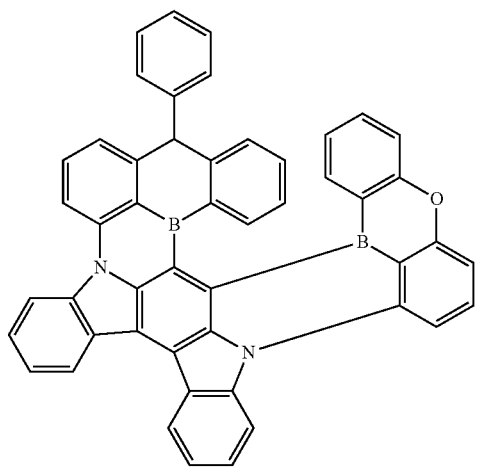
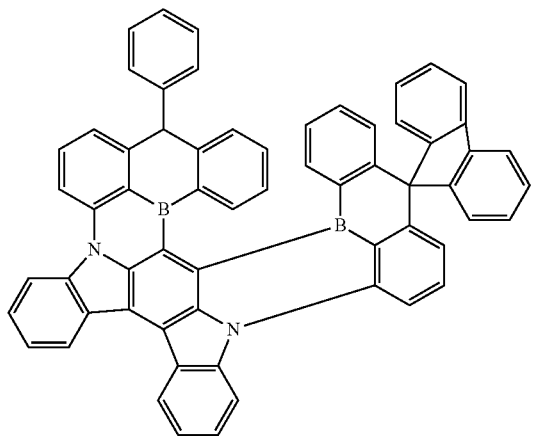
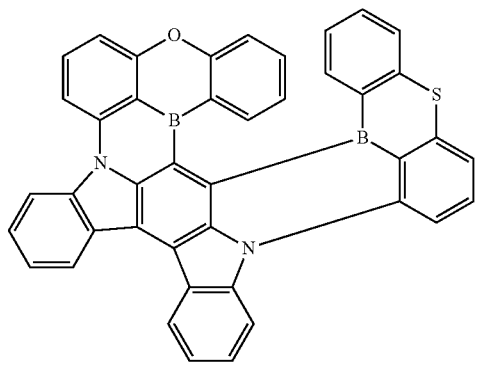

-continued
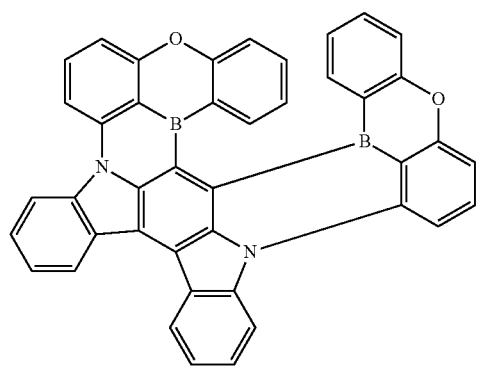
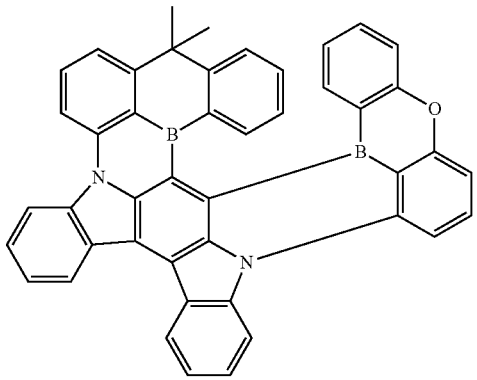
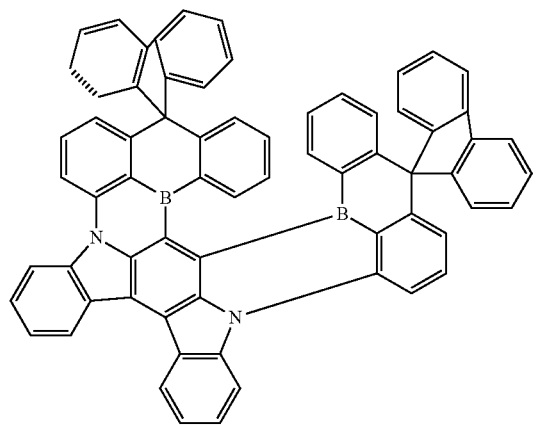
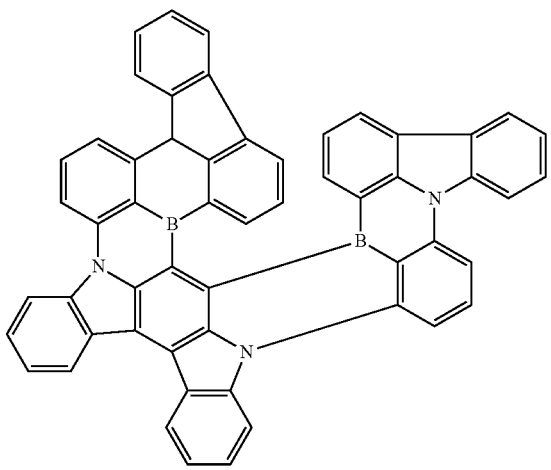
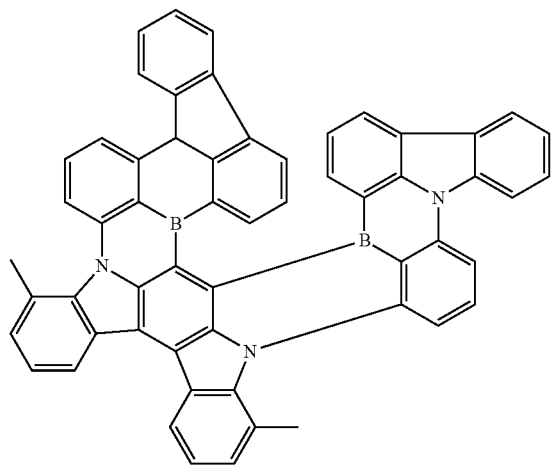
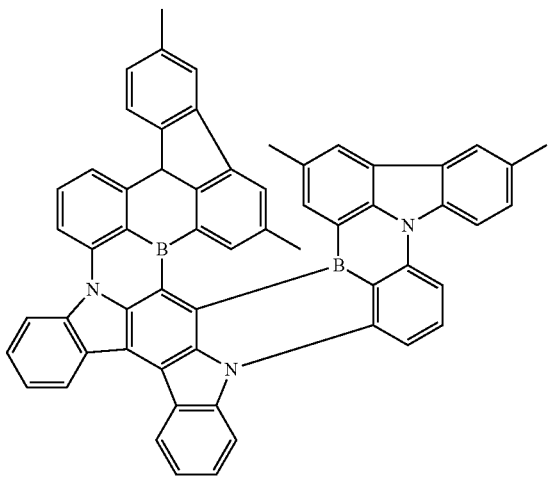
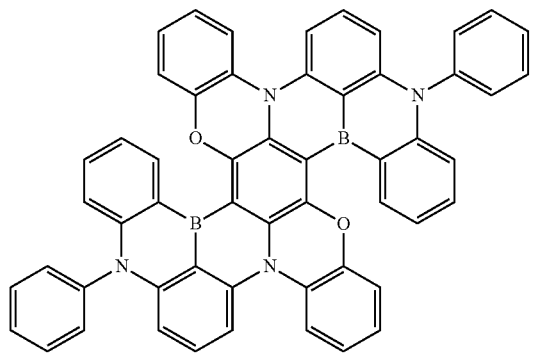
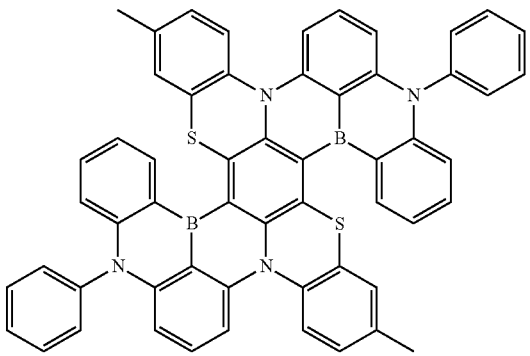

-continued
| 61 | 62 |
|---|---|
| 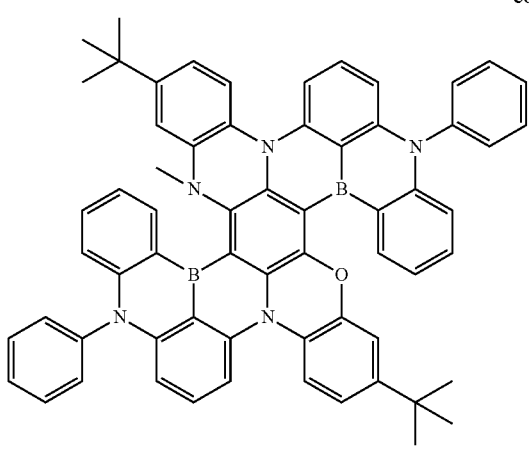 | 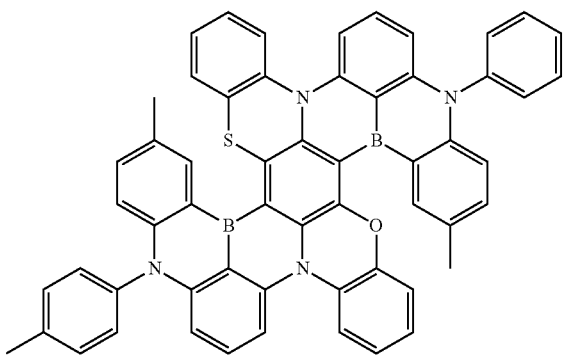 |
| 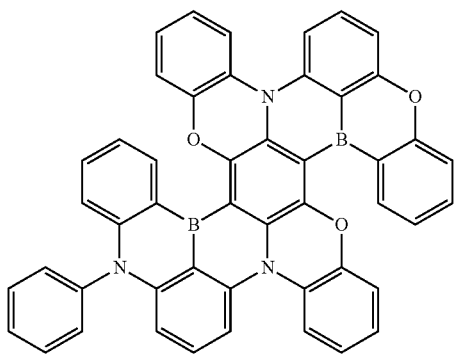 | 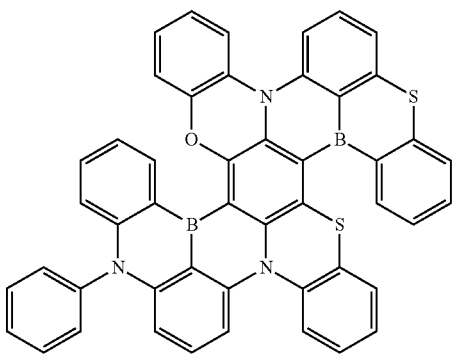 |
| 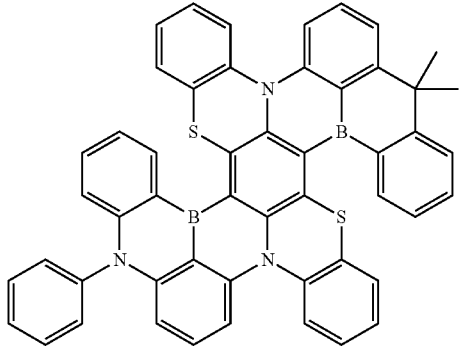 | 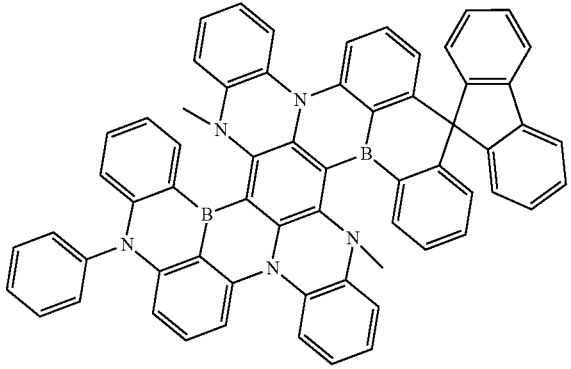 |
| 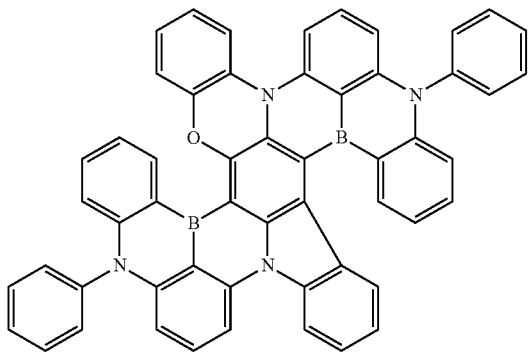 | 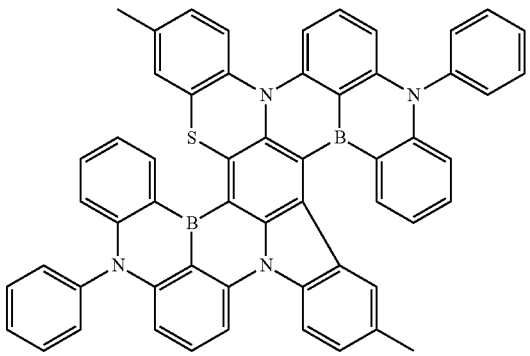 |

-continued
63
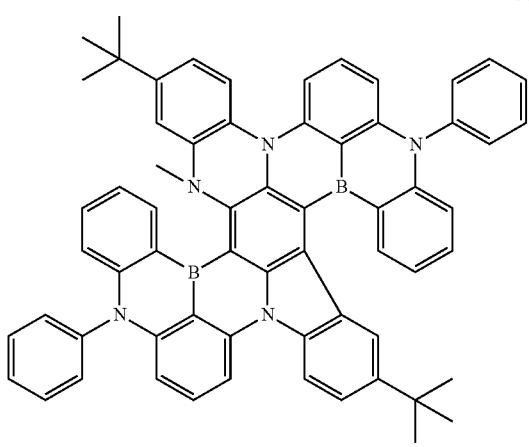
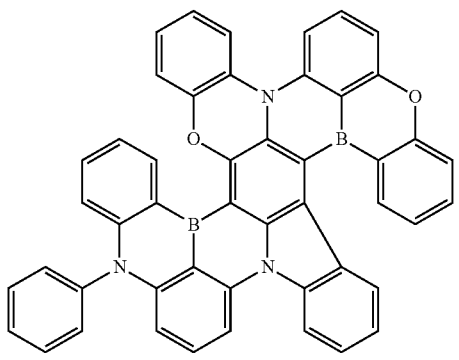
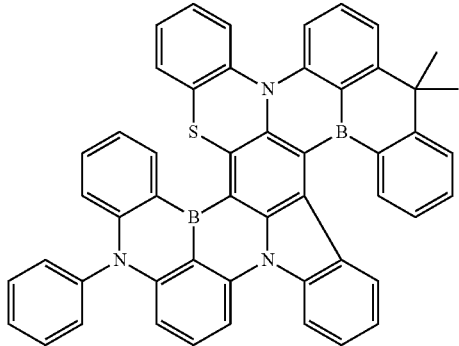
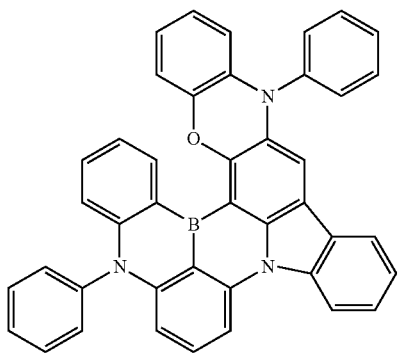
64
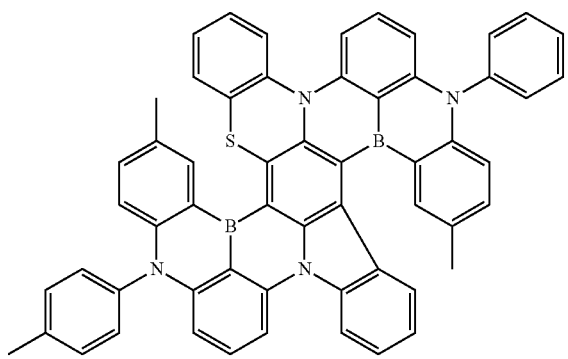
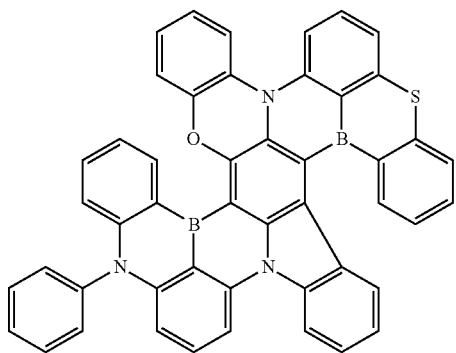
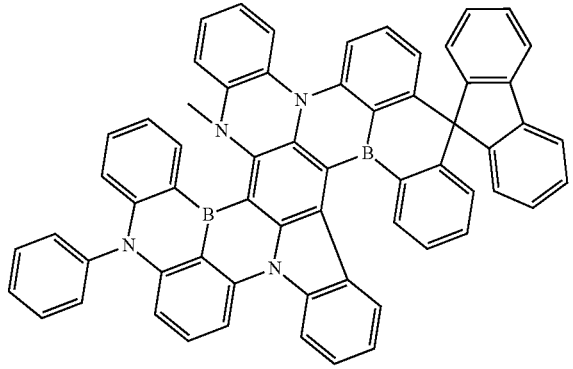
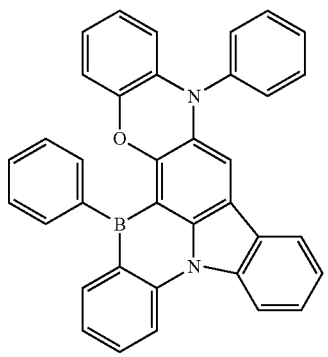

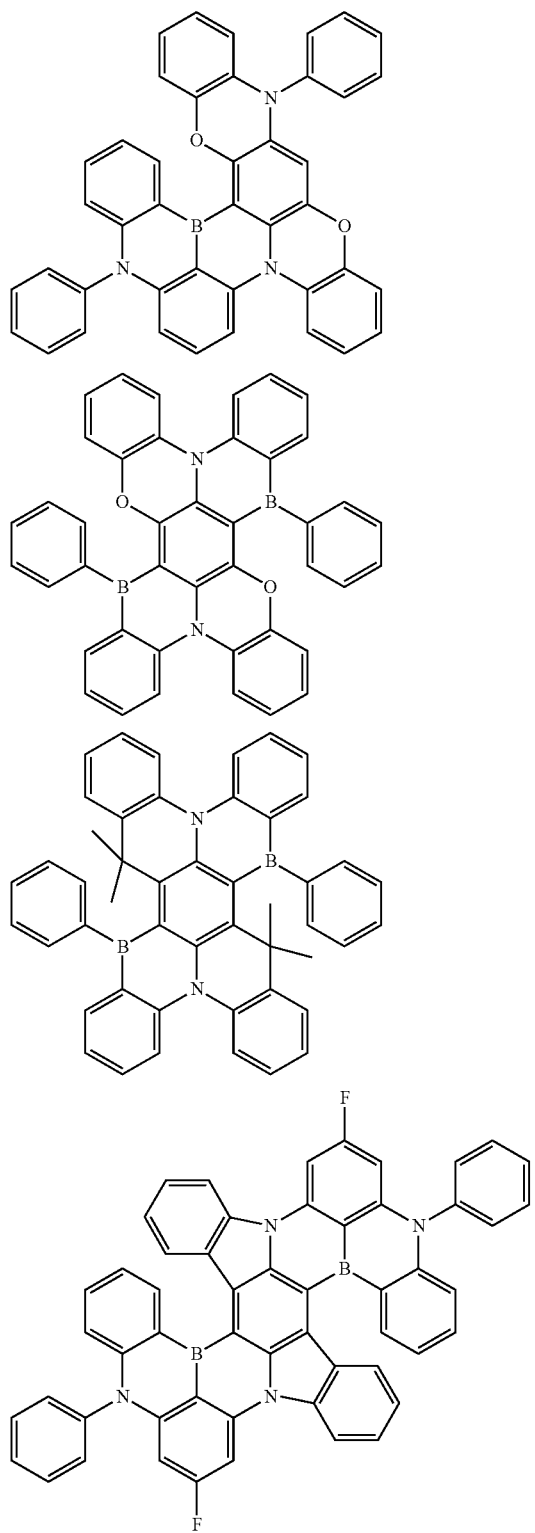
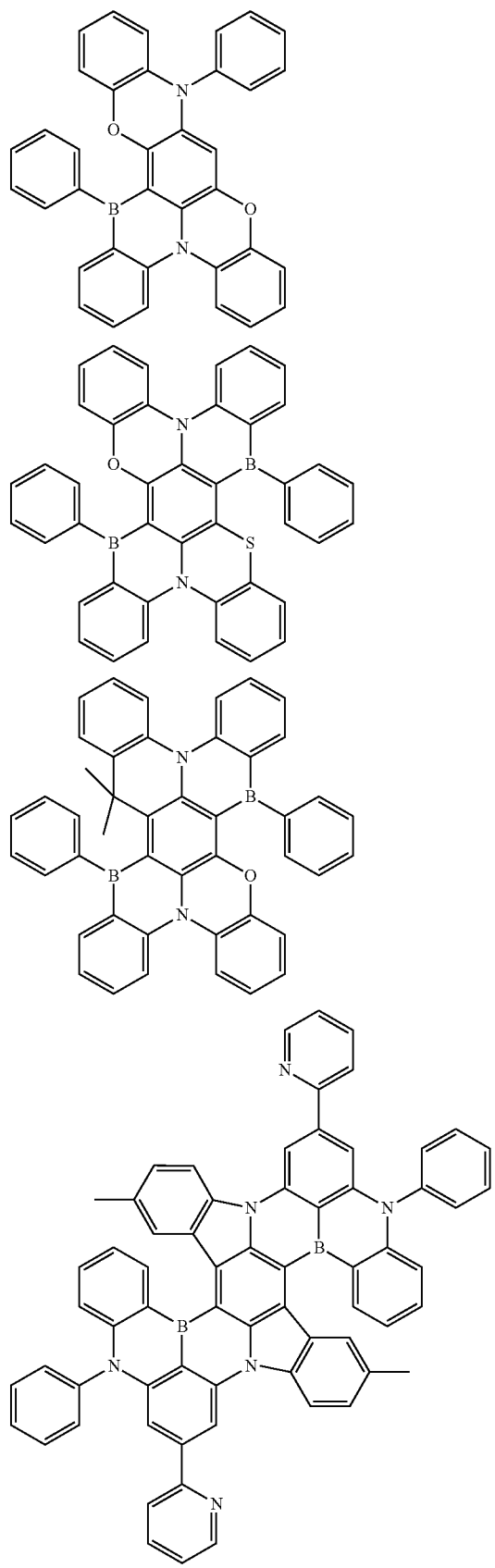

-continued

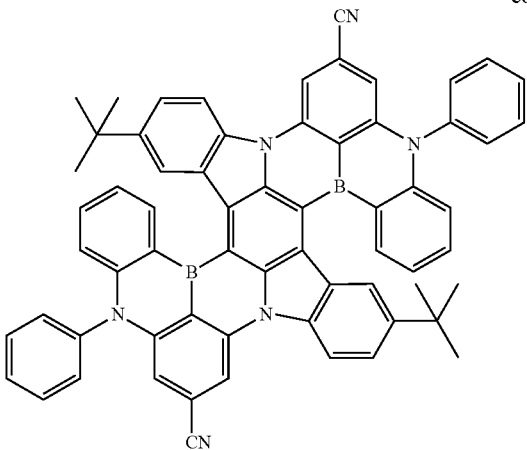

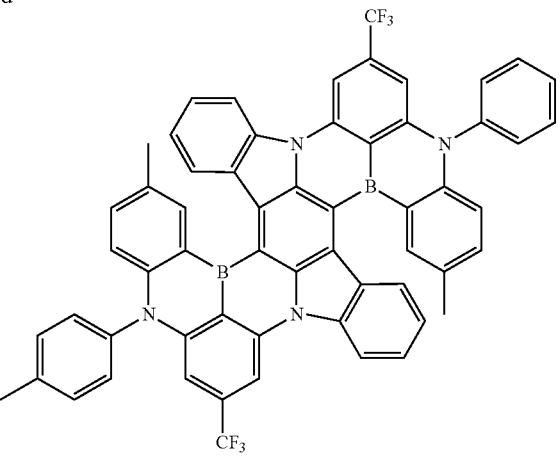

Second Compound

In the organic EL device of the exemplary embodiment, the second compound is a thermally activated delayed fluorescent compound.

Herein, thermally activated delayed fluorescence may be referred to as delayed fluorescence.

In the organic EL device of the exemplary embodiment, the second compound is preferably a compound represented by a formula (H1) below.

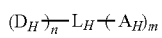
(H1)

In the formula (H1):

$A_H$ is a group having at least one partial structure selected from the group consisting of formulae (a-1), (a-2), (a-3), (a-4), (a-5), (a-6), (a-7), and (a-8) below;

$D_H$ is a group represented by a formula (11), (12), or (13) below;

$L_H$ is a single bond, a substituted or unsubstituted aryl ring having 6 to 50 ring carbon atoms, or a substituted or unsubstituted heterocycle having 5 to 50 ring atoms;

m is 1, 2, 3, 4, or 5, and a plurality of $A_H$ are mutually the same or different; and n is 1, 2, 3, 4, or 5, and a plurality of $D_H$ are mutually the same or different.

(a-1)

*—C≡N
(a-2)

(a-3)

(a-4)

(a-5)

(a-6)

(a-7)

(a-8)

In the formulae (a-1) to (a-8), each * independently represents a bonding position to another atom in a molecule of the second compound.

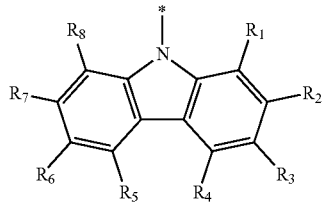
(11)

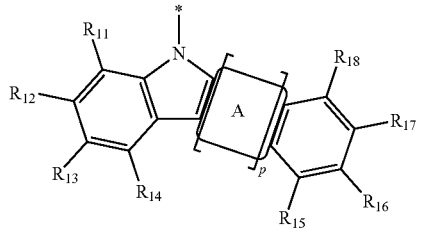
(12)

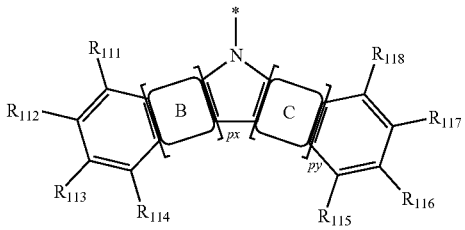
(13)

At least one combination of adjacent two or more of $R_1$ to $R_8$ in the formula (11) are mutually bonded to form a substituted or unsubstituted monocyclic ring, mutually bonded to form a substituted or unsubstituted fused ring, or not mutually bonded;
- at least one combination of adjacent two or more of $R_{11}$ to $R_{18}$ in the formula (12) are mutually bonded to form a substituted or unsubstituted monocyclic ring, mutually bonded to form a substituted or unsubstituted fused ring, or not mutually bonded;
- at least one combination of adjacent two or more of $R_{111}$ to $R_{118}$ in the formula (13) are mutually bonded to form a substituted or unsubstituted monocyclic ring, mutually bonded to form a substituted or unsubstituted fused ring, or not mutually bonded;
- $R_1$ to $R_8$ that form neither a substituted or unsubstituted monocyclic ring nor a substituted or unsubstituted fused ring in the formula (11), $R_{11}$ to $R_{18}$ that form neither a substituted or unsubstituted monocyclic ring nor a substituted or unsubstituted fused ring in the formula (12), and
- $R_{111}$ to $R_{113}$ that form neither a substituted or unsubstituted monocyclic ring nor a substituted or unsubstituted fused ring in the formula (13) are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si$(R_{901})(R_{902})(R_{903})$, a group represented by —O—$(R_{904})$, a group represented by —S—$(R_{905})$, a group represented by —N$(R_{903})(R_{907})$, a substituted or unsubstituted aralkyl group having 7 to 50 carbon atoms, a group represented by —C(=O)$R_{908}$, a group represented by —COO$R_{909}$, a halogen atom, a cyano group, a nitro group, a group represented by —P(=O)$(R_{931})(R_{932})$, a group represented by —Ge$(R_{933})(R_{934})$$(R_{935})$, a group represented by —B$(R_{936})(R_{937})$, a substituted or unsubstituted aryl group having 6 to 50 ring carbon atoms, or a substituted or unsubstituted heterocyclic group having 5 to 50 ring atoms.

In the formulae (12) and (13),
a ring A, ring B, and ring C are each independently a cyclic structure selected from the group consisting of cyclic structures represented by formulae (14) and (15) below,
the ring A, ring B, and ring C are fused with an adjacent ring at any position;
p, px, and py are each independently 1, 2, 3, or 4,
when p is 2, 3, or 4, a plurality of rings A are mutually the same or different,
when px is 2, 3, or 4, a plurality of rings B are mutually the same or different,
when py is 2, 3, or 4, a plurality of rings C are mutually the same or different; and
* in the formulae (11) to (13) represents a bonding position to $L_H$.

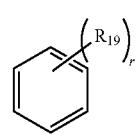
(14)

(15)

In the formula (14):
r is 0, 2, or 4;
a combination of a plurality of $R_1$ are mutually bonded to form a substituted or unsubstituted monocyclic ring, mutually bonded to form a substituted or unsubstituted fused ring, or not mutually bonded; and
in the formula (15), $X_1$ is a sulfur atom, an oxygen atom, or $C(R_{191})(R_{192})$,
a combination of $R_{191}$ and $R_{192}$ are mutually bonded to form a substituted or unsubstituted monocyclic ring, mutually bonded to form a substituted or unsubstituted fused ring, or not mutually bonded; and
$R_{19}$, $R_{191}$, and $R_{192}$ that form neither a substituted or unsubstituted monocyclic ring nor a substituted or unsubstituted fused ring are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si$(R_{901})(R_{902})(R_{903})$, a group represented by —O—$(R_{904})$, a group represented by —S—$(R_{905})$, a group represented by —N$(R_{906})(R_{907})$, a substituted or unsubstituted aralkyl group having 7 to 50 carbon atoms, a group represented by —C(=O)$R_{908}$, a group represented by —COO$R_{909}$, a halogen atom, a cyano group, a nitro group, a group represented by —P(=O)$(R_{931})(R_{932})$, a group represented by —Ge$(R_{933})(R_{934})$$(R_{935})$, a group represented by —B$(R_{936})(R_{937})$, a substituted or unsubstituted aryl group having 6 to 50 ring carbon atoms, or a substituted or unsubstituted heterocyclic group having 5 to 50 ring atoms,
a plurality of $R_{19}$ are mutually the same or different,
a plurality of $R_{191}$ are mutually the same or different,
a plurality of $R_{192}$ are mutually the same or different, and
a plurality of $X_1$ are mutually the same or different.

In the second compound, $R_{901}$, $R_{902}$, $R_{903}$, $R_{904}$, $R_{905}$, $R_{906}$, $R_{907}$, $R_{908}$, $R_{909}$, $R_{931}$, $R_{932}$, $R_{933}$, $R_{934}$, $R_{935}$, $R_{936}$, and $R_{937}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms, when a plurality of $R_{901}$ are present, the plurality of $R_{901}$ are mutually the same or different,
when a plurality of $R_{902}$ are present, the plurality of $R_{902}$ are mutually the same or different,
when a plurality of $R_{903}$ are present, the plurality of $R_{903}$ are mutually the same or different,
when a plurality of $R_{904}$ are present, the plurality of $R_{904}$ are mutually the same or different,
when a plurality of $R_{905}$ are present, the plurality of $R_{905}$ are mutually the same or different,
when a plurality of $R_{906}$ are present, the plurality of $R_{906}$ are mutually the same or different,
when a plurality of $R_{907}$ are present, the plurality of $R_{907}$ are mutually the same or different,
when a plurality of $R_{908}$ are present, the plurality of $R_{908}$ are mutually the same or different,
when a plurality of $R_{909}$ are present, the plurality of $R_{909}$ are mutually the same or different,
when a plurality of $R_{931}$ are present, the plurality of $R_{931}$ are mutually the same or different,
when a plurality of $R_{932}$ are present, the plurality of $R_{932}$ are mutually the same or different,
when a plurality of $R_{933}$ are present, the plurality of $R_{933}$ are mutually the same or different,
when a plurality of $R_{934}$ are present, the plurality of $R_{934}$ are mutually the same or different,
when a plurality of $R_{935}$ are present, the plurality of $R_{935}$ are mutually the same or different,
when a plurality of $R_{936}$ are present, the plurality of $R_{936}$ are mutually the same or different, and
when a plurality of $R_{937}$ are present, the plurality of $R_{937}$ are mutually the same or different.

In the organic EL device of the exemplary embodiment, $A_H$ is preferably a group having a partial structure represented by the formula (a-2).

In the organic EL device of the exemplary embodiment, $A_H$ is preferably a group having a partial structure represented by the formula (a-2), and * in the formula (a-2) is preferably a bonding position to $L_H$.

More specifically, $A_H$ is preferably a cyano group.

In the organic EL device of the exemplary embodiment, the second compound is preferably a compound represented by a formula (H10) below.

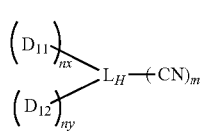

(H10)

In the formula (H10):
CN is a cyano group;
$L_H$ is a substituted or unsubstituted aromatic hydrocarbon ring having 6 to 30 ring carbon atoms;
$D_{11}$ and $D_{12}$ are each independently a group represented by the formula (11), (12), or (13);
m is 1, 2, 3, 4, or 5;
nx is 0, 1, 2, 3, 4, or 5;
ny is 0, 1, 2, 3, 4, or 5;
nx+ny is 1, 2, 3, 4, or 5;
$D_{11}$ and $D_{12}$ are mutually the same or different;
a plurality of $D_{11}$ are mutually the same or different; and
a plurality of $D_{12}$ are mutually the same or different.

In the organic EL device of the exemplary embodiment, the second compound is preferably a compound represented by a formula (H100) below.

(H100)

In the formula (H100), $L_H$, $D_{11}$, $D_{12}$, m, nx, and ny represent the same as $L_H$, $D_{11}$, $D_{12}$, m, nx, and ny, respectively, in the formula (H10);
each R is independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N(Res)($R_{907}$), a substituted or unsubstituted aralkyl group having 7 to 50 carbon atoms, a group represented by —C(=O)$R_{908}$, a group represented by —COO$R_{909}$, a cyano group, a nitro group, a group represented by —P(=O)($R_{931}$)($R_{932}$), a group represented by —Ge($R_{933}$)($R_{934}$)($R_{935}$), a group represented by —B($R_{936}$)($R_{937}$), a substituted or unsubstituted aryl group having 6 to 50 ring carbon atoms, or a substituted or unsubstituted heterocyclic group having 5 to 50 ring atoms;
at least one R is a substituent, and the at least one R serving as the substituent is bonded to $L_H$ of a compound represented by the formula (H100) by a carbon-carbon bond;
k is an integer of 1 or more; and
a plurality of R are mutually the same or different.

In the organic EL device of the exemplary embodiment, the second compound is preferably a compound represented by a formula (H101) below.

(H101)

In the formula (H101):
$D_{11}$ and $D_{12}$ represent the same as $D_{11}$ and $D_{12}$, respectively, in the formula (H10);
each R independently represents the same as R in the formula (H100);
m is 1, 2, 3 or 4;
nx is 0, 1, 2, 3, or 4;
ny is 0, 1, 2, 3, or 4;
k is 1, 2, 3, or 4;
nx+ny is 1, 2, 3, or 4; and
m+nx+ny+k=6.

In the organic EL device of the exemplary embodiment, the second compound is preferably a compound represented by a formula (H110), (H120), or (H130) below.

(H110)

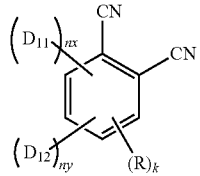

(H120)

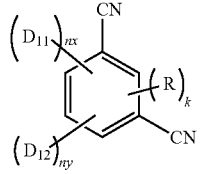

(H130)

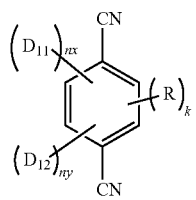

In the formulae (H110), (H120), and (H130):

$D_{11}$ and $D_{12}$ represent the same as $D_{11}$ and $D_{12}$, respectively, in the formula (H10);

each R independently represents the same as R in the formula (H100);

nx is 0, 1, 2, or 3;

ny is 0, 1, 2, or 3;

k is 1, 2, or 3;

nx+ny is 1, 2, or 3; and nx+ny+k=4.

In the organic EL device of the exemplary embodiment, the group represented by the formula (12) in the second compound is preferably a group selected from the group consisting of groups represented by formulae (12A), (12B), (12C), (12D), (12E), and (12F) below.

(12A)

(12B)

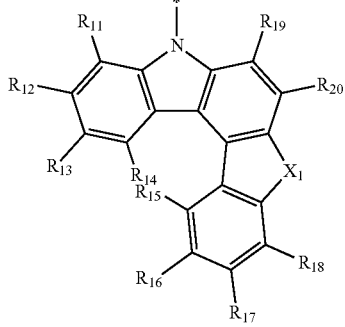

(12C)

(12D)

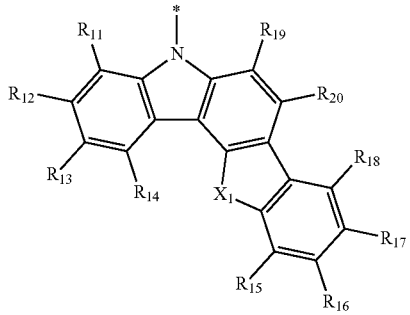

(12E)

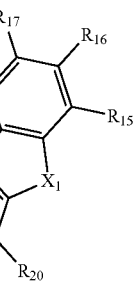

(12F)

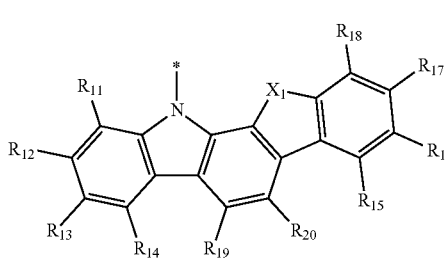

In the formulae (12A), (12B), (12C), (12D), (12E), and (12F):

$R_{11}$ to $R_{18}$ represent the same as $R_{11}$ to $R_{18}$, respectively, in the formula (12);

$R_{19}$ and $R_{20}$ each independently represent the same as $R_{19}$ in the formula (14);

$X_1$ represents the same as $X_1$ in the formula (15); and

* in the formulae (12A), (12B), (12C), (12D), (12E), and (12F) represents a bonding position.

In the organic EL device according to the exemplary embodiment, when the second compound is a compound represented by the formula (H101), * in the formulae (12A), (12B), (12C), (12D), (12E), and (12F) is bonded to the benzene ring itself that is explicitly shown in the formula (H101).

In the second compound of this exemplary embodiment, it is also preferable that $X_1$ is a sulfur atom or an oxygen atom.

In the second compound of this exemplary embodiment, when $X_1$ is $C(R_{191})(R_{192})$, $R_{191}$ and $R_{192}$ are each independently preferably a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms, more preferably a substituted or unsubstituted alkyl group having 1 to 50 carbon atoms, or a substituted or unsubstituted aryl group having 6 to 50 ring carbon atoms.

In the second compound of the exemplary embodiment, it is also preferable that none of combinations of adjacent two or more of $R_1$ to $R_8$ are not mutually bonded.

In the second compound of the exemplary embodiment, it is also preferable that none of combinations of adjacent two or more of $R_{11}$ to $R_{18}$ are not mutually bonded.

In the second compound of the exemplary embodiment, it is also preferable that none of combinations of adjacent two or more of $R_{111}$ to $R_{118}$ are not mutually bonded.

Each R in the second compound of the exemplary embodiment is preferably independently a hydrogen atom, a substituted or unsubstituted alkyl group having 1 to 20 carbon atoms, a substituted or unsubstituted aryl group having 6 to 30 ring carbon atoms, or a substituted or unsubstituted heterocyclic group having 5 to 30 ring atoms.

Each R in the second compound of the exemplary embodiment is preferably independently a hydrogen atom, a substituted or unsubstituted alkyl group having 1 to 6 carbon atoms, a substituted or unsubstituted aryl group having 6 to 18 ring carbon atoms, or a substituted or unsubstituted heterocyclic group having 5 to 18 ring atoms.

$R_1$ to $R_8$, $R_{11}$ to $R_{18}$, $R_{111}$ to $R_{118}$, and $R_{19}$ in the second compound of the exemplary embodiment are preferably each independently a hydrogen atom, a substituted or unsubstituted alkyl group having 1 to 20 carbon atoms, a substituted or unsubstituted aryl group having 6 to 30 ring carbon atoms, or a substituted or unsubstituted heterocyclic group having 5 to 30 ring atoms.

$R_1$ to $R_8$, $R_{11}$ to $R_{18}$, $R_{111}$ to $R_{118}$, and $R_{19}$ in the second compound of the exemplary embodiment are preferably each independently a hydrogen atom, a substituted or unsubstituted alkyl group having 1 to 6 carbon atoms, a substituted or unsubstituted aryl group having 6 to 18 ring carbon atoms, or a substituted or unsubstituted heterocyclic group having 5 to 18 ring atoms.

Each R in the second compound of the exemplary embodiment is preferably independently a hydrogen atom, a substituted or unsubstituted alkyl group having 1 to 20 carbon atoms, a substituted or unsubstituted aryl group having 6 to 30 ring carbon atoms, or a substituted or unsubstituted heterocyclic group having 5 to 30 ring atoms, and $R_1$ to $R_8$, $R_{11}$ to $R_{18}$, $R_{111}$ to $R_{118}$, and $R_{19}$ in the second compound of the exemplary embodiment are preferably each independently a hydrogen atom, a substituted or unsubstituted alkyl group having 1 to 20 carbon atoms, a substituted or unsubstituted aryl group having 6 to 30 ring carbon atoms, or a substituted or unsubstituted heterocyclic group having 5 to ring atoms.

Each R in the second compound of the exemplary embodiment is preferably independently a hydrogen atom, a substituted or unsubstituted alkyl group having 1 to 6 carbon atoms, a substituted or unsubstituted aryl group having 6 to 18 ring carbon atoms, or a substituted or unsubstituted heterocyclic group having 5 to 18 ring atoms.

$R_1$ to $R_8$, $R_{11}$ to $R_{18}$, $R_{111}$ to $R_{118}$, and $R_{19}$ in the second compound of the exemplary embodiment are preferably each independently a hydrogen atom, a substituted or unsubstituted alkyl group having 1 to 6 carbon atoms, a substituted or unsubstituted aryl group having 6 to 18 ring carbon atoms, or a substituted or unsubstituted heterocyclic group having 5 to 18 ring atoms.

In the compound according to the exemplary embodiment, the substituent for the substituted or unsubstituted group is preferably an unsubstituted alkyl group having 1 to 25 carbon atoms, an unsubstituted alkenyl group having 2 to 25 carbon atoms, an unsubstituted alkynyl group having 2 to 25 carbon atoms, an unsubstituted cycloalkyl group having 3 to 25 ring carbon atoms, a group represented by —Si$(R_{901})(R_{902})(R_{903})$, a group represented by —O—$(R_{904})$, a group represented by —S—$(R_{905})$, a group represented by —N$(R_{906})(R_{907})$, an unsubstituted aralkyl group having 7 to 50 carbon atoms, a group represented by —C(=O)$R_{908}$, a group represented by —COO$R_{909}$, a group represented by —P(=O)$(Rg_{31})(R_{932})$, a group represented by —Ge$(R_{933})(R_{934})(R_{935})$, a group represented by —B$(R_{936})(R_{937})$, a group represented by —S(=O)$_2R_{938}$, a halogen atom, a cyano group, a nitro group, an unsubstituted aryl group having 6 to ring carbon atoms, or an unsubstituted heterocyclic group having 5 to 25 ring atoms;

where $R_{901}$ to $R_{909}$ and $R_{931}$ to $R_{938}$ are preferably each independently a hydrogen atom, an unsubstituted alkyl group having 1 to 25 carbon atoms, an unsubstituted aryl group having 6 to 25 ring carbon atoms, or an unsubstituted heterocyclic group having 5 to 25 ring atoms.

In the compound according to the exemplary embodiment, the substituent for the substituted or unsubstituted group is preferably a halogen atom, an unsubstituted alkyl group having 1 to 25 carbon atoms, an unsubstituted aryl group having 6 to 25 ring carbon atoms, or an unsubstituted heterocyclic group having 5 to 25 ring atoms.

In the compound according to the exemplary embodiment, the substituent for the "substituted or unsubstituted" group is preferably an unsubstituted alkyl group having 1 to 10 carbon atoms, an unsubstituted aryl group having 6 to 12 ring carbon atoms, or an unsubstituted heterocyclic group having 5 to 12 ring atoms.

In the second compound according to the exemplary embodiment, it is also preferable that each of the groups mentioned as "substituted or unsubstituted" group is an "unsubstituted" group.

Herein, the group represented by —O—$(R_{904})$ is a hydroxy group when $R_{904}$ is a hydrogen atom.

Herein, the group represented by —S—$(R_{905})$ is a thiol group when $R_{903}$ is a hydrogen atom.

Herein, the group represented by —P(=O)$(R_{931})(R_{932})$ is a substituted phosphine oxide group when $R_{931}$ and $R_{932}$ are substituents, and is an arylphosphoryl group when $R_{931}$ and $R_{932}$ are aryl groups.

Herein, the group represented by —Ge$(R_{933})(R_{934})(R_{935})$ is a substituted germanium group when $R_{933}$, $R_{934}$, and $R_{935}$ are substituents.

Herein, the group represented by —B$(R_{936})(R_{937})$ is a substituted boryl group when $R_{936}$ and $R_{937}$ are substituents.

Delayed Fluorescence

Delayed fluorescence is explained in "Yuki Hando-tai no Debaisu Bussei (Device Physics of Organic Semiconductors)" (edited by ADACHI, Chihaya, published by Kodansha, on pages 261-268).

This document describes that, if an energy difference $\Delta E_{13}$ between a singlet state and a triplet state of a fluorescent material can be reduced, a reverse energy transfer from the triplet state to the singlet state, which usually occurs at a low transition probability, would occur at high efficiency to exhibit thermally activated delayed fluorescence (TADF).

Further, a generation mechanism of delayed fluorescence is explained in FIG. 10.38 in the document.

The second compound according to the exemplary embodiment is preferably a compound that exhibits thermally activated delayed fluorescence generated by such a mechanism.

In general, emission of delayed fluorescence can be confirmed by measuring the transient PL (Photoluminescence).

The behavior of delayed fluorescence can also be analyzed based on the decay curve obtained from the transient PL measurement.

The transient PL measurement is a method of irradiating a sample with a pulse laser to excite the sample, and measuring the decay behavior (transient characteristics) of PL emission after the irradiation is stopped.

PL emission in TADF materials is classified into a light emission component from a singlet exciton generated by the first PL excitation and a light emission component from a singlet exciton generated via a triplet exciton.

The lifetime of the singlet exciton generated by the first PL excitation is on the order of nanoseconds and is very short.

Therefore, light emission from the singlet exciton rapidly attenuates after irradiation with the pulse laser.

On the other hand, the delayed fluorescence is gradually attenuated due to light emission from a singlet exciton generated via a triplet exciton having a long lifetime.

As described above, there is a large temporal difference between the light emission from the singlet exciton generated by the first PL excitation and the light emission from the singlet exciton generated via the triplet exciton.

Therefore, the luminous intensity derived from delayed fluorescence can be determined.

Figure 2:
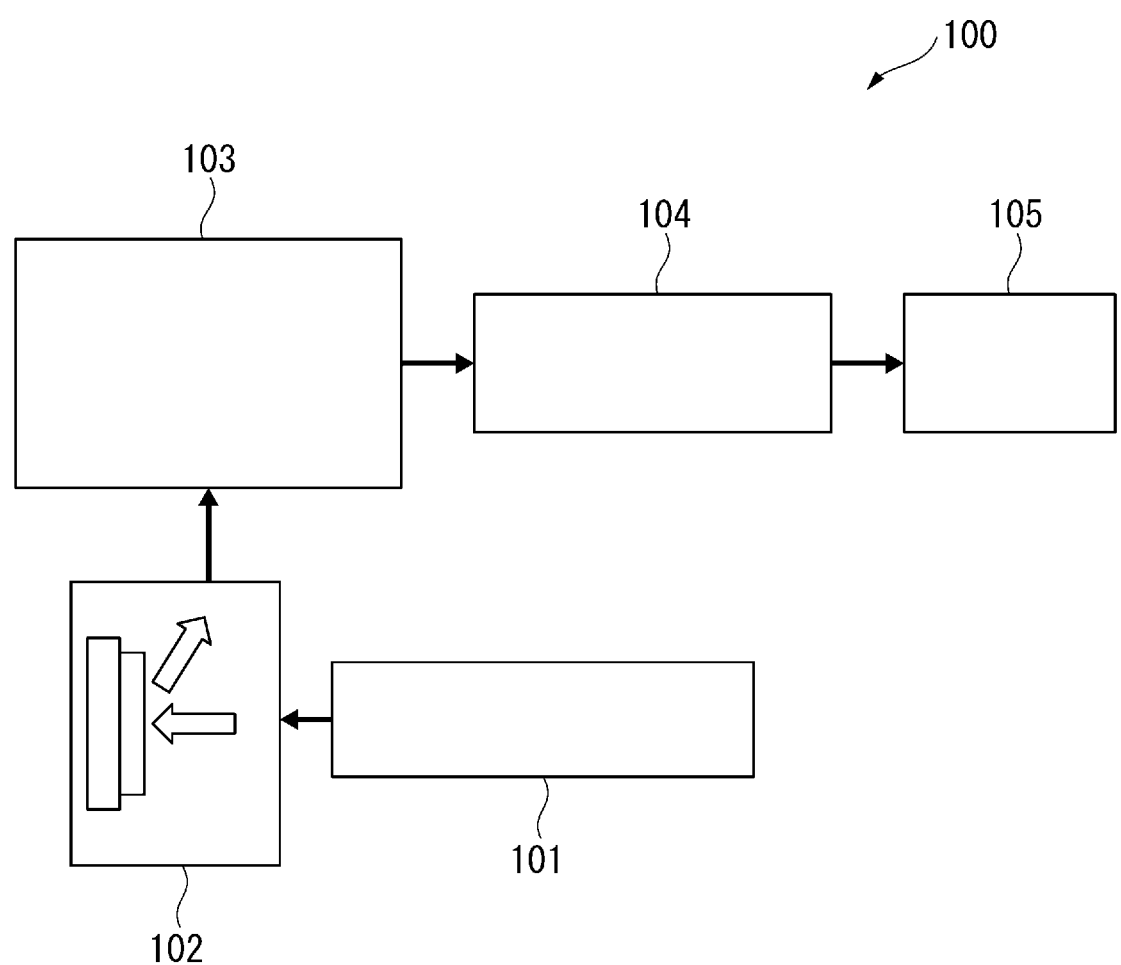
FIG. 2 is a schematic diagram of an apparatus for measuring transient PL.

FIG. 2 is a schematic diagram of an exemplary device for measuring the transient PL.

An example of a method of measuring a transient PL using FIG. 2 and an example of behavior analysis of delayed fluorescence will be described.

A transient PL measuring device 100 in FIG. 2 includes: a pulse laser 101 capable of radiating a light having a predetermined wavelength; a sample chamber 102 configured to house a measurement sample; a spectrometer 103 configured to divide a light radiated from the measurement sample: a streak camera 104 configured to provide a two-dimensional image; and a personal computer 105 configured to import and analyze the two-dimensional image.

A device for measuring the transient PL is not limited to the device shown in FIG. 2

The sample housed in the sample chamber 102 is obtained by forming a thin film, in which a matrix material is doped with a doping material at a concentration of 12 mass %, on the quartz substrate.

The thin film sample housed in the sample chamber 102 is irradiated with the pulse laser from the pulse laser 101 to excite the doping material.

Emission is extracted in a direction of 90 degrees with respect to a radiation direction of the excited light. The extracted emission is divided by the spectrometer 103 to form a two-dimensional image in the streak camera 104.

As a result, the two-dimensional image is obtainable in which the ordinate axis represents a time, the abscissa axis represents a wavelength, and a bright spot represents a luminous intensity.

When this two-dimensional image is taken out at a predetermined time axis, an emission spectrum in which the ordinate axis represents the luminous intensity and the abscissa axis represents the wavelength is obtainable.

Moreover, when this two-dimensional image is taken out at the wavelength axis, a decay curve (transient PL) in which the ordinate axis represents a logarithm of the luminous intensity and the abscissa axis represents the time is obtainable.

For instance, a thin film sample A was prepared as described above using a compound HX1 below as the matrix material and a compound DX1 below as the doping material and subjected to the transient PL measurement.

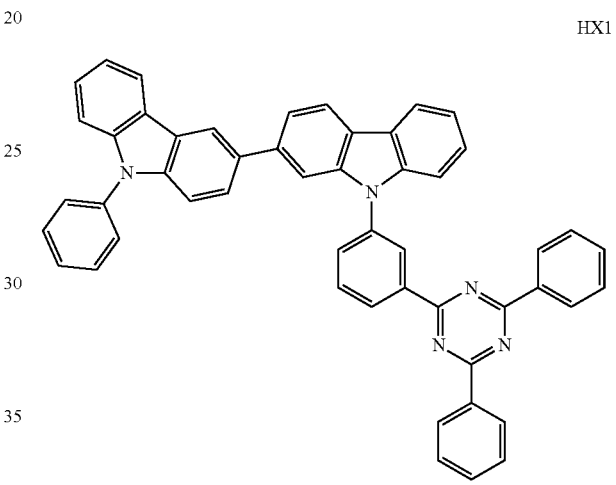

HX1

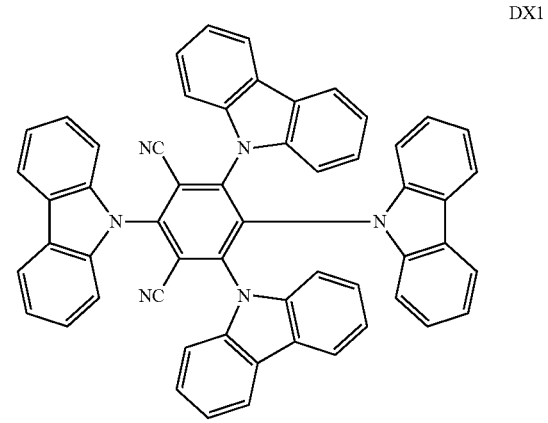

DX1

The decay curve was analyzed with respect to the above thin film sample A and a thin film sample B.

The thin film sample B was prepared as described above using a compound HX2 below as the matrix material and the compound DX1 as the doping material.

Figure 3:
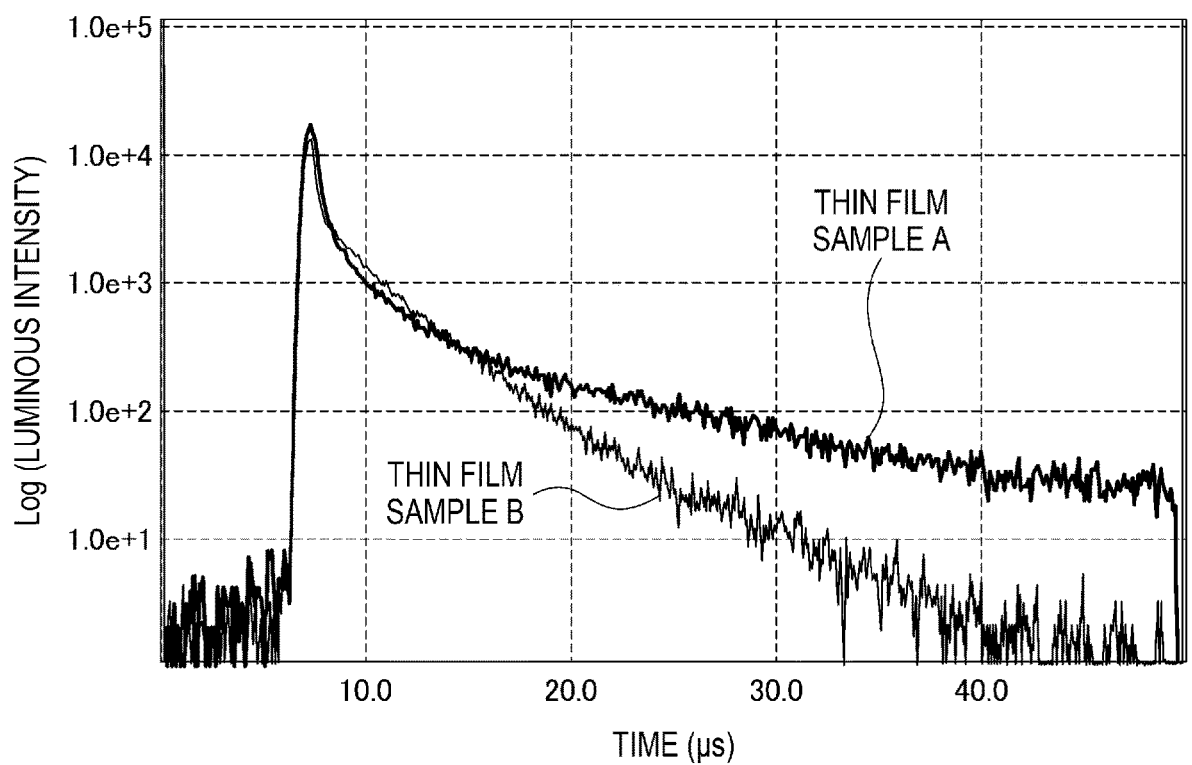
FIG. 3 is a graph showing an example of decay curves of transient PL.

FIG. 3 shows decay curves obtained from transient PL obtained by measuring the thin film samples A and B.

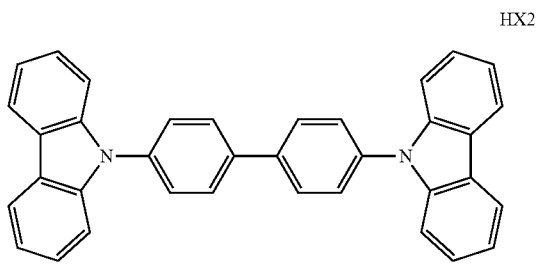 [SMILES: c1ccc2c(c1)c1ccccc1n2-c1ccc(-c2ccc(-n3c4ccccc4c4ccccc43)cc2)cc1]
HX2

As described above, an emission decay curve in which the ordinate axis represents the luminous intensity and the abscissa axis represents the time can be obtained by the transient PL measurement.

Based on the emission decay curve, a fluorescence intensity ratio between fluorescence emitted from a singlet state generated by photo-excitation and delayed fluorescence emitted from a singlet state generated by reverse energy transfer via a triplet state can be estimated.

In a delayed fluorescent material, a ratio of the intensity of the slowly decaying delayed fluorescence to the intensity of the promptly decaying fluorescence is relatively large.

Specifically, Prompt emission and Delay emission are present as emission from the delayed fluorescent material.

Prompt emission is observed promptly when the excited state is achieved by exciting the compound of the exemplary embodiment with a pulse beam (i.e., a beam emitted from a pulse laser) having a wavelength absorbable by the delayed fluorescent material.

Delay emission is observed not promptly when the excited state is achieved but after the excited state is achieved.

An amount of Prompt emission, an amount of Delay emission, and a ratio between the amounts thereof can be determined according to the method as described in "Nature 492, 234-238, 2012" (Reference Literature 1).

The amount of Prompt emission and the amount of Delay emission may be calculated using a device different from one described in Reference Literature 1 or one shown in FIG. 2

A sample prepared by a method described below is used for measuring delayed fluorescence of the second compound according to the exemplary embodiment.

For instance, the second compound according to the exemplary embodiment is dissolved in toluene to prepare a dilute solution with an absorbance of 0.05 or less at the excitation wavelength to eliminate the contribution of self-absorption.

In order to prevent quenching due to oxygen, the sample solution is frozen and degassed and then sealed in a cell with a lid under an argon atmosphere to obtain an oxygen-free sample solution saturated with argon.

The fluorescence spectrum of the sample solution is measured with a spectrofluorometer FP-8600 (produced by JASCO Corporation), and the fluorescence spectrum of a 9,10-diphenylanthracene ethanol solution is measured under the same conditions.

Using the fluorescence area intensities of both spectra, the total fluorescence quantum yield is calculated by an equation (1) in Morris et al. J. Phys. Chem. 80 (1976) 969.

In the exemplary embodiment, provided that the amount of Prompt emission of a measurement target compound is denoted by $X_P$ and the amount of Delay emission is denoted by $X_D$, a value of $X_D/X_P$ is preferably 0.05 or more.

The amount of Prompt emission, the amount of Delay emission, and the ratio between the amounts thereof in compounds other than the second compound according to the exemplary embodiment herein are also measured in the same manner as the amount of Prompt emission, the amount of Delay emission, and the ratio in the second compound according to the exemplary embodiment.

ΔST

In the exemplary embodiment, a difference $(S_1-T_{77K})$ between a lowest singlet energy $S_1$ and an energy gap $T_{77K}$ at 77K is defined as ΔST.

A difference ΔST(M2) between the lowest singlet energy $S_1(M2)$ of the second compound according to the exemplary embodiment and the energy gap $T_{77K}(M2)$ at 77K of the second compound according to the exemplary embodiment is preferably less than 0.3 eV, more preferably less than 0.2 eV, still more preferably less than 0.1 eV, and still further more preferably less than 0.01 eV.

That is, ΔST(M2) preferably satisfies a relationship of a numerical formula (Numerical Formula 10), (Numerical Formula 11), (Numerical Formula 12), or (Numerical Formula 13) below.

$$\Delta ST(M2)=S_1(M2)-T_{77K}(M2)<0.3 \text{ eV} \quad \text{(Numerical Formula 10):}$$

$$\Delta ST(M2)=S_1(M2)-T_{77K}(M2)<0.2 \text{ eV} \quad \text{(Numerical Formula 11):}$$

$$\Delta ST(M2)=S_1(M2)-T_{77K}(M2)<0.1 \text{ eV} \quad \text{(Numerical Formula 12):}$$

$$\Delta ST(M2)=S_1(M2)-T_{77K}(M2)<0.01 \text{ eV} \quad \text{(Numerical Formula 13):}$$

Relationship between Triplet Energy and Energy Gap at 77K

Here, a relationship between a triplet energy and an energy gap at 77K will be described. In the exemplary embodiment, the energy gap at 77K is different from a typical triplet energy in some aspects.

The triplet energy is measured as follows. First, a solution in which a compound (measurement target) is dissolved in an appropriate solvent is encapsulated in a quartz glass tube to prepare a sample. A phosphorescence spectrum (ordinate axis: phosphorescent luminous intensity, abscissa axis: wavelength) of this sample is measured at a low temperature (77K). A tangent is drawn to the rise of the phosphorescence spectrum close to the short-wavelength region. The triplet energy is calculated by a predetermined conversion equation on a basis of a wavelength value at an intersection of the tangent and the abscissa axis.

Here, the thermally activated delayed fluorescent compound among the compounds according to the exemplary embodiment is preferably a compound having a small ΔST. When ΔST is small, intersystem crossing and inverse intersystem crossing are likely to occur even at a low temperature (77K), so that the singlet state and the triplet state coexist. As a result, the spectrum to be measured in the same manner as the above includes emission from both the singlet state and the triplet state. Although it is difficult to distinguish from which state, the singlet state or the triplet state, light is emitted, the value of the triplet energy is basically considered dominant.

Accordingly, in the exemplary embodiment, the triplet energy is measured by the same method as a typical triplet energy T, but a value measured in the following manner is referred to as an energy gap $T_{77K}$ in order to differentiate the measured energy from the typical triplet energy in a strict meaning.

The measurement target compound is dissolved in EPA (diethylether:isopentane:ethanol=5:5:2 in volume ratio) at a concentration of 10 μmol/L, and the obtained solution is put in a quartz cell to provide a measurement sample.

A phosphorescence spectrum (ordinate axis: phosphorescent luminous intensity, abscissa axis: wavelength) of this measurement sample is measured at a low temperature (77K).

A tangent is drawn to the rise of the phosphorescence spectrum close to the short-wavelength region. An amount of energy is calculated by a conversion equation (F1) below on a basis of a wavelength value $\lambda_{edge}$ [nm] at an intersection of the tangent and the abscissa axis. The calculated amount of energy is defined as the energy gap $T_{77K}$ at 77K.

$$T_{77K}[eV]=1239.85/\lambda_{edge} \qquad \text{Conversion Equation (F1):}$$

The tangent to the rise of the phosphorescence spectrum close to the short-wavelength region is drawn as follows. While moving on a curve of the phosphorescence spectrum from the short-wavelength region to the local maximum value closest to the short-wavelength region among the local maximum values of the phosphorescence spectrum, a tangent is checked at each point on the curve toward the long-wavelength of the phosphorescence spectrum. An inclination of the tangent is increased along the rise of the curve (i.e., a value of the ordinate axis is increased).

A tangent drawn at a point of the local maximum inclination (i.e., a tangent at an inflection point) is defined as the tangent to the rise of the phosphorescence spectrum close to the short-wavelength region.

A local maximum point where a peak intensity is 15% or less of the maximum peak intensity of the spectrum is not counted as the above-mentioned local maximum peak intensity closest to the short-wavelength region. The tangent drawn at a point that is closest to the local maximum peak intensity closest to the short-wavelength region and where the inclination of the curve is the local maximum is defined as a tangent to the rise of the phosphorescence spectrum close to the short-wavelength region.

For phosphorescence measurement, a spectrophotofluorometer body F-4500 produced by Hitachi High-Technologies Corporation is usable. Any apparatus for phosphorescence measurement is usable. A combination of a cooling unit, a low temperature container, an excitation light source and a light-receiving unit may be used for phosphorescence measurement.

Lowest Singlet Energy $S_1$

A method of measuring the lowest singlet energy $S_1$ with use of a solution (occasionally referred to as a solution method) is exemplified by a method below.

A toluene solution of a measurement target compound at a concentration of 10 μmol/L is prepared and put in a quartz cell. An absorption spectrum (ordinate axis: absorption intensity, abscissa axis: wavelength) of the thus-obtained sample is measured at a normal temperature (300K).

A tangent is drawn to the fall of the absorption spectrum close to the long-wavelength region, and a wavelength value $\lambda_{edge}$ [nm] at an intersection of the tangent and the abscissa axis is substituted into a conversion equation (F2) below to calculate the lowest singlet energy.

$$S_1[eV]=1239.85/\lambda_{edge} \qquad \text{Conversion Equation (F2):}$$

Any apparatus for measuring an absorption spectrum is usable. For instance, a spectrophotometer produced by Hitachi, Ltd. (apparatus name: U3310) is usable. The tangent to the fall of the absorption spectrum close to the long-wavelength region is drawn as follows. While moving on a curve of the absorption spectrum from the local maximum value closest to the long-wavelength region, among the local maximum values of the absorption spectrum, in a long-wavelength direction, a tangent at each point on the curve is checked. An inclination of the tangent is decreased and increased in a repeated manner as the curve falls (i.e., a value of the ordinate axis is decreased). A tangent drawn at a point where the inclination of the curve is the local minimum closest to the long-wavelength region (except when absorbance is 0.1 or less) is defined as the tangent to the fall of the absorption spectrum close to the long-wavelength region.

The local maximum absorbance of 0.2 or less is not counted as the above-mentioned local maximum absorbance closest to the long-wavelength region.

Method of Producing Second Compound

The second compound can be produced by a known method. The second compound can also be produced based on a known method through a known alternative reaction using a known material(s) tailored for the target compound.

Specific Examples of Second Compound

Specific examples of the second compound include the following compounds.

However, the invention is not limited to these specific examples

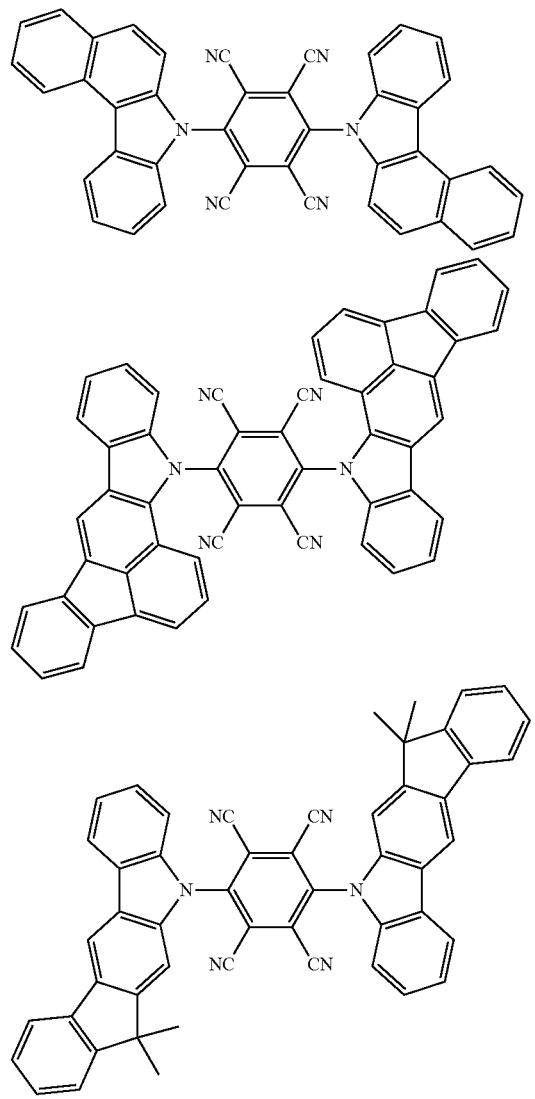

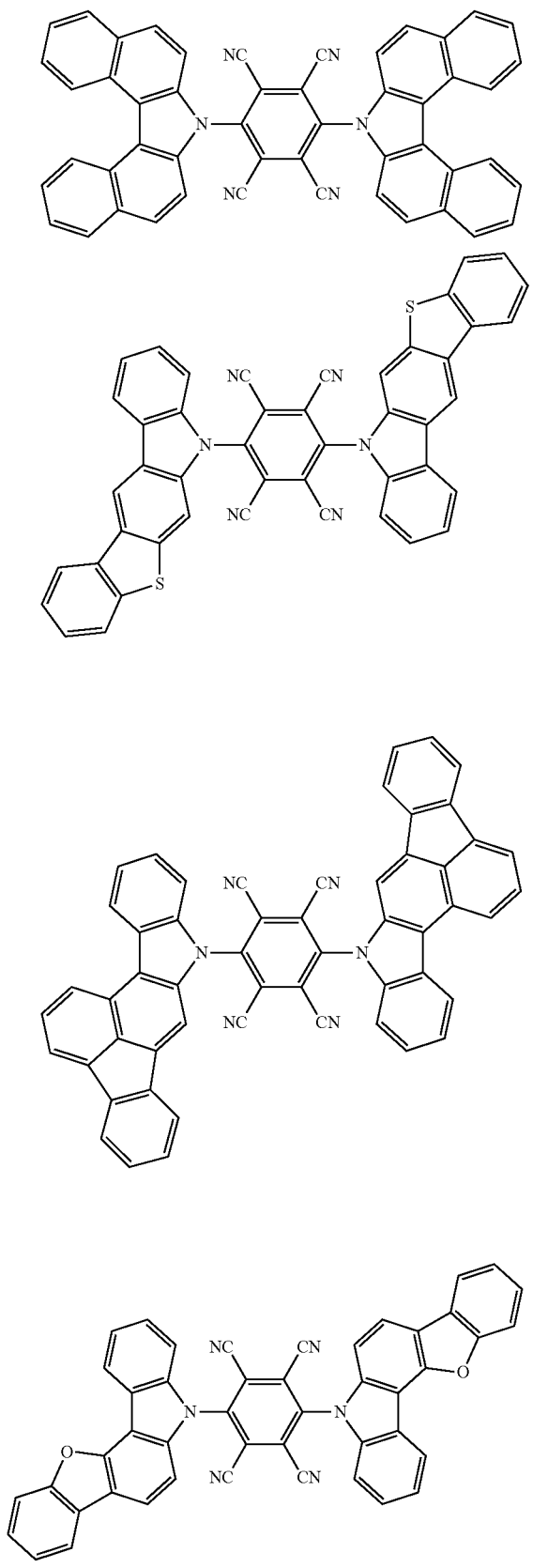
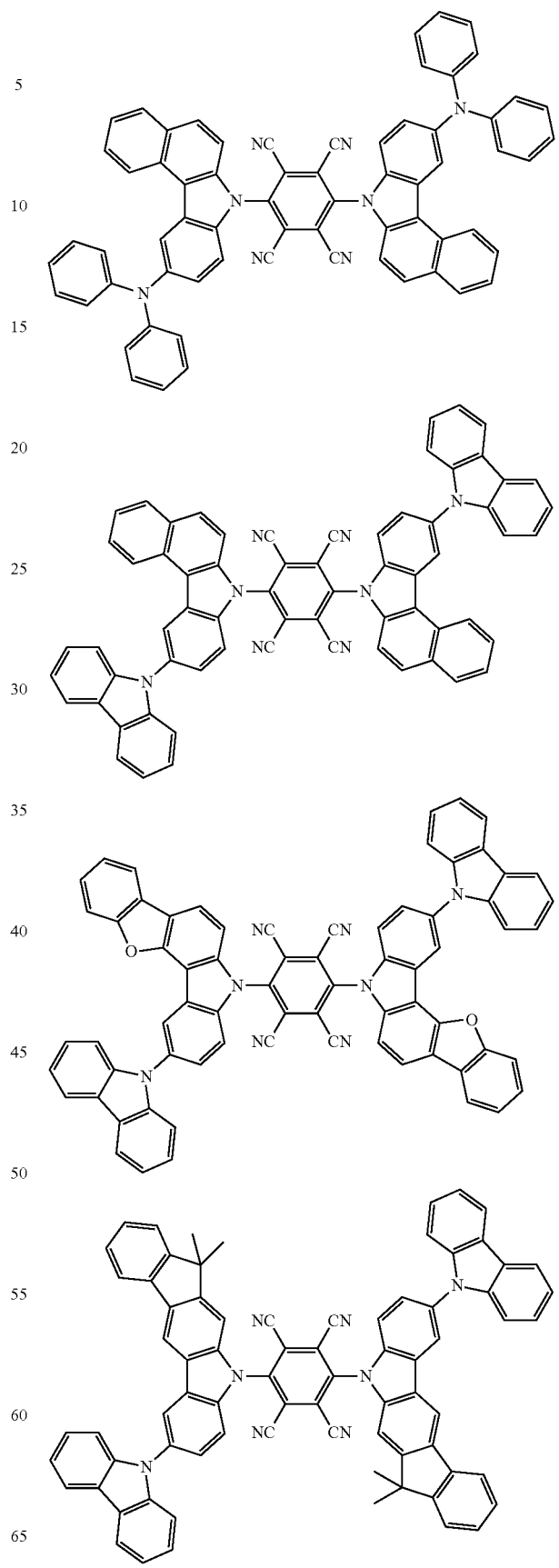

-continued
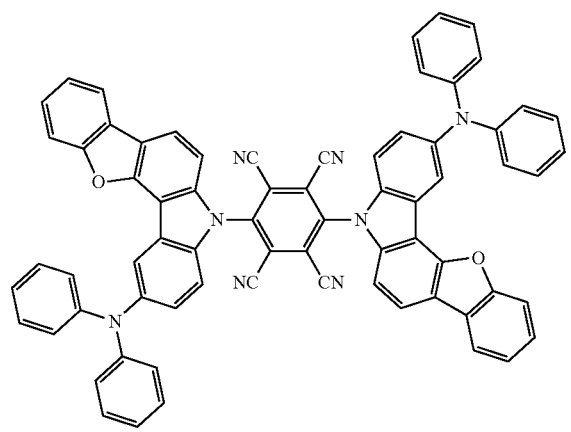
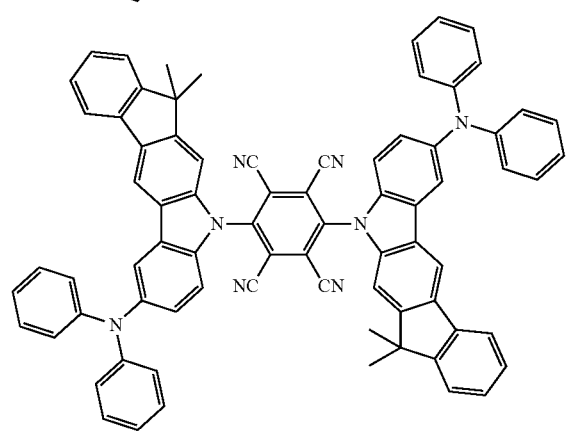
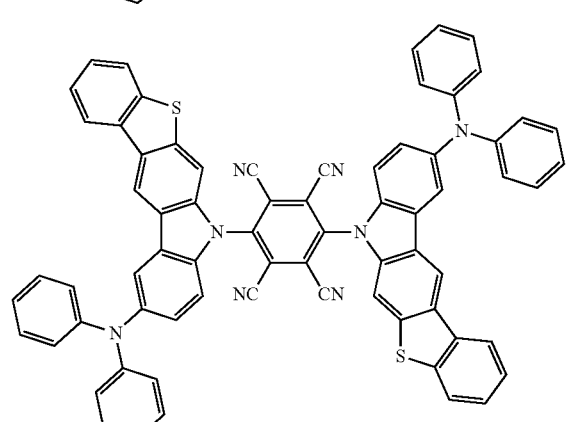
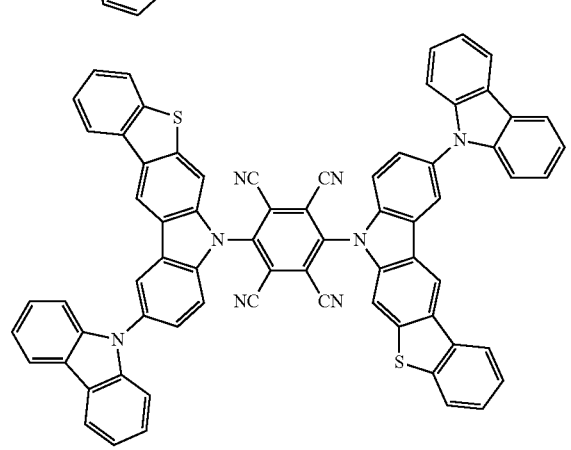
-continued
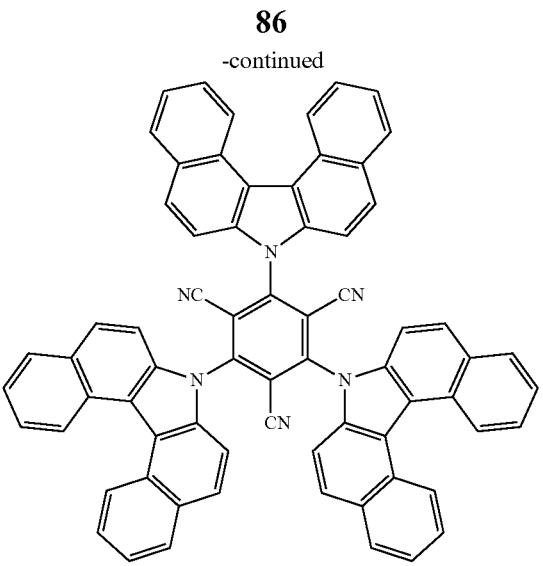
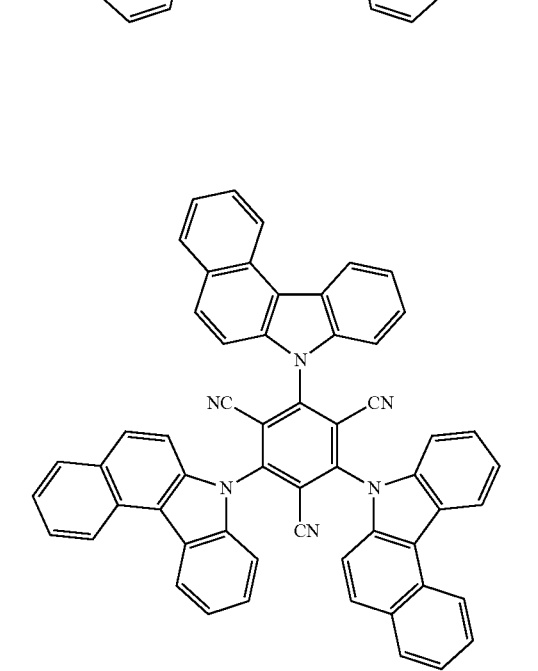
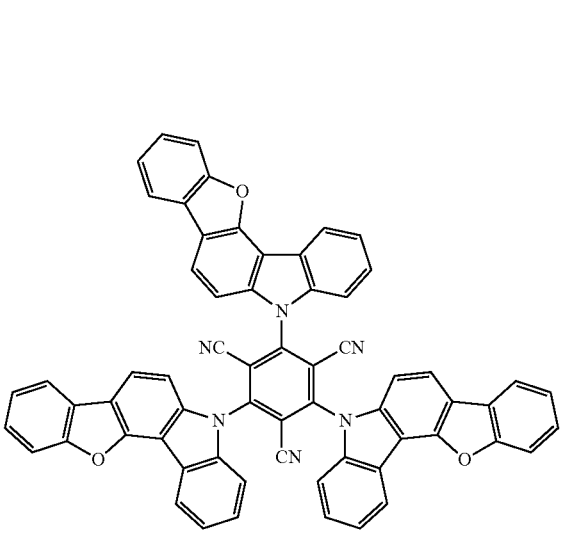

87
-continued
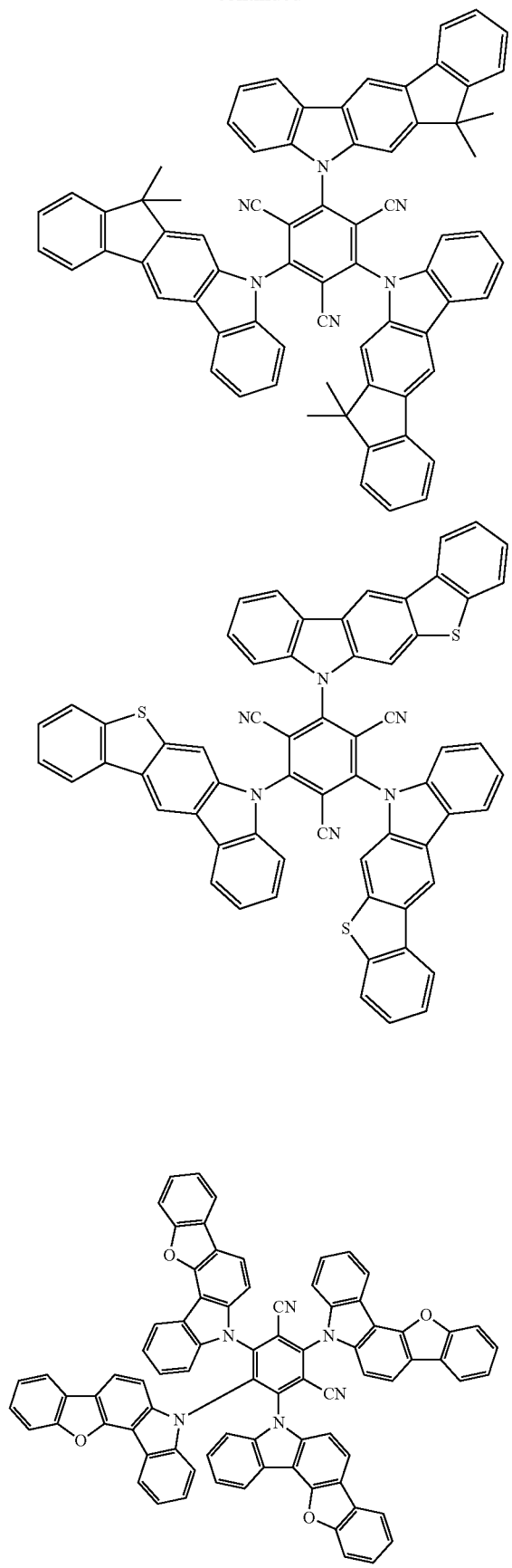
88
-continued
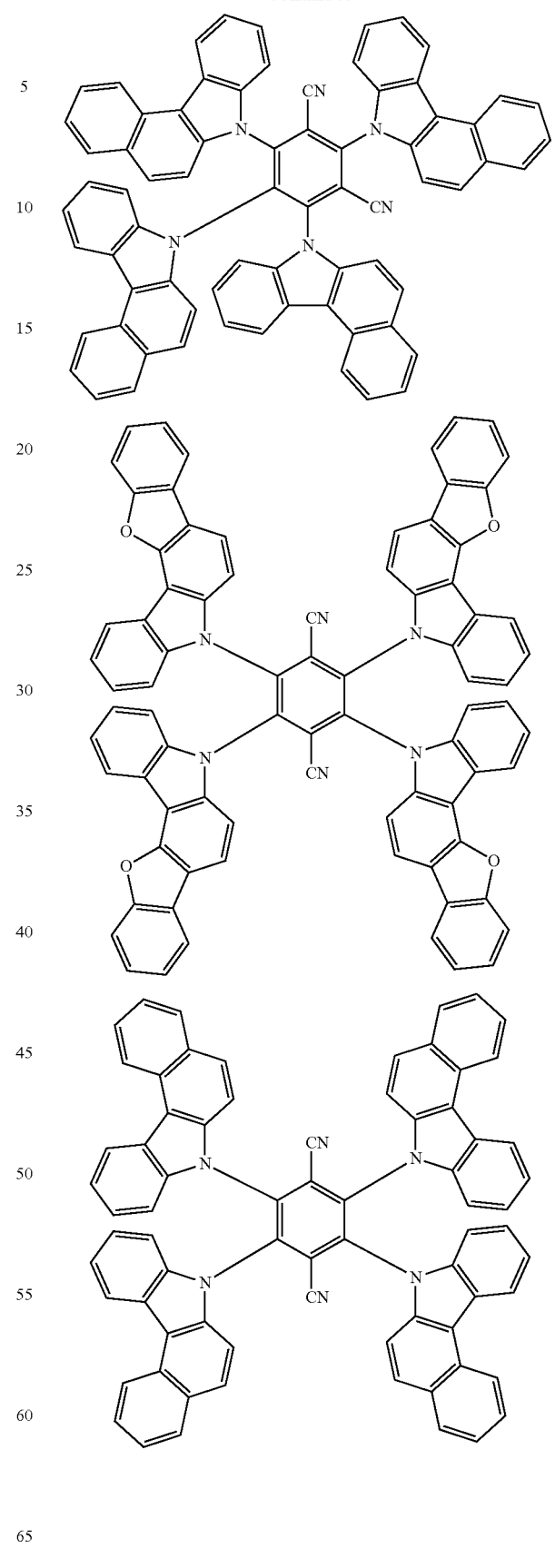

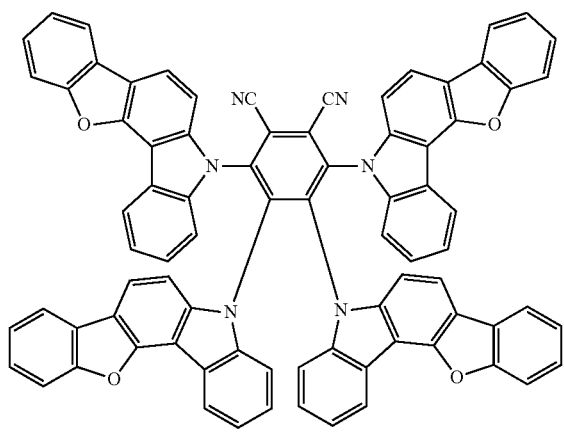
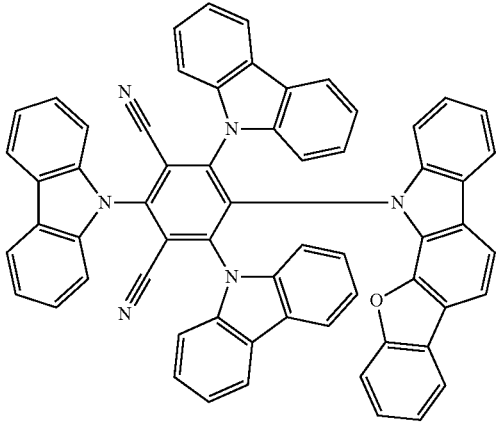
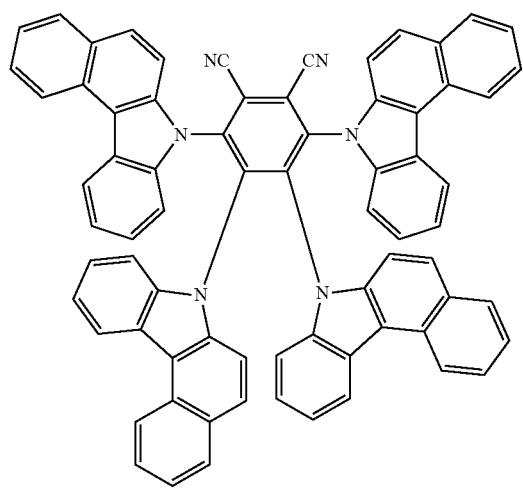
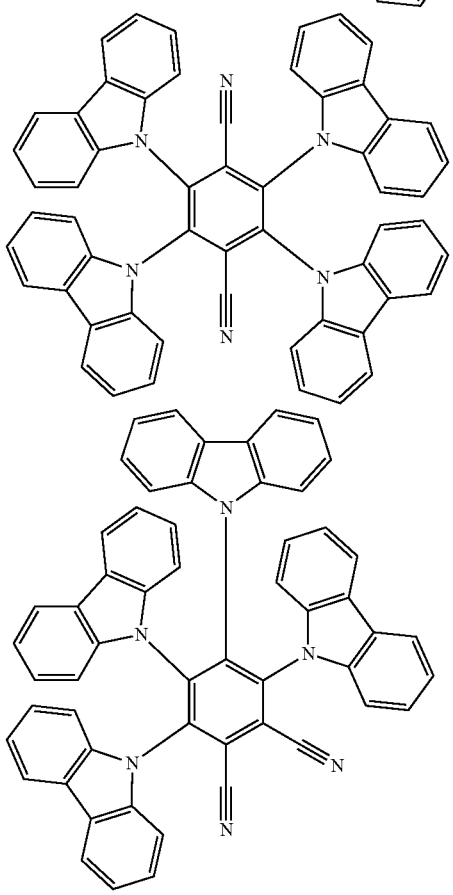
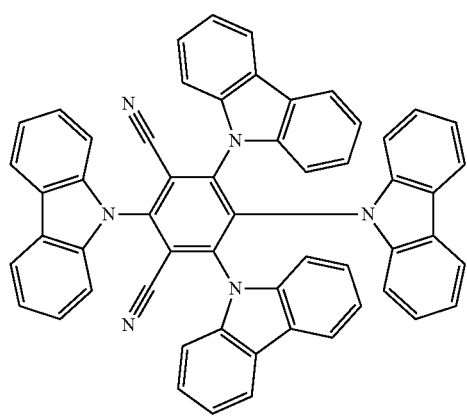

Third Compound

In the organic EL device of the exemplary embodiment, the third compound may be a thermally activated delayed fluorescent compound or a compound that exhibits no thermally activated delayed fluorescence, but is preferably a compound that exhibits no thermally activated delayed fluorescence.

Compound Represented by Formula (3)

In the organic EL device of the exemplary embodiment, the third compound is preferably a compound represented by a formula (3) below.

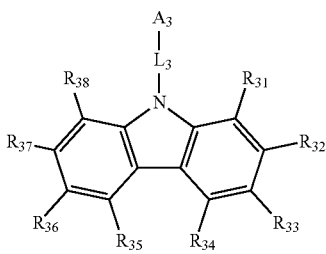

(3)

In the formula (3):

A$_3$ is a substituted or unsubstituted aryl group having 6 to 50 ring carbon atoms, or a substituted or unsubstituted heterocyclic group having 5 to 50 ring atoms;

L$_3$ is a single bond, a substituted or unsubstituted arylene group having 6 to 50 ring carbon atoms, a substituted or unsubstituted divalent heterocyclic group having 5 to 50 ring atoms, a divalent group formed by bonding two groups selected from the group consisting of a substituted or unsubstituted arylene group having 6 to 50 ring carbon atoms and a substituted or unsubstituted divalent heterocyclic group having 5 to 50 ring atoms, or a divalent group formed by bonding three groups selected from the group consisting of a substituted or unsubstituted arylene group having 6 to 30 ring carbon atoms and a substituted or unsubstituted divalent heterocyclic group having 5 to 30 ring atoms:

at least one combination of adjacent two or more of R$_{31}$ to R$_{38}$ are mutually bonded to form a substituted or unsubstituted monocyclic ring, mutually bonded to form a substituted or unsubstituted fused ring, or not mutually bonded; and R$_{31}$ to R$_{38}$ that form neither the substituted or unsubstituted monocyclic ring nor the substituted or unsubstituted fused ring are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si(R$_{901}$)(R$_{902}$)(R$_{903}$), a group represented by —O—(R$_{904}$), a group represented by —S—(R$_{905}$), a group represented by —N(R$_{906}$)(R$_{907}$), a substituted or unsubstituted aralkyl group having 7 to 50 carbon atoms, a group represented by —C(=O)R$_{908}$, a group represented by —COOR$_{909}$, a halogen atom, a cyano group, a nitro group, a group represented by —P(=O)(R$_{931}$)(R$_{932}$), a group represented by —Ge(R$_{933}$)(R$_{934}$)(R$_{935}$), a group represented by —B(R$_{936}$)(R$_{937}$), a substituted or unsubstituted aryl group having 6 to 50 ring carbon atoms, a substituted or unsubstituted heterocyclic group having 5 to 50 ring atoms, or a group represented by a formula (3A) below.

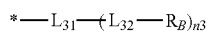

(3A)

In the formula (3A):

R$_B$ is a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si(R$_{901}$)(R$_{902}$)(R$_{908}$), a group represented by —O—(R$_{904}$), a group represented by —S—(R$_{903}$), a group represented by —N(R$_{906}$)(R$_{907}$), a substituted or unsubstituted aralkyl group having 7 to 50 carbon atoms, a group represented by —C(=O)R$_{908}$, a group represented by —COOR$_{909}$, a halogen atom, a cyano group, a nitro group, a group represented by —P(=O)(R$_{931}$)(R$_{932}$), a group represented by —Ge(R$_{33}$)(R$_{934}$)(R$_{935}$), a group represented by —B(R$_{936}$)(R$_{937}$), a substituted or unsubstituted aryl group having 6 to 50 ring carbon atoms, or a substituted or unsubstituted heterocyclic group having 5 to 50 ring atoms, when a plurality of R$_B$ are present, the plurality of R$_B$ are mutually the same or different;

L$_{31}$ is a single bond, a substituted or unsubstituted arylene group having 6 to 50 ring carbon atoms, or a trivalent group, a tetravalent group, a pentavalent group, or a hexavalent group derived from the arylene group, a substituted or unsubstituted divalent heterocyclic group having 5 to 50 ring atoms, or a trivalent group, a tetravalent group, a pentavalent group, or a hexavalent group derived from the heterocyclic group, or a divalent group formed by bonding two groups selected from the group consisting of a substituted or unsubstituted arylene group having 6 to 50 ring carbon atoms and a substituted or unsubstituted divalent heterocyclic group having 5 to 50 ring atoms, or a trivalent group, a tetravalent group, a pentavalent group, or a hexavalent group derived from the divalent group;

L$_{32}$ is a single bond, a substituted or unsubstituted arylene group having 6 to 50 ring carbon atoms, or a substituted or unsubstituted divalent heterocyclic group having to 50 ring atoms;

n$_3$ is 1, 2, 3, 4, or 5;

when L$_{31}$ is a single bond, n$_3$ is 1, and L$_{32}$ is bonded to a carbon atom of a six-membered ring in the formula (3);

when a plurality of L$_{32}$ are present, the plurality of L$_{32}$ are mutually the same or different; and

* is a bonding position to a carbon atom of a six-membered ring in the formula (3).

In the third compound, R$_{901}$, R$_{902}$, R$_{903}$, R$_{904}$, R$_{905}$, R$_{906}$, R$_{907}$, R$_{908}$, R$_{909}$, R$_{931}$, R$_{932}$, R$_{933}$, R$_{934}$, R$_{935}$, R$_{936}$, and R$_{937}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms, when a plurality of R$_{901}$ are present, the plurality of R$_{901}$ are mutually the same or different, when a plurality of R$_{902}$ are present, the plurality of R$_{902}$ are mutually the same or different, when a plurality of R$_{903}$ are present, the plurality of R$_{903}$ are mutually the same or different, when a plurality of R$_{904}$ are present, the plurality of R$_{904}$ are mutually the same or different, when a plurality of R$_{905}$ are present, the plurality of R$_{905}$ are mutually the same or different, when a plurality of R$_{906}$ are present, the plurality of R$_{906}$ are mutually the same or different, when a plurality of R$_{907}$ are present, the plurality of R$_{907}$ are mutually the same or different, when a plurality of R$_{908}$ are present, the plurality of R$_{908}$ are mutually the same or different, when a plurality of $R_{909}$ are present, the plurality of $R_{909}$ are mutually the same or different, when a plurality of $R_{931}$ are present, the plurality of $R_{931}$ are mutually the same or different, when a plurality of $R_{932}$ are present, the plurality of $R_{932}$ are mutually the same or different, when a plurality of $R_{933}$ are present, the plurality of $R_{933}$ are mutually the same or different, when a plurality of $R_{934}$ are present, the plurality of $R_{934}$ are mutually the same or different, when a plurality of $R_{935}$ are present, the plurality of $R_{935}$ are mutually the same or different, when a plurality of $R_{936}$ are present, the plurality of $R_{936}$ are mutually the same or different, and when a plurality of $R_{937}$ are present, the plurality of $R_{937}$ are mutually the same or different.

In the organic EL device of the exemplary embodiment, the third compound is preferably a compound represented by a formula (31), (32), (33), (34), (35), or (36) below.

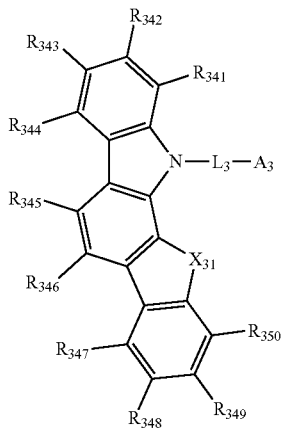

(31)

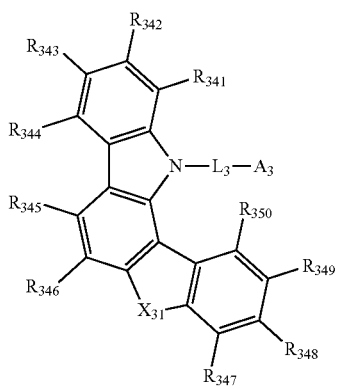

(32)

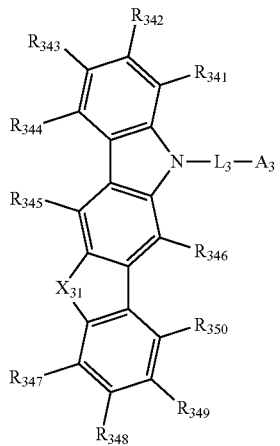

(33)

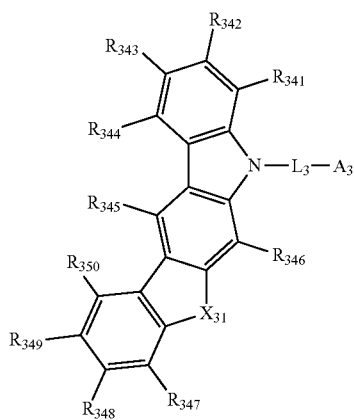

(34)

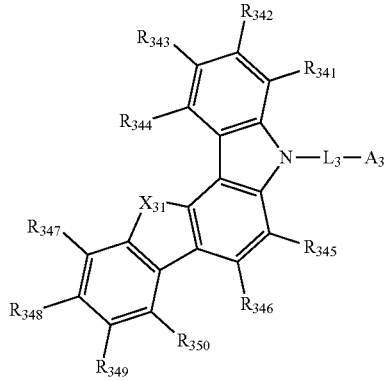

(35)

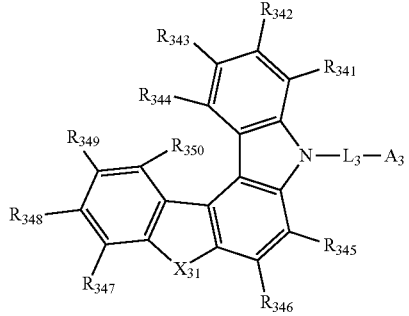

(36)

In the formulae (31) to (36):

A₃ and L₃ represent the same as A₃ and L₃, respectively, in the formula (3);

at least one combination of adjacent two or more of $R_{341}$ to $R_{350}$ are mutually bonded to form a substituted or unsubstituted monocyclic ring, mutually bonded to form a substituted or unsubstituted fused ring, or not mutually bonded;

$X_{31}$ is a sulfur atom, an oxygen atom, $N(R_{352})$, or $C(R_{353})(R_{354})$;

a combination of $R_{353}$ and $Rt_{354}$ are mutually bonded to form a substituted or unsubstituted monocyclic ring, mutually bonded to form a substituted or unsubstituted fused ring, or not mutually bonded; and $R_{341}$ to $R_{350}$ that form neither the substituted or unsubstituted monocyclic ring nor the substituted or unsubstituted fused ring, $R_{352}$, and $R_{353}$ and $R_{354}$ that form neither the substituted or unsubstituted monocyclic ring nor the substituted or unsubstituted fused ring each independently represent the same as $R_{31}$ to $R_{38}$ that form neither the substituted or unsubstituted monocyclic ring nor the substituted or unsubstituted fused ring.

In a compound represented by the formula (3), $R_{352}$ is preferably a substituted or unsubstituted alkyl group having 1 to 50 carbon atoms, a substituted or unsubstituted aryl group having 6 to 50 ring carbon atoms, or a substituted or unsubstituted heterocyclic group having 5 to 50 ring atoms.

In a compound represented by the formula (3), a combination of $R_{353}$ and $R_{354}$ are preferably mutually bonded to form a substituted or unsubstituted monocyclic ring, mutually bonded to form a substituted or unsubstituted fused ring, or not mutually bonded; and $R_{353}$ and $R_{354}$ that form neither a substituted or unsubstituted monocyclic ring nor a substituted or unsubstituted fused ring are preferably each independently a substituted or unsubstituted alkyl group having 1 to 50 carbon atoms, a substituted or unsubstituted aryl group having 6 to 50 ring carbon atoms, or a substituted or unsubstituted heterocyclic group having 5 to 50 ring atoms.

In a compound represented by the formula (3), $X_{31}$ is preferably a sulfur atom or an oxygen atom.

In the organic EL device of the exemplary embodiment, A₃ in the third compound is preferably a group represented by a formula (A31), (A32), (A33), (A34), (A35), (A36), or (A37) below.

(A31)

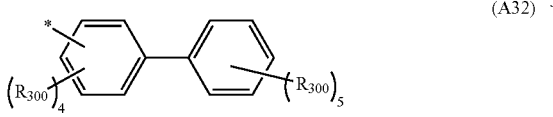
(A32)

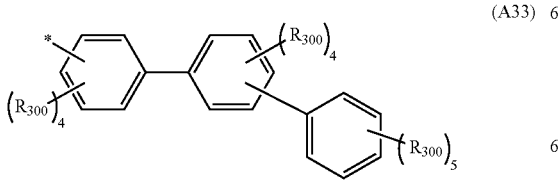
(A33)

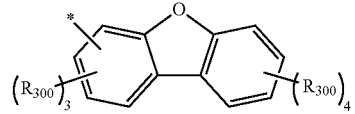
(A34)

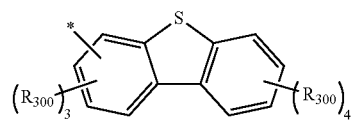
(A35)

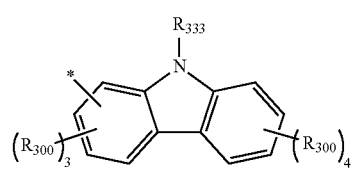
(A36)

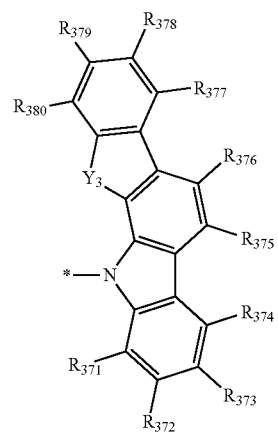
(A37)

In the formulae (A31) to (A37):

at least one combination of adjacent two or more of a plurality of Racy are mutually bonded to form a substituted or unsubstituted monocyclic ring, mutually bonded to form a substituted or unsubstituted fused ring, or not mutually bonded;

$R_{300}$ that form neither the substituted or unsubstituted monocyclic ring nor the substituted or unsubstituted fused ring and $R_{333}$ each independently represent the same as $R_{31}$ to $R_{38}$ that form neither the substituted or unsubstituted monocyclic ring nor the substituted or unsubstituted fused ring; and each * in the formulae (A31) to (A37) represents a bonding position to L₃ of a compound represented by the formula (3).

In a compound represented by the formula (3), it is also preferable that A₃ is a group represented by the formula (A34), (A35), or (A37).

In a compound represented by the formula (3), As is preferably a group represented by one of formulae (A371) to (A376)) below.

(A371)

-continued

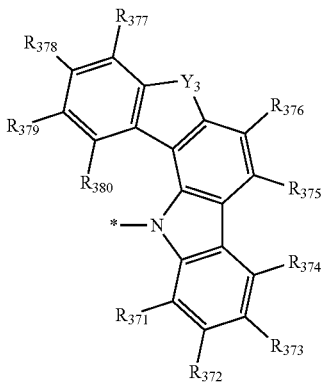

(A372)

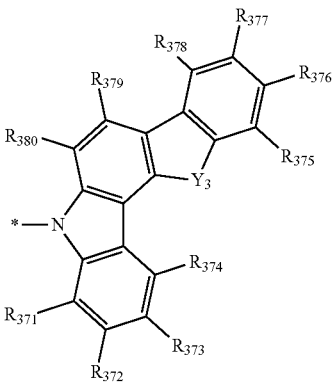

(A376)

(A373)

(A374)

(A375)

In the formulae (A371) to (A376):

$Y_3$ is a sulfur atom, an oxygen atom, $N(R_{381})$, or $C(R_{382})(R_{333})$;

a combination of $R_{382}$ and $R_{383}$ are mutually bonded to form a substituted or unsubstituted monocyclic ring, mutually bonded to form a substituted or unsubstituted fused ring, or not mutually bonded;

at least one combination of adjacent two or more of $R_{371}$ to $R_{380}$ are mutually bonded to form a substituted or unsubstituted monocyclic ring, mutually bonded to form a substituted or unsubstituted fused ring, or not mutually bonded;

$R_{371}$ to $R_{380}$ that form neither the substituted or unsubstituted monocyclic ring nor the substituted or unsubstituted fused ring, $R_{382}$ and $R_{383}$ that form neither the substituted or unsubstituted monocyclic ring nor the substituted or unsubstituted fused ring, and $R_{381}$ each independently represent the same as $R_{31}$ to $R_{38}$ that form neither the substituted or unsubstituted monocyclic ring nor the substituted or unsubstituted fused ring; and each * in the formulae (A371) to (A376) represents a bonding position to $L_3$ of a compound represented by the formula (3).

In the formulae (A371) to (A376), $R_{381}$ is preferably a substituted or unsubstituted alkyl group having 1 to 50 carbon atoms, a substituted or unsubstituted aryl group having 6 to 50 ring carbon atoms, or a substituted or unsubstituted heterocyclic group having 5 to 50 ring atoms.

In the formulae (A371) to (A376), a combination of $R_{382}$ and $R_{383}$ are preferably mutually bonded to form a substituted or unsubstituted monocyclic ring, mutually bonded to form a substituted or unsubstituted fused ring, or not mutually bonded; and $R_{382}$ and $R_{383}$ that form neither a substituted or unsubstituted monocyclic ring nor a substituted or unsubstituted fused ring are preferably each independently a substituted or unsubstituted alkyl group having 1 to 50 carbon atoms, a substituted or unsubstituted aryl group having 6 to 50 ring carbon atoms, or a substituted or unsubstituted heterocyclic group having 5 to 50 ring atoms.

In the formulae (A371) to (A376), Ys is preferably a sulfur atom or an oxygen atom.

It is also preferable that a compound represented by the formula (3) is a compound represented by one of formulae (311) to (316) below.

(311)

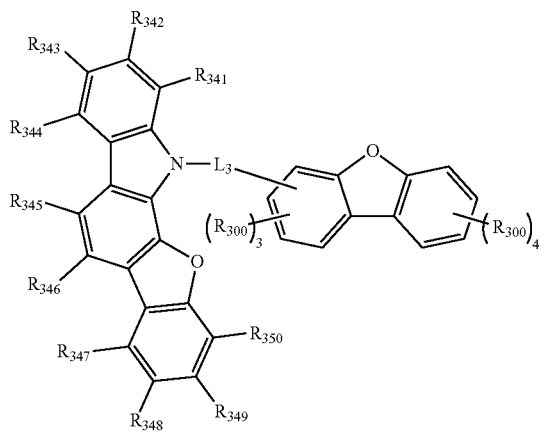

(312)

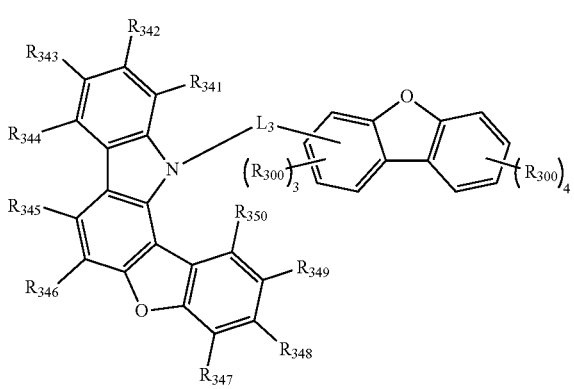

(313)

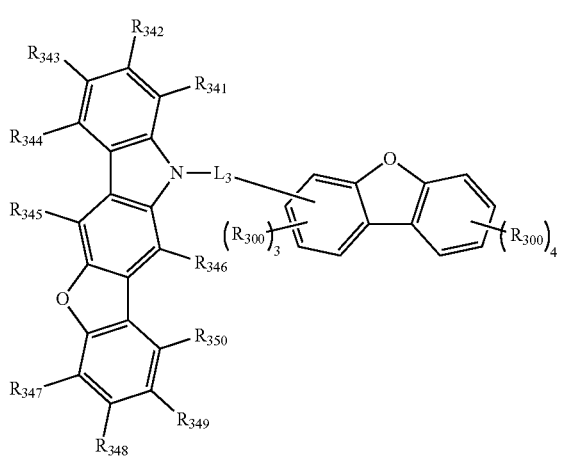

(314)

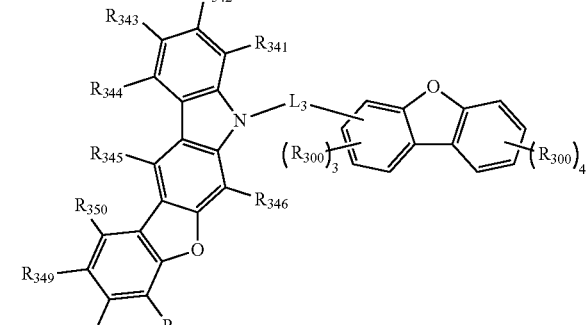

(315)

(316)

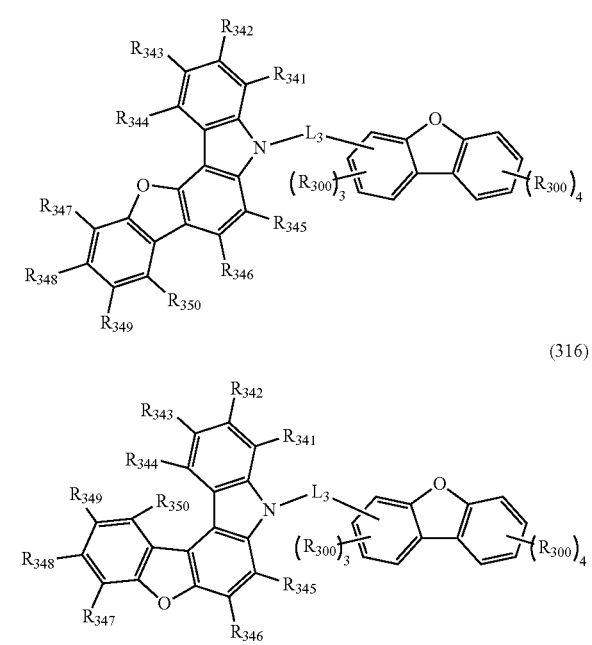

In the formulae (311) to (316):

$L_3$ represents the same as $L_3$ in the formula (3);

at least one combination of adjacent two or more of a plurality of $R_{300}$ are mutually bonded to form a substituted or unsubstituted monocyclic ring, mutually bonded to form a substituted or unsubstituted fused ring, or not mutually bonded;

at least one combination of adjacent two or more of $R_{341}$ to $R_{350}$ are mutually bonded to form a substituted or unsubstituted monocyclic ring, mutually bonded to form a substituted or unsubstituted fused ring, or not mutually bonded; and $R_{300}$ that forms neither the substituted or unsubstituted monocyclic ring nor the substituted or unsubstituted fused ring, and $R_{341}$ to $R_{350}$ that form neither the substituted or unsubstituted monocyclic ring nor the substituted or unsubstituted fused ring each independently represent the same as $R_{31}$ to $R_{38}$ that form neither the substituted or unsubstituted monocyclic ring nor the substituted or unsubstituted fused ring.

It is also preferable that a compound represented by the formula (3) is a compound represented by a formula (321) below.

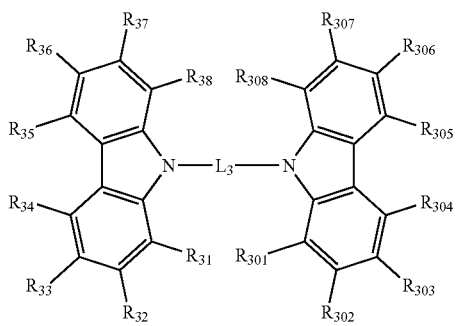

(321)

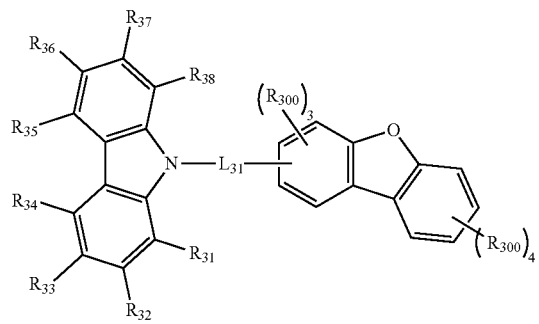

(322)

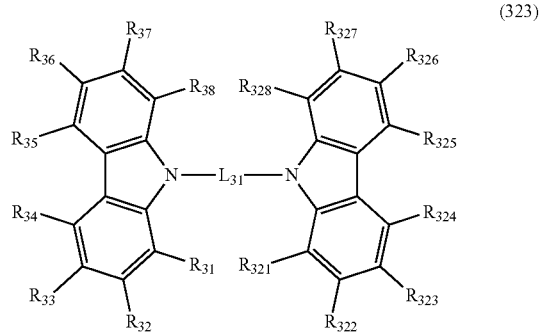

(323)

In the formula (321):

$L_3$ represents the same as $L_3$ in the formula (3); and $R_{31}$ to $R_{38}$ and $R_{301}$ to $R_{308}$ each independently represent the same as $R_{31}$ to $R_{38}$ that form neither the substituted or unsubstituted monocyclic ring nor the substituted or unsubstituted fused ring.

In a compound represented by the formula (3), $L_3$ is preferably a single bond or a substituted or unsubstituted arylene group having 6 to 50 ring carbon atoms.

In a compound represented by the formula (3), $L_3$ is preferably a single bond, a substituted or unsubstituted phenylene group, a substituted or unsubstituted biphenylene group, or a substituted or unsubstituted terphenylene group.

In a compound represented by the formula (3), $L_3$ is preferably a group represented by a formula (317) below.

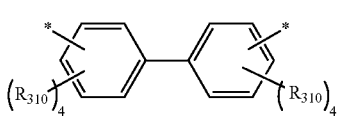

(317)

In the formula (317):

$R_{310}$ each independently represent the same as $R_{31}$ to $R_{38}$ that form neither the substituted or unsubstituted monocyclic ring nor the substituted or unsubstituted fused ring, and each * independently represents a bonding position.

In a compound represented by the formula (3), it is also preferable that $L_3$ includes a divalent group represented by a formula (318) or (319) below.

In a compound represented by the formula (3), it is also preferable that $L_3$ is a divalent group represented by the formula (318) or (319) below.

It is also preferable that a compound represented by the formula (3) is a compound represented by a formula (322) or (323) below.

In the formulae (322) and (323):

$L_{31}$ is a substituted or unsubstituted arylene group having 6 to 50 ring carbon atoms, a substituted or unsubstituted divalent heterocyclic group having 5 to 50 ring atoms, or a divalent group formed by bonding two groups selected from the group consisting of a substituted or unsubstituted arylene group having 6 to 50 ring carbon atoms and a substituted or unsubstituted divalent heterocyclic group having 5 to 50 ring atoms;

$L_{31}$ includes a divalent group represented by the formula (318) or (319) below; and $R_{31}$ to $R_{38}$, $R_{300}$, and $R_{321}$ to $R_{323}$ each independently represent the same as $R_{31}$ to $R_{38}$ that form neither the substituted or unsubstituted monocyclic ring nor the substituted or unsubstituted fused ring.

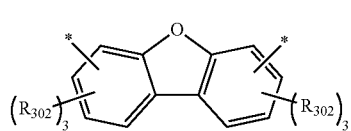

(318)

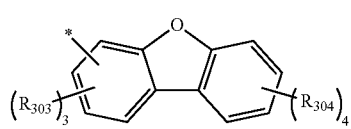

(319)

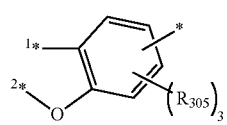

(320)

In the formula (319):

a combination of adjacent two of a plurality of $R_{304}$ are mutually bonded to form a ring represented by the formula (320).

In the formula (320), 1* and 2* each independently represent a bonding position to a ring to which $R_{304}$ are bonded.

$R_{302}$ in the formula (318), $R_{303}$ in the formula (319)), $R_{304}$ that do not form the ring represented by the formula (320), and $R_{305}$ in the formula (320) each independently represent the same as $R_{31}$ to $R_{38}$ that form neither the substituted or unsubstituted monocyclic ring nor the substituted or unsubstituted fused ring.

Each * in the formulae (318) to (320) represents a bonding position.

In a compound represented by the formula (3), the group represented by the formula (319) serving as $L_3$ or $L_{31}$ is, for example, a group represented by a formula (319A) below.

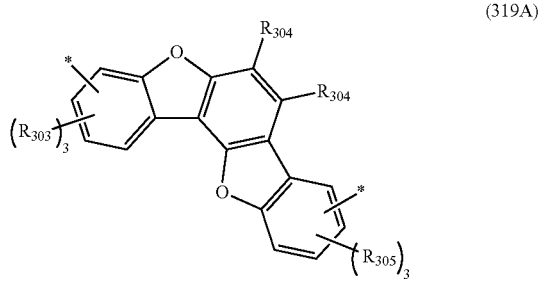

(319A)

In the formula (319A), $R_{303}$, $R_{304}$, and $R_{305}$ each independently represent the same as $R_{31}$ to $R_{38}$ that form neither the substituted or unsubstituted monocyclic ring nor the substituted or unsubstituted fused ring; and each * in the formula (319A) represents a bonding position.

It is also preferable that a compound represented by the formula (3) is a compound represented by the formula (322), and $L_{31}$ is a group represented by the formula (318).

It is also preferable that a compound represented by the formula (3) is a compound represented by a formula (324) below.

In the formula (324), $R_{31}$ to $R_{38}$, $R_{300}$, and $R_{302}$ each independently represent the same as $R_{31}$ to $R_{38}$ that form neither the substituted or unsubstituted monocyclic ring nor the substituted or unsubstituted fused ring.

In a compound represented by the formula (3), $R_{31}$ to $R_{38}$ that form neither the substituted or unsubstituted monocyclic ring nor the substituted or unsubstituted fused ring are preferably each independently a hydrogen atom, a substituted or unsubstituted alkyl group having 1 to 50 carbon atoms, a substituted or unsubstituted aryl group having 6 to 50 ring carbon atoms, a substituted or unsubstituted heterocyclic group having 5 to 50 ring atoms, or a group represented by the formula (3A); and $R_B$ in the formula (3A) is preferably a substituted or unsubstituted alkyl group having 1 to 50 carbon atoms, a substituted or unsubstituted aryl group having 6 to 50 ring carbon atoms, or a substituted or unsubstituted heterocyclic group having 5 to 50 ring atoms.

In a compound represented by the formula (3), $R_{31}$ to $R_{38}$ that form neither the substituted or unsubstituted monocyclic ring nor the substituted or unsubstituted fused ring are preferably each independently a hydrogen atom, a substituted or unsubstituted aryl group having 6 to 50 ring carbon atoms, or a group represented by the formula (3A); and RP in the formula (3A) is preferably a substituted or unsubstituted aryl group having 6 to 50 ring carbon atoms.

In a compound represented by the formula (3), $R_{31}$ to $R_{38}$ that form neither the substituted or unsubstituted monocyclic ring nor the substituted or unsubstituted fused ring are preferably each independently a hydrogen atom, a substituted or unsubstituted phenyl group, or a group represented by the formula (3A); and $R_B$ in the formula (3A) is preferably a substituted or unsubstituted phenyl group.

It is also preferable that a compound represented by the formula (3) is a compound that does not have a pyridine ring, a pyrimidine ring, or a triazine ring.

Compound Represented by Formula (3B)

In the emitting layer of the organic EL device of the exemplary embodiment, it is also preferable that the third compound is a compound represented by a formula (3B) below.

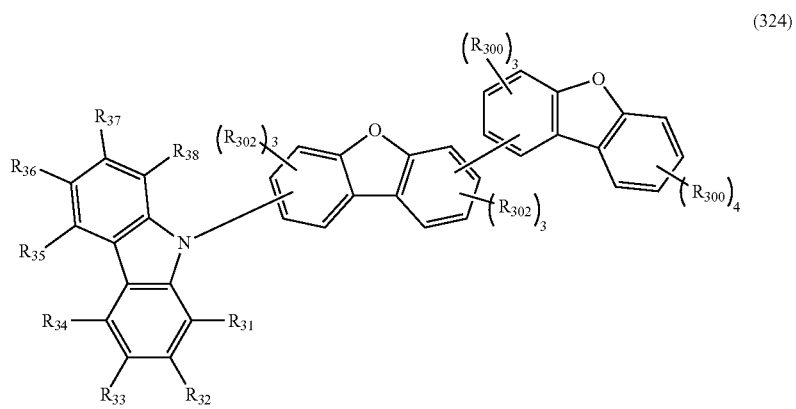

(324)

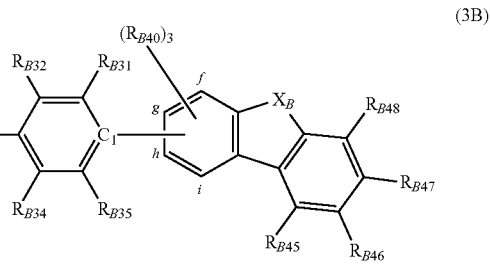

(3B)

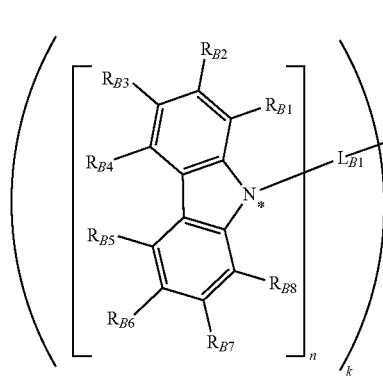

In the formula (3B):

$X_B$ is an oxygen atom or a sulfur atom;

$C_1$ is a carbon atom;

n is 1, 2, or 3; k is 1; 2, or 3;

m is 2, 3, or 4; k+m=5;

when m is 2 or more, a plurality of $R_L$ are mutually the same or different;

at least one combination of adjacent two or more of $R_{B1}$ to $R_{B8}$ are mutually bonded to form a substituted or unsubstituted monocyclic ring, mutually bonded to form a substituted or unsubstituted fused ring, or not mutually bonded;

when at least one of n or k is 2 or more, a plurality of $R_{B1}$ are mutually the same or different, a plurality of $R_{B2}$ are mutually the same or different, a plurality of $R_{B3}$ are mutually the same or different, a plurality of $R_{B4}$ are mutually the same or different, a plurality of $R_{B5}$ are mutually the same or different, a plurality of $R_{B6}$ are mutually the same or different, a plurality of $R_{B7}$ are mutually the same or different, and a plurality of $R_{B8}$ are mutually the same or different;

$L_{B1}$ is a single bond or a linking group, when Lei is a single bond, n is 1;

when k is 2 or more, a plurality of $L_{B1}$ are mutually the same or different;

$L_{B1}$ serving as a linking group is a group derived from a substituted or unsubstituted aryl group having 6 to 30 ring carbon atoms, a group derived from a substituted or unsubstituted heterocyclic group having 5 to 30 ring atoms, or a group formed by bonding two groups selected from the group consisting of groups derived from a substituted or unsubstituted aryl group having 6 to 30 ring carbon atoms and groups derived from a substituted or unsubstituted heterocyclic group having 5 to 30 ring atoms;

when k is 1 and m is 4, four $R_L$ are bonded to respective ones of carbon atoms at the positions of a, b, c, d, and e shown in the formula (3B), and one $L_{B1}$ is bonded to a carbon atom at the position of a, b, c, d, or e that is not bonded to the $R_L$;

when k is 2 and m is 3, three $R_L$ are bonded to respective ones of carbon atoms at the positions of a, b, c, d, and e shown in the formula (3B), and two $L_{B1}$ are bonded to respective ones of carbon atoms at the positions of a, b, c, d, and e that are not bonded to the $R_L$;

when k is 3 and m is 2, two $R_L$ are bonded to respective ones of carbon atoms at the positions of a, b, c, d, and e shown in the formula (3B), and three $L_{B1}$ are bonded to respective ones of carbon atoms at the positions of a, b, c, d, and e that are not bonded to the $R_L$;

at least one combination of adjacent two or more of $R_{B40}$ and $R_{B45}$ to $R_{B46}$ are mutually bonded to form a substituted or unsubstituted monocyclic ring, mutually bonded to form a substituted or unsubstituted fused ring, or not mutually bonded;

three $R_{B40}$ are mutually the same or different, three $R_{B40}$ are bonded to respective ones of carbon atoms at the positions of f, g, h, and i shown in the formula (38), and $C_1$ is bonded to one of carbon atoms at the positions of f, g, h, and i that is not bonded to the $R_{B40}$; and $R_L$, $R_{B31}$, $R_{B32}$, $R_{B34}$, $R_{B35}$, $R_{B1}$ to $R_{B8}$ that form neither the substituted or unsubstituted monocyclic ring nor the substituted or unsubstituted fused ring, and $R_{B40}$ and $R_{B45}$ to $R_{B48}$ that form neither the substituted or unsubstituted monocyclic ring nor the substituted or unsubstituted fused ring are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a substituted or unsubstituted aralkyl group having 7 to 50 carbon atoms, a group represented by —C(=O)$R_{908}$, a group represented by —COO$R_{909}$, a halogen atom, a cyano group, a nitro group, a group represented by —P(=O)($R_{931}$)($R_{932}$), a group represented by —Ge($R_{933}$)($R_{934}$)($R_{935}$), a group represented by —B($R_{936}$)($R_{937}$), a substituted or unsubstituted aryl group having 6 to 50 ring carbon atoms, or a substituted or unsubstituted heterocyclic group having 5 to 50 ring atoms.

In a compound represented by the formula (3B), when n is 2 or 3, each nitrogen atom N* of the structure in the brackets with the subscript n is bonded to $L_{B1}$.

In a compound represented by the formula (38), when $L_{B1}$ is a single bond, a nitrogen atom N* of the structure in the brackets with the subscript n is bonded to one of carbon atoms at the positions a, b, c, d, and e.

In a compound represented by the formula (38), when k is 2 or 3, each $L_{B1}$ of the structure in the parentheses with the subscript k is bonded to one of carbon atoms at the positions a, b, c, d, and e.

For instance, a compound represented by the formula (38) in which n is 2, k is 1, $L_{B1}$ is bonded to the carbon atom at the position c, and a carbon atom $C_1$ is bonded to the carbon atom at the position h is represented by a formula (31B) below.

(31B)

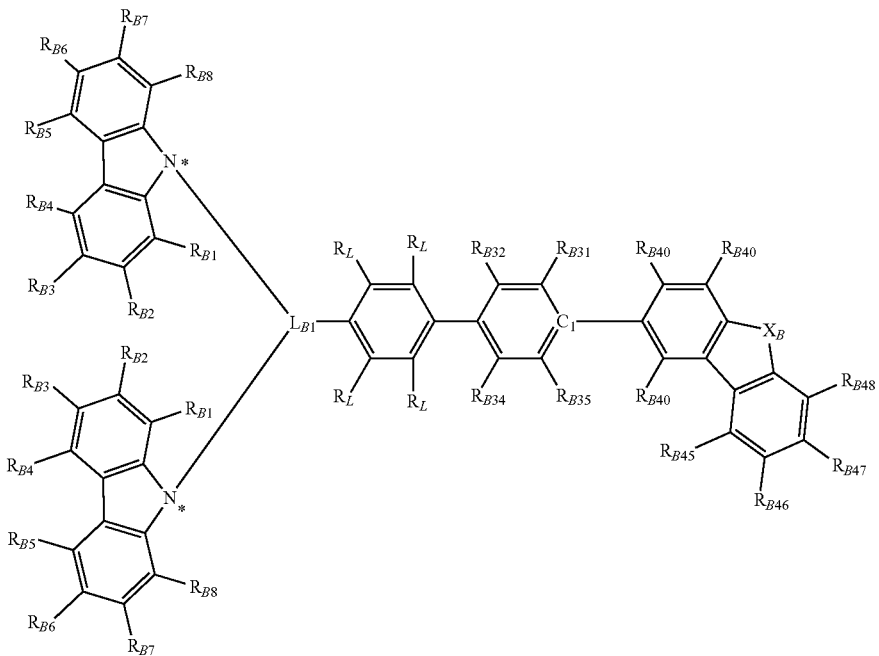

In the formula (31B), $R_{B1}$ to $R_{B8}$, $R_L$, $R_{B31}$, $R_{B32}$, $R_{B34}$, $R_{B35}$, $R_{B40}$, $R_{B45}$ to $R_{B48}$, $L_{B1}$, and $X_B$ are as defined for the formula (3B).

For instance, a compound represented by the formula (3B) in which $L_{B1}$ is a single bond, n is 2, one of two nitrogen atoms N* of the structures in the brackets with the subscript n is bonded to the carbon atom at the position b, and the other nitrogen atoms N* is bonded to the carbon atom at the position b, and carbon atom $C_1$ is bonded to the carbon atom at the position h is represented by a formula (32B) below.

In the formula (32B), $R_{B1}$ to $R_{B8}$, $R_L$, $R_{B31}$, $R_{B32}$, $R_{B34}$, $R_{B35}$, $R_{B40}$, $R_{B45}$ to $R_{B48}$, and $X_B$ are as defined for the formula (3B).

Compound Represented by Formula (MRX3)

In the emitting layer of the organic EL device of the exemplary embodiment, it is also preferable that the third compound is a compound represented by a formula (MRX3) below.

(32B)

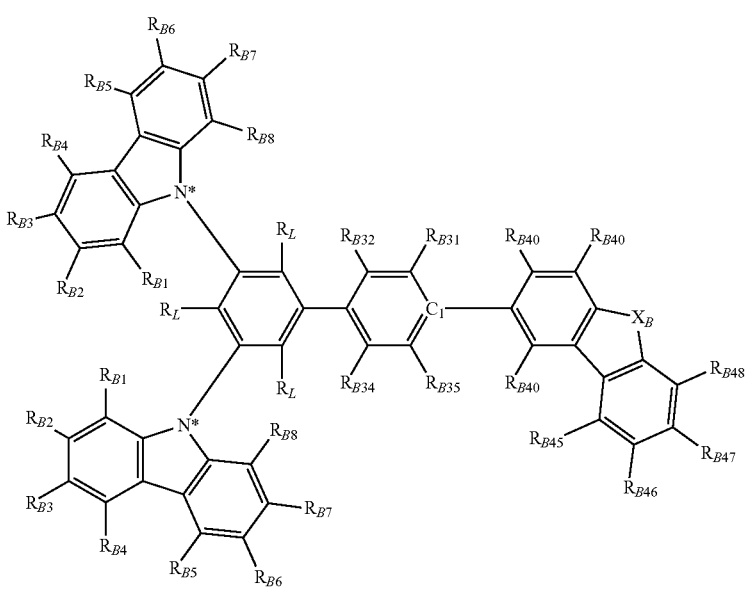

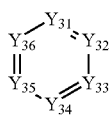
(MRX3)

In the formula (MRX3):

$Y_{31}$ to $Y_{36}$ are each independently $CR_3$ or a nitrogen atom; two or more of $Y_{31}$ to $Y_{36}$ are nitrogen atoms;

when a plurality of $R_3$ are present, at least one combination of adjacent two or more of the plurality of $R_3$ are mutually bonded to form a substituted or unsubstituted monocyclic ring, mutually bonded to form a substituted or unsubstituted fused ring, or not mutually bonded; and $R_3$ that form neither the substituted or unsubstituted monocyclic ring nor the substituted or unsubstituted fused ring are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a substituted or unsubstituted aralkyl group having 7 to 50 carbon atoms, a group represented by —C(=O)$R_{908}$, a group represented by —COO$R_{909}$, a halogen atom, a cyano group, a nitro group, a group represented by —P(=O)($R_{931}$)($R_{932}$), a group represented by —Ge($R_{933}$)($R_{934}$)($R_{935}$), a group represented by —B($R_{936}$)($R_{937}$), a substituted or unsubstituted aryl group having 6 to 50 ring carbon atoms, a substituted or unsubstituted heterocyclic group having 5 to 50 ring atoms, or a group represented by a formula (MRX3A) below.

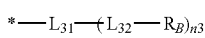
(MRX3A)

In the formula (MRX3A):

$R_B$ represents the same as $R_B$ in the formula (3);

when a plurality of $R_B$ are present, the plurality of $R_B$ are mutually the same or different;

$L_{31}$ and $L_{32}$ represent the same as $L_{31}$ and $L_{32}$, respectively, in the formula (3);

$n_3$ is 1, 2, 3, 4, or 5;

when $L_{31}$ is a single bond, $n_3$ is 1, and $L_{32}$ is bonded to a carbon atom of the six-membered ring in the formula (MRX3);

when a plurality of $L_{32}$ are present, the plurality of $L_{32}$ are mutually the same or different; and

* is a bonding position to a carbon atom of the six-membered ring in the formula (MRX3).

Preferably, a compound represented by the formula (MRX3) does not contain a pyridine ring in a molecule.

It is also preferable that a compound represented by the formula (MRX3) is a compound represented by a formula (MRX31) or (MRX32) below.

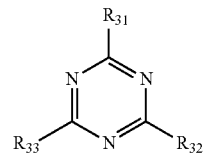
(MRX31)

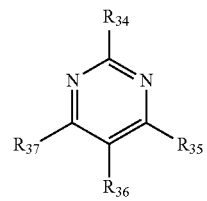
(MRX32)

In the formula (MRX32):

at least one combination of adjacent two or more of $R_{35}$ to $R_{37}$ are mutually bonded to form a substituted or unsubstituted monocyclic ring, mutually bonded to form a substituted or unsubstituted fused ring, or not mutually bonded; and $R_{31}$ to $R_{33}$ in the formula (MRX31), $R_{34}$ in the formula (MRX32), and $R_{35}$ to $R_{37}$ that form neither the substituted or unsubstituted monocyclic ring nor the substituted or unsubstituted fused ring in the formula (MRX32) each independently represent the same as $R_3$ in the formula (MRX3).

It is also preferable that a compound represented by the formula (MRX3) is a compound represented by the formula (MRX31).

$R_3$ in the formula (MRX3) are preferably each independently a hydrogen atom, a substituted or unsubstituted alkyl group having 1 to 50 carbon atoms, a substituted or unsubstituted aryl group having 6 to 50 ring carbon atoms, a substituted or unsubstituted heterocyclic group having 5 to 50 ring atoms, or a group represented by the formula (MRX3A).

$R_3$ in the formula (MRX3) are preferably each independently a hydrogen atom, a substituted or unsubstituted alkyl group having 1 to 50 carbon atoms, a substituted or unsubstituted aryl group having 6 to 50 ring carbon atoms, or a group represented by the formula (MRX3A).

A compound represented by the formula (MRX3) preferably has, in a molecule, at least one group selected from the group consisting of groups represented by formulae (MRXA31) to (MRXA44) below.

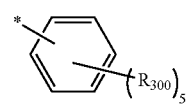
(MRXA31)

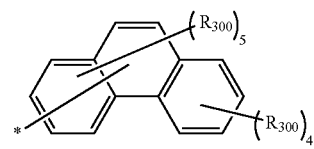
(MRXA32)

-continued (MRXA33)
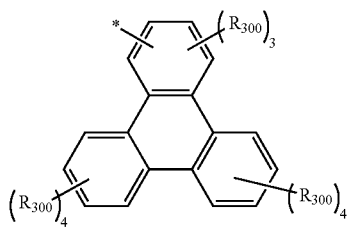

(MRXA34)
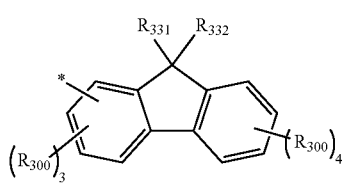

(MRXA35)
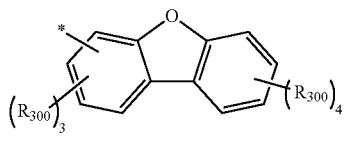

(MRXA36)
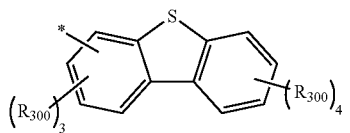

(MRXA37)
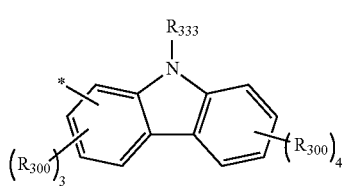

(MRXA38)
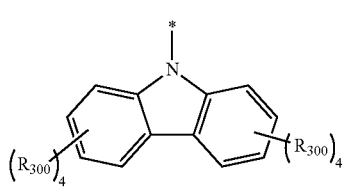

In the formulae (MRXA31) to (MRXA38):
at least one combination of adjacent two or more of a plurality of $R_{300}$ are mutually bonded to form a substituted or unsubstituted monocyclic ring, mutually bonded to form a substituted or unsubstituted fused ring, or not mutually bonded;
a combination of $R_{331}$ and $R_{332}$ are mutually bonded to form a substituted or unsubstituted monocyclic ring, mutually bonded to form a substituted or unsubstituted fused ring, or not mutually bonded;
$R_{300}$ and $R_{331}$ to $R_{332}$ that form neither the substituted or unsubstituted monocyclic ring nor the substituted or unsubstituted fused ring and $R_{333}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a substituted or unsubstituted aralkyl group having 7 to 50 carbon atoms, a group represented by —C(=O)$R_{908}$, a group represented by —COOR$_{909}$, a halogen atom, a cyano group, a nitro group, a substituted or unsubstituted aryl group having 6 to 50 ring carbon atoms, or a substituted or unsubstituted heterocyclic group having 5 to 50 ring atoms; and each * in the formulae (MRXA31) to (MRXA38) represents a bonding position to another atom in a molecule of a compound represented by the formula (MRX3).

(MRXA39)
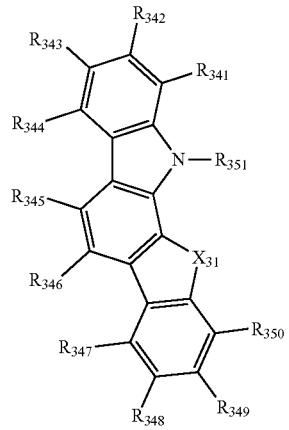

(MRXA40)
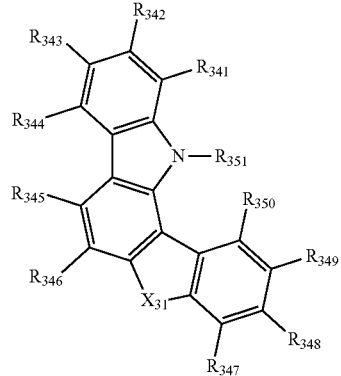

(MRXA41)
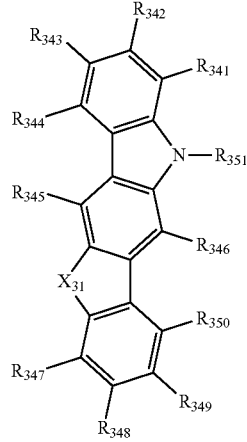

-continued (MRXA42)

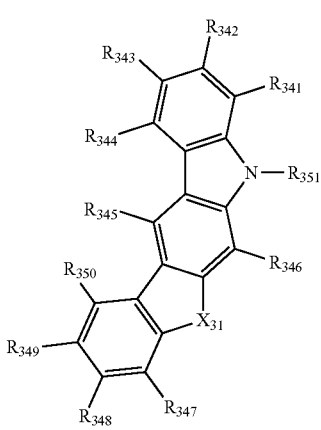

(MRXA43)

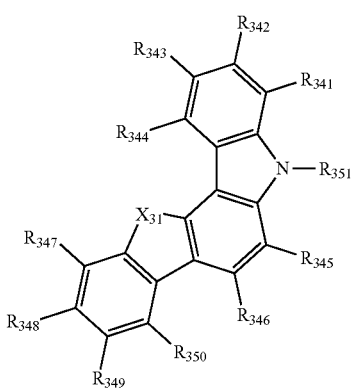

(MRXA44)

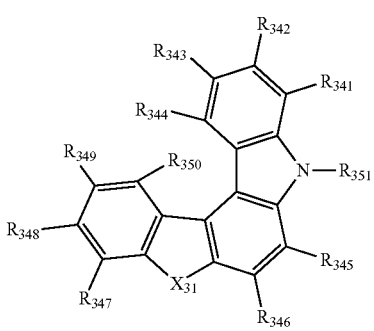

In the formulae (MRXA39) to (MRXA44):
at least one combination of adjacent two or more of $R_{341}$ to $R_{350}$ are mutually bonded to form a substituted or unsubstituted monocyclic ring, mutually bonded to form a substituted or unsubstituted fused ring, or not mutually bonded;
at least one of $R_{341}$ to $R_{351}$ represents a bonding position to another atom in a molecule of a compound represented by the formula (MRX3);
$X_{31}$ is a sulfur atom, an oxygen atom, $NR_{352}$, or $CR_{353}R_{354}$;
a combination of $R_{353}$ and $R_{354}$ are mutually bonded to form a substituted or unsubstituted monocyclic ring, mutually bonded to form a substituted or unsubstituted fused ring, or not mutually bonded; and
$R_{341}$ to $R_{351}$ that are not a bonding position to another atom in a molecule of a compound represented by the formula (MRX3) and that form neither the substituted or unsubstituted monocyclic ring nor the substituted or unsubstituted fused ring, $R_{352}$, and $R_{353}$ and $R_{354}$ that form neither the substituted or unsubstituted monocyclic ring nor the substituted or unsubstituted fused ring are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a group represented by $-N(R_{906})(R_{907})$, a substituted or unsubstituted aralkyl group having 7 to 50 carbon atoms, a group represented by $-C(=O)R_{908}$, a group represented by $-COOR_{909}$, a halogen atom, a cyano group, a nitro group, a substituted or unsubstituted aryl group having 6 to 50 ring carbon atoms, or substituted or unsubstituted heterocyclic group having 5 to 50 ring atoms.

A compound represented by the formula (MRX3) preferably has, in a molecule, at least one group selected from the group consisting of groups represented by the formulae (MRXA38) to (MRXA44).

In a compound represented by the formula (MRX3), at least one of $Y_{31}$ to $Y_{36}$ is preferably $CR_3$, at least one $R_3$ is preferably a group represented by the formula (MRX3A), and $R_B$ is preferably one of the groups represented by the formulae (MRXA31) to (MRXA44).

In a compound represented by the formula (MRX3), at least one of $Y_{31}$ to $Y_{36}$ is preferably $CR_3$, at least one $R_3$ is preferably a group represented by the formula (MRX3A), and $R_B$ is preferably any of the groups represented by the formulae (MRXA38) to (MRXA44).

In a compound represented by the formula (MRX3), $R_{352}$ is preferably a substituted or unsubstituted alkyl group having 1 to 50 carbon atoms, a substituted or unsubstituted aryl group having 6 to 50 ring carbon atoms, or a substituted or unsubstituted heterocyclic group having 5 to 50 ring atoms.

In a compound represented by the formula (MRX3), a combination of $R_{353}$ and $R_{354}$ are preferably mutually bonded to form a substituted or unsubstituted monocyclic ring, mutually bonded to form a substituted or unsubstituted fused ring, or not mutually bonded; and
$R_{353}$ and $R_{354}$ that form neither a substituted or unsubstituted monocyclic ring nor a substituted or unsubstituted fused ring are preferably each independently a substituted or unsubstituted alkyl group having 1 to 50 carbon atoms, a substituted or unsubstituted aryl group having 6 to 50 ring carbon atoms, or a substituted or unsubstituted heterocyclic group having 5 to 50 ring atoms.

In a compound represented by the formula (3), a compound represented by the formula (38), and a compound represented by the formula (MRX3), $L_{31}$ is preferably a single bond, a substituted or unsubstituted arylene group having 6 to 50 ring carbon atoms, or a trivalent group, a tetravalent group, a pentavalent group, or a hexavalent group derived from the arylene group, a divalent group formed by bonding two groups selected from the group consisting of substituted or unsubstituted arylene groups having 6 to 50 ring carbon atoms, or a trivalent group, a tetravalent group, a pentavalent group, or a hexavalent group derived from the divalent group; and
$L_{32}$ is preferably a single bond, or a substituted or unsubstituted arylene group having 6 to 50 ring carbon atoms.

In a compound represented by the formula (3), a compound represented by the formula (3B), and a compound represented by the formula (MRX3), $L_{31}$ is preferably a single bond, or a substituted or unsubstituted arylene group having 6 to 50 ring carbon atoms:

$n_3$ is preferably 1; and $L_{32}$ is preferably a single bond, or a substituted or unsubstituted arylene group having 6 to 50 ring carbon atoms.

In a compound represented by the formula (3), a compound represented by the formula (3B), and a compound represented by the formula (MRX3), $L_{31}$ is preferably a single bond, a substituted or unsubstituted phenylene group, a substituted or unsubstituted biphenylene group, or a divalent group formed by bonding two groups selected from the group consisting of substituted or unsubstituted phenylene groups and substituted or unsubstituted biphenylene groups, or a trivalent group, a tetravalent group, a pentavalent group, or a hexavalent group derived from the divalent group;

$n_3$ is preferably 1; and $L_{32}$ is preferably a single bond, a substituted or unsubstituted phenylene group, or a substituted or unsubstituted biphenylene group.

In a compound represented by the formula (3), a compound represented by the formula (3B), and a compound represented by the formula (MRX3), the substituent for the substituted or unsubstituted group is preferably an unsubstituted alkyl group having 1 to 25 carbon atoms, an unsubstituted alkenyl group having 2 to 25 carbon atoms, an unsubstituted alkynyl group having 2 to 25 carbon atoms, an unsubstituted cycloalkyl group having 3 to 25 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), an unsubstituted aralkyl group having 7 to 50 carbon atoms, a group represented by —C(=O)$R_{908}$, a group represented by —COO$R_{909}$, a group represented by —P(=O)($R_{931}$)($R_{932}$), a group represented by —Ge($R_{933}$)($R_{934}$)($R_{935}$), a group represented by —B($R_{936}$)($R_{937}$), a group represented by —S(=O)$_2R_{938}$, a halogen atom, a cyano group, a nitro group, an unsubstituted aryl group having 6 to ring carbon atoms, or an unsubstituted heterocyclic group having 5 to 25 ring atoms;

$R_{901}$ to $R_{909}$ and $R_{931}$ to $R_{938}$ are preferably each independently a hydrogen atom, an unsubstituted alkyl group having 1 to 25 carbon atoms, an unsubstituted aryl group having 6 to 25 ring carbon atoms, or an unsubstituted heterocyclic group having 5 to 25 ring atoms.

In a compound represented by the formula (3), a compound represented by the formula (3B), and a compound represented by the formula (MRX3), the substituent for the substituted or unsubstituted group is preferably a halogen atom, an unsubstituted alkyl group having 1 to 25 carbon atoms, an unsubstituted aryl group having 6 to 25 ring carbon atoms, or an unsubstituted heterocyclic group having 5 to 25 ring atoms.

In a compound represented by the formula (3), a compound represented by the formula (3B), and a compound represented by the formula (MRX3), the substituent for the substituted or unsubstituted group is preferably an unsubstituted alkyl group having 1 to 10 carbon atoms, an unsubstituted aryl group having 6 to 12 ring carbon atoms, or an unsubstituted heterocyclic group having 5 to 12 ring atoms.

In a compound represented by the formula (3), a compound represented by the formula (3B), and a compound represented by the formula (MRX3), it is also preferable that each of the groups described as "substituted or unsubstituted" group is an "unsubstituted" group.

Method of Producing Third Compound

The third compound according to the exemplary embodiment can be produced by a known method.

The third compound can also be produced based on a known method through a known alternative reaction using a known material(s) tailored for the target compound.

Specific Examples of Third Compound

Specific examples of the third compound include the following compounds. However, the invention is not limited to these specific examples.

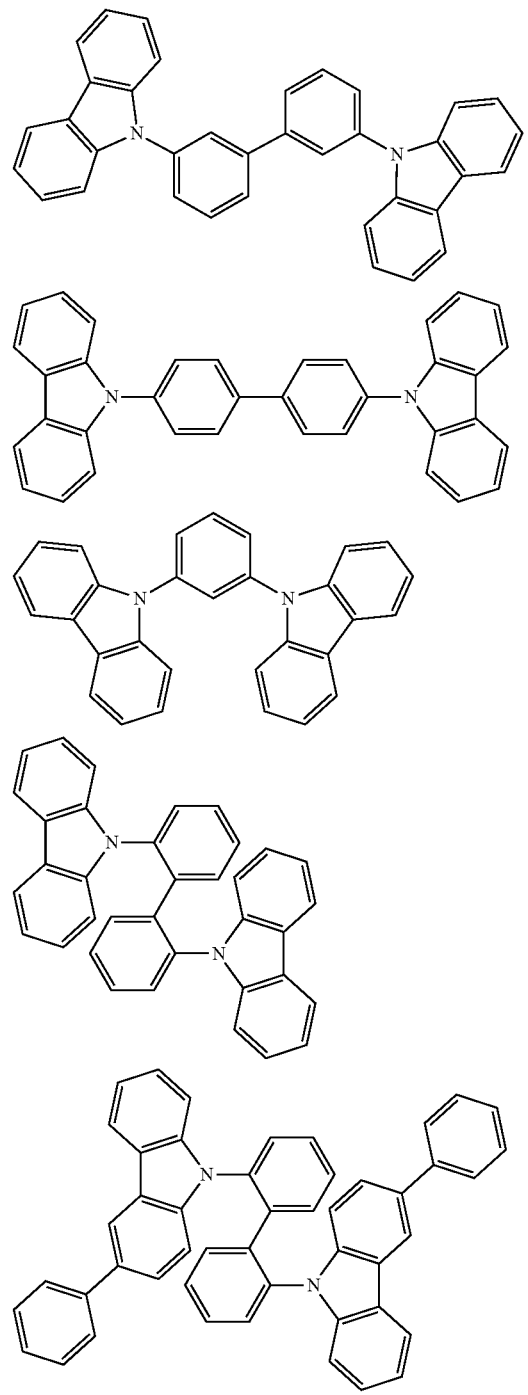

117
-continued
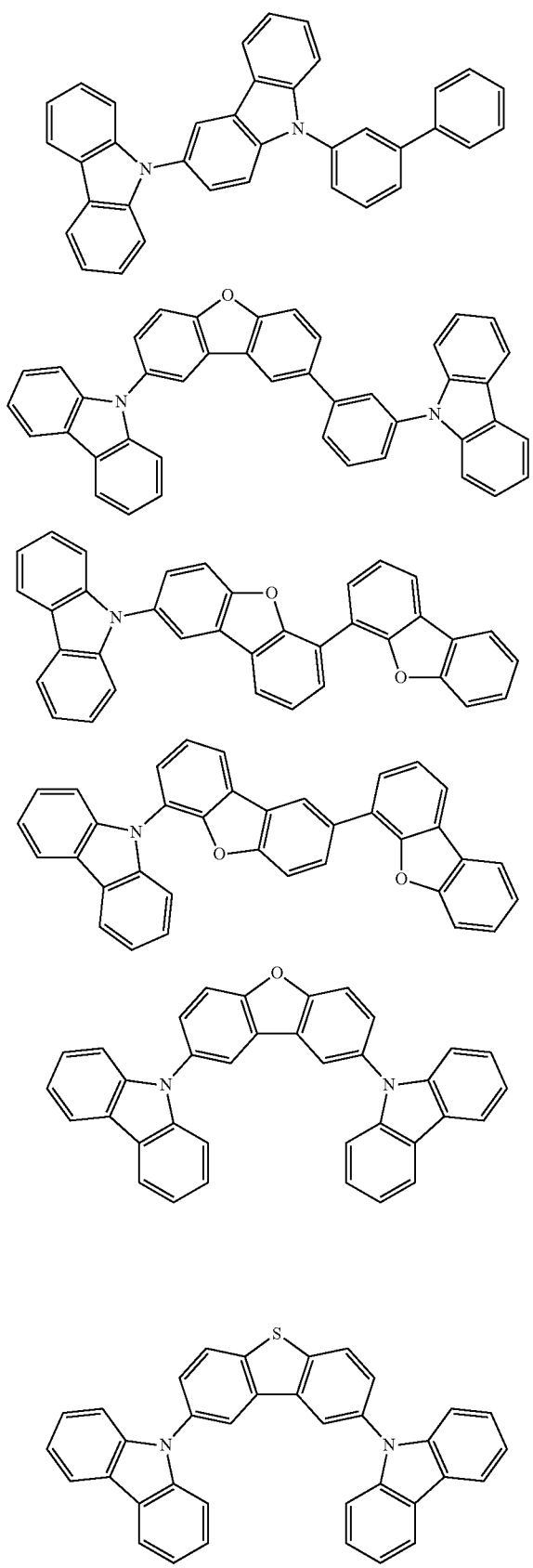
118
-continued
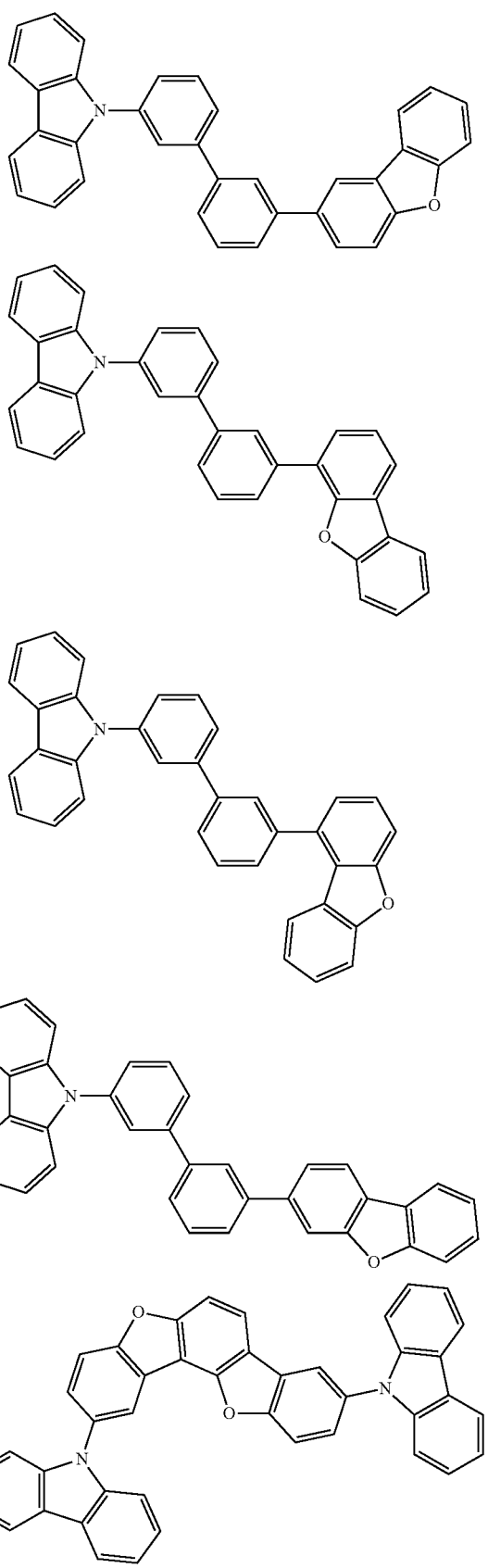

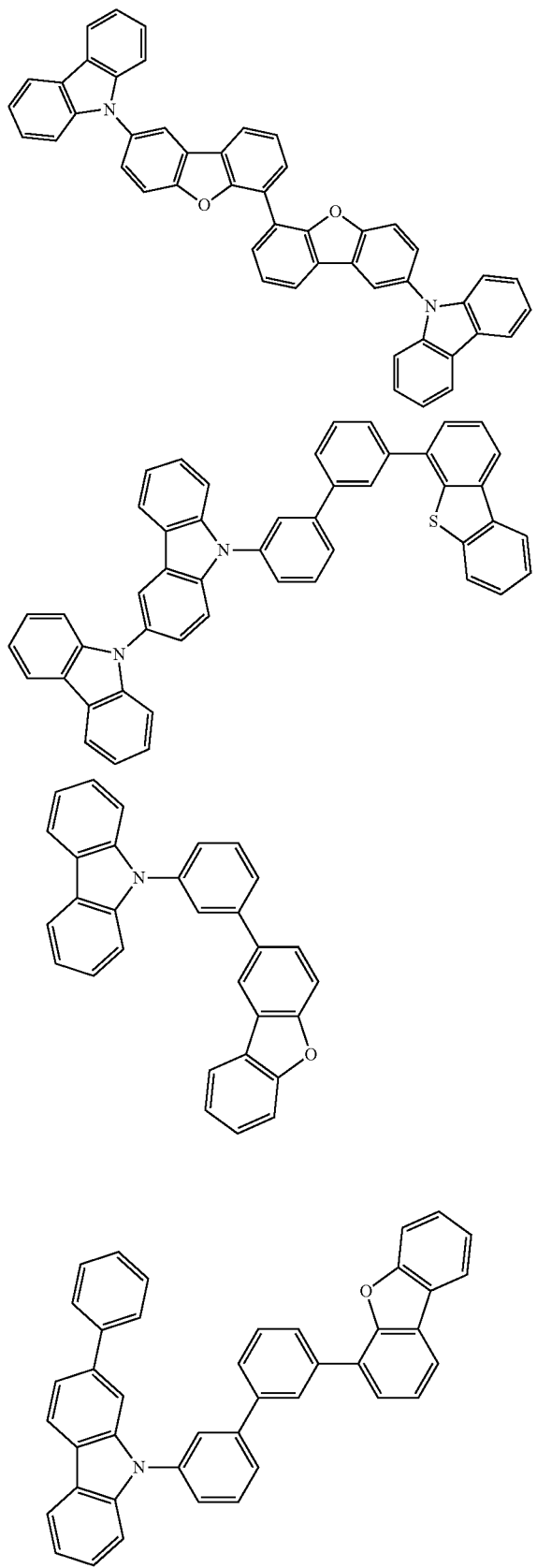
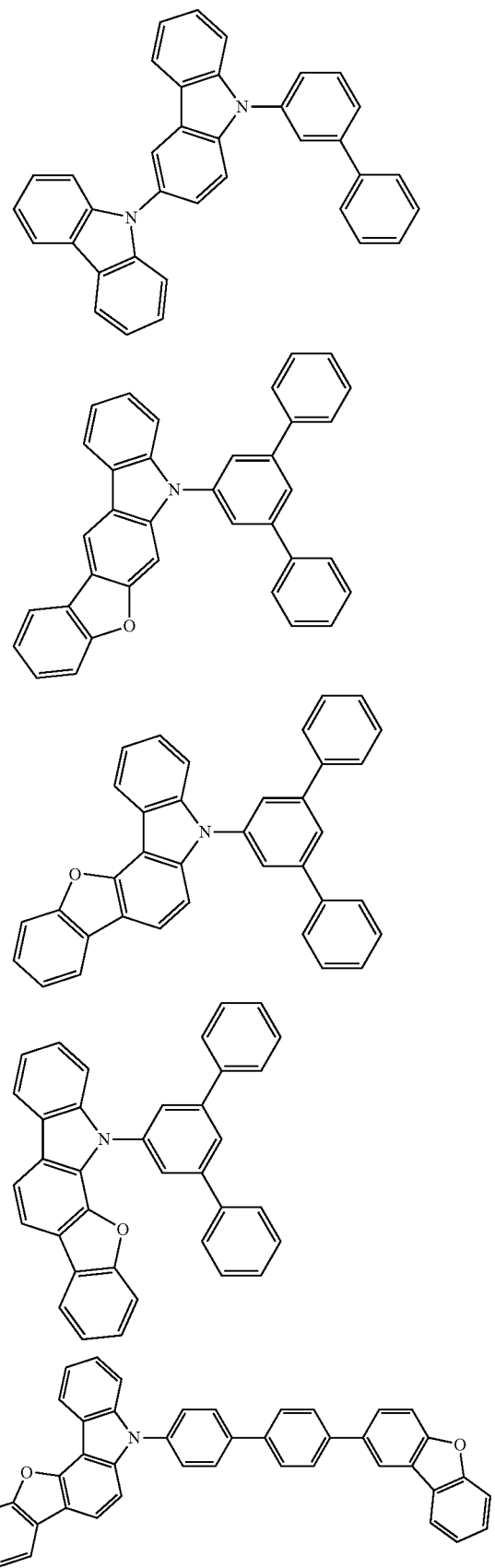

121
-continued
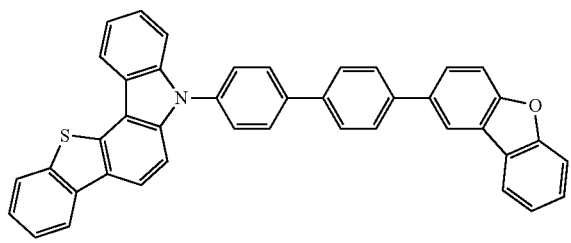
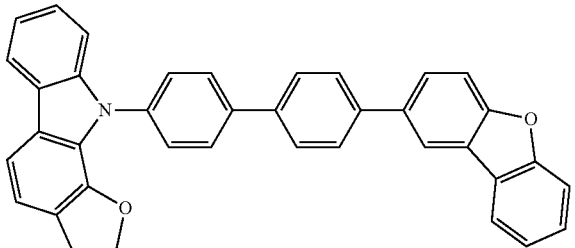
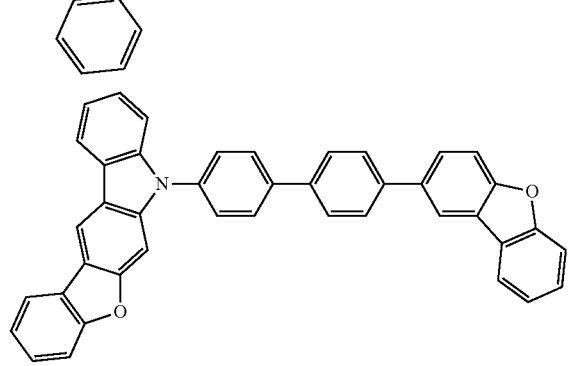
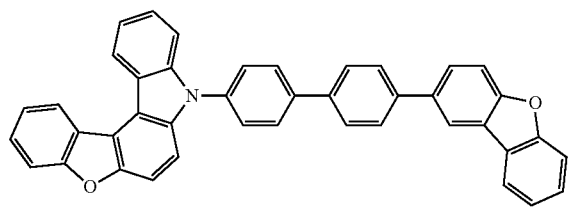
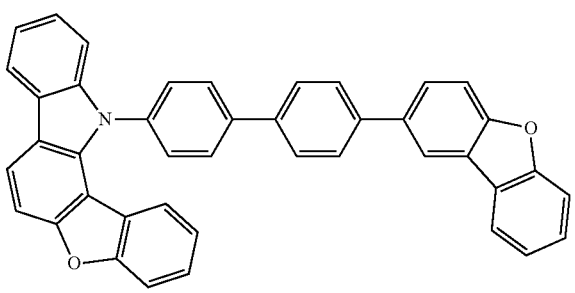
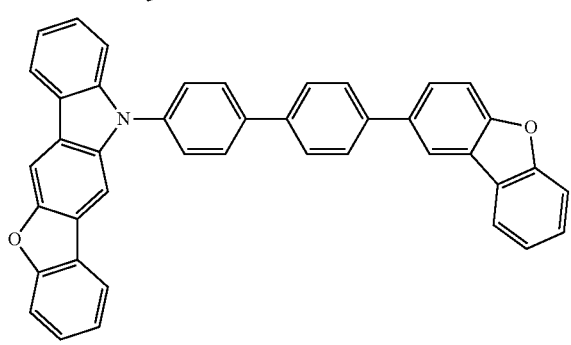
122
-continued
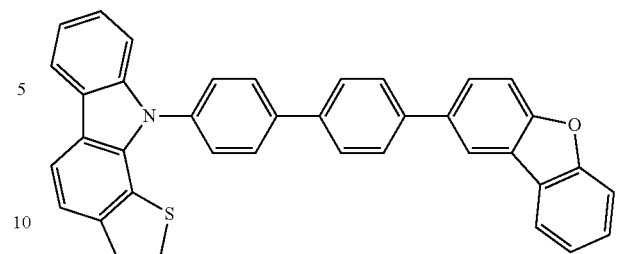
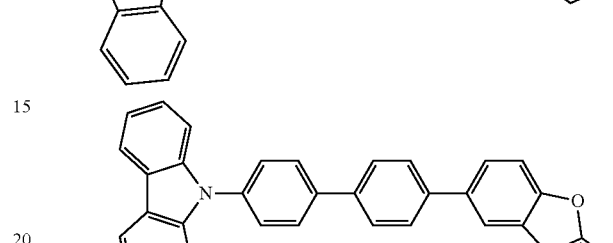
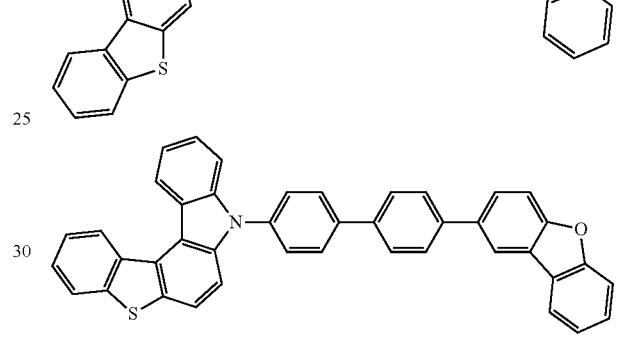
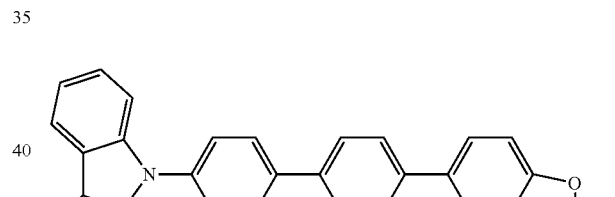
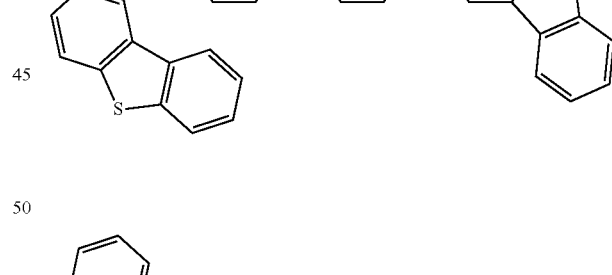
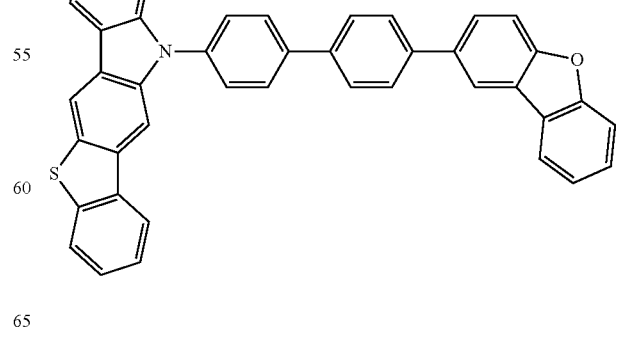

123
-continued
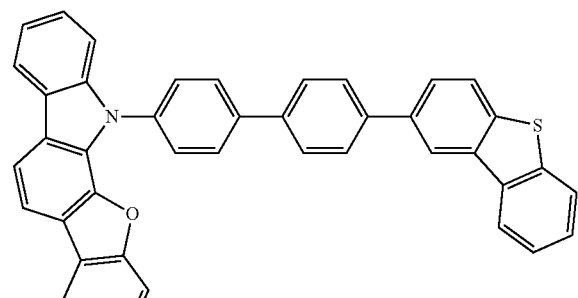
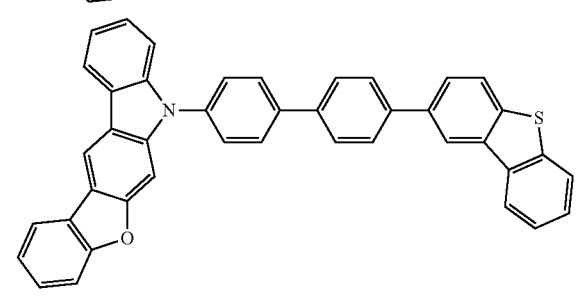
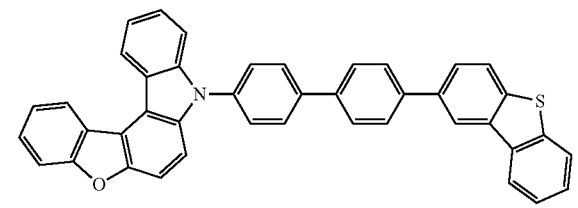
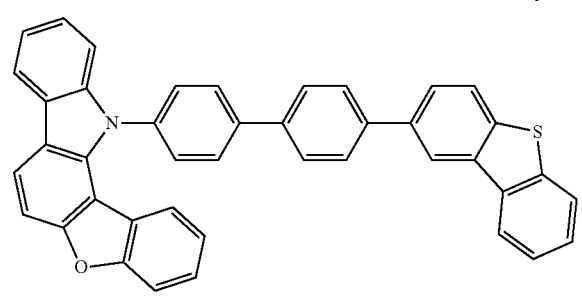
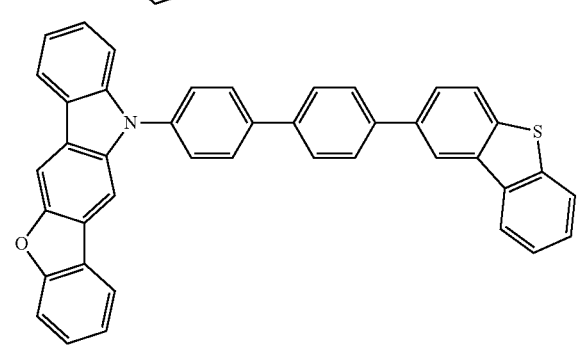
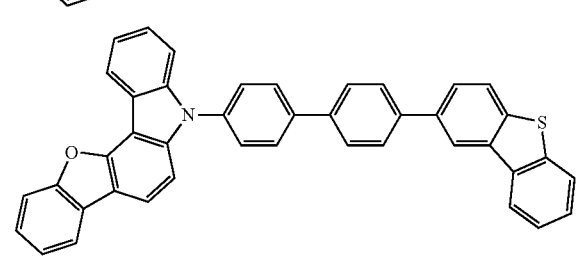
124
-continued
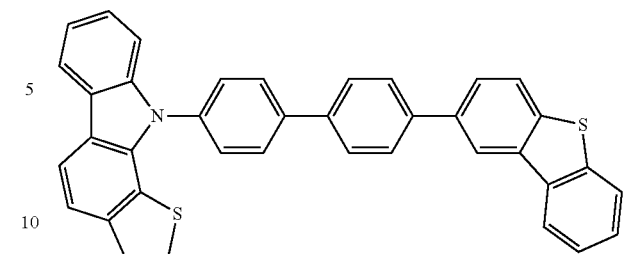
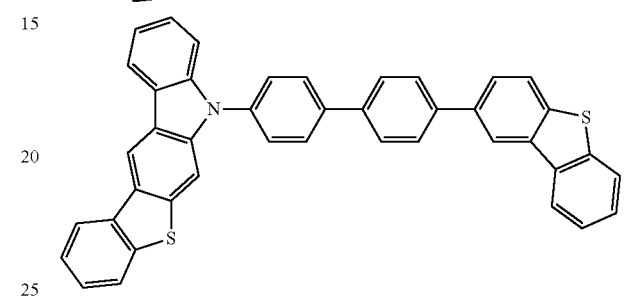
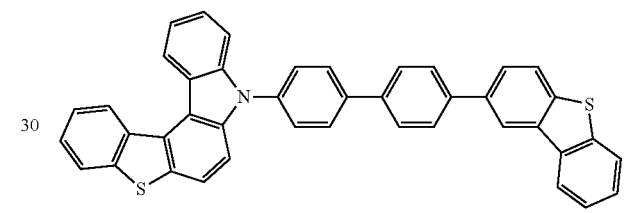
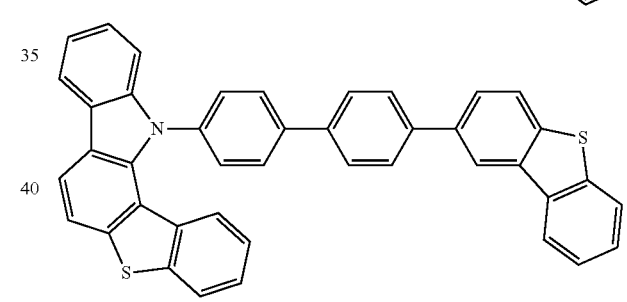
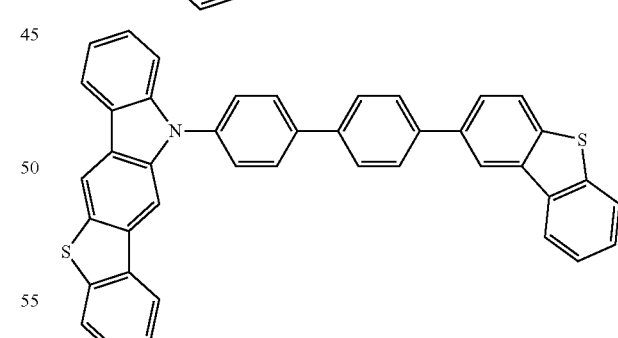
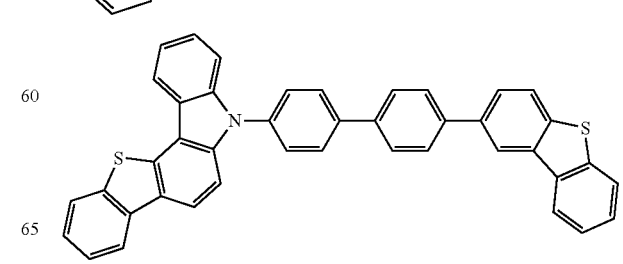

125
-continued
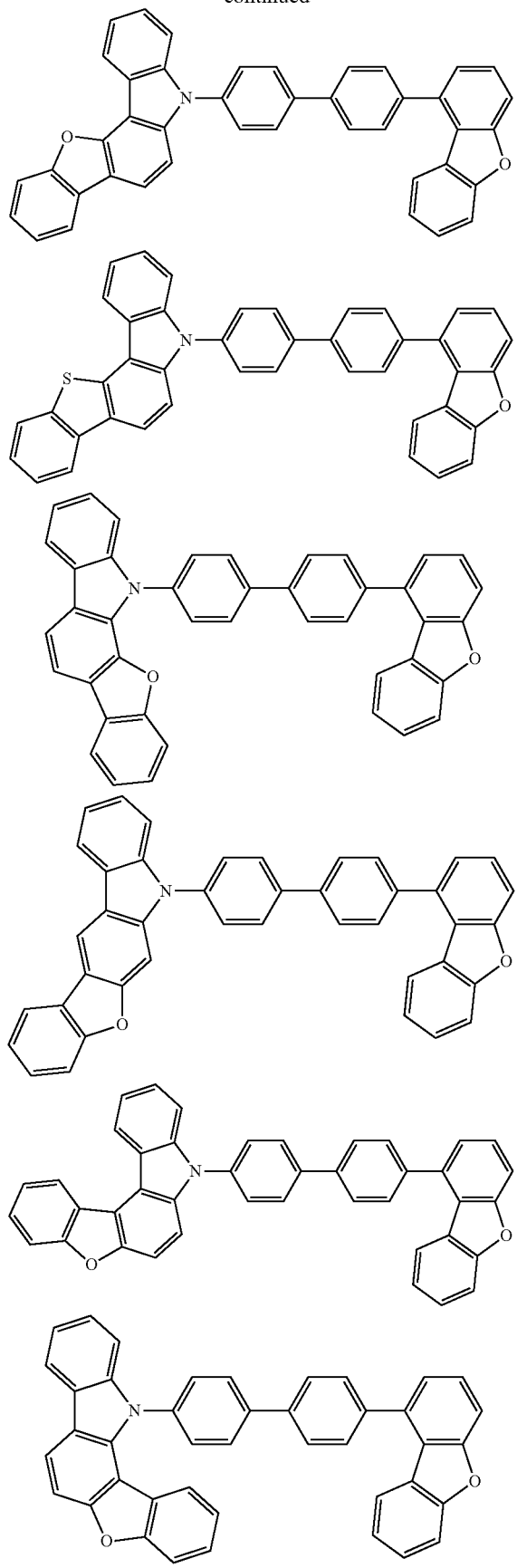
126
-continued
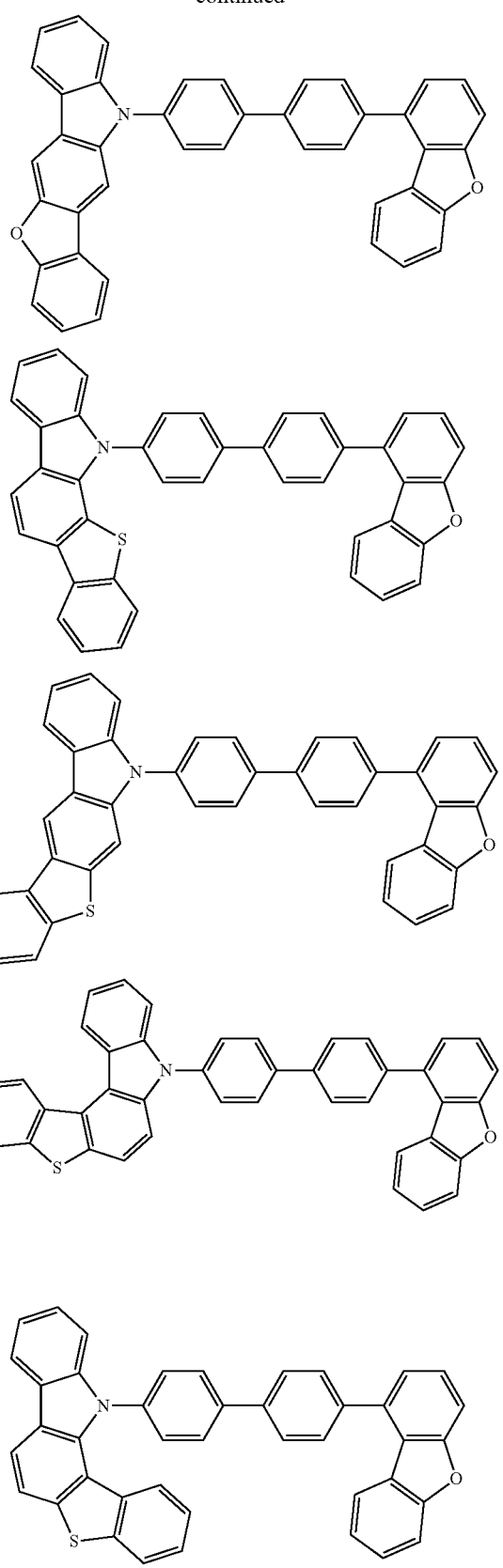

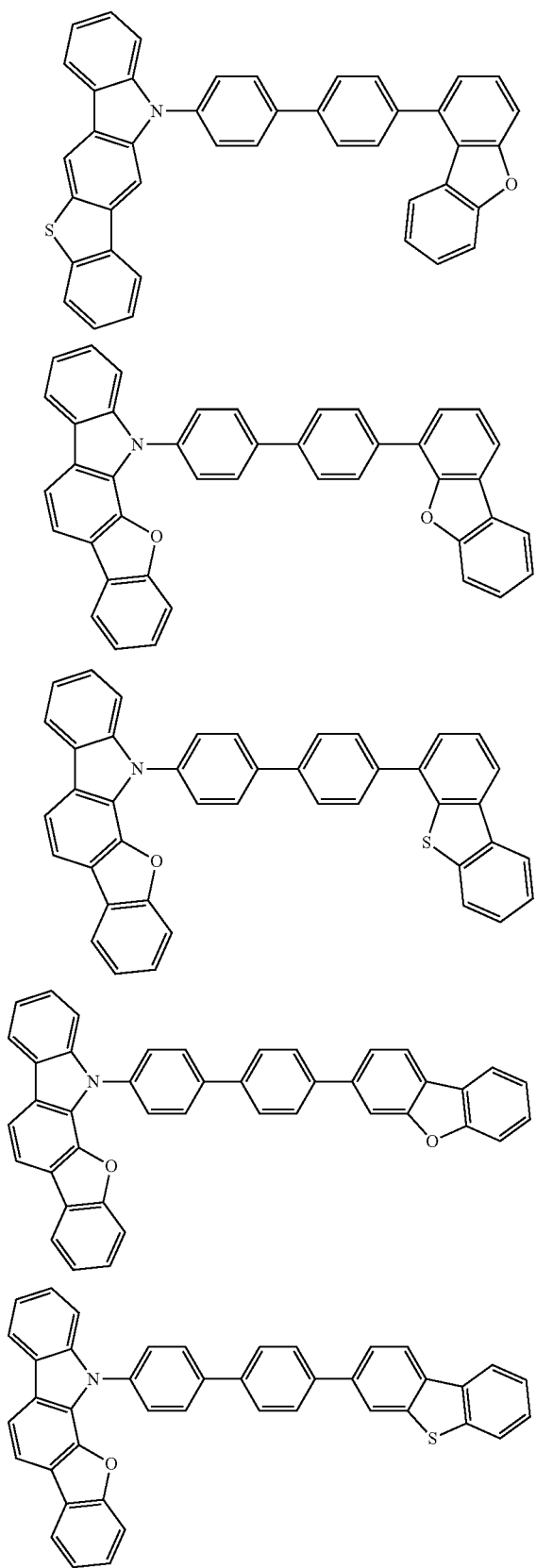
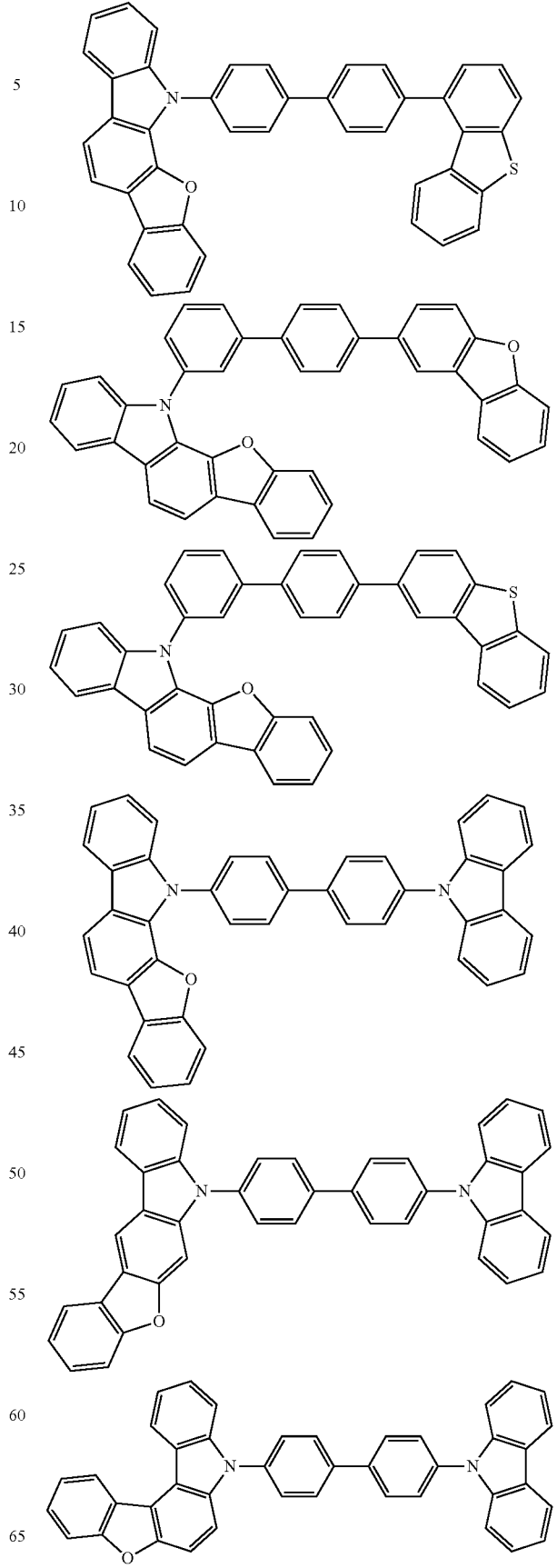

129
-continued
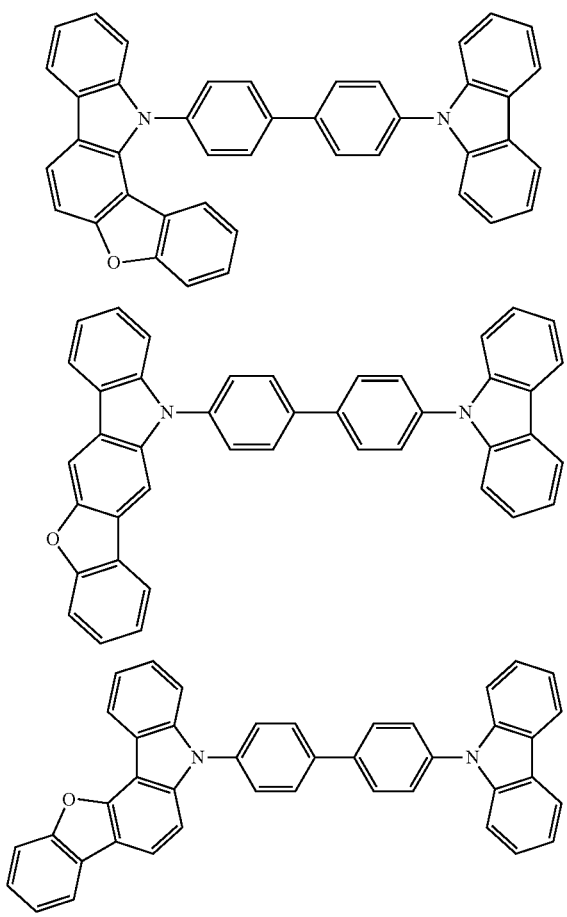
130
-continued
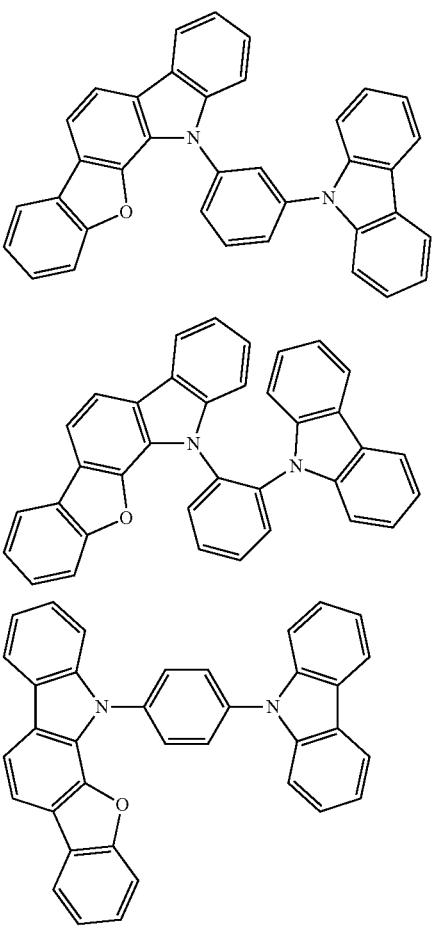
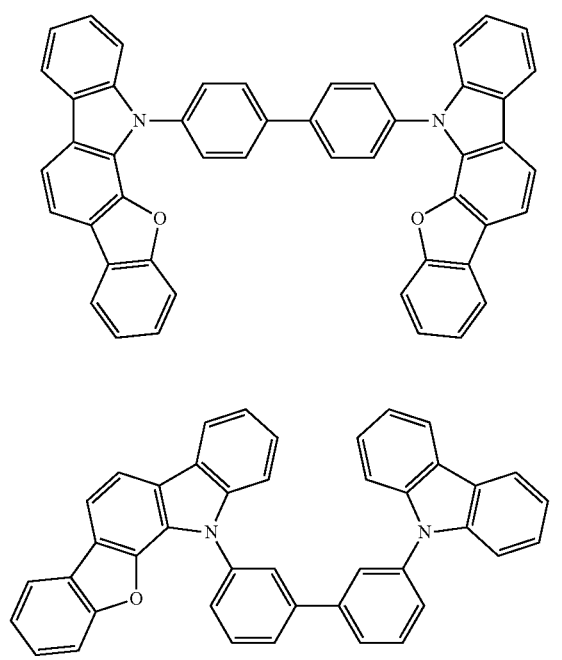
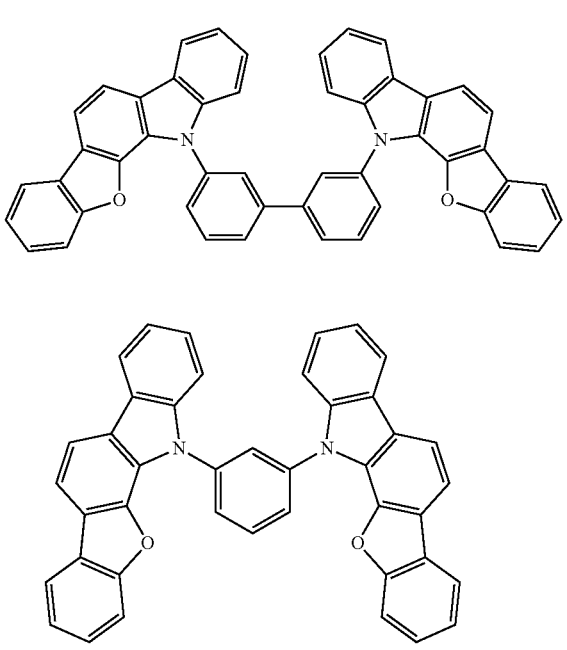

-continued
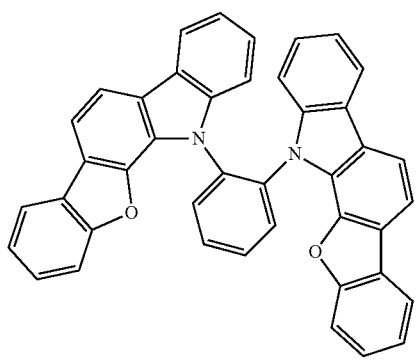
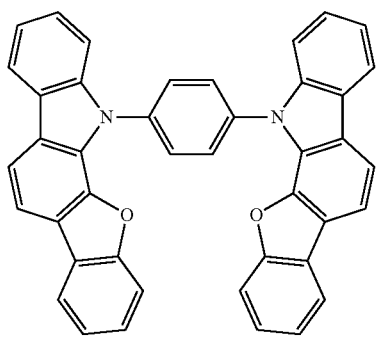
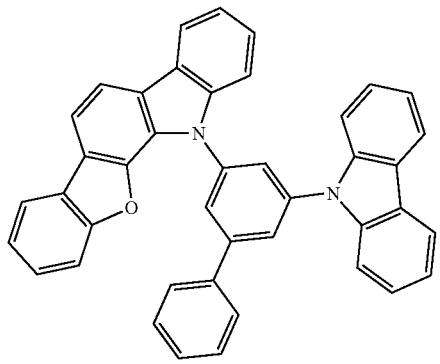
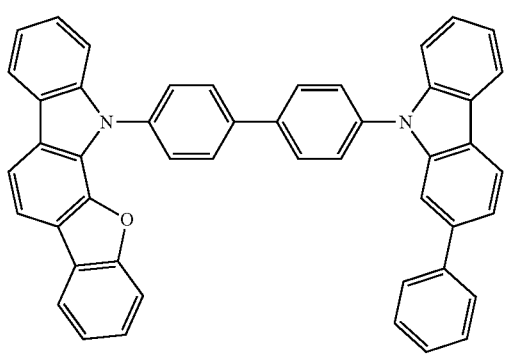
-continued
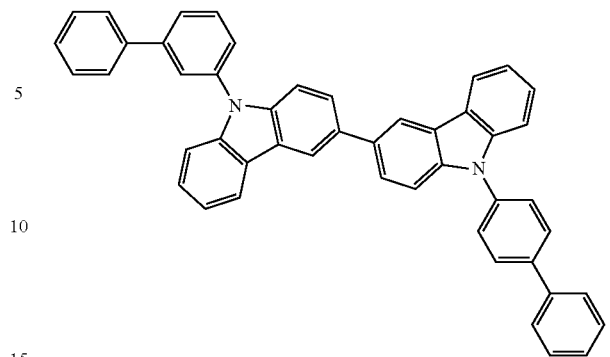
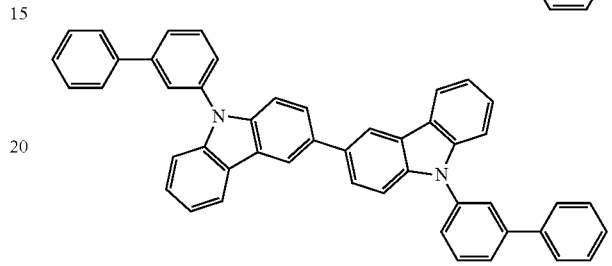
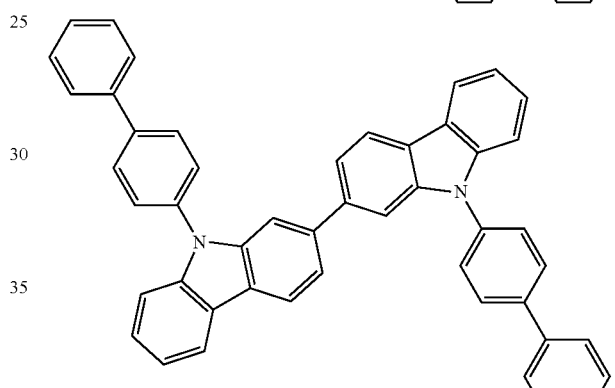
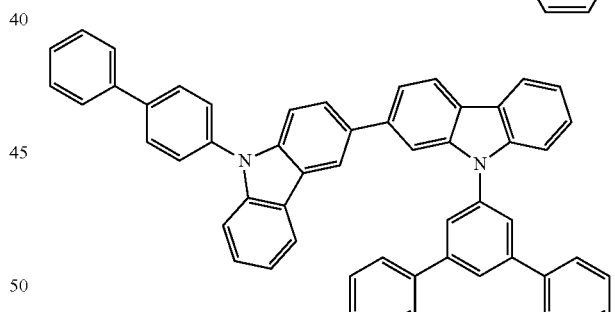
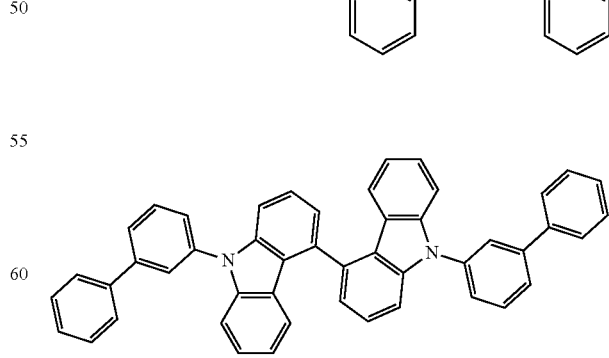

133
-continued
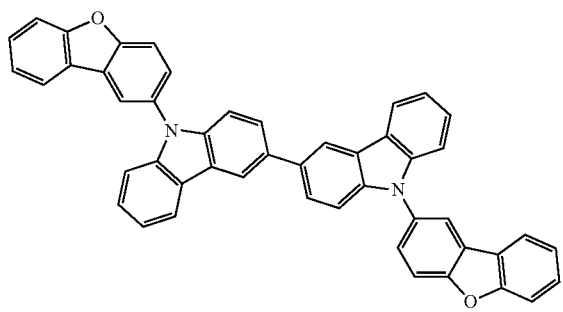
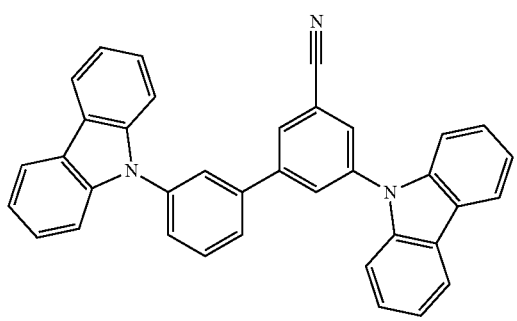
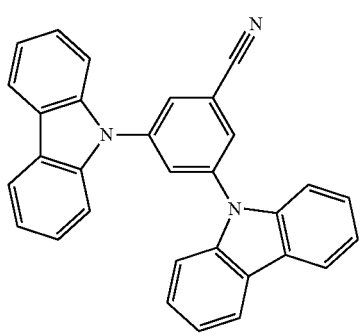
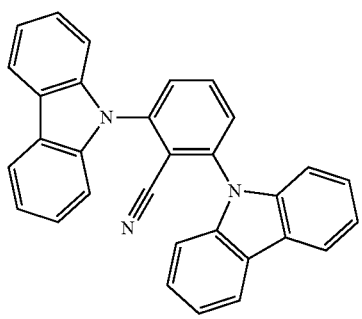
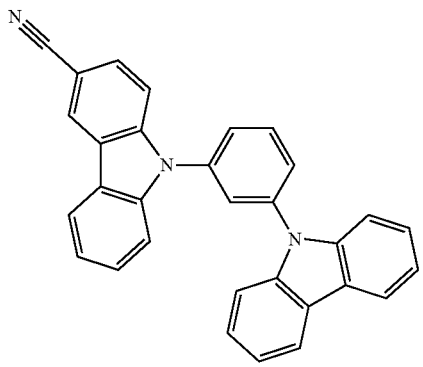
134
-continued
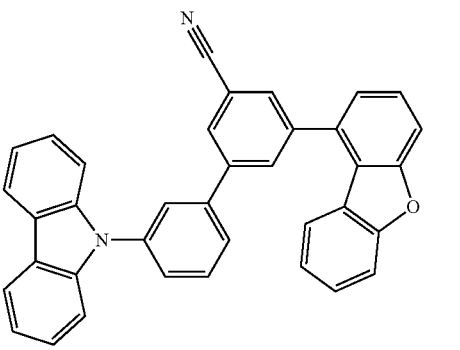
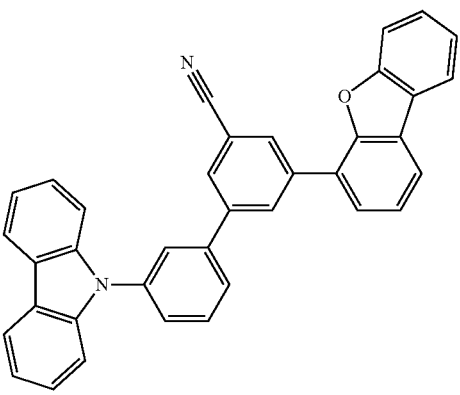
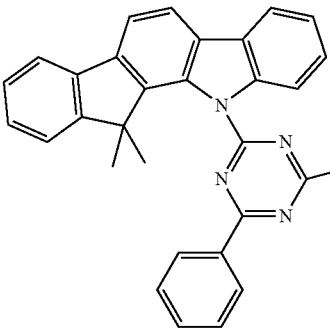
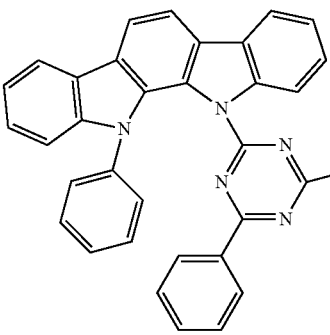

-continued

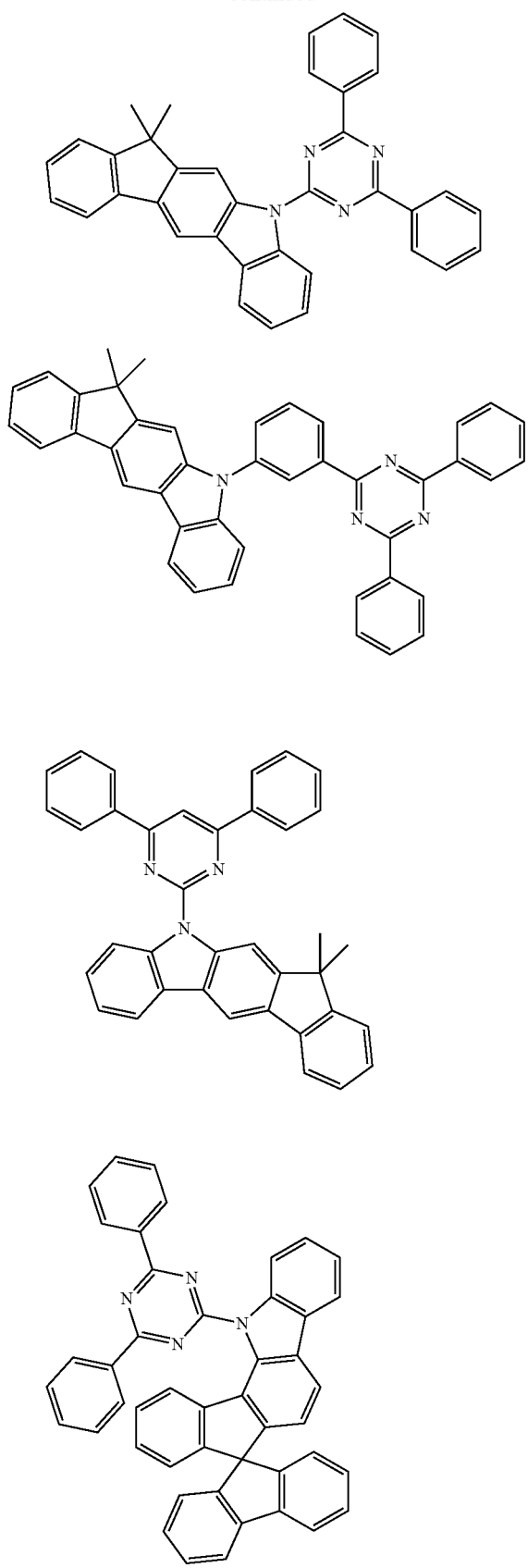

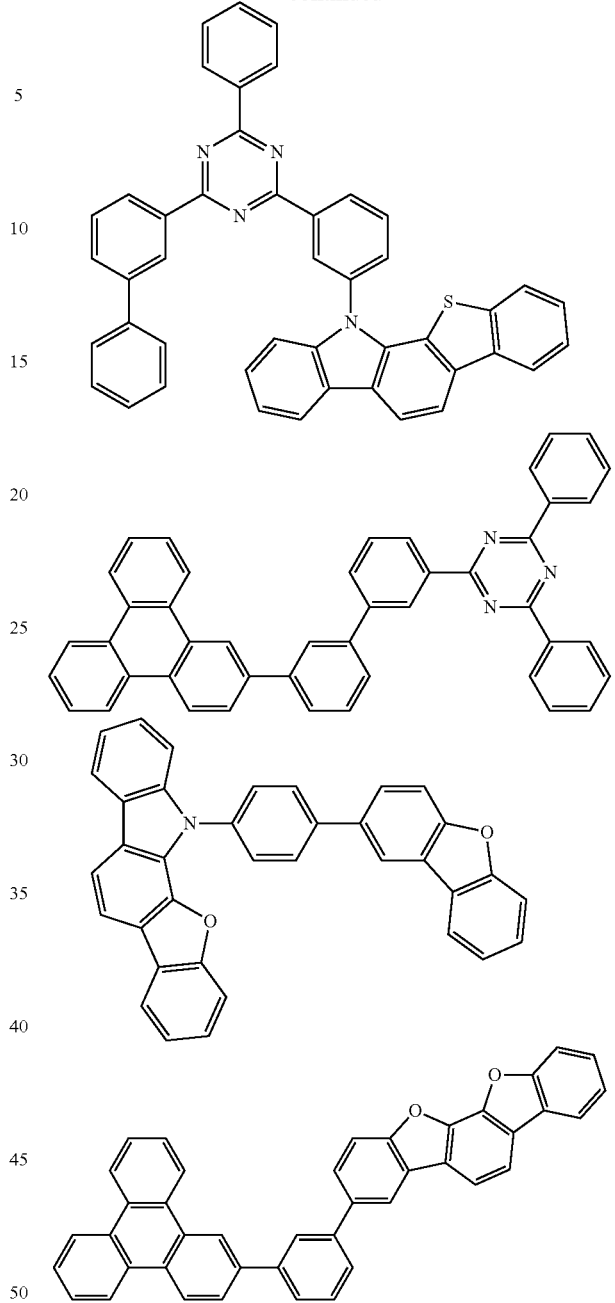

Relationship of First Compound, Second Compound, and Third Compound in Emitting Layer In the organic EL device of the exemplary embodiment, the first compound and the second compound preferably satisfy a numerical formula (Numerical Formula 5) below.

$$S_1(M2) > S_1(M1) \qquad \text{(Numerical Formula 5):}$$

$S_1(M1)$ is a lowest singlet energy of the first compound.

In the organic EL device according to the exemplary embodiment, a lowest singlet energy of the second compound $S_1(M2)$ and a lowest singlet energy of the third compound $S_1(M3)$ preferably satisfy a relationship of a numerical formula (Numerical Formula 4A) below.

$$S_1(M3) > S_1(M2) \qquad \text{(Numerical Formula 4A):}$$

In the organic EL device according to the exemplary embodiment, a lowest singlet energy of the first compound $S_1(M1)$, the lowest singlet energy of the second compound $S_1(M2)$, and the lowest singlet energy of the third compound $S_1(M3)$ preferably satisfy a relationship of a numerical formula (Numerical Formula 3) below.

$$S_1(M3) > S_1(M2) > S_1(M1) \quad \text{(Numerical Formula 4B):}$$

In the organic EL device according to the exemplary embodiment, an energy gap $T_{77K}(M3)$ at 77K of the third compound is preferably larger than an energy gap $T_{77K}(M1)$ at 77K of the first compound.

In the organic EL device according to the exemplary embodiment, the energy gap $T_{77K}(M3)$ at 77K of the third compound is preferably larger than an energy gap $T_{77K}(M2)$ at 77K of the second compound.

In the organic EL device according to the exemplary embodiment, the energy gap $T_{77K}(M1)$ at 77K of the first compound, the energy gap $T_{77K}(M2)$ at 77K of the second compound, and the energy gap $T_{77K}(M3)$ at 77K of the third compound preferably satisfy a relationship of a numerical formula (Numerical Formula 6) below.

$$T_{77K}(M3) > T_{77K}(M2) > T_{77K}(M1) \quad \text{(Numerical Formula 6):}$$

When the organic EL device of the exemplary embodiment emits light, it is preferable that a fluorescent compound in the emitting layer mainly emits light.

The organic EL device according to the exemplary embodiment preferably emits red light or green light.

When the organic EL device of the exemplary embodiment emits green light, the maximum peak wavelength of the light emitted from the organic EL device is preferably in a range from 500 nm to 560 nm.

When the organic EL device of the exemplary embodiment emits red light, the maximum peak wavelength of the light emitted from the organic EL device is preferably in a range from 600 nm to 660 nm.

When the organic EL device of the exemplary embodiment emits blue light, the maximum peak wavelength of the light emitted from the organic EL device is preferably in a range from 430 nm to 480 nm.

The maximum peak wavelength of light emitted from an organic EL device is measured as follows.

A voltage is applied to the organic EL device such that a current density is 10 mA/cm$^2$, where a spectral radiance spectrum is measured with a spectroradiometer CS-2000 (produced by Konica Minolta, Inc.).

In the obtained spectral radiance spectrum, an emission spectrum peak wavelength at which the luminous intensity is maximum is measured and used as the maximum peak wavelength (unit: nm).

Content Ratios of Compounds in Emitting Layer

The content ratios of the first compound, the second compound, and the third compound in the emitting layer preferably fall, for instance, within ranges below.

The content ratio of the first compound is preferably in a range from 0.01 mass % to 10 mass %, more preferably in a range from 0.01 mass % to 5 mass %, and still more preferably in a range from 0.01 mass % to 1 mass %.

The content ratio of the second compound is preferably in a range from 10 mass % to 80 mass %, more preferably in a range from 10 mass % to 60 mass %, and still more preferably in a range from 20 mass % to 60 mass %.

The content ratio of the third compound is preferably in a range from 10 mass % to 80 mass %.

The upper limit of the total content ratio of the first compound, the second compound, and the third compound in the emitting layer is 100 mass %.

In the exemplary embodiment, it is not excluded that the emitting layer contains a material other than the first compound, the second compound, and the third compound.

The emitting layer may contain only a single type of the first compound or may contain two or more types of the first compound.

The emitting layer may contain only a single type of the second compound or may contain two or more types of the second compound.

The emitting layer may contain only a single type of the third compound or may contain two or more types of the third compound.

TADF Mechanism

Figure 4:
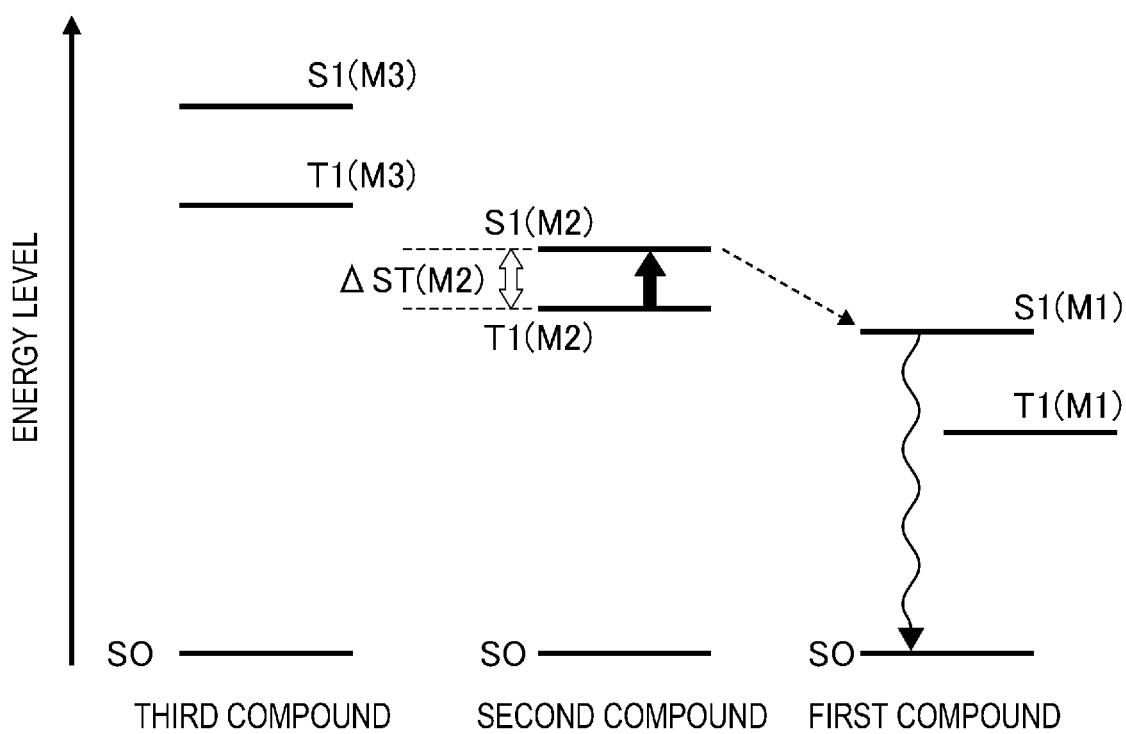
FIG. 4 is a diagram illustrating the relationships of energy transfer and energy levels of a first compound, a second compound, and a third compound in an emitting layer of an example of the organic electroluminescence device according to the first exemplary embodiment of the invention.

FIG. 4 is a diagram illustrating an example of the relationship of energy levels of the first compound, the second compound, and the third compound in an emitting layer.

In FIG. 4, S0 represents a ground state.

S1(M1) represents the lowest singlet state of the first compound, and T1 (M1) represents the lowest triplet state of the first compound.

S1(M2) represents the lowest singlet state of the second compound, and T1(M2) represents the lowest triplet state of the second compound.

S1 (M3) represents the lowest singlet state of the third compound, and T1(M3) represents the lowest triplet state of the third compound.

A dashed arrow directed from S1(M2) to S1(M1) in FIG. 4 represents Förster energy transfer from the lowest singlet state of the second compound to the lowest singlet state of the first compound.

As illustrated in FIG. 4, when a compound having a small $\Delta ST(M2)$ is used as the second compound, inverse intersystem crossing from the lowest triplet state T1(M2) to the lowest singlet state S1(M2) can be caused by thermal energy.

Subsequently, Förster energy transfer from the lowest singlet state S1(M2) of the second compound to the first compound occurs to generate the lowest singlet state S1(M1).

Consequently, fluorescence from the lowest singlet state S1(M1) of the first compound can be observed.

It is inferred that the internal quantum efficiency can be theoretically raised up to 100% also by using delayed fluorescence by the TADF mechanism.

Film Thickness of Emitting Layer

The film thickness of the emitting layer in the organic EL device of this exemplary embodiment is preferably in a range from 5 nm to 50 nm, more preferably in a range from 7 nm to 50 nm, and still more preferably in a range from 10 nm to 50 nm.

When the film thickness of the emitting layer is 5 nm or more, the formation of the emitting layer and the adjustment of the chromaticity are easy. When the film thickness of the emitting layer is 50 nm or less, an increase in the drive voltage is likely to be reduced.

An arrangement of the organic EL device will be further described below.

Substrate

The substrate is used as a support for the organic EL device. For instance, glass, quartz, plastics and the like are usable for the substrate. A flexible substrate is also usable. The flexible substrate is a bendable substrate, which is exemplified by a plastic substrate. Examples of the material for the plastic substrate include polycarbonate, polyarylate, polyethersulfone, polypropylene, polyester, polyvinyl fluoride, polyvinyl chloride, polyimide, and polyethylene naphthalate. Moreover, an inorganic vapor deposition film is also usable.

Anode

Metal, an alloy, an electrically conductive compound, a mixture thereof, or the like having a large work function (specifically, 4.0 eV or more) is preferably used as the anode formed on the substrate. Specific examples of the material include indium tin oxide (ITO), indium oxide-tin oxide containing silicon or silicon oxide, indium oxide-zinc oxide, indium oxide containing tungsten oxide and zinc oxide, and graphene. In addition, gold (Au), platinum (Pt), nickel (Ni), tungsten (W), chrome (Cr), molybdenum (Mo), iron (Fe), cobalt (Co), copper (Cu), palladium (Pd), titanium (Ti), and nitrides of a metal material (e.g., titanium nitride) are usable.

The material is typically formed into a film by a sputtering method. For instance, the indium oxide-zinc oxide can be formed into a film by the sputtering method using a target in which zinc oxide in a range from 1 mass % to 10 mass % is added to indium oxide. Moreover, for instance, the indium oxide containing tungsten oxide and zinc oxide can be formed by the sputtering method using a target in which tungsten oxide in a range from 0.5 mass % to 5 mass % and zinc oxide in a range from 0.1 mass % to 1 mass % are added to indium oxide. In addition, the anode may be formed by a vacuum deposition method, a coating method, an inkjet method, a spin coating method or the like.

Among the organic layers formed on the anode, since the hole injecting layer adjacent to the anode is formed of a composite material into which holes are easily injectable irrespective of the work function of the anode, a material usable as an electrode material (e.g., metal, an alloy, an electroconductive compound, a mixture thereof, and the elements belonging to the group 1 or 2 of the periodic table) is also usable for the anode.

A material having a small work function such as elements belonging to Groups 1 and 2 in the periodic table of the elements, specifically, an alkali metal such as lithium (Li) and cesium (Cs), an alkaline earth metal such as magnesium (Mg), calcium (Ca) and strontium (Sr), alloys (e.g., MgAg and AlLi) including the alkali metal or the alkaline earth metal, a rare earth metal such as europium (Eu) and ytterbium (Yb), alloys including the rare earth metal are also usable for the anode.

It should be noted that the vacuum deposition method and the sputtering method are usable for forming the anode using the alkali metal, alkaline earth metal and the alloy thereof. Further, when a silver paste is used for the anode, the coating method and the inkjet method are usable.

When the organic EL device is a bottom-emission device, the anode is preferably formed of a metallic material having a light transmission property or semi-light transmission property that transmits light from the emitting layer. Herein, the light transmission property or semi-light transmission property means a property of transmitting 50% or more (preferably 80% or more) of light emitted from the emitting layer. The metallic material having a light transmission property or semi-light transmission property can be appropriately selected from the materials mentioned in the above under the subtitle "Anode" and used.

When the organic EL device is a top-emission device, the anode is a reflective electrode having a reflection layer.

The reflection layer is preferably formed from a metallic material having light reflectivity.

Herein, the light reflectivity means a property of reflecting 50% or more (preferably 80% or more) of light emitted from the emitting layer. The metallic material having light reflectivity can be appropriately selected from the materials mentioned in the above under the subtitle "Anode" and used.

The anode may be formed only of the reflection layer, but may be a multilayer structure having the reflection layer and a conductive layer (preferably a transparent conductive layer). When the anode has a reflection layer and a conductive layer, the conductive layer is preferably disposed between the reflection layer and the hole transporting zone. The conductive layer can be appropriately selected from the materials mentioned in the above under the subtitle "Anode" and used.

Cathode

It is preferable to use metal, an alloy, an electroconductive compound, a mixture thereof, or the like having a small work function (specifically, 3.8 eV or less) for the cathode. Examples of the material for the cathode include elements belonging to Groups 1 and 2 in the periodic table of the elements, specifically, an alkali metal such as lithium (Li) and cesium (Cs), an alkaline earth metal such as magnesium (Mg), calcium (Ca) and strontium (Sr), alloys (e.g., MgAg and AlLi) including the alkali metal or the alkaline earth metal, a rare earth metal such as europium (Eu) and ytterbium (Yb), and alloys including the rare earth metal.

It should be noted that the vacuum deposition method and the sputtering method are usable for forming the cathode using the alkali metal, alkaline earth metal and the alloy thereof. Further, when a silver paste is used for the cathode, the coating method and the inkjet method are usable.

By providing the electron injecting layer, various conductive materials such as Al, Ag, ITO, graphene, and indium oxide-tin oxide containing silicon or silicon oxide may be used for forming the cathode regardless of the work function. The conductive materials can be formed into a film using the sputtering method, inkjet method, spin coating method and the like.

When the organic EL device is a bottom-emission device, the cathode is a reflective electrode. The reflective electrode is preferably formed of a metallic material having light reflectivity. The metallic material having light reflectivity can be appropriately selected from the materials mentioned in the above under the subtitle "Cathode" and used.

When the organic EL device is a top-emission device, the cathode is preferably formed of a metallic material having a light transmission property or semi-light transmission property that transmits light from the emitting layer. The metallic material having a light transmission property or semi-light transmission property can be appropriately selected from the materials mentioned in the above under the subtitle "Cathode" and used.

The organic EL device according to the exemplary embodiment may be a bottom-emission organic EL device. Alternatively, the organic EL device according to the exemplary embodiment may be a top-emission organic EL device.

When the organic EL device is a bottom-emission device, the anode is preferably a light-transmissive electrode having a light transmission property, and the cathode is preferably a light-reflective electrode having light reflectivity.

When the organic EL device is a top-emission device, the anode is preferably a light-reflective electrode having light reflectivity, and the cathode is preferably a light-transmissive electrode having a light transmission property.

Capping Layer

When the organic EL device is a top-emission device, the organic EL device typically includes a capping layer on an upper portion of the cathode.

The capping layer may contain, for instance, at least one compound selected from the group consisting of high polymer compounds, metal oxides, metal fluorides, metal borides, silicon nitride, and silicon compounds (such as silicon oxide).

The capping layer may contain, for instance, at least one compound selected from the group consisting of aromatic amine derivatives, anthracene derivatives, pyrene derivatives, fluorene derivatives, and dibenzofuran derivatives.

Furthermore, a laminate obtained by layering layers containing these substances is also usable as the capping layer.

Hole Injecting Layer

The hole injecting layer is a layer containing a substance exhibiting a high hole injectability. Examples of the substance exhibiting a high hole injectability include molybdenum oxide, titanium oxide, vanadium oxide, rhenium oxide, ruthenium oxide, chrome oxide, zirconium oxide, hafnium oxide, tantalum oxide, silver oxide, tungsten oxide, and manganese oxide.

In addition, examples of the substance exhibiting a high hole injectability further include: aromatic amine compounds, which are low-molecular organic compounds, such as 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4-bis(N-{4-[N'-(3-methyl phenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazole-3-yl)-N-phenylamino]-9-phenylcarbazole (abbreviation: PCzPCA1), 3,6-bis[N-(9-phenylcarbazole-3-yl)-N-phenylamino]-9-phenylcarbazole (abbreviation: PCzPCA2), and 3-[N-(1-naphthyl)-N-(9-phenylcarbazole-3-yl)amino]-9-phenylcarbazole (abbreviation: PCzPCN1).

In addition, a high polymer compound (e.g., oligomer, dendrimer and polymer) is usable as the substance exhibiting a high hole injectability. Examples of the high-molecule compound include poly(N-vinylcarbazole) (abbreviation: PVK), poly(4-vinyltriphenylamine) (abbreviation: PVTPA), poly[N-(4-{N'-[4-(4-diphenylamiino)phenyl]phenyl-N'-phenylamino}phenyl)methacrylamide] (abbreviation: PTPDMA), and poly[N,N'-bis(4-butylphenyl)-N,N'-bis(phenyl)benzidine](abbreviation: Poly-TPD).

Moreover, an acid-added high polymer compound such as poly(3,4-ethylenedioxythiophene)/poly(styrene sulfonic acid) (PEDOT/PSS) and polyaniline/poly(styrene sulfonic acid) (PAni/PSS) are also usable.

Hole Transporting Layer

The hole transporting layer is a layer containing a highly hole-transporting substance. An aromatic amine compound, carbazole derivative, anthracene derivative and the like are usable for the hole transporting layer. Specific examples of a material for the hole transporting layer include 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4-phenyl-4'-(9-phenylfluorene-9-yl)triphenylamine (abbreviation: BAFLP), 4,4'-bis[N-(9,9-dimethylfluorene-2-yl)-N-phenylamino]biphenyl (abbreviation: DFLDPBi), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), and 4,4'-bis[N-(spiro-9,9'-bifluorene-2-yl)-N-phenylamino]biphenyl (abbreviation: BSPB). The above-described substances mostly have a hole mobility of $10^{-6}$ cm$^2$/Vs or more.

Carbazole derivatives such as CBP, CzPA, and PCzPA and anthracene derivatives such as t-BuDNA, DNA, and DPAnth may be used for the hole transporting layer.

A high polymer compound such as poly(N-vinylcarbazole) (abbreviation: PVK) and poly(4-vinyltriphenylamine) (abbreviation: PVTPA) is also usable.

However, any substance other than the above substances may be used as long as the substance exhibits a higher hole transportability than the electron transportability.

It should be noted that the layer containing the substance exhibiting a high hole transportability may be a single layer or a laminate of two or more layers formed of the above substance(s).

Electron Transporting Layer

The electron transporting layer is a layer containing a highly electron-transporting substance. For the electron transporting layer, 1) a metal complex such as an aluminum complex, beryllium complex, and zinc complex, 2) a hetero aromatic compound such as imidazole derivative, benzimidazole derivative, azine derivative, carbazole derivative, and phenanthroline derivative, and 3) a high polymer compound are usable. Specifically, as a low-molecule organic compound, a metal complex such as Alq, tris(4-methyl-8-quinolinato)aluminum (abbreviation: Almq3), bis(10-hydroxybenzo[h]quinolinato)beryllium (abbreviation: BeBq2), BAlq, Znq, ZnPBO and ZnBTZ is usable.

In addition to the metal complex, a heteroaromatic compound such as 2-(4-biphenylyl)-5-(4-tert-butylphenyl)-1,3,4-oxadiazole (abbreviation: PBD), 1,3-bis[5-(ptert-butylphenyl)-1,3,4-oxadiazole-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproine (abbreviation: BCP), and 4,4'-bis(5-methylbenzoxazole-2-yl)stilbene (abbreviation: BzOs) is usable. The above-described substances mostly have an electron mobility of $10^{-6}$ cm$^2$/Vs or more. It should be noted that any substance other than the above substance may be used for the electron transporting layer as long as the substance exhibits a higher electron transportability than the hole transportability. The electron transporting layer may be a single layer or a laminate of two or more layers formed of the above substance(s).

Further, a high polymer compound is usable for the electron transporting layer. For instance, poly[(9,9-dihexylfluorene-2,7-diyl)-co-(pyridine-3,5-diyl)] (abbreviation: PF-Py), poly[(9,9-dioctylfluorene-2,7-diyl)-co-(2,2'-bipyridine-6,6'-diyl)] (abbreviation: PF-BPy) and the like are usable.

Electron Injecting Layer

The electron injecting layer is a layer containing a highly electron-injectable substance. Examples of a material for the electron injecting layer include an alkali metal, alkaline earth metal and a compound thereof, examples of which include lithium (Li), cesium (Cs), calcium (Ca), lithium fluoride (LiF), cesium fluoride (CsF), calcium fluoride (CaF$_2$), and lithium oxide (LiOx). In addition, the alkali metal, alkaline earth metal or the compound thereof may be added to the substance exhibiting the electron transportability in use. Specifically, for instance, magnesium (Mg) added to Alq may be used. In this case, the electrons can be more efficiently injected from the cathode.

Alternatively, the electron injecting layer may be provided by a composite material in a form of a mixture of the organic compound and the electron donor. Such a composite material exhibits excellent electron injectability and electron transportability since electrons are generated in the organic compound by the electron donor. In this case, the organic compound is preferably a material excellent in transporting the generated electrons. Specifically, the above examples (e.g., the metal complex and the hetero aromatic compound) of the substance forming the electron transporting layer are usable. As the electron donor, any substance exhibiting electron donating property to the organic compound is usable. Specifically, the electron donor is preferably alkali metal, alkaline earth metal and rare earth metal such as lithium, cesium, magnesium, calcium, erbium and ytterbium. The electron donor is also preferably alkali metal oxide and alkaline earth metal oxide such as lithium oxide, calcium oxide, and barium oxide. Moreover, a Lewis base such as magnesium oxide is usable. Further, the organic compound such as tetrathiafulvalene (abbreviation: TTF) is usable.

Layer Formation Method

A method of forming each of the layers of the organic EL device according to any of the exemplary embodiments is not limited except for the above particular description, and a known method can be used. Examples of the usable method include: dry film-forming such as vacuum deposition, a sputtering method, a plasma method, and an ion plating method, and wet film-forming such as a spin coating method, a dipping method, a flow coating method, and an inkjet method.

Film Thickness

The thickness of each of the organic layers of the organic EL device according to the exemplary embodiment is not limited except for the above particular description. In general, the thickness preferably ranges from several nanometers to 1 µm because an excessively small film thickness is likely to cause defects (e.g. pin holes) and an excessively large thickness leads to the necessity of applying high voltage and consequent reduction in efficiency.

The organic EL device according to the exemplary embodiment is applicable to electronic devices such as a display device and a light-emitting unit.

Second Exemplary Embodiment

Electronic Device

An electronic device according to this exemplary embodiment is installed with any one of the organic EL devices according to the above exemplary embodiments. Examples of the electronic device include a display device and a light-emitting unit. Examples of the display device include a display component (e.g., an organic EL panel module), TV, mobile phone, tablet and personal computer. Examples of the light-emitting unit include an illuminator and a vehicle light.

The display device serving as an electronic device according to the exemplary embodiment is preferably an organic EL display device equipped with organic EL devices serving as a red pixel, a green pixel, and a blue pixel.

In this organic EL display device, the red pixel is preferably an organic EL device according to the first exemplary embodiment.

Modifications of Exemplary Embodiments

It should be noted that the scope of the invention is not limited by the above-described exemplary embodiments, and any modification, improvement, or the like is included in the scope of the invention as long as an object of the invention can be achieved.

For instance, the emitting layer is not limited to a single layer, but may be provided by laminating a plurality of emitting layers.

When the organic EL device has the plurality of emitting layers, it is only required that at least one of the emitting layers satisfies the conditions described in the above exemplary embodiments.

For instance, the rest of the emitting layers may be a fluorescent emitting layer or a phosphorescent emitting layer with use of emission caused by electron transfer from the triplet excited state directly to the ground state.

When the organic EL device includes a plurality of emitting layers, these emitting layers may be mutually adjacently provided, or may form a so-called tandem organic EL device, in which a plurality of emitting units are layered via an intermediate layer.

For instance, a blocking layer may be provided adjacent to at least one of a side of the emitting layer close to the anode or a side of the emitting layer close to the cathode.

The blocking layer is preferably provided in contact with the emitting layer to block at least any of holes, electrons, or excitons. For instance, when the blocking layer is provided in contact with the side of the emitting layer close to the cathode, the blocking layer permits transport of electrons, and blocks holes from reaching a layer provided closer to the cathode (e.g., the electron transporting layer) beyond the blocking layer.

When the organic EL device includes the electron transporting layer, the blocking layer is preferably interposed between the emitting layer and the electron transporting layer.

When the blocking layer is provided in contact with the side of the emitting layer close to the anode, the blocking layer permits transport of holes and blocks electrons from reaching a layer provided closer to the anode (e.g., the hole transporting layer) beyond the blocking layer.

When the organic EL device includes the hole transporting layer, the blocking layer is preferably interposed between the emitting layer and the hole transporting layer.

Alternatively, the blocking layer may be provided adjacent to the emitting layer so that the excitation energy does not leak out from the emitting layer toward neighboring layer(s).

The blocking layer blocks excitons generated in the emitting layer from being transferred to a layer(s) (e.g., the electron transporting layer and the hole transporting layer) closer to the electrode(s) beyond the blocking layer.

The emitting layer is preferably bonded with the blocking layer.

Specific structure, shape and the like of the components in the invention may be designed in any manner as long as an object of the invention can be achieved.

Examples

The invention will be described in more detail by way of Examples. The invention is not at all limited to these Examples.

Compounds

The structures of compounds used to produce organic EL devices according to Examples and Comparative Examples are shown below.

145
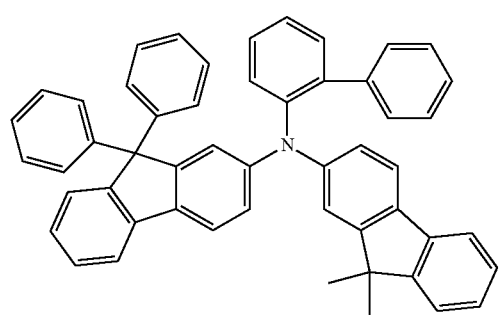
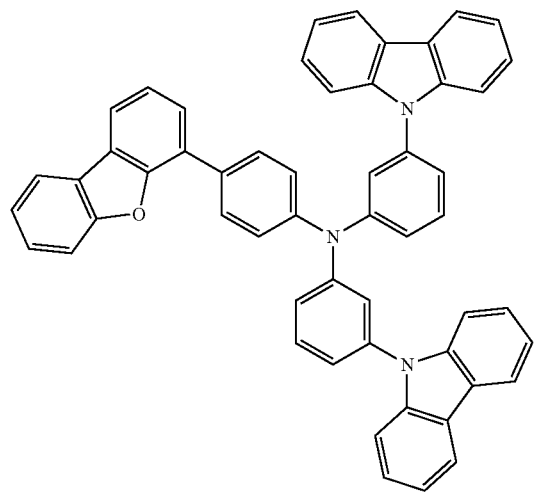
146
HA
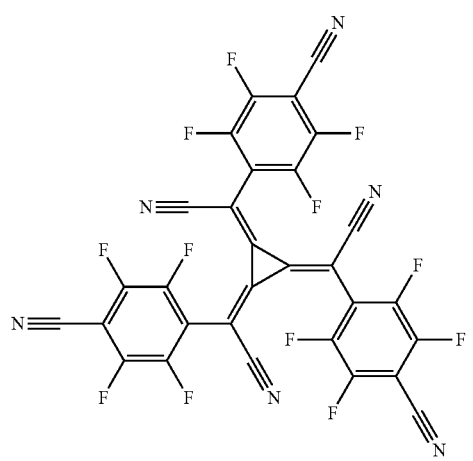
HT-1
HT-2
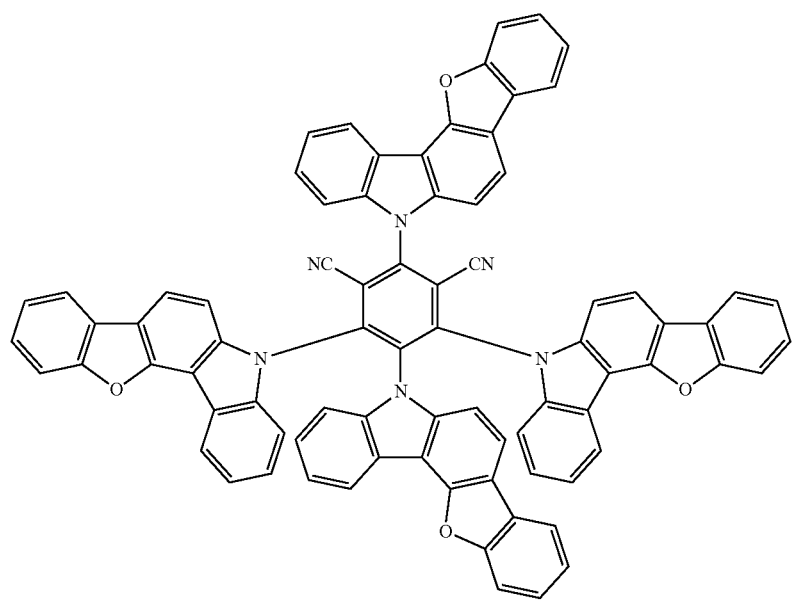
TADF-1

-continued
TADF-2
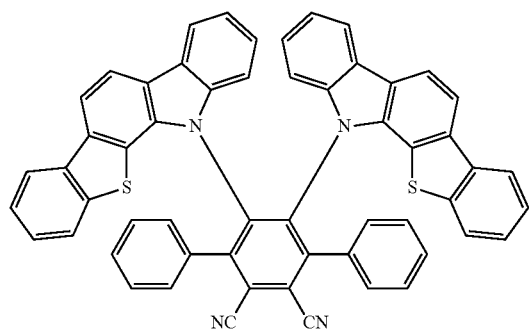
TADF-3
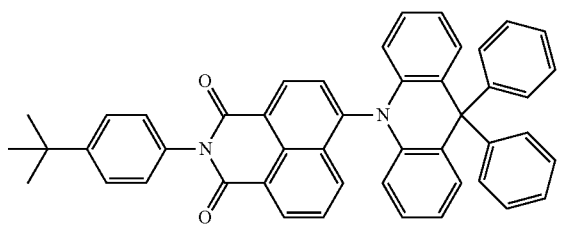
HOST-1
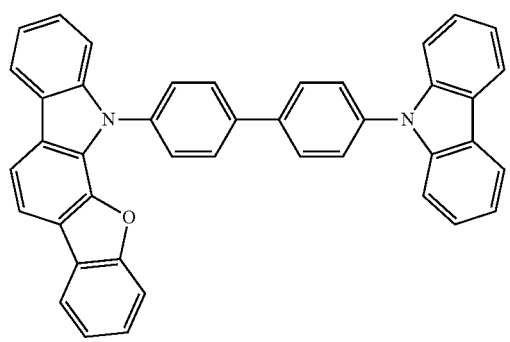
HOST-2
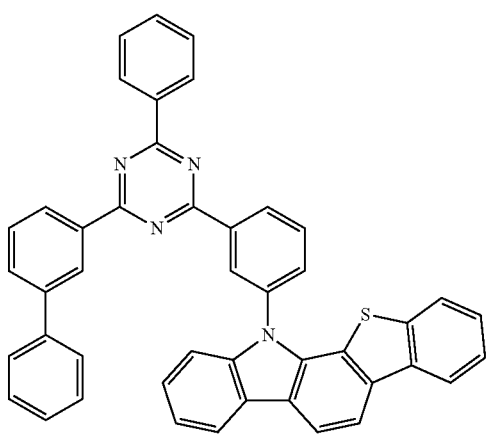
RD
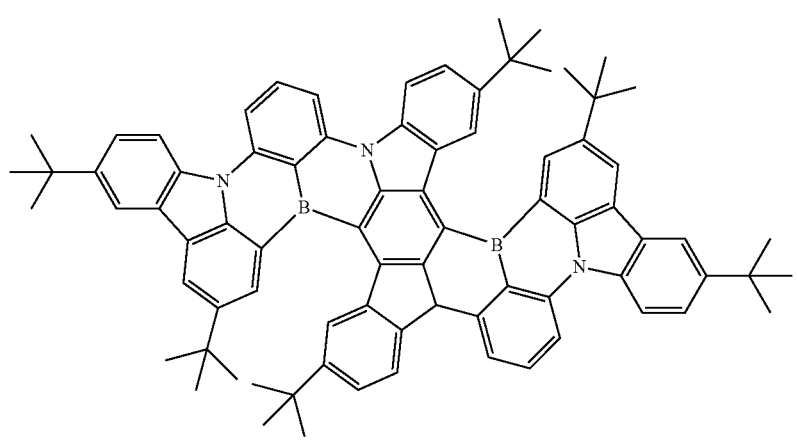

-continued

ET-1

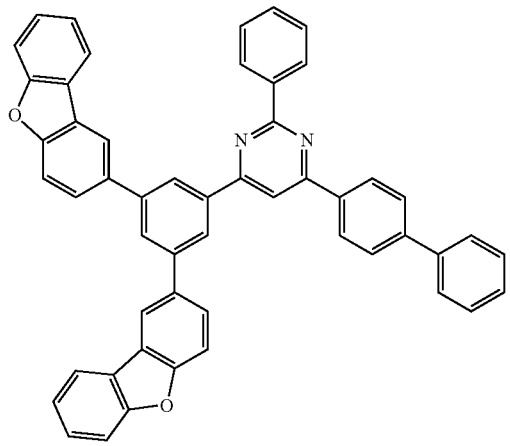

ET-2

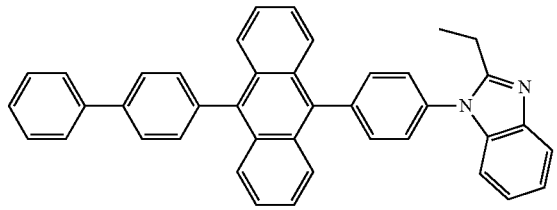

CAP

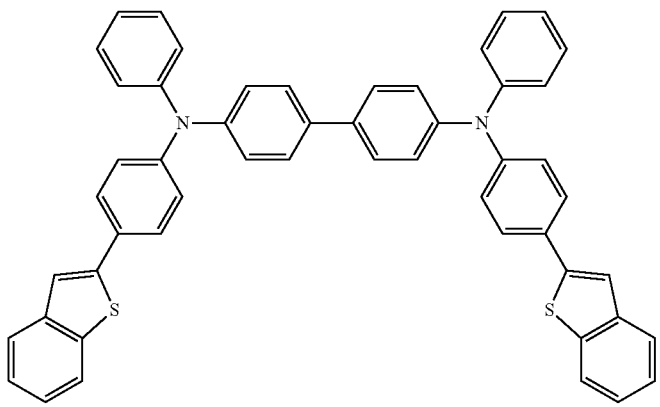

Production (1) of Organic EL Devices

Organic EL devices were produced and evaluated as described below.

Example 1-1

A glass Substrate (size: 25 mm×75 mm×1.1 mm thick, manufactured by Geomatec Co., Ltd.) having an ITO transparent electrode (anode) was ultrasonic-cleaned in isopropyl alcohol for five minutes, and then UV-ozone-cleaned for one minute. The film thickness of ITO was 130 nm.

The cleaned glass substrate having a transparent electrode line was mounted on a substrate holder of a vacuum deposition apparatus. First, a compound HT-1 and a compound HA were co-deposited on the surface with the transparent electrode line formed thereon so as to cover the transparent electrode to thereby form a hole injecting layer having a film thickness of 10 nm. In the hole injecting layer, the ratio of the compound HT-1 was 97 mass %, and the ratio of the compound HA was 3 mass %.

Next, the compound HT-1 was vapor-deposited on the hole injecting layer to form a first hole transporting layer having a film thickness of 200 nm.

Next, a compound HT-2 was vapor-deposited on the first hole transporting layer to form a second hole transporting layer having a film thickness of 10 nm.

Next, a compound HOST-1 serving as the third compound, a compound TADF-1 serving as the second compound, and a compound RD serving as the first compound were co-deposited on the second hole transporting layer to form an emitting layer having a film thickness of 25 nm.

In the emitting layer, the ratio of the compound HOST-1 was 74 mass %, the ratio of the compound TADF-1 was 25 mass %, and the ratio of the compound RD was 1 mass %.

Next, a compound ET-1 was vapor-deposited on the emitting layer to form a hole blocking layer having a film thickness of 10 nm.

Next, a compound ET-2 and Liq were co-deposited on the hole blocking layer to form an electron transporting layer having a film thickness of 30 nm.

In the electron transporting layer, the ratio of the compound ET-2 was 50 mass %, and the ratio of Liq was 50 mass %.

Liq is an abbreviation of (8-quinolinolato)lithium ((8-Quinolinolato)lithium).

Next, ytterbium (Yb) was vapor-deposited on the electron transporting layer to form an electron injecting layer having a film thickness of 1 nm.

Subsequently, metal aluminum (Al) was vapor-deposited on the electron injecting layer to form a metal Al cathode having a film thickness of 80 nm.

A bottom-emission organic EL device according to Example 1-1 was produced as described above.

The schematic device arrangement of the organic EL device according to Example 1-1 is as follows.

ITO(130)/HT-1:HA(10, 97%:3%)/HT-1(200)/HT-2(10)/HOST-1:TADF-1 RD(25, 74%:25%:1%)/ET-1(10)/ET-2: Liq(30, 50%:50%)/Yb(1)/Al(80)

In the device arrangement, numerals in parentheses represent a film thickness (unit: nm).

Similarly, in the device arrangement, in parentheses, numerals (97%:3%) expressed in percentage represent the ratio (mass %) of the compound HT-1 to the compound HA in the hole injecting layer, numerals (74%:25%:1%) expressed in percentage represent the ratio (mass %) of the compound HOST-1, the compound TADF-1, and the compound RD in the emitting layer, and numerals (50%:50%) expressed in percentage represent the ratio (mass %) of the compound ET-2 to Liq in the electron transporting layer.

Similar notations apply to the description below.

Comparative Examples 1-1 to 1-5

Organic EL devices of Comparative Examples 1-1 to 1-5 were produced in the same manner as in Example 1-1 except that the compound TADF-1 serving as the second compound and the compound HOST-1 serving as the third compound that were used in the emitting layer of Example 1-1 were changed to the compounds shown in Table 1.

Evaluation (1) of Organic EL Devices

The organic EL devices produced above were evaluated as follows.

External Quantum Efficiency EQE

A voltage was applied to each of the produced organic EL devices such that a current density was 10.00 mA/cm$^2$, where a spectral radiance spectrum was measured with a spectroradiometer CS-2000 (produced by Konica Minolta, Inc.).

The external quantum efficiency EQE (unit: %) was calculated based on the obtained spectral radiance spectra, assuming that the spectra was provided under a Lambertian radiation.

Current Efficiency L/J

A voltage was applied to each of the produced organic EL devices such that a current density was 10.00 mA/cm$^2$, where a spectral radiance spectrum was measured with a spectroradiometer CS-1000 (produced by Konica Minolta, Inc.).

The current efficiency L/J (unit: cd/A) was calculated based on the obtained spectral radiance spectra.

Furthermore, a relative value of the current efficiency L/J of each example relative to the current efficiency L/J of Example 1-1 was calculated based on a numerical formula (Numerical Formula X1) below.

L/J relative value={(L/J of each example)/(L/J of Example 1-1)}×100   (Numerical Formula X1):

TABLE 1

| | Emitting layer | | | | | | | | | | | Device evaluation | | |
|---|---|---|---|---|---|---|---|---|---|---|---|---|---|---|
| | Third compound | | | | Second compound | | | | First compound | | | | L/J | |
| | Name | Ip [eV] | Af [eV] | S$_1$ [eV] | Name | Ip [eV] | Af [eV] | S$_1$ [eV] | Name | Ip [eV] | Af [eV] | S$_1$ [eV] | EQE [%] | L/J [cd/A] | Relative value (1) |
| Example 1-1 | HOST-1 | 5.78 | 1.46 | 3.42 | TADF-1 | 6.00 | 2.90 | 2.44 | RD | 5.19 | 2.52 | 2.02 | 11.83 | 28.9 | 100% |
| Comparative Example 1-1 | HOST-2 | 5.71 | 2.42 | 3.08 | TADF-1 | 6.00 | 2.90 | 2.44 | RD | 5.19 | 2.52 | 2.02 | 9.36 | 21.4 | 74% |
| Comparative Example 1-2 | HOST-1 | 5.78 | 1.46 | 3.42 | TADF-2 | 5.71 | 2.85 | 2.54 | RD | 5.19 | 2.52 | 2.02 | 7.76 | 18.4 | 64% |
| Comparative Example 1-3 | HOST-2 | 5.71 | 2.42 | 3.08 | TADF-2 | 5.71 | 2.85 | 2.54 | RD | 5.19 | 2.52 | 2.02 | 10.08 | 23.4 | 81% |
| Comparative Example 1-4 | HOST-1 | 5.78 | 1.46 | 3.42 | TADF-3 | 5.66 | 2.88 | 2.42 | RD | 5.19 | 2.52 | 2.02 | 7.64 | 16.9 | 58% |
| Comparative Example 1-5 | HOST-2 | 5.71 | 2.42 | 3.08 | TADF-3 | 5.66 | 2.88 | 2.42 | RD | 5.19 | 2.52 | 2.02 | 7.83 | 17.8 | 62% |

The organic EL device of Example 1-1 included an emitting layer that satisfied the relationships of the numerical formulae (Numerical Formula 1) to (Numerical Formula 4), exhibited a higher external quantum efficiency EQE and a higher current efficiency L/J, and emitted light at a higher luminous efficiency than those of the organic EL devices of Comparative Examples 1-1 to 1-5.

Production (2) of Organic EL Devices

Organic EL devices were produced and evaluated as described below.

Example 2-1

An APC (Ag—Pd—Cu) layer, which was a silver alloy layer having a film thickness of 200 nm, and an indium oxide-zinc oxide (IZO) layer having a film thickness of 10 nm were formed in sequence by a sputtering method on a glass substrate (25 mm×75 mm×0.7 mm in thickness) serving as a substrate for device production.

Thus, an electrical conductive material layer including the APC layer and the IZO layer was obtained.

The APC layer is a reflection layer, and the IZO layer is a transparent conductive layer.

IZO is a registered trademark.

Subsequently, the electrical conductive material layer was patterned by etching using a resist pattern as a mask with an ordinary lithography technique to form a lower electrode (anode).

Next, the compound HT-1 and the compound HA were co-deposited on the lower electrode (anode) to form a hole injecting layer having a film thickness of 10 nm.

In the hole injecting layer, the ratio of the compound HT-1 was 97 mass %, and the ratio of the compound HA was 3 mass %.

Next, the compound HT-1 was vapor-deposited on the hole injecting layer to form a first hole transporting layer having a film thickness of 195 nm.

Next, the compound HT-2 was vapor-deposited on the first hole transporting layer to form a second hole transporting layer having a film thickness of 5 nm.

Next, the compound HOST-1 serving as the third compound, the compound TADF-1 serving as the second compound, and the compound RD serving as the first compound were co-deposited on the second hole transporting layer to form an emitting layer having a film thickness of 25 nm.

In the emitting layer, the ratio of the compound HOST-1 was 74 mass %, the ratio of the compound TADF-1 was 25 mass %, and the ratio of the compound RD was 1 mass %.

Next, the compound ET-1 was vapor-deposited on the emitting layer to form a hole blocking layer having a film thickness of 5 nm.

Next, the compound ET-2 and Liq were co-deposited on the hole blocking layer to form an electron transporting layer having a film thickness of 30 nm.

In the electron transporting layer, the ratio of the compound ET-2 was 50 mass %, and the ratio of Liq was 50 mass %.

Next, ytterbium (Yb) was vapor-deposited on the electron transporting layer to form an electron injecting layer having a film thickness of 1 nm.

Next, Mg and Ag were co-deposited on the electron injecting layer such that the mixing ratio Mg:Ag (ratio by mass %) was 10%:90% to form an upper electrode (cathode) including a semi-light-transmissive MgAg alloy and having a total film thickness of 14 nm.

Next, the compound CAP was deposited over the entire surface of the upper electrode to form a capping layer having a film thickness of 80 nm.

A top-emission organic EL device according to Example 2-1 was produced as described above.

The schematic device arrangement of the organic EL device according to Example 2-1 is as follows.

APC(200)/IZO(10)/HT-1:HA(10, 97%:3%)/HT-1(195)/HT-2(5)/HOST-1:TADF-1:RD(25, 74%:25%:1%)/ET-1(5)/ET-2:Liq(30, 50%:50%)/Yb(1)/Mg:Ag(14, 10%:90%)/CAP(80)

Comparative Examples 2-1 to 2-5

Organic EL devices of Comparative Examples 2-1 to 2-5 were produced in the same manner as in Example 2-1 except that the compound TADF-1 serving as the second compound and the compound HOST-1 serving as the third compound that were used in the emitting layer of Example 2-1 were changed to the compounds shown in Table 2.

Evaluation (2) of Organic EL Devices

The organic EL devices produced above were evaluated as follows. Table 2 shows the evaluation results.

Current Efficiency L/J

A voltage was applied to each of the produced organic EL devices such that a current density was 10.00 mA/cm$^2$, where a spectral radiance spectrum was measured with a spectroradiometer CS-1000 (produced by Konica Minolta, Inc.).

The current efficiency L/J (unit: cd/A) was calculated based on the obtained spectral radiance spectra.

Furthermore, a relative value of the current efficiency L/J of each example relative to the current efficiency L/J of Example 2-1 was calculated based on a numerical formula (Numerical Formula X2) below.

L/J relative value={(L/J of each example)/(L/J of Example 2-1)}×100   (Numerical Formula X2):

Furthermore, a change ΔL/J in the L/J relative value when the arrangement was changed from the bottom-emission organic EL device to the top-emission organic EL device was calculated.

Specifically, the difference between the L/J relative value (1) shown in Table 1 and related to the bottom-emission organic EL device and the L/J relative value (2) shown in Table 2 and related to the top-emission organic EL device was calculated.

Example 2-1: ΔL/J=[L/J relative value (2) of Example 2-1]–[L/J relative value (1) of Example 1-1]=100%–100%=0%

Comparative Example 2-1: ΔL/J=[L/J relative value (2) of Comparative Example 2-1]–[L/J relative value (1) of Comparative Example 1-1]=45%–74%=–29%

Comparative Example 2-2: ΔL/J=[L/J relative value (2) of Comparative Example 2-2]–[L/J relative value (1) of Comparative Example 1-2]=55%–64%=–9%

Comparative Example 2-3: ΔL/J=[L/J relative value (2) of Comparative Example 2-3]–[L/J relative value (1) of Comparative Example 1-3]=61%–81%=–20%

Comparative Example 2-4: ΔL/J=[L/J relative value (2) of Comparative Example 2-4]–[L/J relative value (1) of Comparative Example 1-4]=41%–58%=–17%

Comparative Example 2-5: ΔL/J=[L/J relative value (2) of Comparative Example 2-5]–[L/J relative value (1) of Comparative Example 1-5]=43%–62%=–19%

TABLE 2

| | Emitting layer | | | | | | | | | | | Device evaluation | | |
|---|---|---|---|---|---|---|---|---|---|---|---|---|---|---|
| | Third compound | | | | Second compound | | | | First compound | | | | L/J | | |
| | Name | Ip [eV] | Af [eV] | $S_1$ [eV] | Name | Ip [eV] | Af [eV] | $S_1$ [eV] | Name | Ip [eV] | Af [eV] | $S_1$ [eV] | L/J [cd/A] | Relative value (2) | ΔL/J (2)–(1) |
| Example 2-1 | HOST-1 | 5.78 | 1.46 | 3.42 | TADF-1 | 6.00 | 2.90 | 2.44 | RD | 5.19 | 2.52 | 2.02 | 56 | 100% | 0% |
| Comparative Example 2-1 | HOST-2 | 5.71 | 2.42 | 3.08 | TADF-1 | 6.00 | 2.90 | 2.44 | RD | 5.19 | 2.52 | 2.02 | 25 | 45% | –29% |
| Comparative Example 2-2 | HOST-1 | 5.78 | 1.46 | 3.42 | TADF-2 | 5.71 | 2.85 | 2.54 | RD | 5.19 | 2.52 | 2.02 | 31 | 55% | –9% |
| Comparative Example 2-3 | HOST-2 | 5.71 | 2.42 | 3.08 | TADF-2 | 5.71 | 2.85 | 2.54 | RD | 5.19 | 2.52 | 2.02 | 34 | 61% | –20% |

TABLE 2-continued

| | Emitting layer | | | | | | | | | | | | Device evaluation | | |
|---|---|---|---|---|---|---|---|---|---|---|---|---|---|---|---|
| | Third compound | | | | Second compound | | | | First compound | | | | L/J | | |
| | Name | Ip [eV] | Af [eV] | $S_1$ [eV] | Name | Ip [eV] | Af [eV] | $S_1$ [eV] | Name | Ip [eV] | Af [eV] | $S_1$ [eV] | L/J [cd/A] | Relative value (2) | ΔL/J (2)-(1) |
| Comparative Example 2-4 | HOST-1 | 5.78 | 1.46 | 3.42 | TADF-3 | 5.66 | 2.88 | 2.42 | RD | 5.19 | 2.52 | 2.02 | 23 | 41% | −17% |
| Comparative Example 2-5 | HOST-2 | 5.71 | 2.42 | 3.08 | TADF-3 | 5.66 | 2.88 | 2.42 | RD | 5.19 | 2.52 | 2.02 | 24 | 43% | −19% |

The organic EL device of Example 2-1 is a top-emission organic EL device serving as a red pixel and is also an organic EL device that realizes maintaining the luminous efficiency (blue index (BI)) of an organic EL device serving as a blue pixel.

A feature of the organic EL device of Example 2-1 is that the total film thickness of the electron transporting layer, the electron injecting layer, and the capping layer of the organic EL device serving as a red pixel is made common to a typical total film thickness of the electron transporting layer, the electron injecting layer, and the capping layer of an organic EL device serving as a blue pixel, thereby maintaining the efficiency of the blue pixel without affecting the interference effect/cavity adjustment of the blue pixel.

Table 2 shows the changes ΔL/J between the L/J relative values of Example 1-1 and Comparative Examples 1-1 to 1-5, which are bottom-emission organic EL devices, and the L/J relative values of Example 2-1 and Comparative Examples 2-1 to 2-5, which are top-emission organic EL devices.

As shown in Table 2, the L/J significantly decreased in Comparative Examples 2-1 to 2-5 except for Example 2-1, which was a top-emission organic EL device maintaining the efficiency of a blue pixel.

The reason for this is presumably as follows.

This is probably because, in the organic EL device of Example 2-1, since the emitting region is shifted toward the hole transporting layer, the interference effect/cavity adjustment is facilitated in the top-emission arrangement serving as a red pixel to suppress a decrease in the efficiency of the organic EL device serving as a red pixel.

In contrast, in the devices of Comparative Examples 2-1 to 2-5, probably, since the emitting region is shifted toward the electron transporting layer, the cavity adjustment as a red pixel is difficult in relation to the total film thickness of the electron transporting layer, the electron injecting layer, and the capping layer that is optimized for a blue pixel, resulting in a decrease in the efficiency.

Evaluation of Compounds

The compounds were evaluated as follows.

Ionization Potential Ip and Affinity Af

The ionization potential Ip of a measurement target (compound or material) was calculated by the following numerical formula (Numerical Formula Y1), and the affinity Af thereof was calculated by the following numerical formula (Numerical Formula Y2).

The unit of the ionization potential and the unit of the affinity Af are eV.

$Ip=-1.40\times(Eox-Efc)-4.60$ eV  (Numerical Formula Y1):

$Af=-1.19\times(Ere-Efc)-4.78$ eV  (Numerical Formula Y2):

In the numerical formulae (Numerical Formula Y1) and (Numerical Formula Y2), Eox, Ere, and Efc are as follows.

Eox: First oxidation potential of measurement target (DPV, Positive scan)

Ere: First reduction potential of measurement target (DPV, Negative scan)

Efc: First oxidation potential of ferrocene (DPV, Positive scan), (ca. +0.55 V vs Ag/AgCl)

The oxidation-reduction potential was measured by differential pulse voltammetry (DPV) with an electrochemical analyzer (CHI852D, produced by ALS Co., Ltd.).

A sample solution used for the measurement was prepared by using N,N-dimethylformamide (DMF) as a solvent, dissolving a measurement target such that the concentration of the measurement target was 1.0 mmol/L, and dissolving tetrabutylammonium hexafluorophosphate (TBHP) serving as a supporting electrolyte such that the concentration of TBHP was 100 mmol/L. A glassy carbon electrode was used as a working electrode. A platinum (Pt) electrode was used as a counter electrode.

Lowest Singlet Energy $S_1$

A toluene solution of a measurement target compound at a concentration of 10 μmol/L was prepared and put in a quartz cell. An absorption spectrum (ordinate axis: absorption intensity, abscissa axis: wavelength) of the thus-obtained sample was measured at a normal temperature (300K).

A tangent was drawn to the fall of the absorption spectrum close to the long-wavelength region, and a wavelength value $\Delta_{edge}$ [nm] at an intersection of the tangent and the abscissa axis was substituted into a conversion equation (F2) below to calculate the lowest singlet energy.

$S_1[eV]=1239.85/\lambda_{edge}$  Conversion Equation (F2):

A spectrophotometer (U3310 produced by Hitachi, Ltd.) was used for measuring absorption spectrum. The tangent to the fall of the absorption spectrum close to the long-wavelength region is drawn as follows. While moving on a curve of the absorption spectrum from the local maximum value closest to the long-wavelength region, among the local maximum values of the absorption spectrum, in a long-wavelength direction, a tangent at each point on the curve is checked. An inclination of the tangent is decreased and increased in a repeated manner as the curve falls (i.e., a value of the ordinate axis is decreased). A tangent drawn at a point where the inclination of the curve is the local minimum closest to the long-wavelength region (except when absorbance is 0.1 or less) is defined as the tangent to the fall of the absorption spectrum close to the long-wavelength region. The local maximum absorbance of 0.2 or less is not counted as the above-mentioned local maximum absorbance closest to the long-wavelength region.

Delayed Fluorescence of Compounds

Delayed fluorescence was checked by measuring transient PL using a device shown in FIG. 2.

The compound TADF-1 was dissolved in toluene to prepare a dilute solution with an absorbance of 0.05 or less at the excitation wavelength to eliminate the contribution of self-absorption.

In order to prevent quenching due to oxygen, the sample solution was frozen and degassed and then sealed in a cell with a lid under an argon atmosphere to obtain an oxygen-free sample solution saturated with argon.

The fluorescence spectrum of the sample solution was measured with a spectrofluorometer FP-8600 (produced by JASCO Corporation), and the fluorescence spectrum of a 9,10-diphenylanthracene ethanol solution was measured under the same conditions.

Using the fluorescence area intensities of both spectra, the total fluorescence quantum yield was calculated by an equation (1) in Morris et al. J. Phys. Chem. 80 (1976) 969.

Prompt emission and Delay emission are present. Prompt emission is observed promptly when the excited state is achieved by exciting the compound TADF-1 with a pulse beam (i.e., a beam emitted from a pulse laser) having a wavelength absorbable by the compound TADF-1. Delay emission is observed not promptly when the excited state is achieved but after the excited state is achieved.

The delayed fluorescence in Examples means that an amount of Delay emission is 5% or more with respect to an amount of Prompt emission.

Specifically, provided that the amount of Prompt emission is denoted by $X_P$ and the amount of Delay emission is denoted by $X_D$, the delayed fluorescence means that a value of $X_D/X_P$ is 0.05 or more.

The amount of Prompt emission, the amount of Delay emission, and the ratio between the amounts thereof can be determined according to the method as described in "Nature 492, 234-238, 2012" (Reference Literature 1).

The amount of Prompt emission and the amount of Delay emission may be calculated using a device different from one described in Reference Literature 1 or one shown in FIG. 2

The compounds TADF-2 and TADF-3 were also subjected to the measurement as in the compound TADF-1.

Regarding the compounds TADF-1, TADF-2, and TADF-3, it was confirmed that the amount of Delay emission was 5% or more with respect to the amount of Prompt emission.

Specifically, the value of $X_D/X_P$ was 0.05 or more in each of the compounds TADF-1, TADF-2, and TADF-3.

Maximum Peak Wavelength of Compounds

The maximum peak wavelength A of a compound was measured by the following method.

A toluene solution of a measurement target compound at a concentration of 5 µmol/L was prepared and put in a quartz cell. An emission spectrum (ordinate axis: luminous intensity, abscissa axis: wavelength) of the thus-obtained sample was measured at a normal temperature (300K).

In the Examples, the emission spectrum was measured with a spectrophotofluorometer (device name: F-7000) produced by Hitachi High-Tech Science Corporation.

It should be noted that the machine for measuring the emission spectrum is not limited to the machine used herein.

In the emission spectrum, an emission spectrum peak wavelength at which the luminous intensity was maximum was used as the maximum peak wavelength A.

The maximum peak wavelength A of the compound RD was 615 nm.

What is claimed is:

1. An organic electroluminescence device comprising:
an anode;
a cathode; and
an emitting layer, wherein
the emitting layer comprises a first compound, a second compound, and a third compound,
the first compound, the second compound, and the third compound are different from each other,
the first compound is a fluorescent compound,
the second compound is a delayed fluorescent compound, and
the first compound, the second compound, and the third compound satisfy numerical formulae (Numerical Formula 1), (Numerical Formula 2), (Numerical Formula 3), and (Numerical Formula 4) below:

| | |
|---|---|
| $\|Af(M1)-Af(M2)\|\leq 0.40$ eV | (Numerical Formula 1): |
| $Ip(M2)\geq 5.75$ eV | (Numerical Formula 2): |
| $\|Ip(M2)-Ip(M3)\|\leq 0.25$ eV | (Numerical Formula 3): |
| $S_1(M3)\geq S_1(M2)$ | (Numerical Formula 4): | where Af(M1) is an affinity of the first compound,
Af(M2) is an affinity of the second compound,
Ip(M2) is an ionization potential of the second compound,
$S_1$(M2) is a lowest singlet energy of the second compound,
Ip(M3) is an ionization potential of the third compound, and
$S_1$(M3) is a lowest singlet energy of the third compound.

2. The organic electroluminescence device according to claim 1, wherein the first compound, the second compound, and the third compound are comprised in the same layer.

3. The organic electroluminescence device according to claim 1, wherein
the first compound is a compound represented by a formula (D1) or (D2) below,

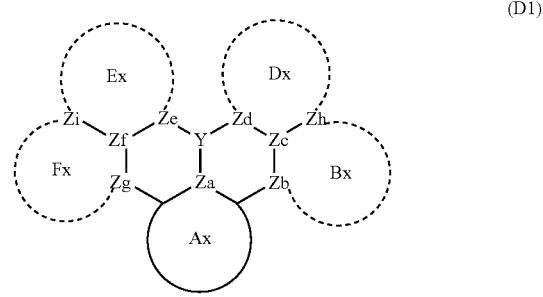

(D1)

where, in the formula (D1):
a ring Ax, a ring Bx, a ring Dx, a ring Ex, and a ring Fx are each independently a cyclic structure selected from the group consisting of a substituted or unsubstituted aryl ring having 6 to 50 ring carbon atoms, and a substituted or unsubstituted heterocycle having 5 to 50 ring atoms,
one of the ring Bx and the ring Dx is present or both the ring Bx and the ring Dx are present,
when both the ring Bx and the ring Dx are present, the ring Bx and the ring Dx share a bond connecting Zc and Zh to each other,
one of the ring Ex and the ring Fx is present or both the ring Ex and the ring Fx are present, when both the ring Ex and the ring Fx are present, the ring Ex and the ring Fx share a bond connecting Zf and Zi to each other;

Za is a nitrogen atom or a carbon atom;

Zb is a nitrogen atom or a carbon atom when the ring Ex is present, or an oxygen atom, a sulfur atom, N(Rb), C(Rb$_1$)(Rb$_2$), Si(Rb$_3$)(Rb$_4$), or B(Rb$_5$) when the ring Bx is not present;

Zc is a nitrogen atom or a carbon atom;

Zd is a nitrogen atom or a carbon atom when the ring Dx is present, or an oxygen atom, a sulfur atom, or N(Rd) when the ring Dx is not present;

Ze is a nitrogen atom or a carbon atom when the ring Ex is present, or an oxygen atom, a sulfur atom, or N(Re) when the ring Ex is not present;

Zf is a nitrogen atom or a carbon atom;

Zg is a nitrogen atom or a carbon atom when the ring Fx is present, or an oxygen atom, a sulfur atom, N(Rg), C(Rg$_1$)(Rg$_2$), Si(Rg$_3$)(Rg$_4$), or B(Rg$_5$) when the ring Fx is not present;

Zh is a nitrogen atom or a carbon atom;

Zi is a nitrogen atom or a carbon atom;

Y is a boron atom, a nitrogen atom, a phosphorus atom, Si(Rh), P=O, or P=S;

a combination of Rb$_1$ and Rb$_2$ are mutually bonded to form a substituted or unsubstituted monocyclic ring, mutually bonded to form a substituted or unsubstituted fused ring, or not mutually bonded;

a combination of Rg$_1$ and Rg$_2$ are mutually bonded to form a substituted or unsubstituted monocyclic ring, mutually bonded to form a substituted or unsubstituted fused ring, or not mutually bonded;

Rb, Rb$_1$, Rb$_2$, Rb$_3$, Rb$_4$, Rb$_5$, Rd, Re, Rg, Rg$_1$, Rg$_2$, Rg$_3$, Rg$_4$, Rg$_5$, and Rh are each independently a hydrogen atom or a substituent;

Rb, Rb$_1$, Rb$_2$, Rb$_3$, Rb$_4$, Rb$_3$, Rd, Re, Rg, Rg$_1$, Rg$_2$, Rg$_3$, Rg$_4$, Rg$_5$, and Rh serving as substituents are each independently a substituted or unsubstituted aryl group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted cycloalkyl group having 3 to 30 ring carbon atoms, a group represented by —Si(R$_{911}$)(R$_{912}$)(R$_{913}$), a group represented by —O—(R$_{914}$), a group represented by —S—(R$_{916}$), or a group represented by —N(R$_{916}$)(R$_{917}$); and a bond between Y and Za, a bond between Y and Zd, and a bond between Y and Ze are each a single bond,

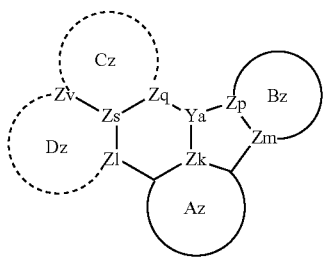

(D2)

where, in the formula (D$_2$):

a ring Az, a ring Bz, a ring Cz, and a ring Dz are each independently a cyclic structure selected from the group consisting of a substituted or unsubstituted aryl ring having 6 to 50 ring carbon atoms, and a substituted or unsubstituted heterocycle having 5 to 50 ring atoms, one of the ring Cz and the ring Dz is present or both the ring Cz and the ring Dz are present, when both the ring Cz and the ring Dz are present, the ring Cz and the ring Dz share a bond connecting Zs and Zv to each other;

Zk is a nitrogen atom or a carbon atom;

Zm is a nitrogen atom or a carbon atom;

Zp is a nitrogen atom or a carbon atom;

Zq is a nitrogen atom or a carbon atom when the ring Cz is present, or an oxygen atom, a sulfur atom, or N(Rq) when the ring Cz is not present;

Zs is a nitrogen atom or a carbon atom;

Zt is a nitrogen atom or a carbon atom when the ring Dz is present, or an oxygen atom, a sulfur atom, N(Rt), C(Rt$_1$)(Rt$_2$), Si(Rt$_3$)(Rt$_4$), or B(Rt$_3$) when the ring Dz is not present;

Zv is a nitrogen atom or a carbon atom

Ya is a boron atom, a nitrogen atom, a phosphorus atom, Si(Rv), P=O, or P=S;

a combination of Rt$_1$ and Rt$_2$ are mutually bonded to form a substituted or unsubstituted monocyclic ring, mutually bonded to form a substituted or unsubstituted fused ring, or not mutually bonded;

Rq, Rt, Rt$_1$, Rt$_2$, Rt$_3$, Rt$_4$, Rt$_5$, and Rv are each independently a hydrogen atom or a substituent; and Rq, Rt, Rt$_1$, Rt$_2$, Rt$_3$, Rt$_4$, Rt$_5$, and Rv serving as substituents are each independently a substituted or unsubstituted aryl group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted cycloalkyl group having 3 to 30 ring carbon atoms, a group represented by —Si(R$_{911}$)(R$_{912}$)(R$_{913}$), a group represented by —O—(R$_{914}$), a group represented by —S—(R$_{915}$), or a group represented by —N(R$_{916}$)(R$_{917}$);

a bond between Ya and Zk, a bond between Ya and Zp, and a bond between Ya and Zq are each a single bond, and in the first compound, R$_{911}$ to R$_{917}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of R$_{911}$ are present, the plurality of R$_{911}$ are mutually the same or different, when a plurality of R$_{912}$ are present, the plurality of R$_{912}$ are mutually the same or different, when a plurality of R$_{913}$ are present, the plurality of R$_{913}$ are mutually the same or different, when a plurality of R$_{914}$ are present, the plurality of R$_{914}$ are mutually the same or different, when a plurality of R$_{915}$ are present, the plurality of R$_{915}$ are mutually the same or different, when a plurality of R$_{916}$ are present, the plurality of R$_{916}$ are mutually the same or different, and when a plurality of R$_{917}$ are present, the plurality of R$_{917}$ are mutually the same or different.

4. The organic electroluminescence device according to claim 3, wherein the first compound is a compound represented by a formula (D100) below,

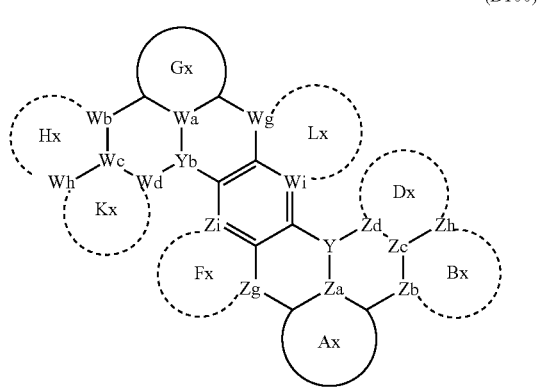

(D100)

where, in the formula (D100):
- a ring Ax, a ring Bx, a ring Dx, and a ring Fx represent the same as the ring Ax, the ring Bx, the ring Dx, and the ring Fx, respectively, in the formula (D1);
- Y, Za, Zb, Zc, Zd, Zg, Zh, and Zi represent the same as Y, Za, Zb, Zc, Zd, Zg, Zh, and Zi, respectively, in the formula (D1);
- a ring Gx, a ring Hx, a ring Kx, and a ring Lx are each independently a cyclic structure selected from the group consisting of a substituted or unsubstituted aryl ring having 6 to 30 ring carbon atoms, and a substituted or unsubstituted heterocycle having 5 to 30 ring atoms,
- one of the ring Hx and the ring Kx is present or both the ring Hx and the ring Kx are present,
- when both the ring Hx and the ring Kx are present, the ring Hx and the ring Kx share a bond connecting Wc and Wh to each other;
- Wa is a nitrogen atom or a carbon atom;
- Wb is a nitrogen atom or a carbon atom when the ring Hx is present, or an oxygen atom, a sulfur atom, N(Rk), C(Rk$_1$)(Rk$_2$), Si(Rk$_3$)(Rk$_4$), or B(Rk$_5$) when the ring Hx is not present;
- Wc is a nitrogen atom or a carbon atom;
- Wd is a nitrogen atom or a carbon atom when the ring Kx is present, or an oxygen atom, a sulfur atom, or N(Rm) when the ring Kx is not present;
- Wg is a nitrogen atom or a carbon atom when the ring Lx is present, or an oxygen atom, a sulfur atom, N(Rn), C(Rn$_1$)(Rn$_2$), Si(Rn$_3$)(Rn$_4$), or B(Rn$_5$) when the ring Lx is not present;
- Wh is a nitrogen atom or a carbon atom;
- Wi is a nitrogen atom or a carbon atom;
- Yb is a boron atom, a nitrogen atom, a phosphorus atom, Si(Rp), P=O, or P=S;
- a combination of Rk$_1$ and Rk$_2$ are mutually bonded to form a substituted or unsubstituted monocyclic ring, mutually bonded to form a substituted or unsubstituted fused ring, or not mutually bonded;
- a combination of Rn$_1$ and Rn$_2$ are mutually bonded to form a substituted or unsubstituted monocyclic ring, mutually bonded to form a substituted or unsubstituted fused ring, or not mutually bonded;
- Rk, Rk$_1$, Rk$_2$, Rk$_3$, Rk$_4$, Rk$_5$, Rm, Rn, Rn$_1$, Rn$_2$, Rn$_3$, Rn$_4$, Rn$_5$, and Rp are each independently a hydrogen atom or a substituent;
- Rk, Rk$_1$, Rk$_2$, Rk$_3$, Rk$_4$, Rk$_5$, Rm, Rn, Rn$_1$, Rn$_2$, Rn$_3$, Rn$_4$, Rn$_5$, and Rp serving as substituents are each independently a substituted or unsubstituted aryl group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted cycloalkyl group having 3 to 30 ring carbon atoms, a group represented by —Si(R$_{911}$)(R$_{912}$)(R$_{913}$), a group represented by —O—(R$_{914}$), a group represented by —S—(R$_{915}$), or a group represented by —N(R$_{916}$)(R$_{917}$); and
- a bond between Yb and Wa and a bond between Yb and Wd are each a single bond.

5. The organic electroluminescence device according to claim 4, wherein
the first compound is a compound represented by a formula (D101) below,

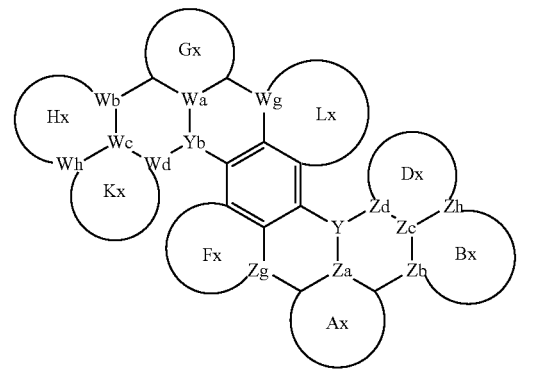

(D101)

where, in the formula (D101):
- a ring Ax, a ring Bx, a ring Dx, a ring Fx, a ring Gx, a ring Hx, a ring Kx, and a ring Lx represent the same as the ring Ax, the ring Bx, the ring Dx, the ring Fx, the ring Gx, the ring Hx, the ring Kx, and the ring Lx, respectively, in the formula (D100);
- Y, Za, Zb, Zc, Zd, Zg, and Zh represent the same as Y, Za, Zb, Zc, Zd, Zg, and Zh, respectively, in the formula (D100); and
- Yb, Wa, Wb, Wc, Wd, Wg, and Wh represent the same as Yb, Wa, Wb, Wc, Wd, Wg, and Wh, respectively, in the formula (D100).

6. The organic electroluminescence device according to claim 5, wherein
the first compound is a compound represented by a formula (D102) below,

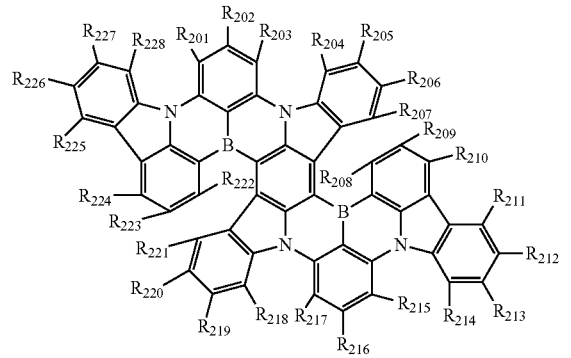

(D102)

where, in the formula (D102):

R$_{201}$ to R$_{228}$ are each independently a hydrogen atom, a substituted or unsubstituted aryl group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted cycloalkyl group having 3 to 30 ring carbon atoms, a halogen atom, a cyano group, a group represented by —Si(R$_{911}$)(R$_{912}$)(R$_{913}$), a group represented by —O—(R$_{914}$), a group represented by —S—(R$_{915}$), or a group represented by —N(R$_{916}$)(R$_{917}$).

7. The organic electroluminescence device according to claim 1, wherein the second compound is a compound represented by a formula (H1) below,

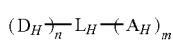
(H1)

where, in the formula (H1):

A$_H$ is a group having at least one partial structure selected from the group consisting of formulae (a-1), (a-2), (a-3), (a-4), (a-5), (a-6), (a-7), and (a-8) below;

D$_H$ is a group represented by a formula (11), (12), or (13) below;

L$_H$ is a single bond, a substituted or unsubstituted aryl ring having 6 to 50 ring carbon atoms, or a substituted or unsubstituted heterocycle having 5 to 50 ring atoms;

m is 1, 2, 3, 4, or 5, and a plurality of A$_H$ are mutually the same or different; and n is 1, 2, 3, 4, or 5, and a plurality of D$_H$ are mutually the same or different,

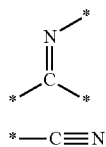
(a-1)

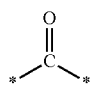
(a-2)

(a-3)

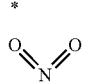
(a-4)

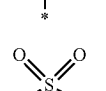
(a-5)

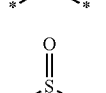
(a-6)

(a-7)

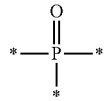
(a-8)

where, in the formulae (a-1) to (a-8), each * independently represents a bonding position to another atom in a molecule of the second compound,

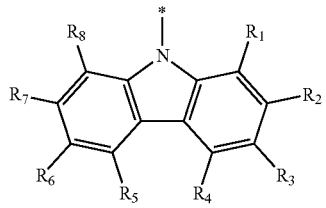
(11)

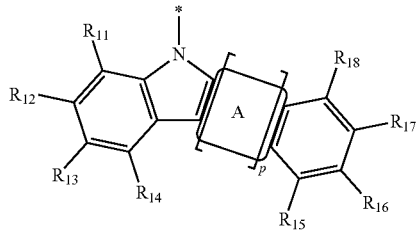
(12)

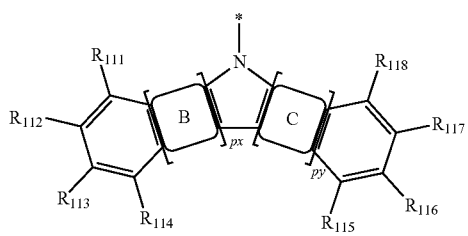
(13)

wherein: at least one combination of adjacent two or more of R$_1$ to R$_8$ in the formula (11) are mutually bonded to form a substituted or unsubstituted monocyclic ring, mutually bonded to form a substituted or unsubstituted fused ring, or not mutually bonded:

at least one combination of adjacent two or more of R$_{11}$ to R$_{18}$ in the formula (12) are mutually bonded to form a substituted or unsubstituted monocyclic ring, mutually bonded to form a substituted or unsubstituted fused ring, or not mutually bonded;

at least one combination of adjacent two or more of R$_{111}$ to R$_{118}$ in the formula (13) are mutually bonded to form a substituted or unsubstituted monocyclic ring, mutually bonded to form a substituted or unsubstituted fused ring, or not mutually bonded;

R$_1$ to R$_8$ that form neither a substituted or unsubstituted monocyclic ring nor a substituted or unsubstituted fused ring in the formula (11), R$_{11}$ to R$_{18}$ that form neither a substituted or unsubstituted monocyclic ring nor a substituted or unsubstituted fused ring in the formula (12), and R$_{111}$ to R$_{118}$ that form neither a substituted or unsubstituted monocyclic ring nor a substituted or unsubstituted fused ring in the formula (13) are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{905}$)($R_{907}$), a substituted or unsubstituted aralkyl group having 7 to 50 carbon atoms, a group represented by —C(=O)$R_{908}$, a group represented by —COO$R_{909}$, a halogen atom, a cyano group, a nitro group, a group represented by —P(=O)($Rg_{931}$)($R_{932}$), a group represented by —Ge($Rg_{933}$)($R_{934}$)($R_{935}$), a group represented by —B($R_{936}$)($R_{937}$), a substituted or unsubstituted aryl group having 6 to 50 ring carbon atoms, or a substituted or unsubstituted heterocyclic group having 5 to 50 ring atoms;

in the formulae (12) and (13):

a ring A, a ring B, and a ring C are each independently a cyclic structure selected from the group consisting of cyclic structures represented by formulae (14) and (15) below;

the ring A, the ring B, and the ring C are fused with an adjacent ring at any position;

p, px, and py are each independently 1, 2, 3, or 4;

when p is 2, 3, or 4, a plurality of ring A are mutually the same or different;

when px is 2, 3, or 4, a plurality of ring B are mutually the same or different;

when py is 2, 3, or 4, a plurality of ring C are mutually the same or different; and

* in the formulae (11) to (13) represents a bonding position to $L_H$,

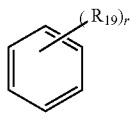

(14)

(15)

where, in the formula (14):

r is 0, 2, or 4;

a combination of a plurality of $R_{19}$ are mutually bonded to form a substituted or unsubstituted monocyclic ring, mutually bonded to form a substituted or unsubstituted fused ring, or not mutually bonded;

in the formula (15), $X_1$ is a sulfur atom, an oxygen atom, or C($R_{191}$)($R_{192}$), a combination of $R_{191}$ and $R_{192}$ are mutually bonded to form a substituted or unsubstituted monocyclic ring, mutually bonded to form a substituted or unsubstituted fused ring, or not mutually bonded;

$R_{19}$, $R_{191}$, and $R_{192}$ that form neither a substituted or unsubstituted monocyclic ring nor a substituted or unsubstituted fused ring are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{908}$), a group represented by —N($R_{906}$)($R_{907}$), a substituted or unsubstituted aralkyl group having 7 to 50 carbon atoms, a group represented by —C(=O)$R_{908}$, a group represented by —COO$R_{909}$, a halogen atom, a cyano group, a nitro group, a group represented by —P(=O)($Rg_{931}$)($R_{932}$), a group represented by —Ge($R_{933}$)($R_{934}$)($R_{935}$), a group represented by —B($R_{936}$)($R_{937}$), a substituted or unsubstituted aryl group having 6 to 50 ring carbon atoms, or a substituted or unsubstituted heterocyclic group having 5 to 50 ring atoms;

a plurality of $R_{19}$ are mutually the same or different;

a plurality of $R_{191}$ are mutually the same or different;

a plurality of $R_{192}$ are mutually the same or different; and a plurality of $X_1$ are mutually the same or different, and in the second compound: $R_{901}$, $R_{902}$, $R_{903}$, $R_{904}$, $R_{905}$, $R_{906}$, $R_{907}$, $R_{908}$, $R_{909}$, $R_{931}$, $R_{932}$, $R_{933}$, $R_{934}$, $R_{935}$, $R_{936}$, and $R_{937}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different;

when a plurality of $R_{907}$ are present, the plurality of $R_{907}$ are mutually the same or different;

when a plurality of $R_{908}$ are present, the plurality of $R_{908}$ are mutually the same or different;

when a plurality of $R_{909}$ are present, the plurality of $R_{909}$ are mutually the same or different;

when a plurality of $R_{931}$ are present, the plurality of $R_{931}$ are mutually the same or different;

when a plurality of $R_{932}$ are present, the plurality of $R_{932}$ are mutually the same or different;

when a plurality of $R_{933}$ are present, the plurality of $R_{933}$ are mutually the same or different;

when a plurality of $R_{934}$ are present, the plurality of $R_{934}$ are mutually the same or different;

when a plurality of $R_{935}$ are present, the plurality of $R_{935}$ are mutually the same or different;

when a plurality of $R_{936}$ are present, the plurality of $R_{936}$ are mutually the same or different; and when a plurality of $R_{937}$ are present, the plurality of $R_{937}$ are mutually the same or different.

8. The organic electroluminescence device according to claim 7, wherein the second compound is a compound represented by a formula (H10) below,

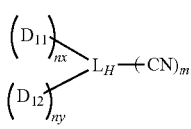
(H10)

where, in the formula (H10):
CN is a cyano group;
$L_H$ is a substituted or unsubstituted aromatic hydrocarbon ring having 6 to 30 ring carbon atoms;
$D_{11}$ and $D_{12}$ are each independently a group represented by the formula (11), (12), or (13);
m is 1, 2, 3, 4, or 5;
nx is 0, 1, 2, 3, 4, or 5;
ny is 0, 1, 2, 3, 4, or 5;
nx+ny is 1, 2, 3, 4, or 5;
$D_{11}$ and $D_{12}$ are mutually the same or different;
a plurality of $D_{11}$ are mutually the same or different; and
a plurality of $D_{12}$ are mutually the same or different.

9. The organic electroluminescence device according to claim 8, wherein
the second compound is a compound represented by a formula (H100) below,

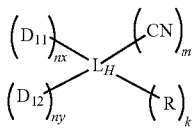
(H100)

where, in the formula (H100): $L_H$, $D_{11}$, $D_{12}$, m, nx, and ny represent the same as $L_H$, $D_{11}$, $D_{12}$, m, nx, and ny, respectively, in the formula (H10);
each R is independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), a substituted or unsubstituted aralkyl group having 7 to 50 carbon atoms, a group represented by —C(=O)$R_{908}$, a group represented by —COO$R_{909}$, a cyano group, a nitro group, a group represented by —P(=O)($R_{931}$)($R_{932}$), a group represented by —Ge($R_{933}$)($R_{934}$)($R_{935}$), a group represented by —B($R_{936}$)($R_{937}$), a substituted or unsubstituted aryl group having 6 to 50 ring carbon atoms, or a substituted or unsubstituted heterocyclic group having 5 to 50 ring atoms;
at least one R is a substituent, and the at least one R serving as the substituent is bonded to $L_H$ of a compound represented by the formula (H100) by a carbon-carbon bond;
k is an integer of 1 or more; and
a plurality of R are mutually the same or different.

10. The organic electroluminescence device according to claim 9, wherein
the second compound is a compound represented by a formula (H101) below,

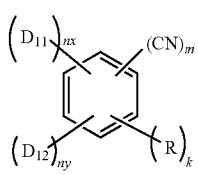
(H101)

where, in the formula (H101):
$D_{11}$ and $D_{12}$ represent the same as $D_{11}$ and $D_{12}$, respectively, in the formula (H10);
each R independently represents the same as R in the formula (H100);
m is 1, 2, 3 or 4;
nx is 0, 1, 2, 3, or 4;
ny is 0, 1, 2, 3, or 4;
k is 1, 2, 3, or 4;
nx+ny is 1, 2, 3, or 4; and
m+nx+ny+k=6.

11. The organic electroluminescence device according to claim 10, wherein
the second compound is a compound represented by a formula (H110), (H120), or (H130) below,

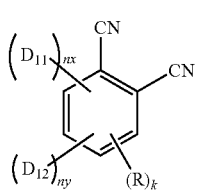
(H110)

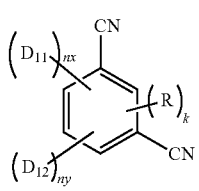
(H120)

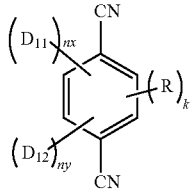
(H130)

where, in the formulae (H110), (H120), and (H130):
$D_{11}$ and $D_{12}$ represent the same as $D_{11}$ and $D_{12}$, respectively, in the formula (H10);
each R independently represents the same as R in the formula (H100);
nx is 0, 1, 2, or 3;
ny is 0, 1, 2, or 3;
k is 1, 2, or 3;
nx+ny is 1, 2, or 3; and
nx+ny+k=4.

12. The organic electroluminescence device according to claim 7, wherein
the group represented by the formula (12) in the second compound is a group selected from the group consisting of groups represented by formulae (12A), (12B), (12C), (12D), (12E), and (12F) below, (12A)
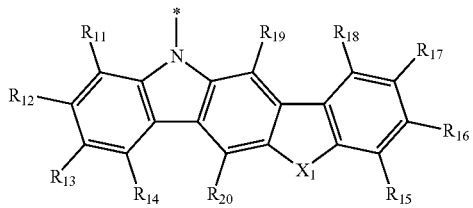

(12B)
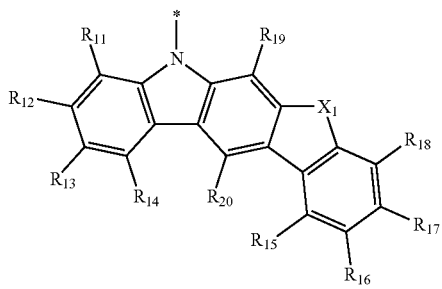

(12C)
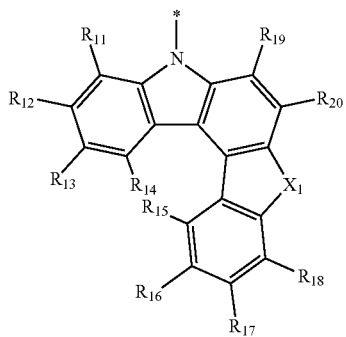

(12D)
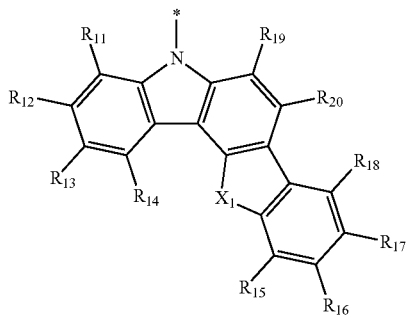

(12E)
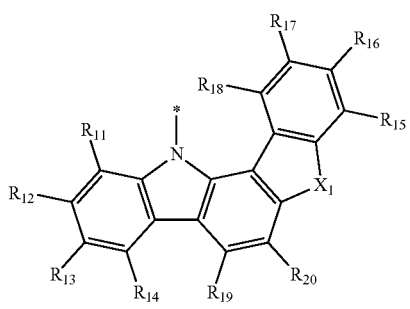

(12F)
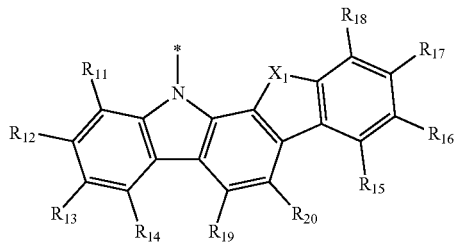

where, in the formulae (12A), (12B), (12C), (12D), (12E), and (12F):

$R_{11}$ to $R_{18}$ represent the same as $R_{11}$ to $R_{18}$, respectively, in the formula (12);

$R_{19}$ and $R_{20}$ each independently represent the same as $R_{19}$ in the formula (14);

$X_1$ represents the same as $X_1$ in the formula (15); and

* in the formulae (12A), (12B), (12C), (12D), (12E), and (12F) represents a bonding position.

13. The organic electroluminescence device according to claim 1, wherein
the third compound is a compound represented by a formula (3) below, (3)
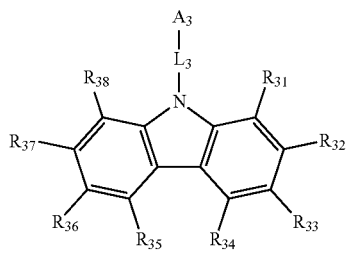

where, in the formula (3):

$A_3$ is a substituted or unsubstituted aryl group having 6 to 50 ring carbon atoms, or a substituted or unsubstituted heterocyclic group having 5 to 50 ring atoms;

$L_3$ is a single bond, a substituted or unsubstituted arylene group having 6 to 50 ring carbon atoms, a substituted or unsubstituted divalent heterocyclic group having 5 to 50 ring atoms, a divalent group formed by bonding two groups selected from the group consisting of a substituted or unsubstituted arylene group having 6 to 50 ring carbon atoms and a substituted or unsubstituted divalent heterocyclic group having 5 to 50 ring atoms, or a divalent group formed by bonding three groups selected from the group consisting of a substituted or unsubstituted arylene group having 6 to 30 ring carbon atoms and a substituted or unsubstituted divalent heterocyclic group having 5 to 30 ring atoms;

at least one combination of adjacent two or more of $R_{31}$ to $R_{38}$ are mutually bonded to form a substituted or unsubstituted monocyclic ring, mutually bonded to form a substituted or unsubstituted fused ring, or not mutually bonded; and $R_{31}$ to $R_{38}$ that form neither the substituted or unsubstituted monocyclic ring nor the substituted or unsubstituted fused ring are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $Si(R_{901})(R_{902})(R_{903})$, a group represented by $-O-(R_{904})$, a group represented by $-S-(R_{905})$, a group represented by $-N(R_{906})(R_{907})$, a substituted or unsubstituted aralkyl group having 7 to 50 carbon atoms, a group represented by $-C(=O)R_{908}$, a group represented by $-COOR_{909}$, a halogen atom, a cyano group, a nitro group, a group represented by $P(=O)(R_{931})(R_{932})$, a group represented by $-Ge(R_{933})(R_{934})(R_{935})$, a group represented by $-B(R_{936})(R_{937})$, a substituted or unsubstituted aryl group having 6 to 50 ring carbon atoms, a substituted or unsubstituted heterocyclic group having 5 to 50 ring atoms, or a group represented by a formula (3A) below,

(3A)

where, in the formula (3A), $R_B$ is a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a group represented by $-N(R_{906})(R_{907})$, a substituted or unsubstituted aralkyl group having 7 to 50 carbon atoms, a group represented by $-C(=O)R_{908}$, a group represented by $-COOR_{909}$, a halogen atom, a cyano group, a nitro group, a group represented by $-P(=O)(R_{931})(R_{932})$, a group represented by $-Ge(R_{933})(R_{934})(R_{935})$, a group represented by $-B(R_{936})(R_{937})$, a substituted or unsubstituted aryl group having 6 to 50 ring carbon atoms, or a substituted or unsubstituted heterocyclic group having 5 to 50 ring atoms;

when a plurality of $R_B$ are present, the plurality of $R_B$ are mutually the same or different;

$L_{31}$ is a single bond, a substituted or unsubstituted arylene group having 6 to 50 ring carbon atoms, or a trivalent group, a tetravalent group, a pentavalent group, or a hexavalent group derived from the arylene group, a substituted or unsubstituted divalent heterocyclic group having 5 to 50 ring atoms, or a trivalent group, a tetravalent group, a pentavalent group, or a hexavalent group derived from the heterocyclic group, or a divalent group formed by bonding two groups selected from the group consisting of a substituted or unsubstituted arylene group having 6 to 50 ring carbon atoms and a substituted or unsubstituted divalent heterocyclic group having 5 to 50 ring atoms, or a trivalent group, a tetravalent group, a pentavalent group, or a hexavalent group derived from the divalent group;

$L_{32}$ is a single bond, a substituted or unsubstituted arylene group having 6 to 50 ring carbon atoms, or a substituted or unsubstituted divalent heterocyclic group having to 50 ring atoms;

$n_3$ is 1, 2, 3, 4, or 5;

when $L_{31}$ is a single bond, $n_3$ is 1, and $L_{32}$ is bonded to a carbon atom of a six-membered ring in the formula (3);

when a plurality of $L_{32}$ are present, the plurality of $L_{32}$ are mutually the same or different; and

* is a bonding position to a carbon atom of a six-membered ring in the formula (3), and in the third compound: $R_{901}$, $R_{902}$, $R_{903}$, $R_{904}$, $R_{905}$, $R_{906}$, $R_{907}$, $R_{908}$, $R_{909}$, $R_{931}$, $R_{932}$, $R_{933}$, $R_{934}$, $R_{935}$, $R_{936}$, and $R_{937}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different;

when a plurality of $R_{907}$ are present, the plurality of $R_{907}$ are mutually the same or different;

when a plurality of $R_{908}$ are present, the plurality of $R_{908}$ are mutually the same or different, when a plurality of $R_{909}$ are present, the plurality of $R_{909}$ are mutually the same or different;

when a plurality of $R_{931}$ are present, the plurality of $R_{931}$ are mutually the same or different;

when a plurality of $R_{932}$ are present, the plurality of $R_{932}$ are mutually the same or different;

when a plurality of $R_{933}$ are present, the plurality of $R_{933}$ are mutually the same or different;

when a plurality of $R_{934}$ are present, the plurality of $R_{934}$ are mutually the same or different;

when a plurality of $R_{935}$ are present, the plurality of $R_{935}$ are mutually the same or different;

when a plurality of $R_{936}$ are present, the plurality of $R_{936}$ are mutually the same or different; and when a plurality of $R_{937}$ are present, the plurality of $R_{937}$ are mutually the same or different.

14. The organic electroluminescence device according to claim 13, wherein the third compound is a compound represented by a formula (31), (32), (33), (34), (35), or (36) below,

(31) 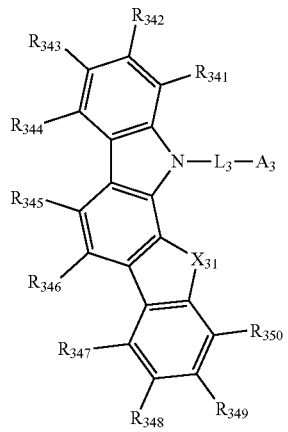

(32) 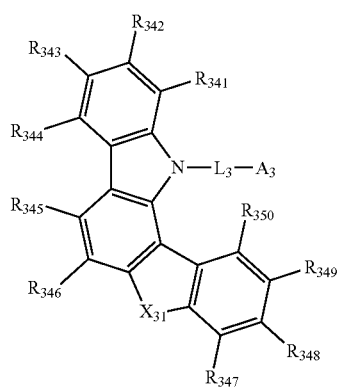

(33) 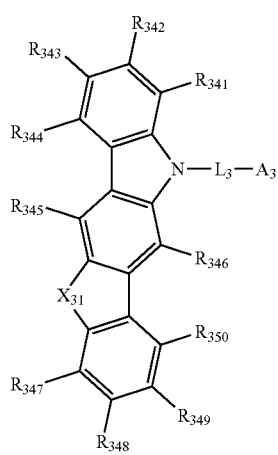

(34) 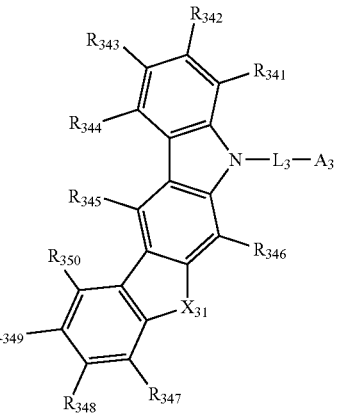

(35) 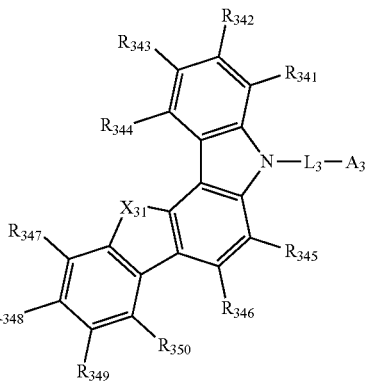

(36) 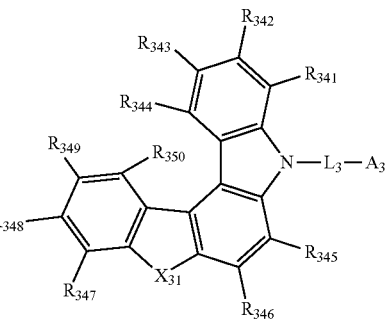

where, in the formulae (31) to (36):
  $A_3$ and $L_3$ represent the same as $A_3$ and $L_3$, respectively, in the formula (3);
  at least one combination of adjacent two or more of $R_{341}$ to $R_{350}$ are mutually bonded to form a substituted or unsubstituted monocyclic ring, mutually bonded to form a substituted or unsubstituted fused ring, or not mutually bonded;
  $X_{31}$ is a sulfur atom, an oxygen atom, $N(R_{352})$, or $C(R_{353})(R_{354})$;
  a combination of $R_{353}$ and $R_{354}$ are mutually bonded to form a substituted or unsubstituted monocyclic ring, mutually bonded to form a substituted or unsubstituted fused ring, or not mutually bonded; and
  $R_{341}$ to $R_{350}$ that form neither the substituted or unsubstituted monocyclic ring nor the substituted or unsubstituted fused ring, $R_{352}$, and $R_{335}$ and $R_{354}$ that form neither the substituted or unsubstituted monocyclic ring nor the substituted or unsubstituted fused ring each independently represent the same as $R_{31}$ to $R_{38}$ that form neither the substituted or unsubstituted monocyclic ring nor the substituted or unsubstituted fused ring.

15. The organic electroluminescence device according to claim 13, wherein $A_3$ in the third compound is a group represented by a formula (A31), (A32), (A33), (A34), (A35), (A36), or (A37) below,

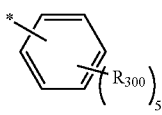
(A31)

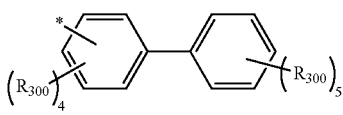
(A32)

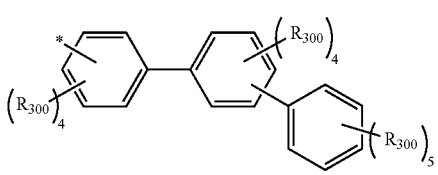
(A33)

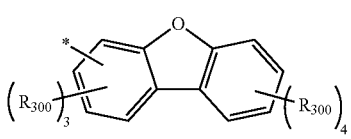
(A34)

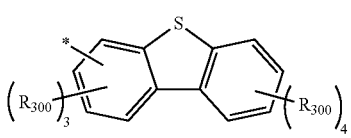
(A35)

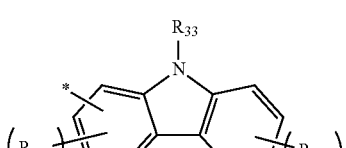
(A36)

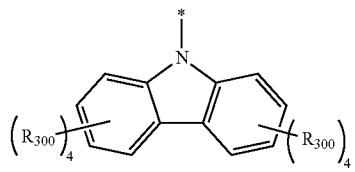
(A37)

where, in the formulae (A31) to (A37):

at least one combination of adjacent two or more of a plurality of $R_{300}$ are mutually bonded to form a substituted or unsubstituted monocyclic ring, mutually bonded to form a substituted or unsubstituted fused ring, or not mutually bonded;

$R_{300}$ that form neither the substituted or unsubstituted monocyclic ring nor the substituted or unsubstituted fused ring and $R_{333}$ each independently represent the same as $R_{31}$ to $R_{38}$ that form neither the substituted or unsubstituted monocyclic ring nor the substituted or unsubstituted fused ring; and each * in the formulae (A31) to (A37) represents a bonding position to $L_3$ of a compound represented by the formula (3).

16. The organic electroluminescence device according to claim 1, wherein the emitting layer comprises no metal complex.

17. The organic electroluminescence device according to claim 1, wherein the emitting layer comprises no phosphorescent material.

18. The organic electroluminescence device according to claim 1, wherein the first compound and the second compound satisfy a numerical formula (Numerical Formula 5) below, $$S_1(M2) > S_1(M1)$$ (Numerical Formula 5):

where $S_1(M1)$ is a lowest singlet energy of the first compound.

19. The organic electroluminescence device according to claim 1, wherein the first compound is a compound that emits fluorescence having a maximum peak wavelength in a range from 600 nm to 660 nm.

20. The organic electroluminescence device according to claim 1, further comprising a hole transporting layer between the anode and the emitting layer.

21. The organic electroluminescence device according to claim 1, further comprising an electron transporting layer between the cathode and the emitting layer.

22. An electronic device comprising the organic electroluminescence device according to claim 1.

* * * * *